US011968850B2

United States Patent
Ohsawa et al.

(10) Patent No.: US 11,968,850 B2
(45) Date of Patent: Apr. 23, 2024

(54) LIGHT-EMITTING ELEMENT HAVING AN ORGANIC COMPOUND AND A TRANSITION METAL

(71) Applicant: Semiconductor Energy Laboratory Co., Ltd., Kanagawa-ken (JP)

(72) Inventors: Nobuharu Ohsawa, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 18/110,999

(22) Filed: Feb. 17, 2023

(65) Prior Publication Data

US 2023/0209851 A1 Jun. 29, 2023

Related U.S. Application Data

(63) Continuation of application No. 17/398,530, filed on Aug. 10, 2021, now Pat. No. 11,588,125, which is a
(Continued)

(30) Foreign Application Priority Data

| Apr. 7, 2017 | (JP) | 2017-077059 |
| Apr. 7, 2017 | (JP) | 2017-077061 |
| Jun. 9, 2017 | (JP) | 2017-114262 |

(51) Int. Cl.
*H10K 50/11* (2023.01)
*H10K 59/38* (2023.01)
(Continued)

(52) U.S. Cl.
CPC ............ *H10K 50/11* (2023.02); *H10K 59/38* (2023.02); *H10K 59/40* (2023.02); *H10K 85/656* (2023.02); *H10K 2101/40* (2023.02)

(58) Field of Classification Search
CPC ........ H10K 50/11; H10K 59/38; H10K 59/40; H10K 85/656; H10K 2101/40
(Continued)

(56) References Cited

U.S. PATENT DOCUMENTS

| 5,834,894 A | 11/1998 | Shirasaki et al. |
| 6,841,932 B2 | 1/2005 | Aziz et al. |

(Continued)

FOREIGN PATENT DOCUMENTS

| CN | 001578558 A | 2/2005 |
| CN | 001703937 A | 11/2005 |

(Continued)

OTHER PUBLICATIONS

International Search Report (Application No. PCT/IB2018/052274) dated Jul. 24, 2018.
(Continued)

*Primary Examiner* — Hoai V Pham
(74) *Attorney, Agent, or Firm* — Husch Blackwell LLP

(57) ABSTRACT

A reliable light-emitting element with low driving voltage is provided. The light-emitting element includes an electron-injection layer between a cathode and a light-emitting layer. The electron-injection layer is a mixed film of a transition metal and an organic compound having an unshared electron pair. An atom of the transition metal and the organic compound form SOMO.

20 Claims, 75 Drawing Sheets

Related U.S. Application Data continuation of application No. 16/499,597, filed as application No. PCT/IB2018/052274 on Apr. 3, 2018, now Pat. No. 11,094,903.

(51) Int. Cl.
   *H10K 59/40* (2023.01)
   *H10K 85/60* (2023.01)
   *H10K 101/40* (2023.01)

(58) Field of Classification Search
   USPC .......................................................... 257/40
   See application file for complete search history.

(56) References Cited

U.S. PATENT DOCUMENTS

| | | |
|---|---|---|
| 6,914,269 B2 | 7/2005 | Nakamura |
| 7,022,421 B2 | 4/2006 | Thompson et al. |
| 7,078,113 B2 | 7/2006 | Thompson et al. |
| 7,189,996 B2 | 3/2007 | Nakamura |
| 7,261,954 B2 | 8/2007 | Thompson et al. |
| 7,288,331 B2 | 10/2007 | Thompson et al. |
| 7,288,887 B2 | 10/2007 | Aziz et al. |
| 7,514,159 B2 | 4/2009 | Nakamura |
| 7,659,556 B2 | 2/2010 | Nakamura |
| 7,728,517 B2 | 6/2010 | Aziz et al. |
| 7,973,467 B2 | 7/2011 | Song et al. |
| 7,985,974 B2 | 7/2011 | Nowatari et al. |
| 7,986,090 B2 | 7/2011 | Pfeiffer et al. |
| 8,207,540 B2 | 6/2012 | Nowatari et al. |
| 8,399,108 B2 * | 3/2013 | Yu .......................... C09K 11/06 257/E51.026 |
| 8,431,940 B2 | 4/2013 | Nowatari et al. |
| 8,581,266 B2 | 11/2013 | Nowatari et al. |
| 8,623,524 B2 | 1/2014 | Arakane et al. |
| 8,952,394 B2 | 2/2015 | Nowatari et al. |
| 9,515,278 B2 | 12/2016 | Suzuki et al. |
| 9,647,228 B2 | 5/2017 | Seo et al. |
| 9,663,711 B2 | 5/2017 | Takeda et al. |
| 9,780,338 B2 | 10/2017 | Suzuki et al. |
| 9,876,056 B2 | 1/2018 | Seo et al. |
| 9,966,574 B2 | 5/2018 | Suzuki et al. |
| 10,388,891 B2 | 8/2019 | Yamaguchi et al. |
| 10,439,156 B2 | 10/2019 | Shitagaki et al. |
| 10,854,682 B2 | 12/2020 | Seo et al. |
| 11,008,510 B2 | 5/2021 | Takeda et al. |
| 2002/0055015 A1 | 5/2002 | Sato et al. |
| 2005/0098207 A1 | 5/2005 | Matsumoto et al. |
| 2005/0244673 A1 | 11/2005 | Satoh et al. |
| 2006/0257684 A1 | 11/2006 | Arakane et al. |
| 2006/0263029 A1 | 11/2006 | Aziz et al. |
| 2009/0121620 A1 | 5/2009 | Satoh et al. |
| 2010/0219397 A1 | 9/2010 | Watanabe et al. |
| 2010/0225229 A1 | 9/2010 | Hosoda et al. |
| 2011/0048538 A1 | 3/2011 | Huang et al. |
| 2013/0228766 A1 | 9/2013 | Nowatari et al. |
| 2017/0033286 A1 | 2/2017 | Kugler et al. |
| 2020/0035940 A1 | 1/2020 | Shitagaki et al. |
| 2020/0321540 A1 | 10/2020 | Yoshizaki et al. |
| 2021/0104580 A1 | 4/2021 | Seo et al. |
| 2021/0277305 A1 | 9/2021 | Takeda et al. |

FOREIGN PATENT DOCUMENTS

| | | |
|---|---|---|
| CN | 001866574 A | 11/2006 |
| CN | 101253185 A | 8/2008 |
| CN | 101272645 A | 9/2008 |
| CN | 101752512 A | 6/2010 |
| CN | 105226193 A | 1/2016 |
| CN | 107464885 A | 12/2017 |
| EP | 1 486 551 A1 | 12/2004 |
| EP | 1 487 029 A2 | 12/2004 |
| EP | 1 550 707 A1 | 7/2005 |
| EP | 1 551 206 A1 | 7/2005 |
| EP | 2 061 104 A1 | 5/2009 |
| EP | 2 192 633 A2 | 6/2010 |
| EP | 2 256 838 A1 | 12/2010 |
| EP | 2 259 360 A2 | 12/2010 |
| EP | 2 261 301 A1 | 12/2010 |
| EP | 2 264 122 A2 | 12/2010 |
| JP | 09-312196 A | 12/1997 |
| JP | 2001-102175 A | 4/2001 |
| JP | 2002-100478 A | 4/2002 |
| JP | 2002-100482 A | 4/2002 |
| JP | 2005-026220 A | 1/2005 |
| JP | 2005-026221 A | 1/2005 |
| JP | 2005-502166 | 1/2005 |
| JP | 2005-522852 | 7/2005 |
| JP | 2006-032683 A | 2/2006 |
| JP | 2006-332048 A | 12/2006 |
| JP | 2011-009688 A | 1/2011 |
| JP | 2012-089513 A | 5/2012 |
| JP | 2013-012467 A | 1/2013 |
| JP | 2014-078525 A | 5/2014 |
| JP | 2014-241408 A | 12/2014 |
| JP | 2015-130319 A | 7/2015 |
| JP | 2015-173137 A | 10/2015 |
| JP | 2016-193889 A | 11/2016 |
| JP | 2017-010918 A | 1/2017 |
| JP | 2017-041648 A | 2/2017 |
| KR | 2004-0107399 A | 12/2004 |
| KR | 2006-0120505 A | 11/2006 |
| KR | 2009-0050369 A | 5/2009 |
| TW | 201308709 | 2/2013 |
| TW | 201508970 | 3/2015 |
| WO | WO 2003/022007 A1 | 3/2003 |
| WO | WO 2003/022008 A1 | 3/2003 |
| WO | WO 2003/088718 A1 | 10/2003 |
| WO | WO 2013/027846 A1 | 2/2013 |
| WO | WO 2016/020801 A1 | 2/2016 |

OTHER PUBLICATIONS

Written Opinion (Application No. PCT/IB2018/052274) dated Jul. 24, 2018.

Yan.F et al., "A plasmonically enhanced charge generation layer for tandem organic light emitting device", Appl. Phys. Lett. (Applied Physics Letters), Jan. 30, 2013, vol. 102, pp. 043303-1-043303-4.

Liu.W et al., "Efficient inverted organic light-emitting devices with self or intentionally Ag-doped interlayer modified cathode", Appl. Phys. Lett. (Applied Physics Letters), Mar. 6, 2014, vol. 104, pp. 0933051-093305-4.

Khadir.S et al., "Localized surface plasmon enhanced emission of organic light emitting diode coupled to DBR-cathode microcavity by using silver nanoclusters", Optics Express, Aug. 31, 2015, vol. 23, No. 18, pp. 23647-23659.

Chinese Office Action (Application No. 201880022351.9) dated Nov. 3, 2021.

Taiwanese Office Action (Application No. 107111968) dated Dec. 29, 2021.

Chinese Office Action (Application No. 201880022351.9) dated May 24, 2022.

* cited by examiner

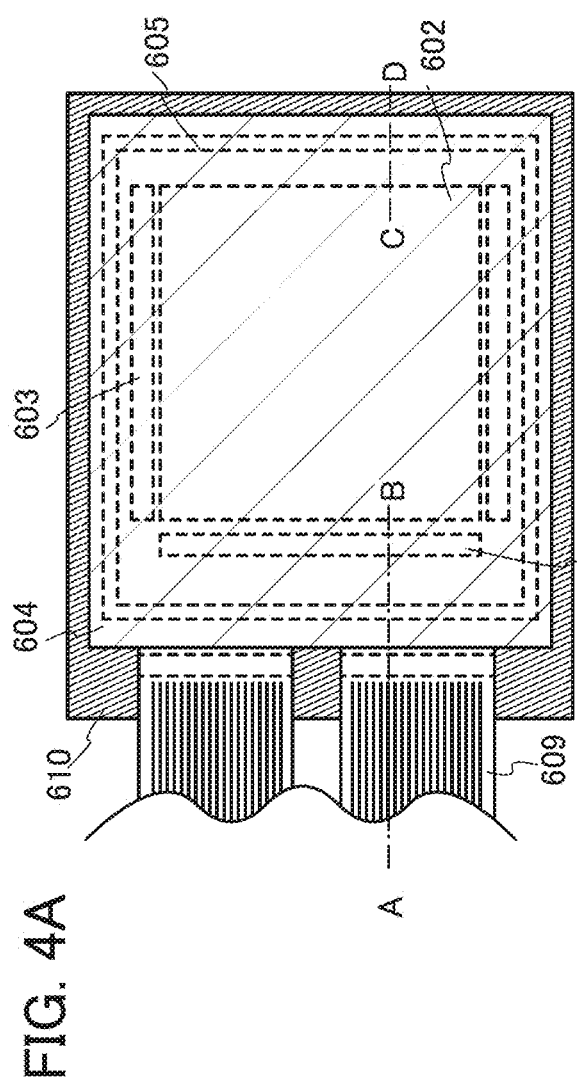
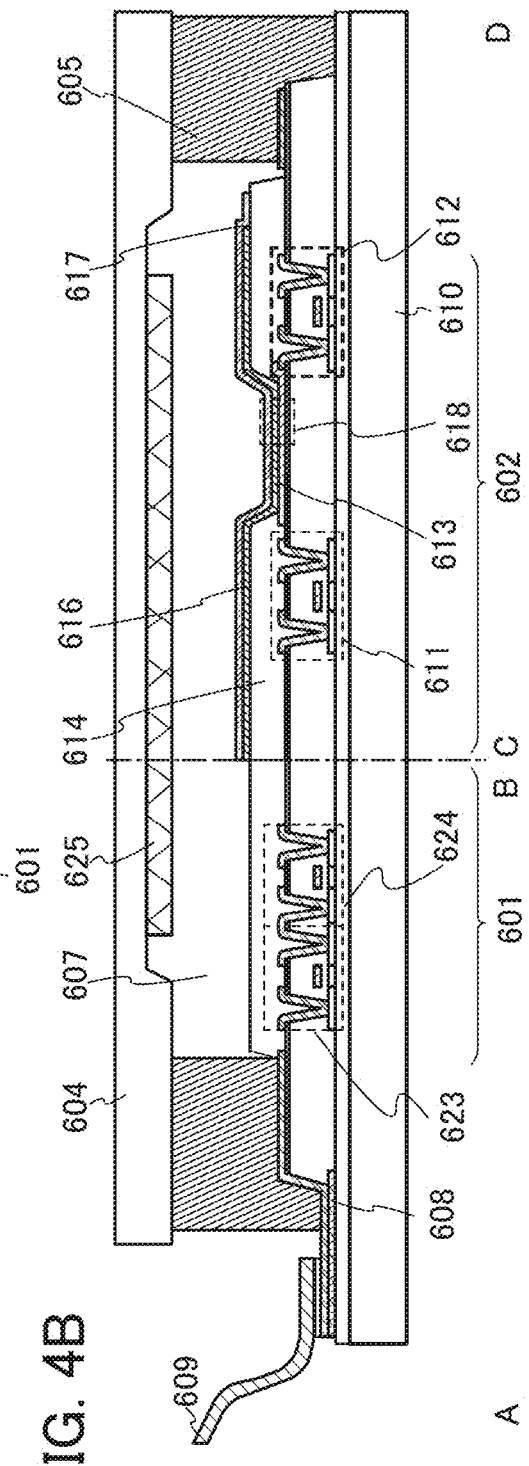
FIG. 4A
FIG. 4B

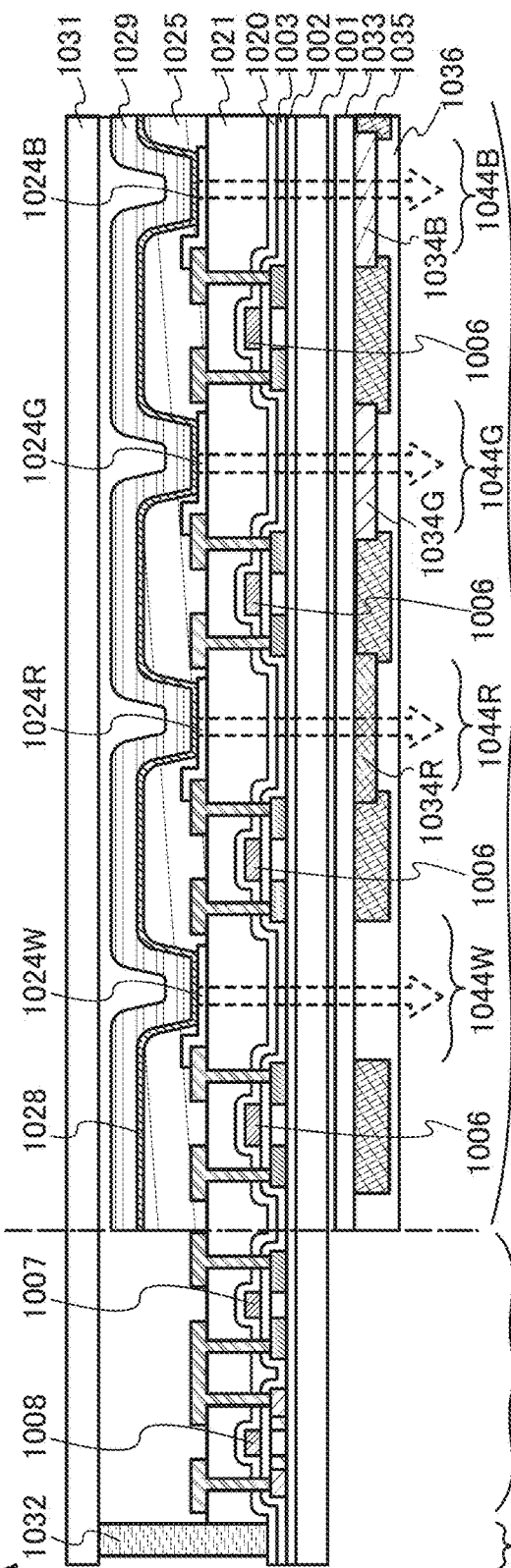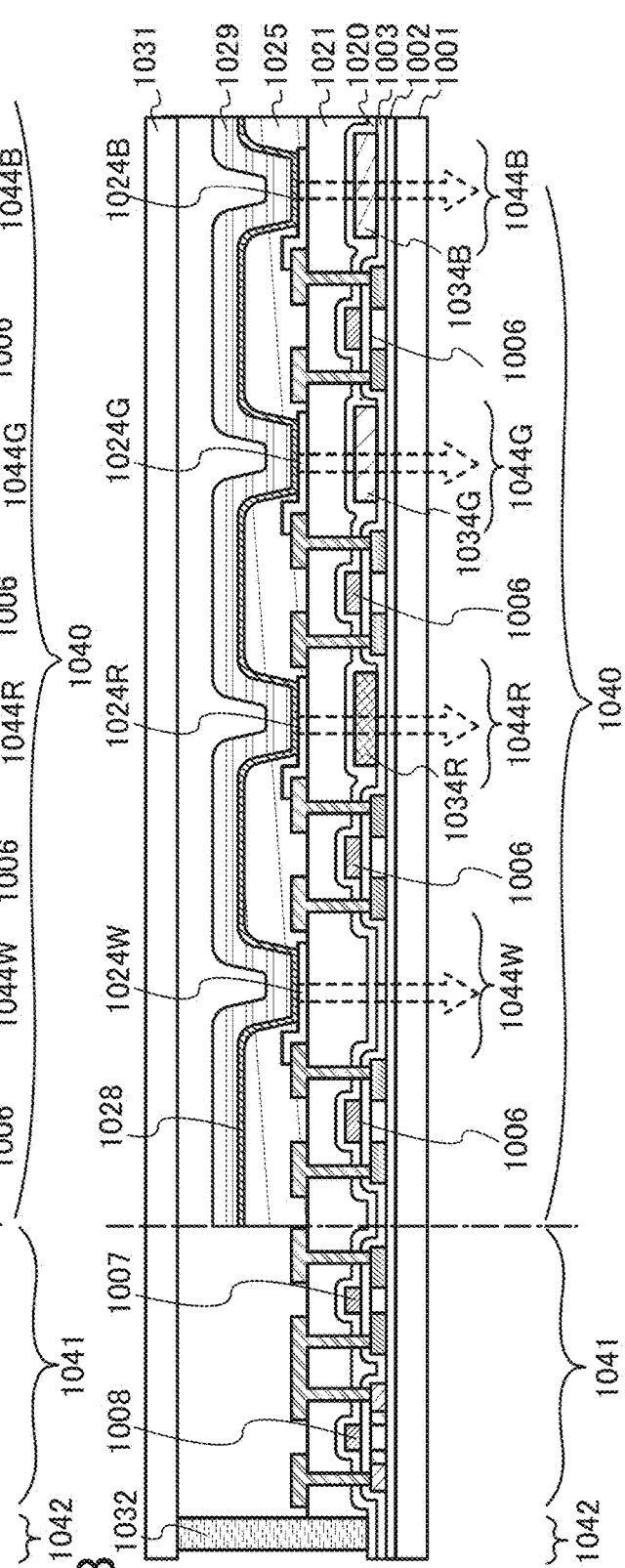

LIGHT-EMITTING ELEMENT HAVING AN ORGANIC COMPOUND AND A TRANSITION METAL

This application is a continuation of U.S. application Ser. No. 17/398,530, filed on Aug. 10, 2021 which is a continuation of U.S. application Ser. No. 16/499,597, filed on Sep. 30, 2019 (now U.S. Pat. No. 11,094,903 issued Aug. 17, 2021) which is a 371 of international application PCT/IB2018/052274 filed on Apr. 3, 2018 which are all incorporated herein by reference.

TECHNICAL FIELD

One embodiment of the present invention relates to a novel light-emitting element including an electron-injection layer. One embodiment of the present invention also relates to a display device, an electronic device, and a lighting device each including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, and a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

BACKGROUND ART

In recent years, research and development have been extensively conducted on light-emitting elements utilizing electroluminescence (EL). In a basic structure of such a light-emitting element, a layer containing a light-emitting substance (an EL layer) is interposed between a pair of electrodes. By application of a voltage between the electrodes of this element, light emission from the light-emitting material can be obtained.

Since the above light-emitting element is a self-luminous type, a display device using this light-emitting element has advantages such as high visibility, no necessity of a backlight, and low power consumption. Furthermore, such a light-emitting element also has advantages in that the element can be formed to be thin and lightweight and has high response speed.

In a general light-emitting element, an electron-injection layer is provided between a cathode and a light-emitting layer to reduce the driving voltage. In the electron-injection layer, a metal having a low work function such as an alkali metal or an alkaline earth metal, typically lithium (Li) or calcium (Ca), or a compound thereof is used to lower a barrier to electron injection between the electron-injection layer and the cathode (e.g., Patent Document 1).

In the case where the above light-emitting element is used for a light-emitting device, there are the following two methods: a method of providing subpixels in a pixel with EL layers having functions of emitting light of different colors (hereinafter referred to as a separate coloring method) and a method of providing subpixels in a pixel with, for example, a common EL layer having a function of emitting white light and color filters having functions of transmitting light of different colors (hereinafter referred to as a color filter method).

One of the advantages of the color filter method is that the EL layer can be shared by all of the subpixels. Therefore, compared with the separate coloring method, loss of a material of the EL layer is small and the number of steps needed for formation of the EL layer can be reduced; thus, light-emitting devices can be manufactured at low cost with high productivity. Further, although it is necessary, in the separate coloring method, to provide a space between the subpixels to prevent mixture of the materials of the EL layers in the subpixels, the color filter method does not need such a space and therefore enables a high-resolution light-emitting device having higher pixel density.

The light-emitting element can emit light of a variety of colors depending on the kind of light-emitting substance included in the EL layer. In the view of application of the light-emitting element to lighting devices, a high efficiency light-emitting element that emits white light or light of color close to white is demanded. In the view of application of the light-emitting element to a light-emitting device utilizing the color filter method, a high efficiency light-emitting element that emits light with high color purity is demanded. In addition, for the light-emitting element used for the lighting device and the light-emitting device, low power consumption is demanded.

Increasing the extraction efficiency of light from a light-emitting device is important for higher emission efficiency of a light-emitting element. In order to increase the extraction efficiency of light from a light-emitting element, a method has been proposed, in which a micro optical resonator (microcavity) structure utilizing a resonant effect of light between a pair of electrodes is used to increase the intensity of light having a specific wavelength (e.g., see Patent Document 2).

As a light-emitting element that emits white light, an element including a charge-generation layer between a plurality of EL layers (a tandem element) has been proposed.

In order to improve element characteristics of such light-emitting elements, improvement of an element structure, development of a material, and the like have been actively carried out.

REFERENCES

Patent Documents

[Patent Document 1] Japanese Published Patent Application No. 2001-102175
[Patent Document 2] Japanese Published Patent Application No. 2015-130319

DISCLOSURE OF INVENTION

A metal having a low work function and a compound of the metal are difficult to handle because of their high reactivity with oxygen or water. When the metal or the compound is used for a light-emitting element, a reduction in the emission efficiency, an increase in the driving voltage, a reduction in the reliability, or the like of the light-emitting element is caused by oxygen or water in some cases. Accordingly, there is a demand for the development of an electron-injection layer that is hardly affected by oxygen and water and forms a low barrier to electron injection between the electron-injection layer and a cathode.

Furthermore, an electron-injection layer that is adjacent to a charge-generation layer of a tandem element needs to have an excellent electron-injection property. Accordingly, an alkali metal such as lithium or cesium or a compound of an alkali metal, or an alkaline earth metal such as calcium or a compound of an alkaline earth metal is used for the electron-injection layer. However, when the metal or the compound is used for the electron-injection layer, the metal is diffused into an electron-transport layer, which causes crosstalk in some cases.

In view of the above-described problems, an object of one embodiment of the present invention is to provide a light-emitting element with low driving voltage. Another object of one embodiment of the present invention is to provide a light-emitting element having high moisture resistance. Another object of one embodiment of the present invention is to provide a light-emitting element having high oxidation resistance. Another object of one embodiment of the present invention is to provide a light-emitting element with low power consumption. Another object of one embodiment of the present invention is to provide a light-emitting element with high reliability. Another object of one embodiment of the present invention is to provide a novel light-emitting element. Another object of one embodiment of the present invention is to provide a novel semiconductor device. Another object of one embodiment of the present invention is to provide a light-emitting element in which crosstalk is unlikely to occur. Another object of one embodiment of the present invention is to provide a light-emitting element that emits light with high color purity.

Another object of one embodiment of the present invention is to provide an electronic device and a lighting device each having high moisture resistance and including the light-emitting element. Another object of one embodiment of the present invention is to provide a light-emitting device with low power consumption in which the light-emitting element is used. Another object of one embodiment of the present invention is to provide a light-emitting device having a long lifetime in which the light-emitting element is used.

Note that the description of the above object does not disturb the existence of other objects. In one embodiment of the present invention, there is no need to achieve all the objects. Other objects are apparent from and can be derived from the description of the specification and the like.

One embodiment of the present invention is a light-emitting element including a light-emitting layer between an anode and a cathode and a first layer between the light-emitting layer and the cathode. The first layer includes a transition metal and a first organic compound having an unshared electron pair. The first organic compound and the transition metal form single occupied molecular orbital (SOMO).

Another embodiment of the present invention is a light-emitting element including a first light-emitting unit and a second light-emitting unit between an anode and a cathode and a first layer between the first light-emitting unit and the second light-emitting unit. The first layer includes a first organic compound and a transition metal. The first organic compound has an unshared electron pair. The first organic compound and the transition metal form SOMO.

Another embodiment of the present invention is a light-emitting element including a first light-emitting unit and a second light-emitting unit between an anode and a cathode and a first layer and a charge-generation layer between the first light-emitting unit and the second light-emitting unit. The first layer and the charge-generation layer are in contact with each other. The first layer includes a first organic compound and a first transition metal. The first organic compound has an unshared electron pair. The first organic compound and the first transition metal form SOMO.

In any of the above embodiments, it is preferable that the first organic compound include an electron deficient heteroaromatic ring. It is further preferable that the first organic compound include at least one of a pyridine ring, a diazine ring, and a triazine ring.

In any of the above embodiments, it is preferable that the first organic compound have 25 to 100 carbon atoms.

In any of the above embodiments, it is preferable that the first organic compound not include a 1,10-phenanthroline skeleton.

In any of the above embodiments, it is preferable that a lowest unoccupied molecular orbital (LUMO) level of the first organic compound is higher than or equal to −3.6 eV and lower than or equal to −2.3 eV In any of the above embodiments, it is preferable that a transition metal be a metal belonging to Group 5, Group 7, Group 9, or Group 11 in the periodic table. It is further preferable that the transition metal be a metal belonging to Group 11. It is still further preferable that the transition metal be Ag.

In any of the above embodiments, it is preferable that a second layer be included between the cathode and the first layer and the second layer include a second organic compound having an electron deficient heteroaromatic ring.

In any of the above embodiments, it is preferable that a LUMO level of the second organic compound be lower than a SOMO level.

In any of the above embodiments, it is preferable that an alkali metal and an alkaline earth metal not be included in the light-emitting element.

In any of the above embodiments, it is preferable that a molar ratio of the metal to the first organic compound in the first layer be higher than or equal to 0.2 and lower than or equal to 0.8.

In any of the above embodiments, it is preferable that the cathode include a metal which is the same as the metal included in the first layer. Furthermore, it is preferable that the light-emitting layer include the first organic compound.

Another embodiment of the present invention is an electronic device including the display device having any of the above structures and at least one of a housing and a touch sensor. Another embodiment of the present invention is a lighting device including the light-emitting element having any of the above structures and at least one of a housing and a touch sensor. The category of one embodiment of the present invention includes not only the light-emitting device including the light-emitting element but also an electric device including the light-emitting device. That is, the light-emitting device in this specification refers to an image display device or a light source (including a lighting device). A display module in which a connector such as a flexible printed circuit (FPC) or a tape carrier package (TCP) is connected to a light-emitting element, a display module in which a printed wiring board is provided on the tip of a TCP, and a display module in which an integrated circuit (IC) is directly mounted on a light-emitting element by a chip on glass (COG) method are also embodiments of the present invention.

One embodiment of the present invention can provide a light-emitting element with low driving voltage. One embodiment of the present invention can provide a light-emitting element with high moisture resistance. One embodiment of the present invention can provide a light-emitting element with high oxidation resistance. One embodiment of the present invention can provide a light-emitting element with low power consumption. One embodiment of the present invention can provide a light-emitting element with high reliability. One embodiment of the present invention can provide a novel light-emitting element. One embodiment of the present invention can provide a novel semiconductor device. One embodiment of the present invention can provide a light-emitting element in which crosstalk is unlikely to occur. One embodiment of the present invention can provide a light-emitting element that emits light with high color purity.

One embodiment of the present invention can provide an electronic device and a lighting device each having high moisture resistance and including the light-emitting element. One embodiment of the present invention can provide a light-emitting device with low power consumption in which the light-emitting element is used. One embodiment of the present invention can provide a light-emitting device having a long lifetime in which the light-emitting element is used.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 4A and 4B are a top view and a schematic cross-sectional view illustrating a display device of one embodiment of the present invention.

FIGS. 5A and 5B are schematic cross-sectional views each illustrating a display device of one embodiment of the present invention.

BEST MODE FOR CARRYING OUT THE INVENTION

Figure 1A:
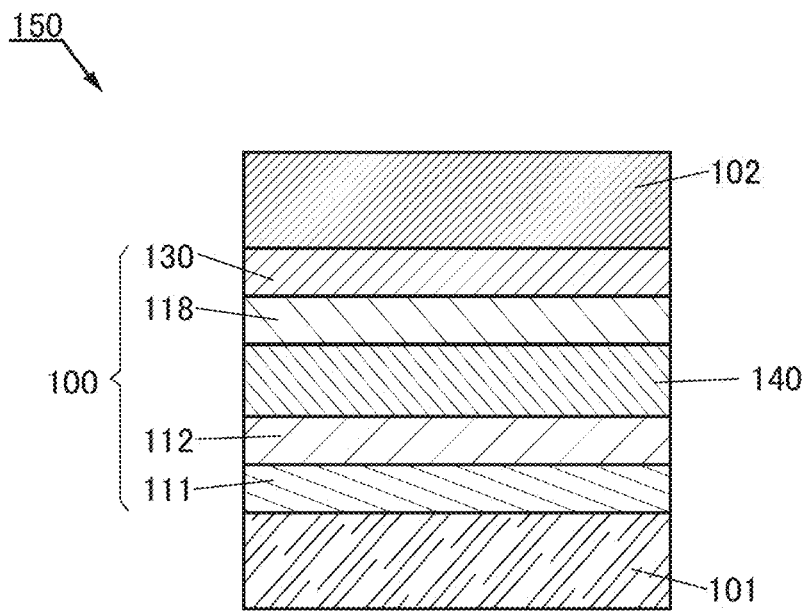
FIGS. 1A to 1C are schematic cross-sectional views illustrating a light-emitting element of one embodiment of the present invention and a diagram illustrating the correlation of energy levels in an electron-injection layer.

Embodiments of the present invention will be described below with reference to the drawings. However, the present invention is not limited to the following description, and the mode and details can be variously changed unless departing from the scope and spirit of the present invention. Accordingly, the present invention should not be interpreted as being limited to the content of the embodiments below.

Note that the position, the size, the range, or the like of each structure illustrated in the drawings and the like are not accurately represented in some cases for easy understanding. Therefore, the disclosed invention is not necessarily limited to the position, the size, the range, or the like disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In describing structures of the invention with reference to the drawings in this specification and the like, common reference numerals are used for the same portions in different drawings.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, a light-emitting element of one embodiment of the present invention will be described below with reference to FIGS. 1A to 1C.

<Structure Example 1 of Light-Emitting Element>

FIG. 1A is a schematic cross-sectional view of a light-emitting element 150 of one embodiment of the present invention.

The light-emitting element 150 includes a pair of electrodes (an electrode 101 and an electrode 102) and an EL layer 100 between the pair of electrodes. The EL layer 100 includes at least a light-emitting layer 140 and an electron-injection layer 130.

The EL layer 100 shown in FIG. 1A includes functional layers such as a hole-injection layer 111, a hole-transport layer 112, and an electron-transport layer 118, in addition to the light-emitting layer 140 and the electron-injection layer 130.

In this embodiment, although description is given assuming that the electrode 101 and the electrode 102 of the pair of electrodes serve as an anode and a cathode, respectively, the structure of the light-emitting element 150 is not limited thereto. That is, the electrode 101 may be a cathode, the electrode 102 may be an anode, and the stacking order of the layers between the electrodes may be reversed. In other words, the hole-injection layer 111, the hole-transport layer 112, the light-emitting layer 140, the electron-transport layer 118, and the electron-injection layer 130 may be stacked in this order from the anode side.

Note that the structure of the EL layer 100 is not limited to the structure shown in FIG. 1A, and the EL layer 100 includes at least the light-emitting layer 140 and the electron-injection layer 130 and does not necessarily include the hole-injection layer 111, the hole-transport layer 112, and the electron-transport layer 118.

These layers may be formed in the EL layer between the pair of electrodes, depending on their functions, and are not limited to the above layers. In other words, the EL layer between the pair of electrodes may include a layer which has a function of lowering a barrier to hole or electron injection, enhancing a hole- or electron-transport property, inhibiting a hole- or electron-transport property, suppressing a quenching phenomenon due to an electrode, or the like.

The light-emitting layer 140 preferably includes a host material and a guest material (a light-emitting material).

As the host material, it is preferable to use one or both of a material having a function of transporting holes (hole-transport property) and a material having a function of transporting electrons (electron-transport property). Alternatively, it is preferable to use a material having a hole-transport property and an electron-transport property.

In the case where the host material is a combination of an electron-transport material and a hole-transport material, the carrier balance can be easily controlled by adjusting the mixture ratio. Specifically, the weight ratio of the electron-transport material to the hole-transport material is preferably within a range of 1:9 to 9:1. Since the carrier balance can be easily controlled with the structure, a carrier recombination region can also be controlled easily.

The guest material may be a light-emitting compound, and the light-emitting compound is preferably a substance capable of emitting fluorescence (hereinafter also referred to as a fluorescent compound) or a substance capable of emitting phosphorescence (hereinafter also referred to as a phosphorescent compound).

In order to reduce the driving voltage of the light-emitting element, it is necessary to lower a barrier to electron injection between the light-emitting layer 140 and the electrode 102. Hence, it is preferable to provide the electron-injection layer 130 between the light-emitting layer 140 and the electrode 102. In a conventional light-emitting element, the electron-injection layer 130 is formed using a metal material including an alkali metal or an alkaline earth metal, which has a low work function. However, a metal material having a low work function has high reactivity with oxygen or water; accordingly, when such a metal material is used for a light-emitting element, a reduction in emission efficiency, an increase in driving voltage, a reduction in element lifetime, generation of shrinkage (a non-emission region at the end of a light-emitting portion), or the like occurs in the light-emitting element, leading to deterioration in the characteristics or a reduction in the reliability of the light-emitting element in some cases. In other words, a metal material having a low work function can cause element degradation. Thus, a light-emitting element without an alkali metal or an alkaline earth metal is preferable in terms of suppressing deterioration in the characteristics or a reduction in the reliability of the light-emitting element.

Meanwhile, when a metal having a high work function is used for the electron-injection layer 130, a barrier to electron injection is formed between the electron-injection layer 130 and the electrode 102 though such a metal has low reactivity with oxygen and water. In this case, an increase in driving voltage or a reduction in emission efficiency occurs in the light-emitting element.

The present inventors have found that a barrier to electron injection between the electron-injection layer and the cathode can be lowered and the moisture resistance of the light-emitting element can be increased by forming SOMO by interaction between a compound having an unshared electron pair and a transition metal and using a composite material of the compound and the transition metal that form the SOMO in combination for the electron-injection layer.

In order to form SOMO by interaction between a compound having an unshared electron pair and a transition metal, the sum of the number of electrons of the compound and the transition metal is preferably an odd number. Accordingly, in the case where the number of electrons of the compound is an even number, the transition metal is preferably a metal belonging to an odd-numbered group in the periodic table. In the case where the number of electrons of the compound is an odd number, the transition metal is preferably a metal belonging to an even-numbered group in the periodic table.

As the compound having an unshared electron pair, an organic compound having a function of transporting an electron is preferably used. Furthermore, an organic compound that functions as an electron acceptor with respect to the transition metal is preferably used.

Thus, the light-emitting element of one embodiment of the present invention is a light-emitting element in which a composite material of a transition metal and an organic compound having an unshared electron pair is used for an electron-injection layer.

A transition metal has low reactivity with water and oxygen; accordingly, in a light-emitting element including a transition metal, element degradation due to water and oxygen, which might occur in the case of using a metal having a low work function, hardly occurs. Hence, according to one embodiment of the present invention, a light-emitting element having high moisture resistance and high oxidation resistance can be provided.

Figure 1B:
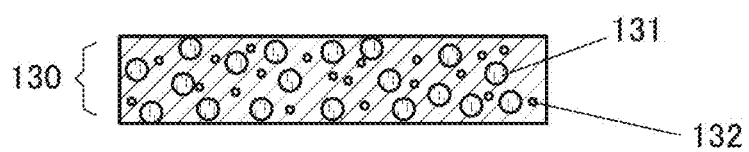

FIG. 1B is a schematic view of the electron-injection layer 130 in the light-emitting element of one embodiment of the present invention. The electron-injection layer 130 includes a compound 131 having an unshared electron pair and a transition metal 132.

Figure 1C:
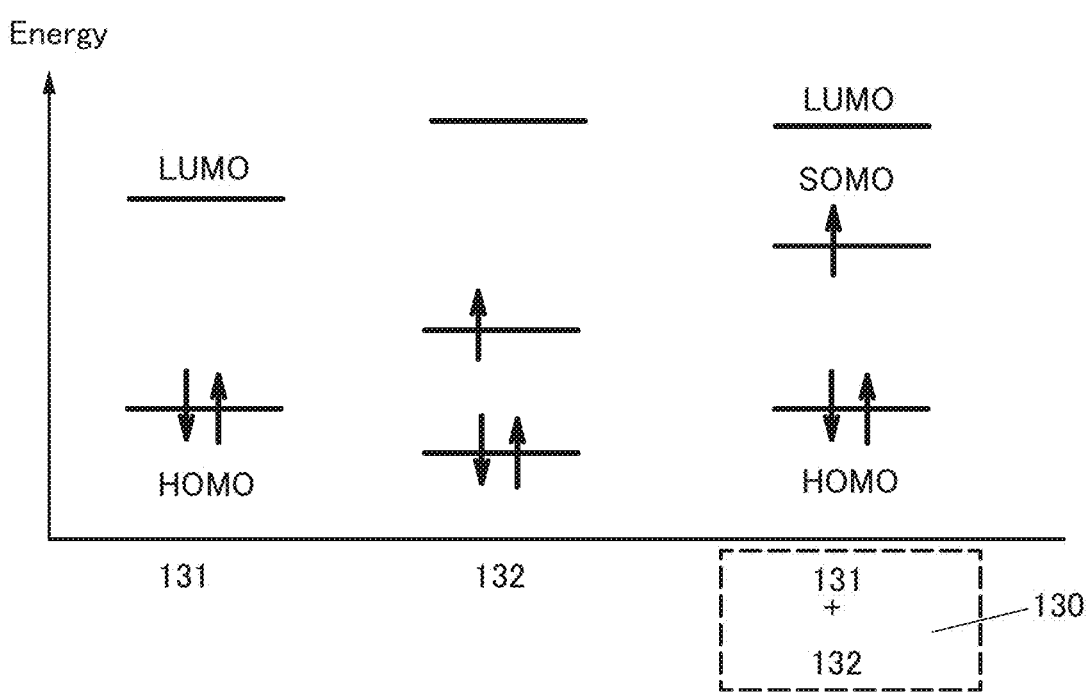

FIG. 1C is a diagram showing energy in the electron-injection layer 130 of the light-emitting element of one embodiment of the present invention. When the transition metal 132 and the compound 131 are mixed, the compound 131 interacts with an atom of the transition metal 132, whereby SOMO is formed. At this time, it is preferable that a highest occupied molecular orbital (HOMO) level formed by interaction between the compound 131 and the atom of the transition metal 132 be approximately equal to the HOMO level of the original compound 131. In the case where an organic compound having a function of transporting an electron is used for the compound 131, the HOMO level of the compound 131 is low, and a hole is not easily injected to the compound 131. Therefore, in the case where the HOMO level formed by the interaction between the compound 131 and the atom of the transition metal 132 is approximately equal to the HOMO level of the original compound 131, a barrier to hole injection between the electron-injection layer 130 and the electrode 102 is high; accordingly, a hole does not easily pass through from the electron-injection layer 130 to the electrode 102, resulting in improvement in the carrier balance in the light-emitting element. Note that HOMO in this specification and the like refers to a molecular orbital having the highest energy of orbitals occupied by electrons.

SOMO is an orbital having only one electron. When a voltage is applied to the light-emitting element 150, the electron in the SOMO serves as a carrier in the light-emitting element and is transported to the electron-transport layer 118 and the light-emitting layer 140. Furthermore, electrons can be easily injected from the electrode 102 to the electron-injection layer 130. That is, when the electron-injection layer 130 includes materials which form SOMO in combination, electrons can be easily injected from the electrode 102 to the EL layer 100. The SOMO level is preferably lower than the LUMO level of the compound 131. Accordingly, the LUMO level of the compound 131 is preferably high. Specifically, the LUMO level of the compound 131 is preferably higher than or equal to −3.6 eV and lower than or equal to −2.3 eV When an organic compound having such a LUMO level and a transition metal are mixed, a SOMO level suitable for electron injection is formed by the interaction, whereby a barrier to electron injection between the electron-injection layer 130 and the electrode 102 can be lowered.

Note that the HOMO level and the LUMO level of an organic material are generally estimated by cyclic voltammetry (CV), photoelectron spectroscopy, optical absorption spectroscopy, inverse photoemission spectroscopy, or the like. When values of different compounds are compared with each other, it is preferable that values estimated by the same measurement method be used.

The above-described transition metal preferably belongs to Group 5, Group 7, Group 9, or Group 11. Among transition metals belonging to the odd-numbered groups, a metal having one electron (an unpaired electron) in the orbital of the outermost shell is particularly preferable because of its property of easily forming SOMO by combination with the compound 131.

<Estimation of SOMO Level Formed by Interaction Between Transition Metal 132 and Compound 131 by Quantum Chemistry Calculations>

The interaction between the compound 131 and the transition metal 132 is needed for formation of SOMO. Accordingly, the stabilization energy when an organic compound interacts with various transition metal atoms and the SOMO levels formed by interaction between the organic compound and the transition metal atoms are estimated by quantum chemistry calculations. The results are shown in Table 1. Note that as an organic compound having an unshared electron pair, 2,9-bis(naphthalen-2-yl)-4,7-diphenyl-1,10-phenanthroline (abbreviation:NBPhen) shown below is used.

[Chemical formula 1]

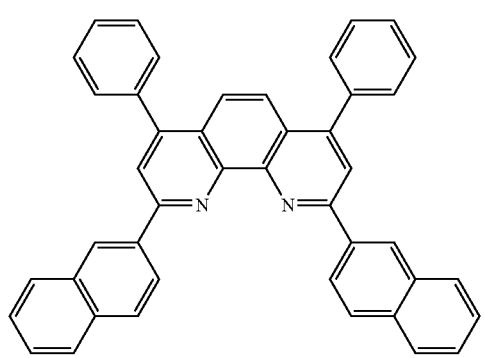

NBPhen

TABLE 1

|  | Stabilization energy (eV) | HOMO (eV) | SOMO (eV) | LUMO (eV) |
|---|---|---|---|---|
| NBPhen | — | −5.74 | — | −2.04 |
| NBPhen + Cu | −2.28 | −5.04 | −3.04 | −1.99 |
| NBPhen + Ag | −0.23 | −5.85 | −3.26 | −2.07 |
| NBPhen +Au | −0.23 | −5.85 | −4.41 | −2.67 |
| NBPhen + Co | −2.47 | −5.25 | −3.10 | −2.09 |
| NBPhen + Mn | −2.70 | −5.43 | −3.31 | −1.98 |
| NBPhen + Li | −2.31 | −5.50 | −2.96 | −1.91 |

As the quantum chemistry computational program, Gaussian 09 is used. A high performance computer (ICE X, manufactured by SGI Japan, Ltd.) is used for the calculations. First, the most stable structures in the ground state of the organic compound alone, the ground state of each transition metal alone, and the ground state of a composite material of the organic compound and each transition metal are calculated by density functional theory (DFT). As basis functions, 6-311G(d,p) and LanL2DZ are used, and as a functional, B3LYP is used. Next, the stabilization energy is calculated by subtracting the sum of the total energy of the organic compound alone and the total energy of the transition metal alone from the total energy of the composite material of the organic compound and the transition metal. That is, (stabilization energy)=(the total energy of the composite material of the organic compound and the transition metal)−(the total energy of the organic compound alone)−(the total energy of the transition metal alone) is satisfied. In the DFT, the total energy is represented as the sum of potential energy, electrostatic energy between electrons, electronic kinetic energy, and exchange-correlation energy including all the complicated interactions between electrons. Also in the DFT, exchange-correlation interaction is approximated by a functional (a function of another function) of one electron potential represented in terms of electron density to enable high-accuracy calculations.

As shown in Table 1, the stabilization energy is a negative value in the case where manganese (Mn), which is a transition metal belonging to Group 7, cobalt (Co), which is a transition metal belonging to Group 9, and copper (Cu), silver (Ag), and gold (Au), which are transition metals belonging to Group 11, are used as the transition metals of the composite materials. This indicates that, in the case where an organic compound having an unshared electron pair (here, NBPhen) and a transition metal are mixed, the state that the organic compound interacts with an atom of the transition metal is more stable than the state that the organic compound does not interact with an atom of the transition metal. That is, Table 1 shows that, when the transition metal and the organic compound having an unshared electron pair are mixed, the organic compound interacts with the transition metal, and the composite material of the organic compound and the transition metal becomes stable. Note that the values of the energy levels of HOMO and LUMO in Table 1 and Table 2 are calculated values, and the values are different from measured values in some cases.

SOMO is formed by the interaction between the organic compound and the transition metal. The SOMO is an orbital originating from an unpaired electron of metal and is distributed also on the orbital of the organic compound. Accordingly, it is shown that the electron orbital of a transition metal and the electron orbital of the organic compound interact with each other. Table 1 shows the SOMO levels. In the case where the composite material of the compound 131 and the transition metal 132 is used for the electron-injection layer 130, a higher SOMO level is preferable in terms of electron injection. Thus, Cu, Ag, Co, and Mn each having a SOMO level approximately equivalent to that of Li widely used as a material for an electron-injection layer are particularly suitable for the transition metal 132, which interacts with the compound 131, in one embodiment of the present invention.

By formation of SOMO through interaction between the compound 131 and the transition metal 132, an unpaired electron is formed in the electron-injection layer 130. Thus, formation of SOMO can be observed by electron spin resonance (ESR). In order to inject electrons from the electrode 102 to the light-emitting layer 140 favorably, the spin density originating from SOMO is preferably higher than or equal to $1 \times 10^{16}$ spins/cm$^3$, further preferably higher than or equal to $5 \times 10^{16}$ spins/cm$^3$, still further preferably higher than or equal to $1 \times 10^{17}$ spins/cm$^3$.

Meanwhile, in a manufacturing process of a light-emitting element, an EL layer of a light-emitting element, particularly an electron-injection layer, and a cathode are generally formed by a vacuum evaporation method. In those cases, it is preferable to use a material which can be easily deposited by vacuum evaporation, i.e., a material with a low melting point. The melting point of an element belonging to Group 11 is lower than the melting point of an element belonging to Group 7 or Group 9; accordingly, an element belonging to Group 11 can be suitably used for deposition by vacuum evaporation. Among elements belonging to Group 11, Ag has an especially low melting point and is preferable. Furthermore, a vacuum evaporation method is preferably used because it allows easy mixing of a transition metal atom and an organic compound.

Ag or Cu can be used also as a cathode material. Using the same material for the electron-injection layer 130 and the electrode 102 is preferable because the light-emitting element can be manufactured easily. Furthermore, with the use of the same material for the electron-injection layer 130 and the electrode 102, the adhesion between the electron-injection layer 130 and the electrode 102 can be increased, whereby the reliability of the light-emitting element can be increased. Moreover, the manufacturing cost of the light-emitting element can be reduced.

Next, the stabilization energy and the SOMO levels when Ag is used as the transition metal 132 and various organic compounds having unshared electron pairs are used as the compounds 131 and interaction occurs between the compounds 131 and Ag atoms are estimated by quantum chemistry calculations. The results are shown in Table 2. The organic compounds used for the estimation and abbreviations thereof are shown below. Note that a calculation method of the quantum chemistry calculations is similar to a calculation method used to calculate the values shown in Table 1.

[Chemical Formula 2]

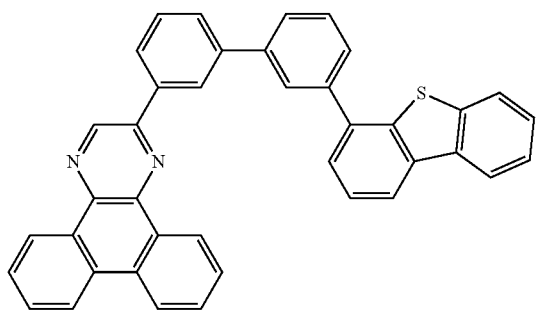

2mDBTBPDBq-II

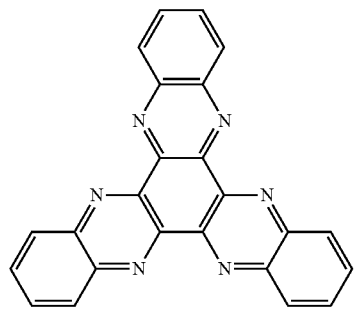

HATNA

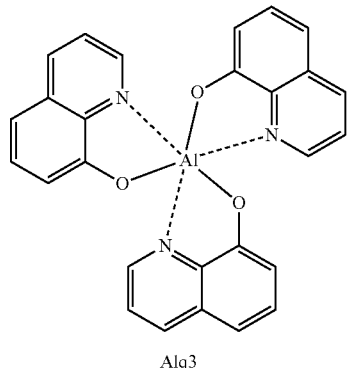

Alq3

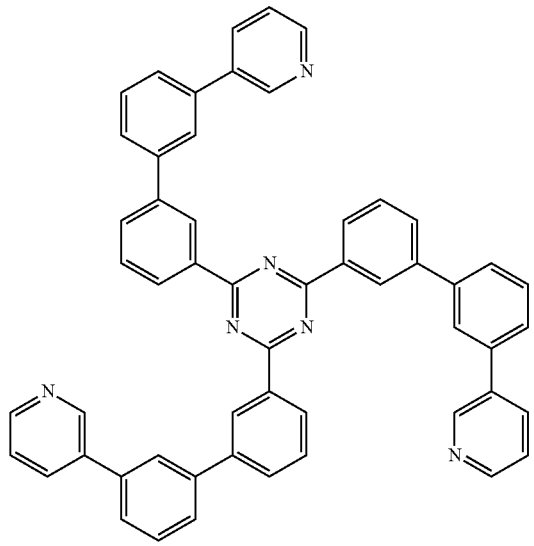

TmPPPyTz

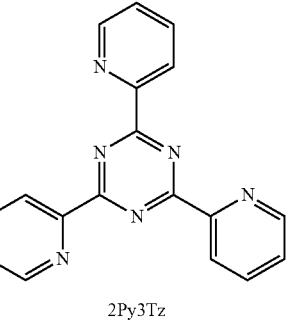

2Py3Tz

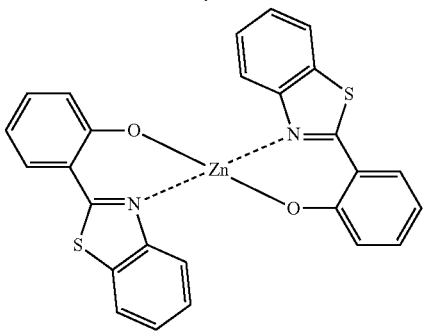

Zn(BTZ)$_2$

TABLE 2

| | Stabilization energy (eV) | HOMO (eV) | SOMO (eV) | LUMO (eV) |
|---|---|---|---|---|
| 2mDBTBPDBq-II | — | −5.96 | — | −2.10 |
| 2mDBTBPDBq-II + Ag | −0.08 | −5.98 | −4.37 | −2.71 |
| Alq3 | — | −5.25 | — | −2.01 |
| Alq3 + Ag | −0.16 | −5.42 | −3.78 | −2.20 |
| HATNA | — | −6.65 | — | −2.90 |
| HATNA + Ag | −0.59 | −6.30 | −4.05 | −3.01 |
| 2Py3Tzn | — | −6.89 | — | −2.20 |
| 2Py3Tzn + Ag | −0.28 | −6.78 | −3.63 | −2.45 |
| TmPPPyTz | — | −6.52 | — | −2.26 |
| TmPPPyTz + Ag | −0.04 | −6.55 | −4.51 | −2.89 |
| Zn(BTZ)$_2$ | — | −5.60 | — | −2.00 |
| Zn(BTZ)$_2$ + Ag | −0.14 | −5.68 | −4.09 | −2.33 |

In Table 2, the stabilization energy has negative values in the case where the various organic compounds having unshared electron pairs are mixed with transition metals (here, Ag), which shows that a composite material of the organic compound having an unshared electron pair and a transition metal is stabilized by interaction.

In the case where the compound 131 interacts with an atom of the transition metal 132, it is preferable that the atom of the transition metal 132 and the compound 131 serve as an electron donor and an electron acceptor, respectively. In that case, the compound 131 preferably has an electron deficient heteroaromatic ring. The compound 131 having such a structure receives electrons easily, whereby the stabilization energy when the compound 131 and the atom of the transition metal 132 interact with each other can be lowered. A compound having an electron deficient heteroaromatic ring has a favorable electron-transport property; accordingly, such a compound is preferably used as the compound 131 of the electron-injection layer in terms of reducing the driving voltage of the light-emitting element.

Preferably, the electron deficient heteroaromatic ring is a nitrogen-containing heteroaromatic ring; further preferably, the nitrogen-containing heteroaromatic ring has at least one of a pyridine ring, a diazine ring (a pyrimidine ring, a pyrazine ring, or a pyridazine ring), and a triazine ring. Light-emitting elements including these rings can have high reliability because these rings have high electrochemical stability. Moreover, the driving voltage of the light-emitting elements can be reduced because these rings have high electron-transport properties. Note that a compound having the electron deficient heteroaromatic ring may be a metal complex.

In the case where an organic compound is used as the compound 131, the organic compound preferably has 25 to 100 carbon atoms. When an organic compound has such number of carbon atoms, the organic compound can have a high sublimation property, and accordingly, the thermal decomposition of the organic compound in vacuum evaporation can be suppressed, whereby favorable material use efficiency can be achieved. Furthermore, the glass transition point (Tg) is preferably 100° C. or higher. When an organic compound with such Tg is used for the EL layer, the light-emitting element can have high heat resistance.

As shown in Table 1 and Table 2, the stabilization energy in the case where NBPhen, diquinoxalino[2,3-α:2',3'-c]phenazine (abbreviation: HATNA), and 2,4,6-tris[3'-(pyridin-3-yl)biphenyl-3-yl]-1,3,5-triazine (abbreviation: TmPPPyTz) interact with Ag atoms is lower than the stabilization energy in the case where the other organic compounds interact with Ag atoms. This is because the heterocyles of the above compounds (NBPhen, HATNA, and TmPPPyTz) each have a conjugate double bond N—C—C—N over the plurality of heterocycles, allowing a chelate ring (a ring structure) to be formed by interaction between the compound 131 and the transition metal 132. Accordingly, in the case where the compound 131 coordinates to an atom of the transition metal 132, a chelate ring is preferably formed because the stabilization energy becomes low.

The molar ratio of the transition metal 132 to the compound 131 is preferably higher than or equal to 0.1 and lower than or equal to 10, further preferably higher than or equal to 0.2 and lower than or equal to 2, still further preferably higher than or equal to 0.2 and lower than or equal to 0.8. When the transition metal 132 and the compound 131 are mixed in such a molar ratio, a light-emitting element with a favorable electron-injection property can be provided. In the case where the molar ratio of the transition metal 132 to the compound 131 is too low compared with the above-described ratio, the amount of the compound 131 that interacts with the transition metal 132 to form SOMO is small, resulting in an inferior electron-injection property in some cases. In the case where the molar ratio of the transition metal 132 to the compound 131 is too high compared with the above-described ratio, the transmittance of the electron-injection layer 130 is reduced, which reduces the emission efficiency of the light-emitting element in some cases.

The thickness of the electron-injection layer 130 is preferably greater than or equal to 3 nm, further preferably greater than or equal to 5 nm. With the structure, the composite material of the transition metal 132 and the compound 131 can favorably work. The thickness of the electron-injection layer 130 is preferably less than or equal to 50 nm, further preferably less than or equal to 20 nm, still further preferably less than or equal to 10 nm. With the structure, the electron-injection layer 130 is less likely to absorb light, whereby the light-emitting element can have high emission efficiency.

Next, the stabilization energy and the SOMO level in the case where iron (Fe), which is a transition metal belonging to an even-numbered group, is used as the transition metal 132 and copper phthalocyanine (abbreviation: CuPc) is used as the compound 131, and interaction occurs between the transition metal 132 and the compound 131 are estimated by quantum chemistry calculations. The results are shown in Table 3. Note that a calculation method of the quantum chemistry calculations is similar to the calculation method used to calculate the values shown in Table 1.

TABLE 3

|  | Stabilization energy (eV) | HOMO (eV) | SOMO (eV) | LUMO (eV) |
|---|---|---|---|---|
| CuPc | — | −5.17 | −6.55 | −2.98 |
| CuPc + Fe | −3.80 | −4.84 | −3.92 | −2.95 |

Copper phthalocyanine is a compound having an odd number of electrons, and the SOMO is located at the energy level lower than the HOMO level. As shown in Table 3, the stabilization energy has a negative value in the case where copper phthalocyanine is used as the organic compound having an unshared electron pair and mixed with a transition metal belonging to an even-numbered group (here, Fe). That is, it is shown that interaction between the organic compound having an unshared electron pair and the atom of the transition metal leads to stabilization.

By interaction between copper phthalocyanine and Fe, SOMO of a composite material of copper phthalocyanine and Fe is formed. An energy level of the SOMO is between a HOMO level and a LUMO level of copper phthalocyanine. Thus, with the use of the composite material for the electron-injection layer 130, a light-emitting element with a high electron-injection property can be provided.

Structure Example 2 of Light-Emitting Element

Structure examples different from that of the light-emitting element 150 shown in FIGS. 1A to 1C will be described with reference to FIGS. 2A and 2B.

Figure 2A:
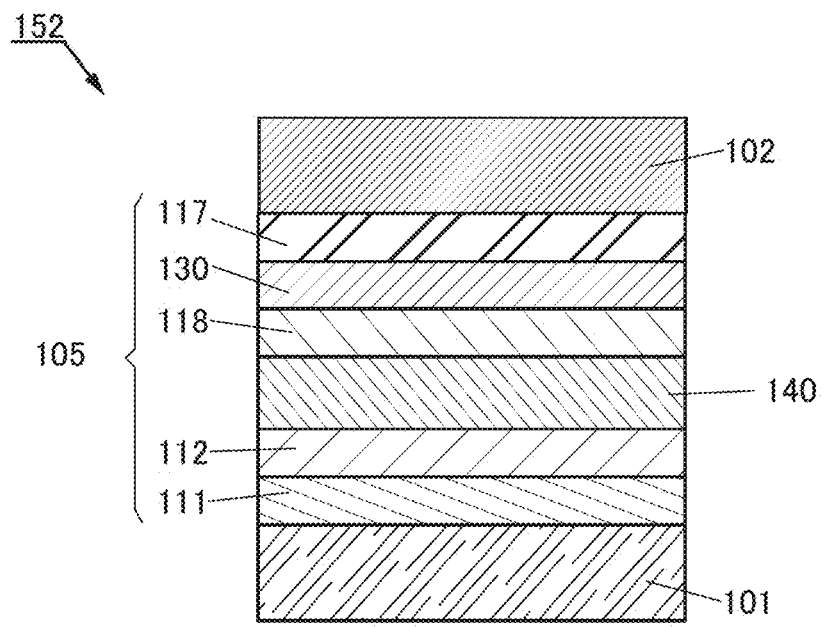
FIGS. 2A and 2B are schematic cross-sectional views each illustrating a light-emitting element of one embodiment of the present invention.
Figure 2B:
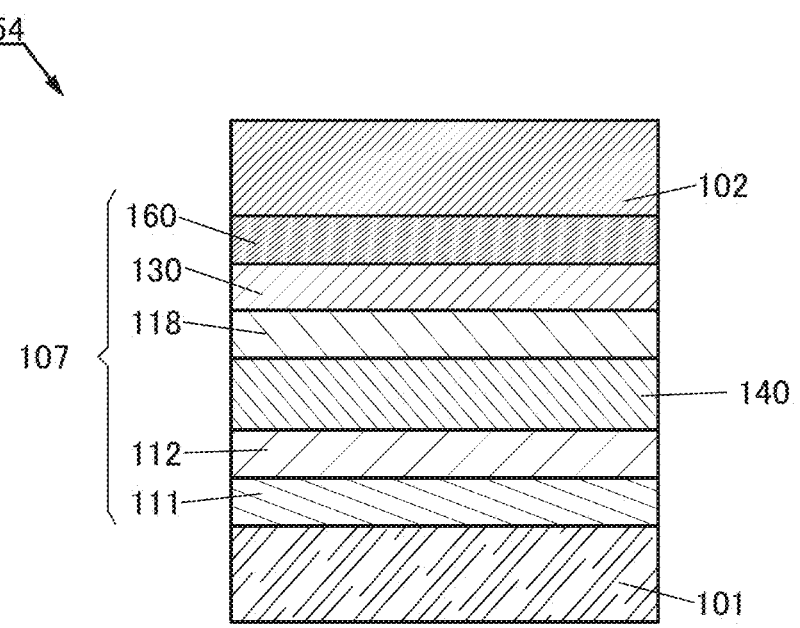

FIGS. 2A and 2B are each a schematic cross-sectional view of a light-emitting device of one embodiment of the present invention. Note that in FIGS. 2A and 2B, a portion having a function similar to that in FIGS. 1A to 1C is represented by the same hatch pattern and not denoted by a reference numeral in some cases. In addition, common reference numerals are used for portions having similar functions, and a detailed description of such portions is not repeated in some cases.

A light-emitting element 152 shown in FIG. 2A includes a pair of electrodes (the electrode 101 and the electrode 102) and an EL layer 105 between the pair of electrodes. The EL layer 105 includes at least the light-emitting layer 140 and the electron-injection layer 130. In addition, a buffer layer 117 is included. The buffer layer 117 is provided between the electron-injection layer 130 and the electrode 102.

The EL layer 105 shown in FIG. 2A includes functional layers such as the hole-injection layer 111, the hole-transport layer 112, and the electron-transport layer 118 in addition to the light-emitting layer 140.

The buffer layer 117 provided between the electrode 102 and the electron-transport layer 118 reduces the possibility that the electron-transport layer 118, the electron-injection layer 130, the light-emitting layer 140, and the like will contact oxygen and moisture; accordingly, the moisture resistance and the oxidation resistance of the light-emitting element can be increased.

In one embodiment of the present invention, the above-described composite material of the compound 131 and the transition metal 132 is used for the electron-injection layer 130, and an organic compound having an electron deficient heteroaromatic ring is used for the buffer layer 117. An electron deficient heteroaromatic ring has a high electron-transport property as described above, and accordingly, the driving voltage of the light-emitting element can be reduced.

The buffer layer 117 is preferably sandwiched between the electron-injection layer 130 and the electrode 102, in which case an energy barrier between the electrode 102 and the electron-injection layer 130 can be lowered. The thickness of the buffer layer is preferably greater than or equal to 1 nm and less than or equal to 20 nm. With such a structure, a barrier to electron injection can be lowered while a high electron-transport property is maintained.

The LUMO level of the organic compound used for the buffer layer 117 is preferably lower than the SOMO level formed in the electron-injection layer 130. With such a structure, a barrier to electron injection between the electron-injection layer 130 and the electrode 102 can be lowered.

Note that the above-described composite material of the transition metal 132 and the compound 131 having an unshared electron pair can be used for a thin film solar cell. Specifically, the above-described composite material can also be suitably used for an electron-injection layer of a thin film solar cell.

Structure Example 3 of Light-Emitting Element

A light-emitting element 154 shown in FIG. 2B includes a pair of electrodes (the electrode 101 and the electrode 102) and an EL layer 107 between the pair of electrodes. The EL layer 107 includes at least the light-emitting layer 140 and the electron-injection layer 130. In addition, a charge-generation layer 160 is included. The charge-generation layer 160 is provided between the electron-injection layer 130 and the electrode 102.

The EL layer 107 shown in FIG. 2B includes functional layers such as the hole-injection layer 111, the hole-transport layer 112, and the electron-transport layer 118 in addition to the light-emitting layer 140.

The charge-generation layer 160 provided between the electrode 102 and the electron-transport layer 118 reduces the amount of oxygen and moisture that enter the electron-transport layer 118, the electron-injection layer 130, the light-emitting layer 140, and the like; accordingly, the moisture resistance and the oxidation resistance of the light-emitting element can be increased.

As described above, in the case where the charge-generation layer 160 includes a hole-transport material and an electron-accepting material and the electron-injection layer 130 includes a metal material including an alkali metal or an alkaline earth metal with a low work function, the electron-accepting material of the charge-generation layer 160 extracts an electron from a material used for the electron-injection layer 130. Therefore, a depletion layer is formed in the vicinity of the interface between the charge-generation layer 160 and the electron-injection layer 130, which increases the driving voltage in some cases. To prevent the formation of the depletion layer, a layer having a function of transferring an electron has conventionally been needed between the electron-injection layer 130 and the charge-generation layer 160.

Meanwhile, in the light-emitting element of one embodiment of the present invention, the electron-injection layer 130 includes the composite material of the transition metal and the compound having an unshared electron pair, in which case an electron is hardly extracted by the material having an electron accepting property of the charge-generation layer 160. Thus, the charge-generation layer 160 can be provided without formation of the above-described depletion layer, so that a light-emitting element that includes a small number of stacked layers and is driven at a low driving voltage can be manufactured.

The thickness of the charge-generation layer 160 is not limited in particular and can be controlled as appropriate. For example, by controlling the thickness from the light-emitting layer 140 to the electrode 102, light emitted from the light-emitting layer 140 can be extracted to the outside of the light-emitting element efficiently. That is, by controlling the thickness of the charge-generation layer 160, the light extraction efficiency can be increased.

It is preferable that the charge-generation layer 160 be in contact with the electrode 102. With the structure, a barrier to electron injection between the electrode 102 and the EL layer 107 can be lowered, whereby the driving voltage of the light-emitting element can be reduced. It is further preferable that the charge-generation layer 160 be in contact with the electron-injection layer 130. As described above, in one embodiment of the present invention, a light-emitting element with low driving voltage can be manufactured even when the charge-generation layer 160 is in contact with the electron-injection layer 130. With the structure, the number of stacked layers in the EL layer 107 can be reduced.

As the electron-accepting material of the charge-generation layer 160, a transition metal oxide can be suitably used. Examples of the transition metal oxide include titanium oxide, vanadium oxide, tantalum oxide, molybdenum oxide, tungsten oxide, rhenium oxide, ruthenium oxide, chromium oxide, zirconium oxide, hafnium oxide, and silver oxide. Among these, molybdenum oxide is particularly preferable because of its high stability in the air, low hygroscopicity, and inexpensiveness. With the use of the transition metal oxide, a barrier to electron injection between the electrode 102 and the charge-generation layer 160 can be lowered. Thus, one embodiment of the present invention is a light-emitting element in which the electron-injection layer 130 includes a transition metal element and the charge-generation layer 160 includes a transition metal element. Note that the electron-accepting material of the charge-generation layer 160 is not limited to the above-described compounds.

As the hole-transport material of the charge-generation layer 160, an organic compound having one of a pyrrole skeleton, a thiophene skeleton, a furan skeleton, and an aromatic amine skeleton is preferably used. The organic compound having the skeleton has a high hole-transport property; accordingly, when the organic compound having the skeleton is used for the charge-generation layer 160, the driving voltage of the light-emitting element can be reduced. The hole-transport material of the charge-generation layer 160 is not limited to the above-described compound.

Structure Example 4 of Light-Emitting Element

Structure examples different from the structures of the light-emitting element 150 shown in FIGS. 1A to 1C and the light-emitting elements 152 and 154 shown in FIGS. 2A and 2B will be described below with reference to FIGS. 49A and 49B.

Figure 49A:
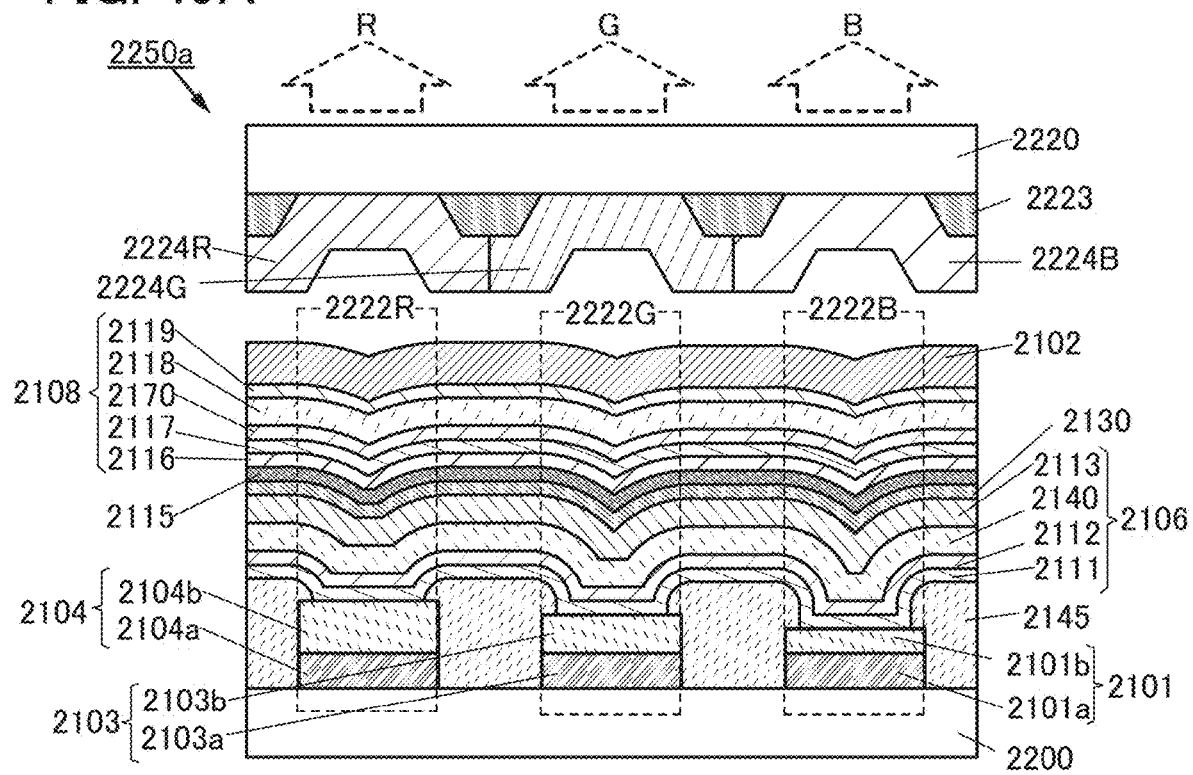
FIGS. 49A and 49B are schematic cross-sectional views each illustrating a light-emitting element of one embodiment of the present invention.
Figure 49B:
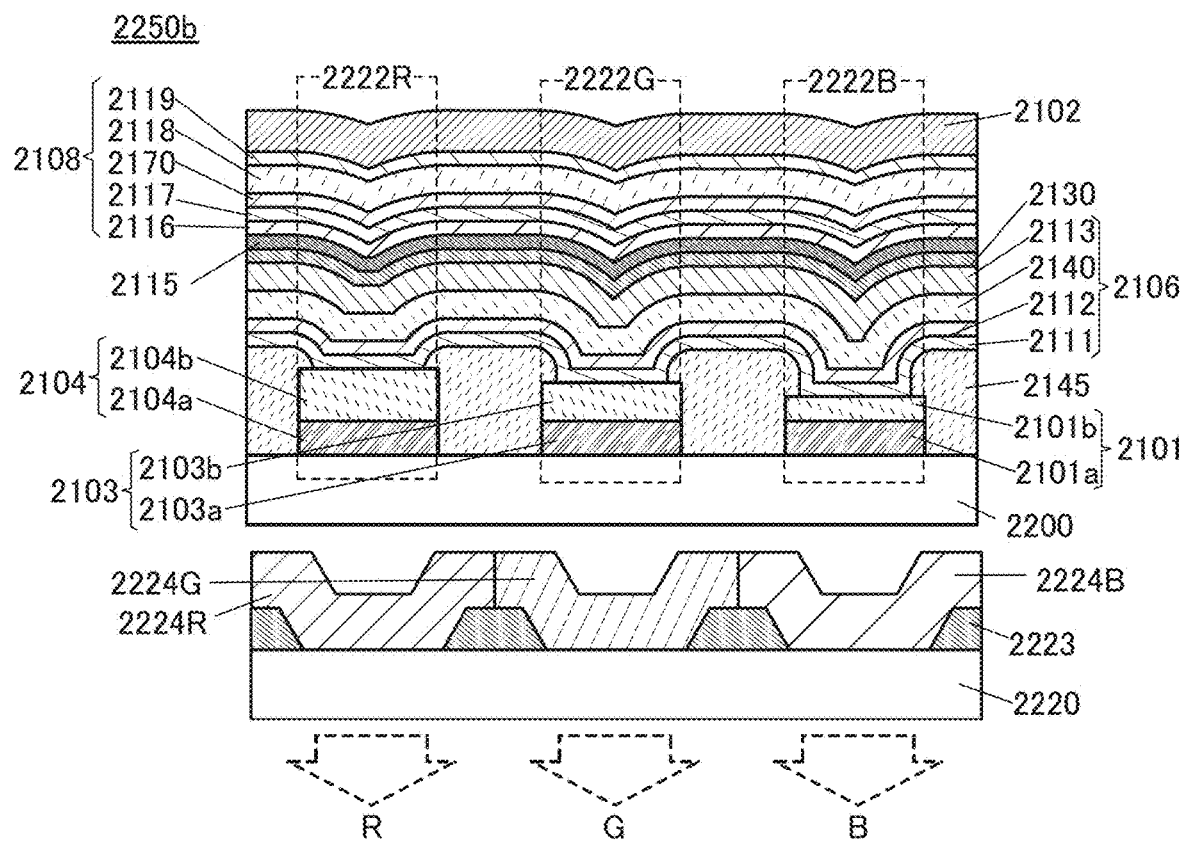

FIGS. 49A and 49B are schematic cross-sectional views of a light-emitting element 2250a and a light-emitting element 2250b.

The light-emitting elements 2250a and 2250b each include an electrode 2101, an electrode 2102, an electrode 2103, and an electrode 2104 over a substrate 2200. At least a light-emitting unit 2106, a light-emitting unit 2108, and an electron-injection layer 2130 are provided between the electrode 2101 and the electrode 2102, between the electrode 2102 and the electrode 2103, and between the electrode 2102 and the electrode 2104. A charge-generation layer 2115 is provided between the light-emitting unit 2106 and the light-emitting unit 2108. Note that the light-emitting unit 2106 and the light-emitting unit 2108 may have the same structures or different structures.

The charge-generation layer 2115 provided between the light-emitting unit 2106 and the light-emitting unit 2108 is configured so that electrons are injected to the light-emitting unit on one side and holes are injected into the light-emitting unit on the other side when a voltage is applied between the electrode 2101 and the electrode 2102, for example. For example, in FIGS. 49A and 49B, the charge-generation layer 2115 injects electrons into the light-emitting unit 2106 and holes into the light-emitting unit 2108 when a voltage is applied such that the potential of the electrode 2102 is higher than that of the electrode 2101.

The light-emitting unit 2106 includes a hole-injection layer 2111, a hole-transport layer 2112, a light-emitting layer 2140, and an electron-transport layer 2113, for example. The light-emitting unit 2108 includes a hole-injection layer 2116, a hole-transport layer 2117, a light-emitting layer 2170, an electron-transport layer 2118, and an electron-injection layer 2119, for example.

As shown in FIGS. 49A and 49B, it is preferable that the electron-injection layer 2130 be adjacent to the electron-transport layer 2113 and provided between the light-emitting unit 2108 and the electron-transport layer 2113. It is preferable that the charge-generation layer 2115 be adjacent to the electron-injection layer 2130 and located between the electron-injection layer 2130 and the light-emitting unit 2108. With such a structure, electrons can be efficiently transported to the light-emitting unit 2106.

Note that in the structure examples of the light-emitting element, the electrode 2101, the electrode 2103, and the electrode 2104 are used as anodes and the electrode 2102 is used as a cathode, but the structures of the light-emitting element 2250a and the light-emitting element 2250b are not limited thereto. That is, the electrode 2101, the electrode 2103, and the electrode 2104 may be cathodes, the electrode 2102 may be an anode, and the stacking order of the layers between the electrodes may be reversed. That is, the hole-injection layer 2111, the hole-transport layer 2112, the light-emitting layer 2140, the electron-transport layer 2113, and the electron-injection layer 2130 are stacked in this order from the anode side in the light-emitting unit 2106, and the hole-injection layer 2116, the hole-transport layer 2117, the light-emitting layer 2170, the electron-transport layer 2118, and the electron-injection layer 2119 are stacked in this order from the anode side in the light-emitting unit 2108.

The structures of the light-emitting element 2250a and the light-emitting element 2250b are not limited to those shown in FIGS. 49A and 49B. At least the light-emitting layer 2140, the light-emitting layer 2170, the charge-generation layer 2115, and the electron-injection layer 2130 are included in each of the light-emitting elements 2250a and 2250b, but the hole-injection layer 2111, the hole-injection layer 2116, the hole-transport layer 2112, the hole-transport layer 2117, the electron-transport layer 2113, the electron-transport layer 2118, and the electron-injection layer 2119 may be optionally included.

Layers are not limited to the above layers as long as they are formed between the pair of electrodes. In other words, layers between the pair of electrodes may include a layer which has a function of lowering a barrier to hole or electron injection, enhancing a hole- or electron-transport property, inhibiting a hole- or electron-transport property, suppressing a quenching phenomenon due to an electrode, or the like.

Note that when a surface of a light-emitting unit on the anode side is in contact with the charge-generation layer 2115 like a surface of the light-emitting unit 2108, the charge-generation layer 2115 can also function as a hole-injection layer in the light-emitting unit 2108 in some cases, and thus, a hole-injection layer is not necessarily formed in the light-emitting unit in such cases.

The light-emitting elements each having two light-emitting units are shown in FIGS. 49A and 49B; however, a similar structure can be applied to a light-emitting element in which three or more light-emitting units are stacked. When a plurality of light-emitting units partitioned by the charge-generation layer are arranged between a pair of electrodes as in the light-emitting elements 2250a and 2250b, a high-luminance light-emitting element with a long lifetime can be achieved while the current density is kept low. In addition, a light-emitting element with low power consumption can be obtained.

In the light-emitting element 2250a, the electrode 2101, the electrode 2103, and the electrode 2104 each have a function of reflecting visible light, and the electrode 2102 has a function of transmitting visible light. In the light-emitting element 2250b, the electrode 2101, the electrode 2103, and the electrode 2104 each have a function of transmitting visible light, and the electrode 2102 has a function of reflecting visible light.

Accordingly, light emitted from the light-emitting element 2250a is extracted to the outside through the electrode 2102, and light emitted from the light-emitting element 2250b is extracted to the outside through the electrode 2101, the electrode 2103, and the electrode 2104. However, one embodiment of the present invention is not limited to this, and a dual-emission light-emitting element in which light is extracted in both top and bottom directions of the substrate 2200 where the light-emitting element is formed may be employed.

The electrode 2101 includes a conductive layer 2101a and a conductive layer 2101b over and in contact with the conductive layer 2101a. The electrode 2103 includes a conductive layer 2103a and a conductive layer 2103b over and in contact with the conductive layer 2103a. The electrode 2104 includes a conductive layer 2104a and a conductive layer 2104b over and in contact with the conductive layer 2104a.

The conductive layer 2101b, the conductive layer 2103b, and the conductive layer 2104b each have a function of transmitting visible light. In the light-emitting element 2250a, the conductive layer 2101a, the conductive layer 2103a, and the conductive layer 2104a each have a function of reflecting visible light. In the light-emitting element 2250b, the conductive layer 2101a, the conductive layer 2103a, and the conductive layer 2104a each have a function of transmitting visible light.

The light-emitting element 2250a shown in FIG. 49A and the light-emitting element 2250b shown in FIG. 49B each include a partition wall 2145 between a region 2222B sandwiched between the electrode 2101 and the electrode

2102, a region 2222G sandwiched between the electrode 2102 and the electrode 2103, and a region 2222R sandwiched between the electrode 2102 and the electrode 2104. The partition wall 2145 has an insulating property. The partition wall 2145 covers end portions of the electrodes 2101, 2103, and 2104 and has openings overlapping with the electrodes. With the partition wall 2145, the electrodes provided over the substrate 2200 in the regions can be separated into island shapes.

In FIGS. 49A and 49B, the hole-injection layer 2111, the hole-injection layer 2116, the hole-transport layer 2112, the hole-transport layer 2117, the light-emitting layer 2140, the light-emitting layer 2170, the electron-transport layer 2113, the electron-transport layer 2118, the electron-injection layer 2119, the charge-generation layer 2115, and the electrode 2102 are provided in the regions without being divided; however, they may be provided separately in each of the regions.

In each of the light-emitting elements 2250a and 2250b of one embodiment of the present invention, voltage application between the pair of electrodes (the electrode 2101 and the electrode 2102) in the region 2222B, between the pair of electrodes (the electrode 2102 and the electrode 2103) in the region 2222G, and between the pair of electrodes (the electrode 2102 and the electrode 2104) in the region 2222R allows electron injection from the cathode to the electron-injection layer 2119 and hole injection from the anode to the hole-injection layer 2111, whereby current flows. Electrons are injected from the charge-generation layer 2115 to the electron-injection layer 2130 and holes are injected from the charge-generation layer 2115 to the hole-injection layer 2116. By recombination of the injected carriers (electrons and holes), excitons are formed. When carriers (electrons and holes) recombine and excitons are formed in the light-emitting layer 2140 and the light-emitting layer 2170 including light-emitting materials, the light-emitting materials in the light-emitting layer 2140 and the light-emitting layer 2170 are brought into an excited state, causing light emission from the light-emitting materials.

Each of the light-emitting layer 2140 and the light-emitting layer 2170 preferably includes any one or more light-emitting materials that emit light of violet, blue, blue green, green, yellow green, yellow, yellow orange, orange, and red.

The light-emitting layer 2140 and the light-emitting layer 2170 may each have a two-layer structure. Two light-emitting layers each including two kinds of light-emitting materials (a first compound and a second compound) for emitting light of different colors enable emission of light of a plurality of colors. It is particularly preferable to select the light-emitting materials of the light-emitting layer 2140 and the light-emitting layer 2170 such that white light or light of color close to white can be obtained by combining light emissions from the light-emitting layers.

Either or both of the light-emitting layers 2140 and 2170 may have a stacked structure of three or more layers, in which a layer not including a light-emitting material may be included.

The light-emitting elements 2250a and 2250b each include the substrate 2220 provided with an optical element 2224B, an optical element 2224G, and an optical element 2224R in the direction in which light emitted from the region 2222B, light emitted from the region 2222G, and light emitted from the region 2222R are extracted. The light emitted from each region is emitted outside the light-emitting element through each optical element. In other words, the light from the region 2222B, the light from the region 2222G, and the light from the region 2222R are emitted through the optical element 2224B, the optical element 2224G, and the optical element 2224R, respectively.

The optical elements 2224B, 2224G, and 2224R each have a function of selectively transmitting light of a particular color out of incident light. For example, the light emitted from the region 2222B through the optical element 2224B is blue light, the light emitted from the region 2222G through the optical element 2224G is green light, and the light emitted from the region 2222R through the optical element 2224R is red light.

Note that in FIGS. 49A and 49B, blue light (B), green light (G), and red light (R) emitted from the regions through the optical elements are schematically illustrated by arrows of dashed lines. The light-emitting element 2250a shown in FIG. 49A is a top-emission light-emitting element, and the light-emitting element 2250b shown in FIG. 49B is a bottom-emission light-emitting element.

A light-blocking layer 2223 is provided between the optical elements. The light-blocking layer 2223 has a function of blocking light emitted from the adjacent regions. Note that a structure without the light-blocking layer 2223 may also be employed. A structure in which one or more of the optical elements 2224B, 2224G and 2224R are not provided may be employed. With the structure in which the optical element 2224B, the optical element 2224G, or the optical element 2224R is not provided, the extraction efficiency of light emitted from the light-emitting element can be increased.

The charge-generation layer 2115 can be formed with a material obtained by adding an electron acceptor (acceptor) to a hole-transport material or a material obtained by adding an electron donor (donor) to an electron-transport material.

Figure 50A:
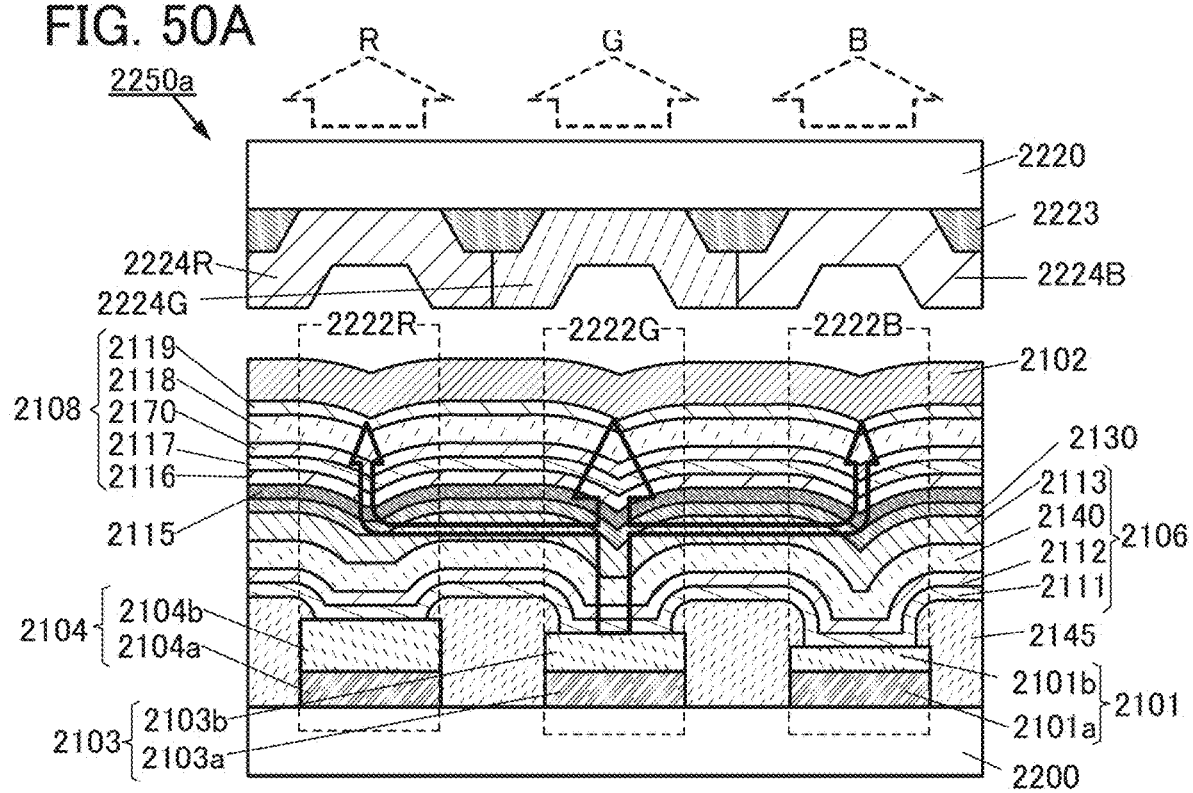
FIGS. 50A and 50B are schematic cross-sectional views each illustrating a light-emitting element of one embodiment of the present invention.
Figure 50B:
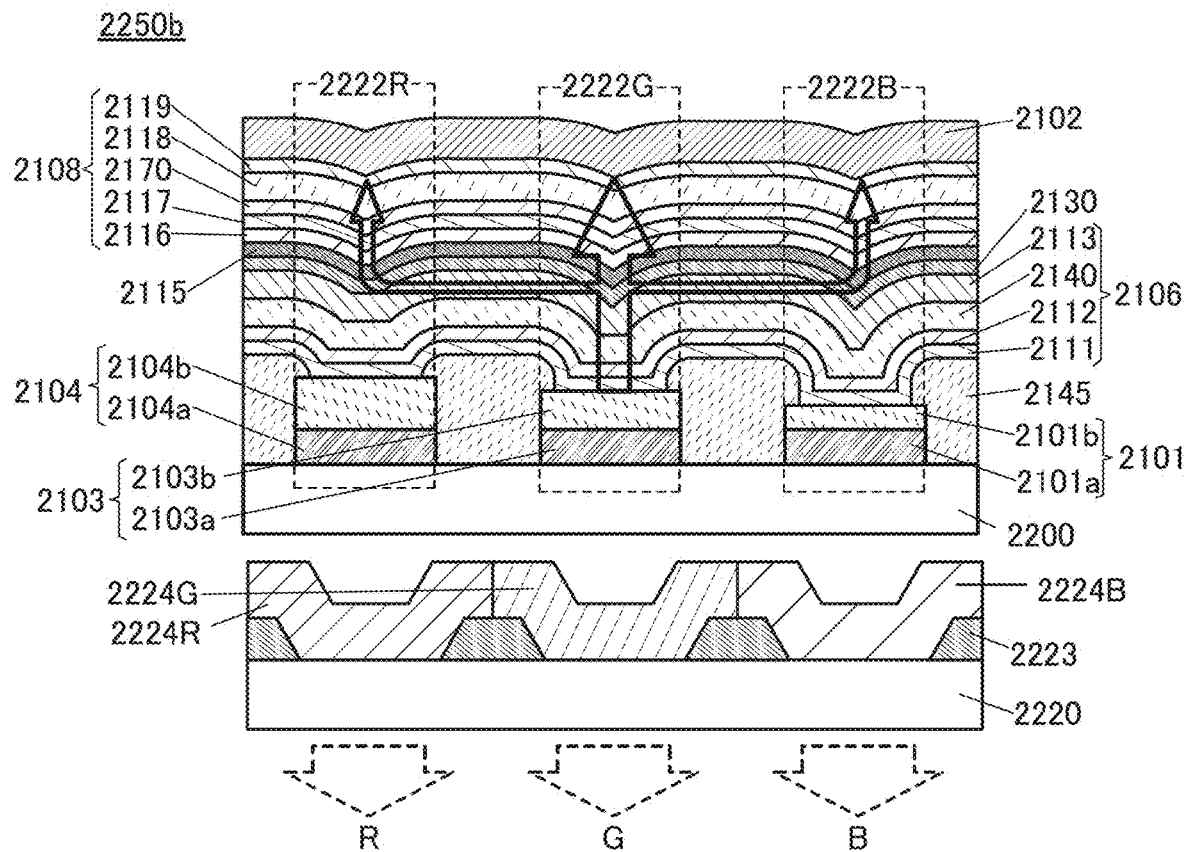

In order to reduce the driving voltage of the light-emitting element, it is preferable to lower a barrier to electron injection from the charge-generation layer 2115 to the electron-transport layer 2113 such that electrons generated in the charge-generation layer 2115 are injected and transported to the electron-transport layer 2113 smoothly. Hence, the electron-injection layer 2130 is preferably provided between the charge-generation layer 2115 and the electron-transport layer 2113. The electron-injection layer 2119 and the electron-injection layer 2130 are required to have a high electron-injection property, and accordingly, an alkali metal such as lithium (Li) or cesium (Cs), a compound of an alkali metal, an alkaline earth metal such as calcium (Ca), or a compound of an alkali earth metal is used for the electron-injection layers 2119 and 2130. However, in the case where the metal or the compound is used for the electron-injection layer 2130, for example, as shown in FIGS. 50A and 50B, when current is made to flow in the region 2222G by voltage application between the electrode 2103 and the electrode 2102, current flows also in the regions 2222B and 2222R adjacent to the region 2222G through the electron-injection layer 2130 and the electron-transport layer 2113, whereby light is emitted not only from the region 2222G but also from the regions 2222B and 2222R adjacent to the region 2222G (this phenomenon is called crosstalk) in some cases. Note that in FIGS. 50A and 50B, current that flows in the regions 2222G, 2222R, and 2222B is indicated by a solid arrow.

In the case where the crosstalk occurs in the light-emitting elements as described above, light is emitted not only from a desired region (e.g., the region 2222G) but also from other regions (e.g., the regions 2222B and 2222R), which causes a reduction in the color purity or the intensity of light emitted from the light-emitting elements 2250a and 2250b in some cases.

A cause of the crosstalk is diffusion of an alkali metal, an alkaline earth metal, or a compound of an alkali metal or an alkaline earth metal from the electron-injection layer 2130 sandwiched between the charge-generation layer 2115 and electron-transport layer 2113 to the electron-transport layer 2113, which increases the conductivity of the electron-transport layer 2113 (particularly, the conductivity in a direction perpendicular to the direction of voltage application). In particular, a metal with a small atomic number, e.g., Li or Ca, or a compound thereof in the electron-injection layer 2130 is easily diffused to the electron-transport layer 2113. Therefore, it is preferable that an alkali metal and an alkaline earth metal not be included in the electron-injection layer 2130 in terms of suppressing the crosstalk. On the other hand, in the case where an alkali metal, an alkaline earth metal, or a compound of an alkali metal or an alkaline earth metal is not included in the electron-injection layer 2130, a barrier to electron injection from the charge-generation layer 2115 to the electron-transport layer 2113 is increased and electrons are not easily injected to the electron-transport layer 2113, resulting in an increase in the driving voltage or a reduction in the emission efficiency of the light-emitting element in some cases.

Thus, in order to reduce the driving voltage of the light-emitting element, increase the emission efficiency of the light-emitting element, and suppress the crosstalk, a metal that has a high electron-injection property and is not easily diffused is preferably used for the electron-injection layer 2130. It is preferable to use a metal with a long atomic radius as the metal that is not easily diffused and is used for the electron-injection layer 2130. Furthermore, a metal with a large atomic weight is preferably used.

However, in the case where a metal with a long atomic radius or a large atomic weight, which is not easily diffused, is used for the electron-injection layer 2130, a barrier to electron injection is formed between the charge-generation layer 2115 and the electron-transport layer 2113, which causes an increase in the driving voltage and a reduction in the emission efficiency of the light-emitting element in some cases.

In view of this, the present inventors have found that, when the composite material of the compound and the transition metal that form SOMO in combination is used for the electron-injection layer 2130 adjacent to the charge-generation layer 2115 in the light-emitting element, the light-emitting element can have a favorable electron-injection property and crosstalk is suppressed in the light-emitting element.

The light-emitting element of one embodiment of the present invention is a light-emitting element in which a plurality of light-emitting units are provided and the electron-injection layer 2130 including a composite material of a transition metal and an organic compound having an unshared electron pair is provided between the light-emitting units.

A transition metal has a large atomic weight and is not easily diffused in an organic compound, and accordingly, a light-emitting element in which crosstalk is suppressed can be provided.

Note that since the organic compound having an unshared electron pair transports electrons, the organic compound having an unshared electron pair preferably includes at least a π-conjugated system. In this case, an atom having a π-electron (Pz orbital) preferably includes the unshared electron pair, or an atom bonded (adjacent) to an atom having a π-electron (Pz orbital) preferably includes the unshared electron pair.

In the case where a composite material of the transition metal 132 and the compound 131 that are shown in FIGS. 1A to 1C is included in the electron-injection layer 2130, the HOMO level formed by interaction between the compound 131 and an atom of the transition metal 132 is preferably approximately equal to the HOMO level of the original compound 131. In the case where an organic compound having a function of transporting an electron is used as the compound 131, the HOMO level of the compound 131 is low and holes are not easily injected to the compound 131. Therefore, in the case where the HOMO level formed by the interaction between the compound 131 and the transition metal 132 is approximately equivalent to the HOMO level of the original compound 131, a barrier to hole injection between the electron-injection layer 2130 and the charge-generation layer 2115 is increased; accordingly, a hole does not easily pass through from the electron-injection layer 2130 to the charge-generation layer 2115, and the carrier balance in the light-emitting element can be improved.

SOMO is an orbital having only one electron; thus, in the case where the above-described composite material is used for the electron-injection layer 2119 and the electron-injection layer 2130, by application of a voltage to the light-emitting element 2250a and the light-emitting element 2250b, an electron in SOMO serves as a carrier in the light-emitting element and is transported to the electron-transport layer 2113 and the light-emitting layer 2140. Moreover, electrons can be easily injected from the charge-generation layer 2115 to the electron-injection layer 2130. That is, when the electron-injection layer 2130 includes materials forming SOMO in combination, electrons can be easily injected from the charge-generation layer 2115 to the light-emitting unit 2106. The SOMO level is preferably lower than the LUMO level of the compound 2131. Accordingly, the LUMO level of the compound 131 is preferably high. Specifically, the LUMO level of the compound 131 is preferably higher than or equal to −3.6 eV and lower than or equal to −2.3 eV When an organic compound having such a LUMO level and a transition metal are mixed, a SOMO level suitable for electron injection is formed by interaction between the organic compound and the transition metal; thus, a barrier to electron injection between the electron-injection layer 2130 and the charge-generation layer 2115 can be lowered.

By formation of SOMO through interaction between the compound 131 and the transition metal 132, an unpaired electron is formed in the electron-injection layer 130. Thus, formation of SOMO can be observed by ESR. In order to inject electrons from the charge-generation layer 2115 to the light-emitting layer 2140 favorably, the spin density originating from SOMO is preferably higher than or equal to $1×10^{16}$ spins/cm$^3$, further preferably higher than or equal to $5×10^{16}$ spins/cm$^3$, still further preferably higher than or equal to $1×10^{17}$ spins/cm$^3$. In order to suppress crosstalk, the spin density originating from SOMO is preferably lower than or equal to $5×10^{17}$ spins/cm$^3$.

<Components of Light-Emitting Element>

Components of the light-emitting elements shown in FIGS. 1A to 1C, FIGS. 2A and 2B, FIGS. 49A and 49B, and FIGS. 50A and 50B are described in detail below.

«Electron-Injection Layer»

The electron-injection layers 130, 2130, and 2119 are layers each including a substance having a high electron-injection property, and the above-described composite material of the transition metal and the organic compound having an unshared electron pair can be suitably used for the layers. As the organic compound used for the electron-injection layers 130, 2130, and 2119, a material having a high electron-transport property is preferably used, and specifically, a metal complex or a heteroaromatic compound described below can be used, for example.

For the electron-injection layer 130, the electron-injection layer 2130, and the electron-injection layer 2119, a metal complex having a quinoline ligand, a benzoquinoline ligand, an oxazole ligand, or a thiazole ligand, a pyridine derivative, a pyrimidine derivative, a pyrazine derivative, a triazine derivative, an oxadiazole derivative, a triazole derivative, a phenanthroline derivative, or the like can be used. Specifically, a metal complex such as $Alq_3$, $Almq_3$, $BeBq_2$, Balq, bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ) can be used. Furthermore, any of the following can be used: heterocyclic compounds having azole skeletons such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 4,4'-bis(5-methylbenzoxazol-2-yl)stilbene (abbreviation: BzOs), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having diazine skeletons such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), and 4-{3-[3'-(9H-carbazol-9-yl)]biphenyl-3-yl}benzofuro[3,2-d]pyrimidine (abbreviation: 4mCzBPBfpm); heterocyclic compounds having triazine skeletons such as 2-{4-[3-(N-phenyl-9H-carbazol-3-yl)-9H-carbazol-9-yl]phenyl}-4,6-diphenyl-1,3,5-triazine (abbreviation: PCCzPTzn), 2,4,6-tris[3'-(pyridin-3-yl)biphenyl-3-yl]-1,3,5-triazine (abbreviation: TmPPPyTz), and 2,4,6-tris(2-pyridyl)-1,3,5-triazine (abbreviation: 2Py3Tzn); and heterocyclic compounds having pyridine skeletons such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), bathocuproine (abbreviation: BCP), and 2,9-bis(naphthalen-2-yl)-4,7-diphenyl-1,10-phenanthroline (abbreviation: NBPhen). Among the above-described materials, heterocyclic compounds having diazine skeletons and triazine skeletons and heterocyclic compounds having pyridine skeletons have high reliability and are thus preferable. Heterocyclic compounds having diazine (pyrimidine or pyrazine) skeletons and triazine skeletons have a high electron-transport property and contribute to a decrease in driving voltage. The substances listed here are mainly ones that have an electron mobility of $1 \times 10^{-6}$ $cm^2/Vs$ or higher. Note that other substances may also be used for the electron-injection layer 130, the electron-injection layer 2130, and the electron-injection layer 2119 as long as their electron-transport properties are higher than their hole-transport properties.

«Hole-Injection Layer»

The hole-injection layers 111 and 2111 each have a function of promoting hole injection by lowering a barrier to hole injection from one of the pair of electrodes (the electrode 101 or the electrode 102, or the electrode 2101 or the electrode 2102), and the hole-injection layer 2116 has a function of promoting hole injection by lowering a barrier to hole injection from the charge-generation layer 2115. The hole-injection layers 111, 2111, and 2116 are each formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As each of the hole-injection layers 111, 2111, and 2116, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1 \times 10^{-6}$ $cm^2/Vs$ or higher is preferable. Specifically, any of the aromatic amine, carbazole derivative, aromatic hydrocarbon, stilbene derivative, and the like described as examples of the hole-transport material that can be used in the light-emitting layer 140 can be used. Furthermore, the hole-transport material may be a high molecular compound.

As other examples of the hole-transport material, aromatic hydrocarbons such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4- phenylphenyl)anthracene (abbreviation: t-BuDBA), 9,10-di (2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene can be given. Other examples are pentacene, coronene, and the like. The aromatic hydrocarbon having a hole mobility of $1\times10^{-6}$ cm$^2$/Vs or higher and having 14 to 42 carbon atoms is particularly preferable.

The aromatic hydrocarbon may have a vinyl skeleton. As the aromatic hydrocarbon having a vinyl group, the following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Other examples are thiophene compounds, furan compounds, fluorene compounds, triphenylene compounds, phenanthrene compounds, and the like such as 4-{3-[3-(9-phenyl-9H-fluoren-9-yl)phenyl]phenyl}dibenzofuran (abbreviation: mmDBFFLBi-II), 4,4',4"-(benzene-1,3,5-triyl) tri(dibenzofuran) (abbreviation: DBF3P-II), 1,3,5-tri(dibenzothiophen-4-yl)benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl] dibenzothiophene (abbreviation: mDBTPTp-II). Among the above compounds, compounds including a pyrrole skeleton, a furan skeleton, a thiophene skeleton, or an aromatic amine skeleton are preferred because of their high stability and reliability. In addition, the compounds having such skeletons have a high hole-transport property to contribute to a reduction in driving voltage.

«Hole-Transport Layer»

The hole-transport layers 112, 2112, and 2117 each include a hole-transport material and can be formed using any of the materials given as examples of the materials of the hole-injection layers 111, 2111, and 2116. The hole-transport layers 112, 2112, and 2117 each have a function of transporting, to the light-emitting layers 140, 2140, and 2170, a hole injected from the hole-injection layers 111, 2111, and 2116.

In that case, a hole-transport material whose HOMO level is between the LUMO level of the acceptor material of the hole-injection layer 111 and the HOMO level of the material of the light-emitting layer 140 is preferably used for the hole-transport layer 112. Similarly, a hole-transport material whose HOMO level is between the LUMO level of the acceptor material of the hole-injection layer 2111 and the HOMO level of the material of the light-emitting layer 2140 is preferably used for the hole-transport layer 2112. Each of the hole-transport layers 112, 2112, and 2117 is not limited to a single layer and may include a stack of two or more layers. In that case, it is preferable to stack hole-transport materials in order of decreasing HOMO level such that HOMO levels of hole-transport materials on the light-emitting layer 140 side, on the light-emitting layer 2140 side, and on the light-emitting layer 2170 side are lower than those of hole-transport materials on the hole-injection layer 111 side, on the hole-injection layer 2111 side, and on the hole-injection layer 2116 side, respectively. In the case where the hole-transport layers 112, 2112, and 2117 each include a stack of two or more layers, in order to transport holes smoothly, the difference in the HOMO level between hole-transport materials is preferably greater than or equal to 0 eV and less than or equal to 0.5 eV, more preferably greater than or equal to 0 eV and less than or equal to 0.3 eV, still more preferably greater than or equal to 0 eV and less than or equal to 0.2 eV.

Examples of the hole-transport material include compounds having aromatic amine skeletons such as 4,4'-bis[N-(1-naphthyl)-N-phenylamino]biphenyl (abbreviation: NPB), N,N'-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl) phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl) benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4"-(benzene-1,3,5-triyl)tri (dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in driving voltage. Hole-transport materials can be selected from a variety of substances as well as from the hole-transport materials given above.

Furthermore, examples of the substance having a high hole-transport property include compounds having aromatic amine skeletons, such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 4-phenyl-4'-(9-phenyl-9H-carbazol-3-yl)triphenylamine (abbreviation: PCBA1BP), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), 3,3'-bis(9-phenyl-9H-carbazole) (abbreviation: PCCP), N-[4-(9H-carbazol-9-yl) phenyl]-N-(4-phenyl)phenylaniline (abbreviation: YGA1BP), 1,3,5-tri(dibenzothiophen-4-yl)-benzene (abbreviation: DBT3P-II), 4,4',4"-(benzene-1,3,5-triyl)tri(dibenzofuran) (abbreviation: DBF3P-II), 4-phenyl-4'-(9-phenylfluoren-9-yl)triphenylamine (abbreviation: BPAFLP), 4-[3-(triphenylen-2-yl)phenyl]dibenzothiophene (abbreviation: mDBTPTp-II), 4,4'-bis[N-(1-naphthyl)-N-phenylamino]biphenyl (abbreviation: NPB or a,-NPD), N,N'-bis(3-methylphenyl)-N,N-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. Other examples include carbazole compounds such as 4,4'-di(N-carbazolyl)biphenyl (abbreviation: CBP) and 1,3,5-tris[4-(N-carbazolyl)phenyl]benzene (abbreviation: TCPB); amine compounds; dibenzothiophene compounds; dibenzofuran compounds; fluorene compounds; triphenylene compounds; and phenanthrene compounds. The substances given here are mainly substances having a hole mobility of $1 \times 10^{-6}$ cm$^2$/Vs or higher. Note that any other material may be used as long as it has a property of transporting more holes than electrons.

Note that any of these compounds that can be used for the hole-transport layer can also be used for the hole-injection layer.

«Charge-Generation Layer»

Each of the charge-generation layers 160 and 2115 may have either a structure in which an acceptor substance that is an electron acceptor is added to a hole-transport material or a structure in which a donor substance that is an electron donor is added to an electron-transport material. Alternatively, both of these structures may be stacked.

In the case where each of the charge-generation layers 160 and 2115 include a composite material of an organic compound and an acceptor substance, the composite material that can be used for the above-described hole-injection layer 111 may be used for the composite material. As the organic compound, a variety of compounds such as an aromatic amine compound, a carbazole compound, an aromatic hydrocarbon, and a high molecular compound (such as an oligomer, a dendrimer, or a polymer) can be used. A substance having a hole mobility of $1 \times 10^{-6}$ cm$^2$/Vs or higher is preferably used as the organic compound. Note that any other material may be used as long as it has a property of transporting more holes than electrons. Since the composite material of an organic compound and an acceptor substance has excellent carrier-injection and carrier-transport properties, low-voltage driving or low-current driving can be realized. Note that when surfaces of light-emitting units on the anode side are in contact with the charge-generation layers 160 and 2115, each of the charge-generation layers 160 and 2115 can also serve as a hole-injection layer or a hole-transport layer of the light-emitting unit; thus, a hole-injection layer or a hole-transport layer is not necessarily included in the light-emitting unit.

The charge-generation layers 160 and 2115 may each have a stacked-layer structure of a layer containing the composite material of an organic compound and an acceptor substance and a layer containing another material. For example, the charge-generation layers 160 and 2115 may each be formed using a combination of a layer containing the composite material of an organic compound and an acceptor substance with a layer containing one compound selected from among electron-donating materials and a compound having a high electron-transport property. Furthermore, the charge-generation layers 160 and 2115 may each be formed using a combination of a layer containing the composite material of an organic compound and an acceptor substance with a layer containing a transparent conductive material.

Note that for light extraction efficiency, the charge-generation layers 160 and 2115 preferably transmit visible light (specifically, each of the charge-generation layers 160 and 2115 has a visible-light transmittance higher than or equal to 40%). The charge-generation layers 160 and 2115 function even with conductivity lower than that of the pair of electrodes (the electrodes 2101, 2102, 2103, and 2104).

Forming the charge-generation layers 160 and 2115 by using any of the above materials can suppress an increase in driving voltage caused by the stack of the light-emitting layers.

«Light-Emitting Layer»

The light-emitting layers 140, 2140, and 2170 each include a light-emitting material having a function of emitting at least one of violet light, blue light, blue green light, green light, yellow green light, yellow light, orange light, and red light. In addition, the light-emitting layers 140, 2140, and 2170 each include an electron-transport material and/or a hole-transport material as a host material in addition to the light-emitting material.

As the light-emitting material, any of light-emitting substances that convert singlet excitation energy into luminescence and light-emitting substances that convert triplet excitation energy into luminescence can be used. Examples of the light-emitting substance are given below.

Examples of the light-emitting substance capable of converting singlet excitation energy into luminescence include substances that emit fluorescence (fluorescent compound). Although there is no particular limitation on the fluorescent compound, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like is preferably used, and for example, any of the following substances can be used.

Specific examples of the fluorescent compound include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N-bis[4-(9-phenyl-9H-fluoren-9-yl)phenyl]pyrene-1,6-diamine (abbreviation: 1,6FLPAPrn), N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-bis[4-(9-phenyl-9H-fluoren-9-yl)phenyl]-N,N-bis(4-tert-butylphenyl)pyrene-1,6-diamine (abbreviation: 1,6tBu-FLPAPrn), N,N-diphenyl-N,N-bis[4-(9-phenyl-9H-fluoren-9-yl)phenyl]-3,8-dicyclohexylpyrene-1,6-diamine (abbreviation: ch-1,6FLPAPrn), N,N-(pyrene-1,6-diyl)bis[(6,N-diphenylbenzo[b]naphtho[1,2-d]furan)-8-amine](abbreviation: 1,6BnfAPrn-03), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N,N-triphenyl-1,4-phenylenediamine] (abbreviation: DPABPA), N,9-diphenyl-N-[4-(9,10-diphenyl-2-anthryl)phenyl]-9H-carbazol-3-amine (abbreviation:

2PCAPPA), N-[4-(9,10-diphenyl-2-anthryl)phenyl]-N,N,N-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N,N-triphenyl-1,4-phenylenediamine (abbreviation: 2DPAPA), N-[9,10-bis(1,1'-biphenyl-2-yl)-2-anthryl]-N,N,N-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N,N-tetrakis(4-methylphenyl)tetracene-5,11-diamine (abbreviation: p-mPhTD), 7,14-diphenyl-N,N,N,N-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-1m]perylene.

As an example of the light-emitting substance capable of converting triplet excitation energy into luminescence, a substance which emits phosphorescence (a phosphorescent compound) can be given. As the phosphorescent compound, an iridium-, rhodium-, or platinum-based organometallic complex or metal complex can be used. Furthermore, a platinum complex having a porphyrin ligand, an organoiridium complex, and the like can be given; specifically, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be given. In this case, the phosphorescent compound has an absorption band based on triplet MLCT (metal to ligand charge transfer) transition.

Examples of the substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-κN$^2$]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the materials given above, the organometallic iridium complexes having a nitrogen-containing five-membered heterocyclic skeleton, such as a 4H-triazole skeleton, a 1H-triazole skeleton, or an imidazole skeleton have high triplet excitation energy, reliability, and emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium (III) (abbreviation: Ir(dmppm-dmp)$_2$(acac)), and (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N,C$^{2'}$)iridium(III) acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the materials given above, the organometallic iridium complexes having a pyrimidine skeleton have distinctively high reliability and light emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(d1npm)$_2$(dpm)); organometallic iridium complexes having a pyrazine skeleton, such as (acetylacetonato)bis(2,3,5-triphenylpyrazinato)iridium (III) (abbreviation: Ir(tppr)$_2$(acac)), bis(2,3,5-triphenylpyrazinato) (dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N,C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP), and rare earth metal complexes such as tris(1,3-diphenyl-1,3-propanedionato) (monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and light emission efficiency and are thus particularly preferable. Further, the organometallic iridium complexes having a pyrazine skeleton can provide red light emission with favorable chromaticity.

As an example of the material that can convert the triplet excitation energy into light emission, a thermally activated delayed fluorescent (TADF) material can be given in addition to a phosphorescent compound. Therefore, the term "phosphorescent compound" in the description can be rephrased as the term "thermally activated delayed fluorescence compound". The thermally activated delayed fluorescence compound is a material having a small difference between the singlet excitation energy level and the triplet excitation energy level and a function of converting triplet excitation energy into singlet excitation energy by reverse intersystem crossing. Thus, the thermally activated delayed fluorescence material can up-convert a triplet excited state into a singlet excited state (i.e., reverse intersystem crossing is possible) using a little thermal energy and efficiently exhibit light emission (fluorescence) from the singlet excited state. The TADF is efficiently obtained under the condition where the difference between the singlet excitation energy level and the triplet excitation energy level is preferably greater than 0 eV and less than or equal to 0.3 eV, further preferably greater than 0 eV and less than or equal to 0.2 eV, still further preferably greater than 0 eV and less than or equal to 0.1 eV In the case where the thermally activated delayed fluorescence compound is composed of one kind of material, any of the following materials can be used, for example.

First, a fullerene, a derivative thereof, an acridine derivative such as proflavine, eosin, and the like can be given. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP).

As the thermally activated delayed fluorescent compound composed of one kind of material, a heterocyclic compound including a π-electron rich heteroaromatic skeleton and a π-electron deficient heteroaromatic skeleton can also be used. Specifically, 2-(biphenyl-4-yl)-4,6-bis(12-phenylindolo[2,3-α]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. The heterocyclic compound is preferable because of having the π-electron rich heteroaromatic skeleton and the π-electron deficient heteroaromatic skeleton, for which the electron-transport property and the hole-transport property are high. Among the π-electron deficient heteroaromatic skeletons, a diazine skeleton (a pyrimidine skeleton, a pyrazine skeleton, or a pyridazine skeleton) and a triazine skeleton have high stability and reliability and are particularly preferable. Among the π-electron rich heteroaromatic skeletons, an acridine skeleton, a phenoxazine skeleton, a phenothiazine skeleton, a furan skeleton, a thiophene skeleton, and a pyrrole skeleton have high stability and reliability; therefore, one or more of these skeletons are preferably included. As the pyrrole skeleton, an indole skeleton, a carbazole skeleton, or a 9-phenyl-3,3'-bi-9H-carbazole skeleton is particularly preferred. Note that a substance in which the π-electron rich heteroaromatic skeleton is directly bonded to the π-electron deficient heteroaromatic skeleton is particularly preferable because the donor property of the π-electron rich heteroaromatic skeleton and the acceptor property of the π-electron deficient heteroaromatic skeleton are both increased and the difference between the singlet excitation energy level and the triplet excitation energy level becomes small.

The material that exhibits thermally activated delayed fluorescence may be a material that can form a singlet excited state from a triplet excited state by reverse intersystem crossing or may be a combination of a plurality of materials which form an exciplex.

As the host material used for the light-emitting layers 140, 2140, and 2170, hole-transport materials and electron-transport materials can be used.

Although there is no particular limitation on a material that can be used as a host material of the light-emitting layer, for example, any of the following substances can be used for the host material: metal complexes such as tris(8-quinolinolato)aluminum(III) (abbreviation: Alq$_3$), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato) aluminum(III) (abbreviation: BAlq), bis(8-quinolinolato) zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ);

heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or α-NPD), N,N-bis(3-methylphenyl)-N,N-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). In addition, condensed polycyclic aromatic compounds such as anthracene derivatives, phenanthrene derivatives, pyrene derivatives, chrysene derivatives, and dibenzo[g,p]chrysene derivatives can be used. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 2PCAPA, 6,12-dimethoxy-5,11-diphenylchrysene, DBC1, 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more substances having a wider energy gap than the above-described light-emitting material is preferably selected from these substances and a variety of substances. Moreover, in the case where the light-emitting material is a phosphorescent compound, a substance having triplet excitation energy which is higher than that of the light-emitting material is preferably selected as the host material.

In the case where a plurality of materials are used as the host material of the light-emitting layer, it is preferable to use a combination of two kinds of compounds which form an exciplex. In this case, a variety of carrier-transport materials can be used as appropriate. In order to form an exciplex efficiently, it is particularly preferable to combine an electron-transport material and a hole-transport material.

This is because in the case where the combination of an electron-transport material and a hole-transport material which form an exciplex is used as a host material, the carrier balance between holes and electrons in the light-emitting layer can be easily optimized by adjustment of the mixture ratio of the electron-transport material and the hole-transport material. The optimization of the carrier balance between holes and electrons in the light-emitting layer can prevent a region in which electrons and holes are recombined from existing on one side in the light-emitting layer. By preventing the region in which electrons and holes are recombined from existing on one side, the reliability of the light-emitting element can be improved.

As the electron-transport material, a metal complex containing zinc or aluminum, a π-electron deficient heteroaromatic compound such as a nitrogen-containing heteroaromatic compound, or the like can be used. Specifically, any of the following can be used: bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); heterocyclic compounds having azole skeletons such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having diazine skeletons such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), and 4-{3-[3'-(9H-carbazol-9-yl)]biphenyl-3-yl}benzofuro[3,2-d]pyrimidine (abbreviation: 4mCzBPBfpm); heterocyclic compounds having triazine skeletons such as 2-{4-[3-(N-phenyl-9H-carbazol-3-yl)-9H-carbazol-9-yl]phenyl}-4,6-diphenyl-1,3,5-triazine (abbreviation: PCCzPTzn), 2,4,6-tris[3'-(pyridin-3-yl)biphenyl-3-yl]-1,3,5-triazine (abbreviation: TmPPPyTz), and 2,4,6-tris(2-pyridyl)-1,3,5-triazine (abbreviation: 2Py3Tz); and heterocyclic compounds having pyridine skeletons such as 3,5-bis[3-(9H-carbazol-9-yl)phenyl]pyridine (abbreviation: 35DCzPPy), and 1,3,5-tri[3-(3-pyridyl)phenyl]benzene (abbreviation: TmPyPB). Among the above-described materials, heterocyclic compounds having diazine skeletons and triazine skeletons and heterocyclic compounds having pyridine skeletons have high reliability and are thus preferable. Heterocyclic compounds having diazine (pyrimidine or pyrazine) skeletons and triazine skeletons have a high electron-transport property and contribute to a decrease in driving voltage.

As the hole-transport material, a π-electron rich heteroaromatic compound (e.g., a carbazole derivative or an indole derivative), an aromatic amine compound, or the like can be favorably used. Specific examples include compounds having aromatic amine skeletons, such as 2-[N-(9-phenylcarbazol-3-yl)-N-phenylamino]spiro-9,9'-bifluorene (abbreviation: PCASF), 4,4',4"-tris[N-(1-naphthyl)-N-phenylamino]triphenylamine (abbreviation: 1'-TNATA), 2,7-bis[N-(4-diphenylaminophenyl)-N-phenylamino]spiro-9,9'-bifluorene (abbreviation: DPA2SF), N,N'-bis(9-phenylcarbazol-3-yl)-N,N-diphenylbenzene-1,3-diamine (abbreviation: PCA2B), N-(9,9-dimethyl-2-diphenylamino-9H-fluoren-7-yl)diphenylamine (abbreviation: DPNF), N,N,N'-triphenyl-N,N',N'-tris(9-phenylcarbazol-3-yl)benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N-bis[4-(carbazol-9-yl)phenyl]-N,N-diphenyl-9,9-dimethylfluorene-2,7-diamine (abbreviation: YGA2F), 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(4-diphenylaminophenyl)-N-phenylamino]biphenyl (abbreviation: DPAB), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), 3-[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), N,N-bis{4-[bis(3-methylphenyl)amino]phenyl}-N,N'-diphenyl-(1,1'-biphenyl)-4,4'-diamine (abbreviation: DNTPD), 3,6-bis[N-(4-diphenylaminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), N-(4-biphenyl)-N-(9,9-dimethyl-9H-fluoren-2-yl)-9-phenyl-9H-carbazol-3-amine (abbreviation: PCBiF), and N-(1,1'-biphenyl-4-yl)-N-[4-(9-phenyl-9H-carbazol-3-yl)phenyl]-9,9-dimethyl-9H-fluoren-2-amine (abbreviation: PCBBiF); compounds having carbazole skeletons, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 9-phenyl-9H-3-(9-phenyl-9H-carbazol-3-yl)carbazole (abbreviation: PCCP); compounds having thiophene skeletons, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having furan skeletons, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in driving voltage.

Note that the combination of the materials which form an exciplex and is used as a host material is not limited to the above-described compounds, as long as they can transport carriers, the combination can form an exciplex, and light emission of the exciplex overlaps with an absorption band on the longest wavelength side in an absorption spectrum of a light-emitting material (an absorption corresponding to the transition of the light-emitting material from the singlet ground state to the singlet excited state), and other materials may be used.

As the host material of the light-emitting layer, a thermally activated delayed fluorescent material may be used.

As the electron-transport material used for the light-emitting layer, a material that is the same as the electron-transport material used for the electron-injection layer can be used. This simplifies the manufacture of the light-emitting element and reduces the manufacturing cost of the light-emitting element.

«Electron-Transport Layer»

The electron-transport layers 118, 2113, and 2118 each include a substance having a high electron-transport property. Examples of the substance having a high-electron transport property used for the electron-transport layers 118, 2113, and 2118 include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. Specifically, any of the metal complexes and the heteroaromatic compounds that are given as the examples of the compound that can be used for the electron-injection layers 130, 2130, and 2119 can be used. Note that other substances may also be used for the electron-transport layers 118, 2113, and 2118 as long as their electron-transport properties are higher than their hole-transport properties.

Each of the electron-transport layers 118, 2113, and 2118 is not limited to a single layer and may include a stack of two or more layers containing the aforementioned substances.

A layer that controls transfer of electron carriers may be provided between the electron-transport layer 118 and the light-emitting layer 140, between the electron-transport layer 2113 and the light-emitting layer 2140, and between the electron-transport layer 2118 and the light-emitting layer 2170. This is a layer formed by addition of a small amount of a substance having a high electron-trapping property to the above-described material having a high electron-transport property, and the layer is capable of adjusting carrier balance by suppressing transport of electron carriers. Such a structure is very effective in preventing a problem (such as a reduction in element lifetime) that occurs when electrons pass through the light-emitting layer.

As the electron-transport material used for the electron-transport layer, a material that is the same as the electron-transport material used for the electron-injection layer can be used. As the electron-transport material used for the electron-transport layer, a material that is the same as the electron-transport material used for the light-emitting layer can be used. With this structure, the light-emitting element can be manufactured easily and the manufacturing cost of the light-emitting element can be reduced.

Note that the hole-injection layer, the hole-transport layer, the light-emitting layer, the electron-transport layer, and the electron-injection layer described above can each be formed by an evaporation method (including a vacuum evaporation method), an inkjet method, a coating method, a gravure printing method, or the like. Besides the above-mentioned materials, an inorganic compound such as a quantum dot or a high molecular compound (e.g., an oligomer, a dendrimer, or a polymer) may be used for the hole-injection layer, the hole-transport layer, the light-emitting layer, the electron-transport layer, and the electron-injection layer.

The quantum dot may be a colloidal quantum dot, an alloyed quantum dot, a core-shell quantum dot, or a core quantum dot, for example. The quantum dot containing elements belonging to Groups 2 and 16, elements belonging to Groups 13 and 15, elements belonging to Groups 13 and 17, elements belonging to Groups 11 and 17, or elements belonging to Groups 14 and 15 may be used. Alternatively, the quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

An example of the liquid medium used for the wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

Examples of the high molecular compound that can be used for the light-emitting layer include a polyphenylenevinylene (PPV) derivative such as poly[2-methoxy-5-(2-ethylhexyloxy)-1,4-phenylenevinylene] (abbreviation: MEH-PPV) or poly(2,5-dioctyl-1,4-phenylenevinylene); a polyfluorene derivative such as poly(9,9-di-n-octylfluorenyl-2,7-diyl) (abbreviation: PF8), poly[(9,9-di-n-octylfluorenyl-2,7-diyl)-alt-(benzo[2,1,3]thiadiazole-4,8-diyl)] (abbreviation: F8BT), poly(9,9-di-n-octylfluorenyl-2,7-diyl)-alt-(2,2'-bithiophene-5,5'-diyl)] (abbreviation: F8T2), poly[(9,9-dioctyl-2,7-divinylenefluorenylene)-alt-(9,10-anthracene)], or poly[(9,9-dihexylfluorene-2,7-diyl)-alt-(2,5-dimethyl-1,4-phenylene)]; a polyalkylthiophene (PAT) derivative such as poly(3-hexylthiophen-2,5-diyl) (abbreviation: P3HT); and a polyphenylene derivative. These high molecular compounds or a high molecular compound such as poly(9-vinylcarbazole) (abbreviation: PVK), poly(2-vinylnaphthalene), or poly[bis(4-phenyl) (2,4,6-trimethylphenyl)amine] (abbreviation: PTAA) may be doped with a light-emitting low molecular compound and used for the light-emitting layer. As the light-emitting low molecular compound, any of the above-described fluorescent compounds can be used.

«Pair of Electrodes»

The electrodes 101, 102, 2101, 2102, 2103, and 2104 each function as an anode or a cathode of the light-emitting element. The electrodes 101, 102, 2101, 2102, 2103, and 2104 can each be formed using a metal, an alloy, or a conductive compound, a mixture or a stack thereof, or the like.

The electrode 101 or the electrode 102 is preferably formed using a conductive material having a function of reflecting light. The electrode 2102 or the electrodes 2101, 2103, and 2104 are preferably formed using a conductive material having a function of reflecting light. Examples of the conductive material include aluminum (Al), an alloy containing Al, and the like. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistivity and high light reflectivity. Aluminum is included in earth's crust in large amount and is inexpensive; therefore, it is possible to reduce costs for manufacturing a light-emitting element with aluminum. Silver (Ag) can be suitably used as a material for the electrode because it has a high light reflectivity. Furthermore, Ag is a transition metal belonging to Group 11, and Ag is preferably used as the cathode of the light-emitting element in which Ag is used for the electron-injection layer, in which case the adhesion between the electrode and the electron-injection layer is improved. Alternatively, an alloy of Ag and N (N is one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), and gold (Au)) can be used, for example. Examples of the alloy containing silver include an alloy containing silver, palladium, and copper, an alloy containing silver and copper, an alloy containing silver and magnesium, an alloy containing silver and nickel, an alloy containing silver and gold, an alloy containing silver and ytterbium, and the like. Besides, a transition metal such as tungsten, chromium (Cr), molybdenum (Mo), copper, or titanium can be used.

Light emitted from the light-emitting layer is extracted through the electrodes 101 and/or 102 or through the electrode 2102 and/or the electrodes 2101, 2103, and 2104. Thus, at least one of the electrodes 101 and 102 and at least one of the electrode 2102 and a group of the electrodes 2101, 2103, and 2104 are preferably formed using a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1 \times 10^{-2}$ Ω·cm can be used.

The electrodes 101, 102, 2101, 2102, 2103, and 2104 may each be formed using a conductive material having a function of transmitting and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1 \times 10^{-2}$ Ω·cm can be used. For example, one or more kinds of conductive metals and alloys, conductive compounds, and the like can be used. Specifically, a metal oxide such as indium tin oxide (hereinafter, referred to as ITO), indium tin oxide containing silicon or silicon oxide (ITSO), indium oxide-zinc oxide (indium zinc oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

The conductive layer 2101b, the conductive layer 2103b, and the conductive layer 2104b are each preferably formed using the above-described conductive material having a function of transmitting light. The conductive layer 2101a, the conductive layer 2103a, and the conductive layer 2104a are each preferably formed using the conductive material having a function of reflecting light, the conductive material having a function of transmitting light, or the conductive material having a function of transmitting and reflecting light.

In this specification and the like, as the material having a function of transmitting light, a material that transmits visible light and has conductivity is used. Examples of the material include, in addition to the above-described oxide conductor typified by an ITO, an oxide semiconductor and an organic conductor containing an organic substance. Examples of the organic conductor containing an organic substance include a composite material in which an organic compound and an electron donor (donor) are mixed and a composite material in which an organic compound and an electron acceptor (acceptor) are mixed. Alternatively, an inorganic carbon-based material such as graphene may be used. The resistivity of the material is preferably lower than or equal to $1\times10^5\,\Omega\cdot\text{cm}$, further preferably lower than or equal to $1\times10^4\,\Omega\cdot\text{cm}$.

Alternatively, one or both of the electrodes 101 and 102 and one or both of the electrode 2102 and the group of the electrodes 2101, 2103, and 2104 may be formed by stacking a plurality of the above-described materials.

In order to improve the light extraction efficiency, a material whose refractive index is higher than that of an electrode having a function of transmitting light may be formed in contact with the electrode. The material may be conductive or non-conductive as long as it has a function of transmitting visible light. In addition to the oxide conductors described above, an oxide semiconductor and an organic substance are given as the examples of the material. Examples of the organic substance include the materials for the light-emitting layer, the hole-injection layer, the hole-transport layer, the electron-transport layer, and the electron-injection layer. Alternatively, an inorganic carbon-based material or a metal film thin enough to transmit light can be used. Further alternatively, stacked layers with a thickness of several nanometers to several tens of nanometers may be used.

In the case where the electrode 101 or the electrode 102 functions as the cathode, the electrode preferably contains a material having a low work function (3.8 eV or lower). In the case where the electrode 2102 or the electrodes 2101, 2103, and 2104 function as the cathode, the electrode(s) preferably contain(s) a material having a low work function (3.8 eV or lower).

In the case where the electrode 101 or the electrode 102 is used as an anode, the anode preferably contains a material having a high work function (4.0 eV or higher). In the case where the electrode 2102 or the electrodes 2101, 2103, and 2104 function as the anode, the anode preferably contains a material having a high work function (4.0 eV or higher).

The electrode 101 and the electrode 102 may each be a stack of a conductive material having a function of reflecting light and a conductive material having a function of transmitting light. Such a structure is preferable because the electrodes 101 and 102 can each have a function of adjusting the optical path length so that light with a desired wavelength that is emitted from each light-emitting layer resonates and intensifies. Similarly, the electrode 2102 and/or the electrodes 2101, 2103, and 2104 may each be a stack of a conductive material having a function of reflecting light and a conductive material having a function of transmitting light. Such a structure is preferable because the electrodes 2101, 2102, 2103, and 2104 can each have a function of adjusting the optical path length such that light with a desired wavelength that is emitted from each light-emitting layer resonates and intensifies.

As the method for forming the electrodes 101, 102, 2101, 2102, 2103, and 2104, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

«Microcavity Structure»

The light-emitting element of one embodiment of the present invention can employ a micro optical resonator (microcavity) structure in which the electrode 2101 is formed using a conductive material having a function of reflecting light and the electrode 2102 is formed using a conductive material having a function of transmitting and reflecting light as shown in FIGS. 49A and 49B, for example. With such a structure, light emitted from the light-emitting layer 2140 or the light-emitting layer 2170 can resonate between the electrodes, and desired light among light emitted through the electrode 2102 can be intensified.

Note that in this embodiment, light is extracted to the electrode 2102 side (the cathode side); however, light may be extracted to the electrode 2101 side (the anode side). In that case, the electrode 2101 is formed using a conductive material having a function of reflecting and transmitting light, and the electrode 2102 is formed using a conductive material having a function of reflecting light.

Light emitted from the light-emitting layers 2140 and 2170 resonates between a pair of electrodes (e.g., the electrode 2101 and the electrode 2102). The light-emitting layers 2140 and 2170 are formed at positions that increase the intensity of light of a desired wavelength among light to be emitted. For example, by adjusting an optical path length from a reflective region of the electrode 2101 to a light-emitting region of the light-emitting layer 2170 and an optical path length from a reflective region of the electrode 2102 to the light-emitting region of the light-emitting layer 2170, light of a desired wavelength among light emitted from the light-emitting layer 2170 can be intensified. For example, by adjusting an optical path length from the reflective region of the electrode 2101 to a light-emitting region of the light-emitting layer 2140 and an optical path length from the reflective region of the electrode 2102 to the light-emitting region of the light-emitting layer 2140, the light of a desired wavelength among light emitted from the light-emitting layer 2140 can be intensified. When a light-emitting element has a stack of a plurality of light-emitting layers (here, the light-emitting layers 2140 and 2170), the optical path lengths of the light-emitting layers 2140 and 2170 are preferably optimized.

For example, to amplify light of a desired wavelength (wavelength: k) obtained from the light-emitting layer 2140, the optical path length from the reflective region of the electrode 2101 to a region where the light of the desired wavelength is obtained in the light-emitting layer 2140 (the light-emitting region) and the optical path length from the reflective region of the electrode 2102 to the region where the light of the desired wavelength is obtained in the light-emitting layer 2140 (the light-emitting region) are preferably adjusted to around $(2m'-1)\lambda/4$ (m' is a natural number). Here, the light-emitting region means a region where holes and electrons are recombined in the light-emitting layer 2140.

By such optical adjustment, the spectrum of light emitted from the light-emitting layer 2140 can be narrowed and light emission with a high color purity can be obtained.

«Substrate»

The light-emitting element of one embodiment of the present invention may be formed over a substrate of glass, plastic, or the like. As the way of stacking layers over the substrate, layers may be sequentially stacked from the electrode 101 side or sequentially stacked from the electrode 102 side. As the way of stacking layers of the light-emitting element 2250a and the light-emitting element 2250b, the layers may be sequentially stacked from the electrode 2101 side, the electrode 2102 side, and the electrode 2103 side or sequentially stacked from the electrode 2102 side.

For the substrate over which the light-emitting element of one embodiment of the present invention can be formed, glass, quartz, plastic, or the like can be used, for example. Alternatively, a flexible substrate can be used. The flexible substrate is a substrate that can be bent, such as a plastic substrate made of polycarbonate or polyarylate, for example. A film, an inorganic vapor deposition film, or the like can also be used. Another material may be used as long as the substrate functions as a support in a manufacturing process of the light-emitting elements or the optical elements. Another material having a function of protecting the light-emitting elements or the optical elements may be used.

In this specification and the like, a light-emitting element can be formed using any of a variety of substrates, for example. The type of a substrate is not limited particularly. Examples of the substrate include a semiconductor substrate (e.g., a single-crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, a base material film, and the like. As an example of a glass substrate, a barium borosilicate glass substrate, an aluminoborosilicate glass substrate, a soda lime glass substrate, or the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Alternatively, polypropylene, polyester, polyvinyl fluoride, polyvinyl chloride, or the like can be used. Alternatively, polyamide, polyimide, aramid, epoxy, an inorganic vapor deposition film, paper, or the like can be used.

A flexible substrate may be used as the substrate, and the light-emitting element may be provided directly on the flexible substrate. A separation layer may be provided between the substrate and the light-emitting element. The separation layer can be used when part or the whole of the light-emitting element formed over the separation layer is completed, separated from the substrate, and transferred to another substrate. In such a case, the light-emitting element can be transferred to a substrate having low heat resistance or a flexible substrate as well. For the above separation layer, a stack including inorganic films, which are a tungsten film and a silicon oxide film, or a resin film of polyimide or the like formed over a substrate can be used, for example.

In other words, after the light-emitting element is formed using a substrate, the light-emitting element may be transferred to another substrate. Examples of a substrate to which the light-emitting element is transferred include, in addition to the above-described substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester, or the like), a leather substrate, and a rubber substrate. By using such a substrate, a light-emitting element with high durability, a light-emitting element with high heat resistance, a lightweight light-emitting element, or a thin light-emitting element can be obtained.

The light-emitting element 150, the light-emitting element 2250a, and the light-emitting element 2250b may each be formed over an electrode electrically connected to a field-effect transistor (FET), for example, that is formed over any of the above-described substrates. Accordingly, an active matrix display device in which the FET controls the driving of the light-emitting element can be manufactured.

As the substrate 2220 over which the optical element is formed, the above-described substrate can be used.

«Light-Blocking Layer»

The light-blocking layer 2223 has a function of reducing the reflection of external light. The light-blocking layer 2223 has a function of preventing mixing of light emitted from an adjacent light-emitting element. As the light-blocking layer 2223, a metal, a resin containing black pigment, carbon black, a metal oxide, a composite oxide containing a solid solution of a plurality of metal oxides, or the like can be used.

«Optical Element»

The optical elements 2224B, 2224G, and 2224R each have a function of selectively transmitting light of a particular color out of incident light. For example, the light emitted from the region 2222B through the optical element 2224B is blue light, the light emitted from the region 2222G through the optical element 2224G is green light, and the light emitted from the region 2222R through the optical element 2224R is red light.

For example, a coloring layer (also referred to as color filter), a band pass filter, a multilayer filter, or the like can be used for the optical elements 2224R, 2224G, and 2224B. Alternatively, color conversion elements can be used as the optical elements. A color conversion element is an optical element that converts incident light into light having a longer wavelength than the incident light. As the color conversion elements, quantum-dot elements can be favorably used. Using the quantum-dot type can increase color reproducibility of the display device.

One or more of optical elements may further be stacked over each of the optical elements 2224R, 2224G, and 2224B. As another optical element, a circularly polarizing plate, an anti-reflective film, or the like can be provided, for example. A circularly polarizing plate provided on the side where light emitted from the light-emitting element of the display device is extracted can prevent a phenomenon in which light entering from the outside of the display device is reflected inside the display device and returned to the outside. An anti-reflective film can weaken external light reflected by a surface of the display device. This leads to clear observation of light emitted from the display device.

«Partition Wall»

The partition wall 2145 has an insulating property and is formed using an inorganic or organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

Note that a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

The structure described in this embodiment can be used in appropriate combination with any of the other embodiments as appropriate.

Embodiment 2

Figure 3A:
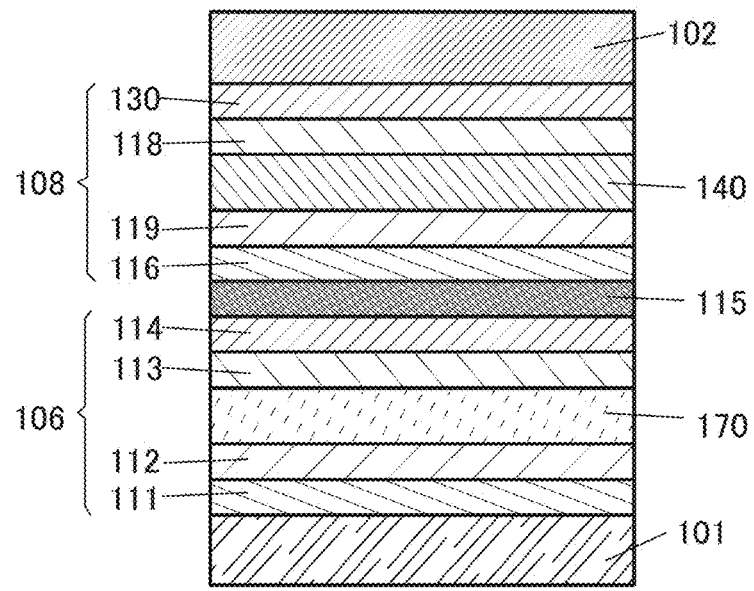
FIGS. 3A and 3B are schematic cross-sectional views each illustrating a light-emitting element of one embodiment of the present invention.
Figure 3B:
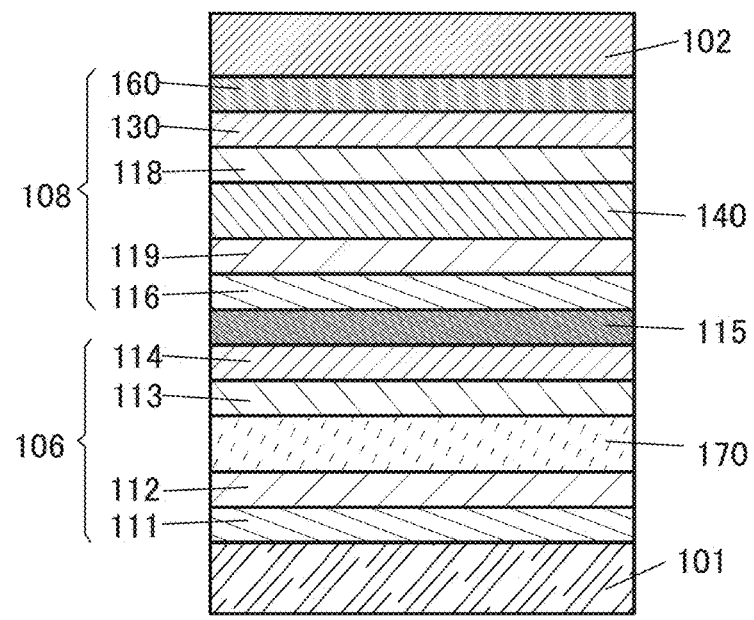

In this embodiment, a light-emitting element having a structure different from that described in Embodiment 1 and a light emission mechanism of the light-emitting element are described below with reference to FIGS. 3A and 3B. In FIGS. 3A and 3B, a portion having a function similar to that in FIG. 1A is represented by the same hatch pattern as in FIG. 1A and not especially denoted by a reference numeral in some cases. In addition, common reference numerals are used for portions having similar functions, and a detailed description of the portions is omitted in some cases.

Structure Example 5 of Light-Emitting Element

FIGS. 3A and 3B are schematic cross-sectional views of a light-emitting element 250 and a light-emitting element 252.

The light-emitting elements 250 and 252 shown in FIGS. 3A and 3B each include a plurality of light-emitting units (a light-emitting unit 106 and a light-emitting unit 108 in FIGS. 3A and 3B) between the pair of electrodes (the electrode 101 and the electrode 102). Note that the electrode 101 functions as an anode and the electrode 102 functions as a cathode in the following description of the light-emitting elements 250 and 252; however, the functions may be interchanged in the light-emitting element 250.

In the light-emitting elements 250 and 252 shown in FIGS. 3A and 3B, the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures.

The light-emitting elements 250 and 252 each include the light-emitting layer 140 and a light-emitting layer 170. The light-emitting unit 106 includes the hole-injection layer 111, the hole-transport layer 112, an electron-transport layer 113, and an electron-injection layer 114 in addition to the light-emitting layer 170. The light-emitting unit 108 includes a hole-injection layer 116, a hole-transport layer 119, the electron-transport layer 118, and the electron-injection layer 130 in addition to the light-emitting layer 140.

The composite material of the transition metal and the organic compound having an unshared electron pair, which is described in Embodiment 1, can be suitably used for the electron-injection layer 114 and the electron-injection layer 130. With such a structure, a highly reliable light-emitting element that has high moisture resistance and can be driven at a low voltage can be provided. Furthermore, the charge-generation layer 160 may be provided between the electron-injection layer 130 and the electrode 102 as in the light-emitting element 252 shown in FIG. 3B. With the structure, the element can be further improved in the moisture resistance and the oxidation resistance.

Each of the charge-generation layers 115 and 160 may have either a structure in which an acceptor substance, i.e., an electron acceptor, is added to a hole-transport material or a structure in which a donor substance, i.e., an electron donor, is added to an electron-transport material as described above. Alternatively, both of these structures may be stacked. With the structure, a light-emitting element with high moisture resistance can be easily manufactured.

In the light-emitting elements of one embodiment of the present invention, the charge-generation layers 115 and 160 may be formed using the same material. For example, the charge-generation layers 115 and 160 may be formed using the same hole-transport material and the same acceptor material. With the structure, a light-emitting element with high moisture resistance can be easily manufactured.

The charge-generation layer 115 provided between the light-emitting unit 106 and the light-emitting unit 108 may have any structure as long as electrons can be injected into the light-emitting unit on one side and holes can be injected into the light-emitting unit on the other side when a voltage is applied between the electrode 101 and the electrode 102. For example, in FIGS. 3A and 3B, the charge-generation layer 115 injects electrons into the light-emitting unit 106 and holes into the light-emitting unit 108 when a voltage is applied such that the potential of the electrode 101 is higher than that of the electrode 102.

The light-emitting element having two light-emitting units has been described with reference to FIGS. 3A and 3B; however, a similar structure can be applied to a light-emitting element in which three or more light-emitting units are stacked. With a plurality of light-emitting units partitioned by the charge-generation layer between a pair of electrodes as in the light-emitting element 250, it is possible to provide a light-emitting element which can emit light with high luminance with the current density kept low and has a long lifetime. In addition, a light-emitting element with low power consumption can be realized.

Note that in each of the above-described structures, the emission colors of the guest materials used in the light-emitting unit 106 and the light-emitting unit 108 may be the same or different. In the case where guest materials emitting light of the same color are used for the light-emitting unit 106 and the light-emitting unit 108, the light-emitting elements 250 and 252 can exhibit high emission luminance at a small current value, which is preferable. In the case where guest materials emitting light of different colors are used for the light-emitting unit 106 and the light-emitting unit 108, the light-emitting element 250 can exhibit multi-color light emission, which is preferable. In that case, when a plurality of light-emitting materials with different emission wavelengths are used in one or both of the light-emitting layers 140 and 170, the light-emitting element 250 emits light obtained by synthesizing lights with different emission peaks. That is, the emission spectrum of the light-emitting element 250 has at least two maximum values.

The above structure is also suitable for obtaining white light emission. When the light-emitting layer 140 and the light-emitting layer 170 emit light of complementary colors, white light emission can be obtained. It is particularly favorable to select the guest materials so that white light emission with high color rendering properties or light emission of at least red, green, and blue can be obtained.

Note that when a light-emitting element in which three or more light-emitting units are stacked is used, the emission colors of the guest materials used in the light-emitting units may be the same or different. In the case where a light-emitting element includes light-emitting units that exhibit the same emission color, the emission color of the light-emitting units can have higher light emission luminance at a smaller current value than another emission color of a light-emitting unit. Such a structure can be suitably used to adjust light emission colors. The structure is particularly suitable when guest materials that have different emission efficiency and exhibit different emission colors are used. For example, when the light-emitting element includes three layers of light-emitting units, the light-emitting units are two light-emitting units including a fluorescent compound and emitting light of the same color and one light-emitting unit including a phosphorescent compound and emitting light of a color different from the color of the fluorescent compound, in which case the intensity of fluorescence and phosphorescence can be adjusted. That is, the emission intensity of light of each color can be adjusted by the number of light-emitting units.

When the light-emitting element includes two layers of fluorescence-emitting units and one layer of a phosphorescence-emitting unit, preferable combinations of the emitting units are as follows: a combination of the two layers of fluorescence-emitting units including a blue fluorescent compound and the one layer of the phosphorescence-emitting unit including a yellow phosphorescent compound; a combination of the two layers of fluorescence-emitting units including a blue fluorescent compound and the one layer of the phosphorescence-emitting unit including a red phosphorescent compound and a green phosphorescent compound; and a combination of the two layers of fluorescence-emitting units including a blue fluorescent compound and the one layer of the phosphorescence-emitting unit including a red phosphorescent compound, a yellow phosphorescent compound, and a green phosphorescent compound. The combinations are preferable because they enable efficient white-light emission.

At least one of the light-emitting layers 140 and 170 may be further divided into layers and the divided layers may contain different light-emitting materials. That is, at least one of the light-emitting layers 140 and 170 may consist of two or more layers. For example, in the case where the light-emitting layer is formed by stacking a first light-emitting layer and a second light-emitting layer in this order from the hole-transport layer side, the first light-emitting layer is formed using a material having a hole-transport property as the host material and the second light-emitting layer is formed using a material having an electron-transport property as the host material. In that case, a light-emitting material included in the first light-emitting layer may be the same as or different from a light-emitting material included in the second light-emitting layer. In addition, the materials may have functions of emitting light of the same color or light of different colors. White light emission with a high color rendering property that is formed of three primary colors or four or more colors can be obtained by using a plurality of light-emitting materials emitting light of different colors.

Note that the light-emitting units 106 and 108 and the charge-generation layer 115 can be formed by an evaporation method (including a vacuum evaporation method), an ink-jet method, a coating method, gravure printing, or the like.

Note that the structure described in this embodiment can be used in appropriate combination with any of the structures described in the other embodiments.

Embodiment 3

In this embodiment, examples of a light-emitting device using the light-emitting element described in Embodiments 1 and 2 are described below with reference to FIGS. 4A and 4B, FIGS. 5A and 5B, and FIG. 6.

FIG. 4A is a top view of the light-emitting device and FIG. 4B is a cross-sectional view taken along the lines A-B and C-D in FIG. 4A. The light-emitting device includes a driver circuit portion (source side driver circuit) 601, a pixel portion 602, and a driver circuit portion (gate side driver circuit) 603, which control light emission of a light-emitting element and are illustrated with dotted lines. Moreover, a reference numeral 604 denotes a sealing substrate, a reference numeral 625 denotes a desiccant, and a reference numeral 605 denotes a sealant. A portion surrounded by the sealant 605 is a space 607.

Note that a lead wiring 608 is a wiring for transmitting signals to be input to the source side driver circuit 601 and the gate side driver circuit 603 and for receiving a video signal, a clock signal, a start signal, a reset signal, and the like from a flexible printed circuit (FPC) 609 functioning as an external input terminal. Although only the FPC is illustrated here, a printed wiring board (PWB) may be attached to the FPC. The light-emitting device in this specification includes, in its category, not only the light-emitting device itself but also the light-emitting device provided with the FPC or the PWB.

Next, a cross-sectional structure of the light-emitting device is described with reference to FIG. 4B. The driver circuit portion and the pixel portion are formed over an element substrate 610. Here, the source side driver circuit 601, which is the driver circuit portion, and one pixel of the pixel portion 602 are illustrated.

In the source side driver circuit 601, a CMOS circuit is formed in which an n-channel TFT 623 and a p-channel TFT 624 are combined. The driver circuit may be formed using various circuits such as a CMOS circuit, a PMOS circuit, or an NMOS circuit. Although a driver-integrated type in which the driver circuit is formed over the substrate is described in this embodiment, the driver circuit is not necessarily formed over the substrate, and may be formed outside the substrate.

The pixel portion 602 includes a plurality of pixels including a switching TFT 611, a current controlling TFT 612, and a first electrode 613 electrically connected to a drain of the current controlling TFT 612. Note that an insulator 614 is formed to cover an end portion of the first electrode 613. The insulator 614 can be formed using a positive photosensitive resin film.

In order to improve coverage with a film that is formed over the insulator 614, the insulator 614 is formed to have a curved surface with curvature at its upper or lower end portion. For example, in the case where photosensitive acrylic is used as a material of the insulator 614, only the upper end portion of the insulator 614 preferably has a curved surface. The radius of curvature of the curved surface is preferably greater than or equal to 0.2 μm and less than or equal to 0.3 μm. As the insulator 614, either a negative photosensitive material or a positive photosensitive material can be used.

An EL layer 616 and a second electrode 617 are formed over the first electrode 613. As a material used for the first electrode 613 which functions as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack including a titanium nitride film and a film containing aluminum as its main component, a stack including three layers of a titanium nitride film, a film containing aluminum as its main component, and a titanium nitride film, or the like can be used. The stacked structure achieves low wiring resistance, a favorable ohmic contact, and a function as an anode.

The EL layer 616 is formed by any of a variety of methods such as an evaporation method using an evaporation mask, an inkjet method, and a spin coating method. As another material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al) is preferably used. In the case where light generated in the EL layer 616 passes through the second electrode 617, a stack including a thin metal film and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that a light-emitting element 618 is formed with the first electrode 613, the EL layer 616, and the second electrode 617. The light-emitting element 618 preferably has the structure described in Embodiment 1 and Embodiment 2. In the light-emitting device of this embodiment, the pixel portion, which includes a plurality of light-emitting elements, may include both the light-emitting element with the structure described in Embodiment 1 and Embodiment 2 and a light-emitting element with a different structure.

The sealing substrate 604 is attached to the element substrate 610 with the sealant 605, so that the light-emitting element 618 is provided in the space 607 surrounded by the element substrate 610, the sealing substrate 604, and the sealant 605. The space 607 is filled with a filler. The filler may be an inert gas (such as nitrogen or argon), or a resin and/or a desiccant.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastic (FRP), polyvinyl fluoride (PVF), polyester, acrylic, or the like can be used.

As described above, the light-emitting device including the light-emitting element described in Embodiments 1 and 2 can be obtained.

Structure Example 1 of Light-Emitting Device

As an example of a light-emitting device, FIGS. 5A and 5B each show a light-emitting device including a light-emitting element exhibiting white light emission and a coloring layer (a color filter).

FIG. 5A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition wall 1026, an EL layer 1028, a second electrode 1029 of the light-emitting elements, a sealing substrate 1031, a sealant 1032, and the like.

In FIGS. 5A and 5B, coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 5A, light emitted from some of the light-emitting layers does not pass through the coloring layers, while light emitted from the others of the light-emitting layers passes through the coloring layers. Since light that does not pass through the coloring layers is white and light that passes through any one of the coloring layers is red, blue, or green, an image can be displayed using pixels of the four colors.

FIG. 5B shows an example in which the red coloring layer 1034R, the green coloring layer 1034G, and the blue coloring layer 1034B are formed between the gate insulating film 1003 and the first interlayer insulating film 1020. As shown in FIG. 5B, the coloring layers may be provided between the substrate 1001 and the sealing substrate 1031.

The above-described light-emitting device has a structure in which light is extracted from the substrate 1001 side where the TFTs are formed (a bottom emission structure), but may have a structure in which light is extracted from the sealing substrate 1031 side (a top emission structure).

Structure Example 2 of Light-Emitting Device

Figure 6:
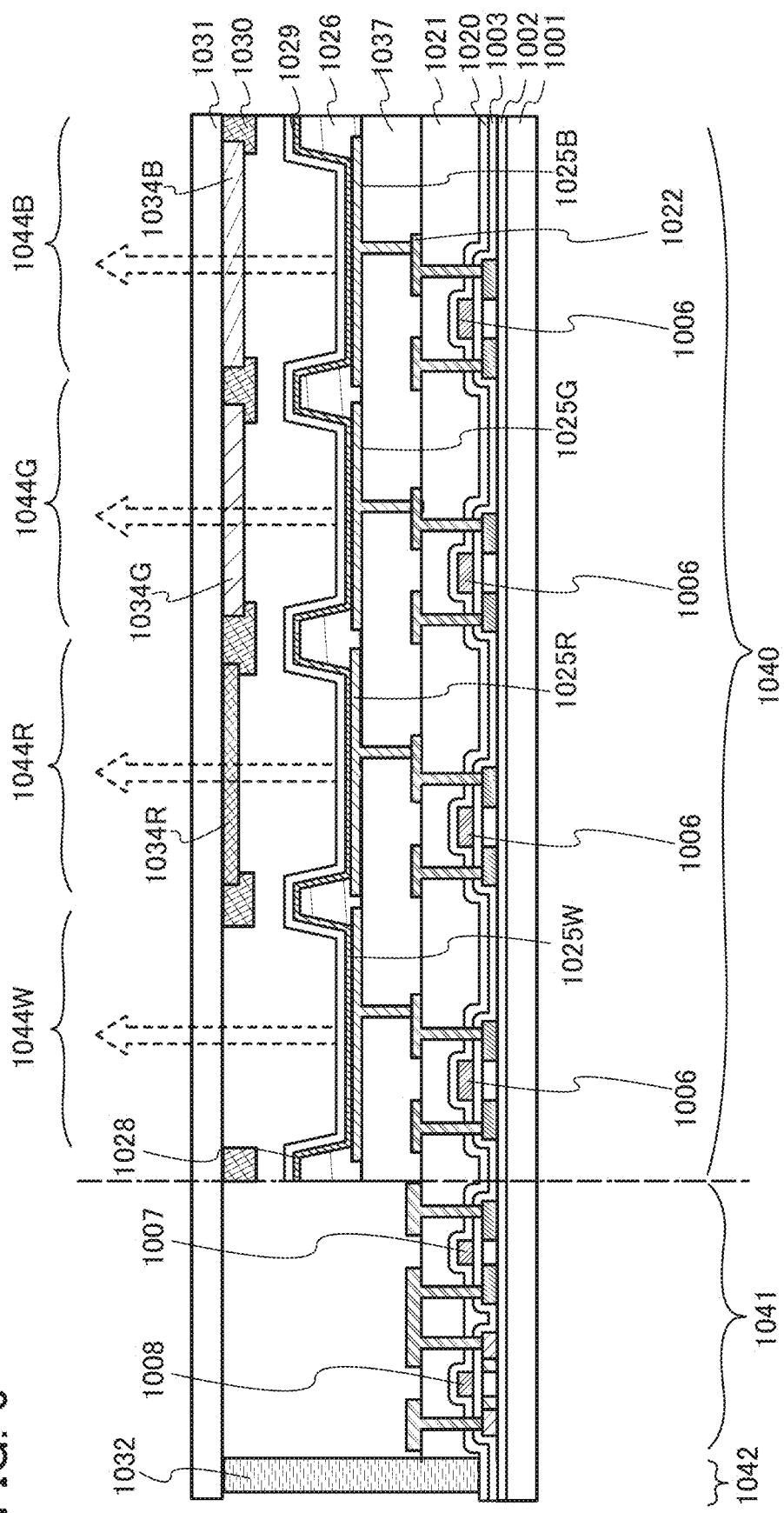
FIG. 6 is a schematic cross-sectional view illustrating a display device of one embodiment of the present invention.

FIG. 6 is a cross-sectional view of a light-emitting device having a top emission structure. In this case, a substrate that does not transmit light can be used as the substrate 1001. The process up to the step of forming of a connection electrode which connects the TFT and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film 1021, or can be formed using any other various materials.

First lower electrodes 1025W, 1025R, 1025G, and 1025B of the light-emitting elements each function as an anode here, but may function as a cathode. Furthermore, in the case of the light-emitting device having a top emission structure as shown in FIG. 6, the lower electrodes 1025W, 1025R, 1025G, and 1025B are preferably reflective electrodes. Note that the second electrode 1029 preferably has a function of reflecting light and a function of transmitting light. It is preferable that a microcavity structure be used between the second electrode 1029 and the lower electrodes 1025W, 1025R, 1025G, and 1025B, in which case light having a specific wavelength is amplified. The EL layer 1028 is formed to have a structure similar to the structure described in Embodiment 2, with which white light emission can be obtained.

In FIGS. 5A and 5B and FIG. 6, the structure of the EL layer for providing white light emission can be achieved by, for example, using a plurality of light-emitting layers or using a plurality of light-emitting units. Note that the structure to provide white light emission is not limited to the above.

In the case of a top emission structure as shown in FIG. 6, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (the black matrix) 1030 which is positioned between pixels. The coloring layers (the red coloring layer 1034R, the green coloring layer 1034G, and the blue coloring layer 1034B) and the black layer (the black matrix) may be covered with the overcoat layer. Note that a light-transmitting substrate is used as the sealing substrate 1031.

Although an example in which full color display is performed using four colors of red, green, blue, and white is shown here, there is no particular limitation and full color display using three colors of red, green, and blue or four colors of red, green, blue, and yellow may be performed.

As described above, the light-emitting device including the light-emitting element described in Embodiments 1 and 2 can be obtained.

Note that this embodiment can be combined with any of the other embodiments as appropriate.

Embodiment 4

In this embodiment, a transistor that can be used in a display device of one embodiment of the present invention will be described with reference to FIGS. 7A to 7G.

Figure 7A:
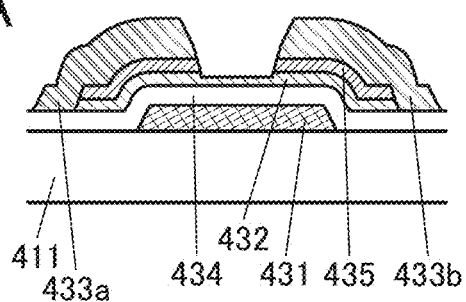
FIGS. 7A to 7G are cross-sectional views illustrating examples of a transistor.

A transistor shown in FIG. 7A is what is called a channel-etched bottom-gate transistor. The transistor includes a conductive layer 431 functioning as a gate electrode, an insulating layer 434 functioning as a gate insulating layer, a semiconductor layer 432, and a pair of conductive layers 433a and 433b functioning as a source electrode and a drain electrode over a substrate 411. A region of the semiconductor layer 432 overlapping with the conductive layer 431 functions as a channel formation region. The semiconductor layer 432 is connected to the conductive layers 433a and 433b.

The transistor shown in FIG. 7A includes a pair of impurity semiconductor layers 435 functioning as a source region and a drain region. The impurity semiconductor layers 435 are provided between the semiconductor layer 432 and the conductive layer 433a and between the semiconductor layer 432 and the conductive layer 433b. The semiconductor layer 432 and the impurity semiconductor layers 435 are provided in contact with each other. The impurity semiconductor layer 435 is provided in contact with the conductive layer 433a or the conductive layer 433b.

For example, a semiconductor containing silicon can be used as the semiconductor layer 432. For example, hydrogenated amorphous silicon, microcrystalline silicon, or polycrystalline silicon can be used as the semiconductor containing silicon. Hydrogenated amorphous silicon is particularly preferable because it can be formed over a large substrate with a high yield. The display device of one embodiment of the present invention can display an image favorably even when a transistor containing amorphous silicon that has relatively low field-effect mobility is used.

An organic substance can be used for the semiconductor layer 432. For example, the above-described electron-transport material or hole-transport material can be used as the organic substance. Furthermore, a high molecular compound such as polythiophene, poly-paraphenylene vinylene, or polydiacetylene can be used. Note that the organic substance is not limited thereto.

The impurity semiconductor film to form the impurity semiconductor layer 435 is formed using a semiconductor to which an impurity element imparting one conductivity type is added. In the case where the transistor is an n-channel transistor, for example, silicon to which P or As is added is given as a semiconductor to which an impurity element imparting one conductivity type is added. In the case where the transistor is a p-channel transistor, for example, it is possible to add B as the impurity element imparting one conductivity type; however, it is preferable to use an n-channel transistor. Note that the impurity semiconductor layer may be formed using an amorphous semiconductor or a crystalline semiconductor such as a microcrystalline semiconductor. Note that the composite material of the transition metal and the organic compound having an unshared electron pair, which is described in Embodiment 1, can be suitably used for the impurity semiconductor layer 435.

Figure 7B:
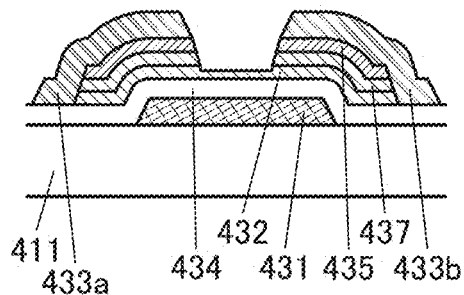

A transistor shown in FIG. 7B includes a semiconductor layer 437 between the semiconductor layer 432 and the impurity semiconductor layer 435.

The semiconductor layer 437 may be formed using the same semiconductor film as the semiconductor layer 432. The semiconductor layer 437 can function as an etching stopper for preventing the semiconductor layer 432 from being removed at the time of etching for forming the impurity semiconductor layer 435. Although FIG. 7A shows an example where the semiconductor layer 437 is divided into a right portion and a left portion, part of the semiconductor layer 437 may cover a channel formation region of the semiconductor layer 432.

Furthermore, the concentration of an impurity contained in the semiconductor layer 437 may be lower than that contained in the impurity semiconductor layer 435. Thus, the semiconductor layer 437 can function as a lightly doped drain (LDD) region and can suppress hot carrier degradation when the transistor is driven.

Figure 7C:
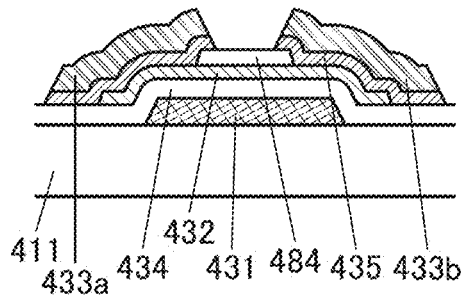

In a transistor shown in FIG. 7C, an insulating layer 484 is provided over a channel formation region of the semiconductor layer 432. The insulating layer 484 functions as an etching stopper at the time of etching for forming the impurity semiconductor layers 435.

Figure 7D:
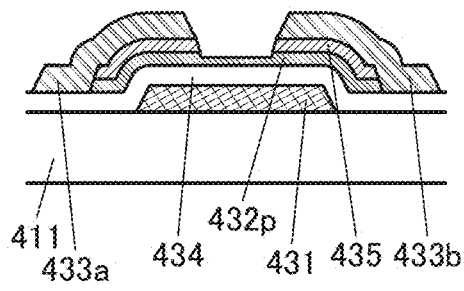

A transistor shown in FIG. 7D includes a semiconductor layer 432p instead of the semiconductor layer 432. The semiconductor layer 432p includes a semiconductor film having high crystallinity. For example, the semiconductor layer 432p includes a polycrystalline semiconductor or a single-crystal semiconductor. Thus, a transistor having high field-effect mobility can be provided.

Figure 7E:
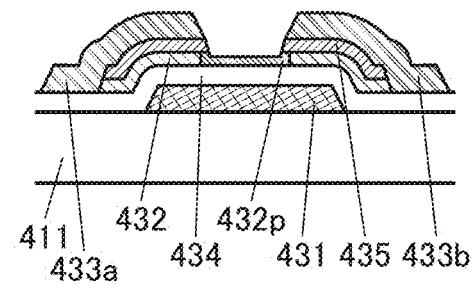

A transistor shown in FIG. 7E includes the semiconductor layer 432p in a channel formation region of the semiconductor layer 432. For example, the transistor shown in FIG. 7E can be formed by irradiating a semiconductor film to be the semiconductor layer 432 with laser light or the like so that the semiconductor film is crystallized locally. Thus, a transistor having high field-effect mobility can be provided.

Figure 7F:
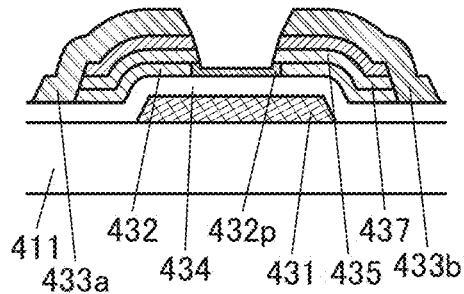

A transistor shown in FIG. 7F includes the semiconductor layer 432p having crystallinity in a channel formation region of the semiconductor layer 432 of the transistor shown in FIG. 7B.

Figure 7G:
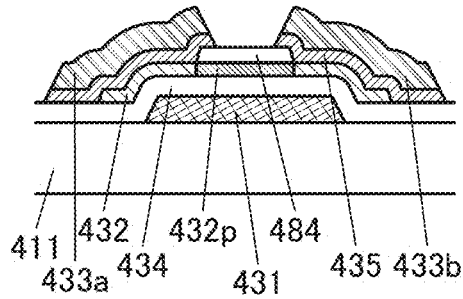

A transistor shown in FIG. 7G includes the semiconductor layer 432p having crystallinity in a channel formation region of the semiconductor layer 432 of the transistor shown in FIG. 7C.

Components of the transistor will be described below in detail.

The transistors each include a conductive layer functioning as the gate electrode, the semiconductor layer, a conductive layer functioning as the source electrode, a conductive layer functioning as the drain electrode, and an insulating layer functioning as a gate insulating layer.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be suppressed.

Silicon can be used as a semiconductor in which a channel of the transistor is formed, for example. In particular, amorphous silicon is preferably used as the silicon. By using amorphous silicon, a transistor can be formed over a large-sized substrate in high yield, resulting in excellent mass productivity.

Furthermore, silicon having crystallinity such as microcrystalline silicon, polycrystalline silicon, or single-crystal silicon can be used. In particular, polycrystalline silicon can be formed at a lower temperature than single-crystal silicon and has a higher field-effect mobility and a higher reliability than amorphous silicon.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner and variation in characteristics can be reduced. In some cases, the top-gate transistor is particularly preferable when polycrystalline silicon, single-crystal silicon, or the like is employed.

«Substrate»

There is no particular limitation on the properties of a material and the like of the substrate 411 as long as the material has heat resistance enough to withstand at least heat treatment to be performed later. For example, a glass substrate, a ceramic substrate, a quartz substrate, a sapphire substrate, or the like may be used as the substrate 411. Alternatively, a single crystal semiconductor substrate or a polycrystalline semiconductor substrate of silicon or silicon carbide, a compound semiconductor substrate of silicon germanium or the like, an SOI substrate, or the like can be used, or any of these substrates provided with a semiconductor element may be used as the substrate 411. In the case where a glass substrate is used as the substrate 411, a large-area glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured. Such a large-sized substrate is preferably used because manufacturing cost can be reduced.

Still alternatively, a flexible substrate may be used as the substrate 411, and the transistor may be provided directly on the flexible substrate. A separation layer may be provided between the substrate 411 and the transistor. The separation layer can be used when part or the whole of the transistor formed over the separation layer is completed, separated from the substrate 411, and transferred to another substrate. In such a case, the transistor can be transferred to even a substrate having low heat resistance or a flexible substrate.

«Conductive Layer»

As materials of a gate, a source, and a drain of a transistor, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of shape processing by etching is increased.

As a light-transmitting conductive material that can be used for the gate, source, and drain of the transistor, a conductive oxide such as indium oxide, indium tin oxide, indium zinc oxide, zinc oxide, or zinc oxide to which gallium is added or graphene can be used. It is also possible to use a metal material such as gold, silver, platinum, magnesium, nickel, tungsten, chromium, molybdenum, iron, cobalt, copper, palladium, or titanium; an alloy material containing any of these metal materials; or a nitride of the metal material (e.g., titanium nitride). In the case of using the metal material or the alloy material (or the nitride thereof), the film thickness is set small enough to transmit light. Alternatively, a stacked film of any of the above materials can be used for the conductive layers. For example, a stacked film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

«Insulating Layer»

Examples of an insulating material that can be used for the insulating layers include a resin such as acrylic or epoxy resin, a resin having a siloxane bond such as silicone, and an inorganic insulating material such as silicon oxide, silicon oxynitride, silicon nitride oxide, silicon nitride, or aluminum oxide.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

Note that the films included in the transistor described in Embodiment 4 (i.e., the conductive film, the insulating film, the semiconductor film, and the like) can be formed by a sputtering method, a chemical vapor deposition (CVD) method, a plasma-enhanced CVD (PECVD) method, a vacuum evaporation method, or a pulsed laser deposition (PLD) method. However, one embodiment of the present invention is not limited thereto, and the films may be formed by a coating method, a printing method, a thermal CVD method, or an atomic layer deposition (ALD) method, for example. By a thermal CVD method such as a metal organic CVD (MOCVD) method, the conductive film, the insulating film, the semiconductor film, and the like may be formed.

Embodiment 5

In this embodiment, electronic devices of one embodiment of the present invention will be described.

One embodiment of the present invention is a light-emitting element using organic EL, and thus, highly reliable electronic devices having flat surfaces and with favorable emission efficiency can be manufactured. According to one embodiment of the present invention, highly reliable electronic devices having curved surfaces and with favorable emission efficiency can be manufactured.

Examples of the electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

Figure 8A:
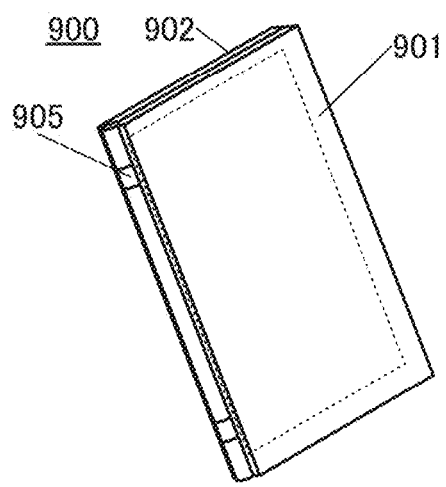
FIGS. 8A to 8D show electronic devices of one embodiment of the present invention.
Figure 8B:
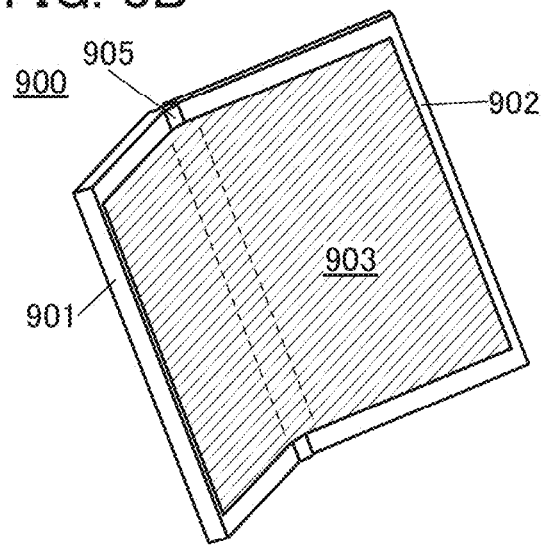

A portable information terminal 900 shown in FIGS. 8A and 8B includes a housing 901, a housing 902, a display portion 903, a hinge portion 905, and the like.

The housing 901 and the housing 902 are joined together with the hinge portion 905. The portable information terminal 900 can be opened as shown in FIG. 8B from a closed state (FIG. 8A). Thus, the portable information terminal 900 has high portability when carried and excellent visibility when used because of its large display region.

In the portable information terminal 900, the flexible display portion 903 is provided across the housing 901 and the housing 902 which are joined to each other by the hinge portion 905.

The light-emitting device manufactured using one embodiment of the present invention can be used for the display portion 903. Thus, the portable information terminal can be manufactured with high yield.

The display portion 903 can display at least one of a text, a still image, a moving image, and the like. When a text is displayed on the display portion, the portable information terminal 900 can be used as an e-book reader.

When the portable information terminal 900 is opened, the display portion 903 is significantly curved. For example, the display portion 903 is held while including a curved portion with a radius of curvature of greater than or equal to 1 mm and less than or equal to 50 mm, preferably greater than or equal to 5 mm and less than or equal to 30 mm. Part of the display portion 903 can display an image while being bent since pixels are continuously arranged from the housing 901 to the housing 902.

The display portion 903 functions as a touch panel and can be controlled with a finger, a stylus, or the like.

The display portion 903 is preferably formed using one flexible display. Thus, a continuous image can be displayed between the housing 901 and the housing 902. Note that each of the housing 901 and the housing 902 may be provided with a display.

The hinge portion 905 preferably includes a locking mechanism so that an angle formed between the housing 901 and the housing 902 does not become larger than a predetermined angle when the portable information terminal 900 is opened. For example, an angle at which the housing 901 and the housing 902 become locked (they are not opened any further) is preferably greater than or equal to 90° and less than 180° and can be typically 90°, 120°, 135°, 150°, 175°, or the like. In that case, the convenience, safety, and reliability of the portable information terminal 900 can be improved.

When the hinge portion 905 includes a locking mechanism, excessive force is not applied to the display portion 903; thus, breakage of the display portion 903 can be prevented. Therefore, a highly reliable portable information terminal can be provided.

A power button, an operation button, an external connection port, a speaker, a microphone, or the like may be provided for the housing 901 and the housing 902.

Either of the housing 901 and the housing 902 is provided with a wireless communication module, and data can be transmitted and received through a computer network such as the Internet, a local area network (LAN), or Wi-Fi (registered trademark).

Figure 8C:
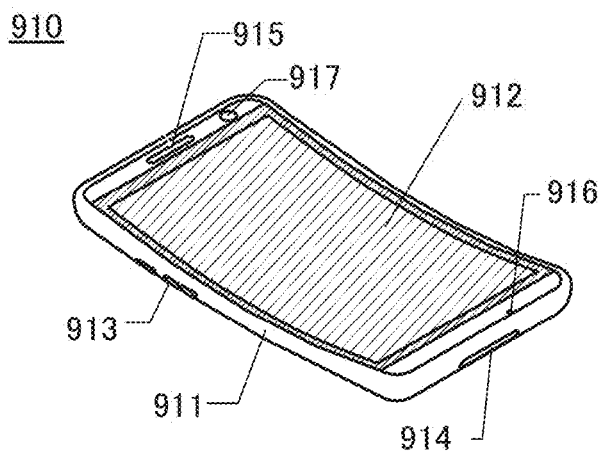

A portable information terminal 910 shown in FIG. 8C includes a housing 911, a display portion 912, an operation button 913, an external connection port 914, a speaker 915, a microphone 916, a camera 917, and the like.

The light-emitting device manufactured using one embodiment of the present invention can be used for the display portion 912. Thus, the portable information terminal can be manufactured with high yield.

The portable information terminal 910 includes a touch sensor in the display portion 912. Operations such as making a call and inputting a character can be performed by touch on the display portion 912 with a finger, a stylus, or the like.

With the operation button 913, the power can be turned on or off. In addition, types of images displayed on the display portion 912 can be switched; for example, switching an image from a mail creation screen to a main menu screen is performed with the operation button 913.

When a detection device such as a gyroscope sensor or an acceleration sensor is provided inside the portable information terminal 910, the direction of display on the screen of the display portion 912 can be automatically changed by determining the orientation of the portable information terminal 910 (whether the portable information terminal 910 is placed horizontally or vertically). Furthermore, the direction of display on the screen can be changed by touch on the display portion 912, operation with the operation button 913, sound input using the microphone 916, or the like.

The portable information terminal 910 functions as, for example, one or more of a telephone set, a notebook, and an information browsing system. Specifically, the portable information terminal 910 can be used as a smartphone. The portable information terminal 910 is capable of executing a variety of applications such as mobile phone calls, e-mailing, viewing and editing texts, music reproduction, reproducing a moving image, Internet communication, and computer games, for example.

Figure 8D:
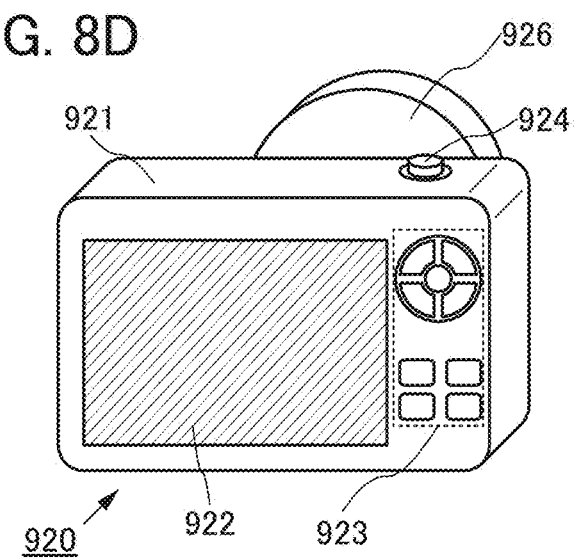

A camera 920 shown in FIG. 8D includes a housing 921, a display portion 922, operation buttons 923, a shutter button 924, and the like. Furthermore, an attachable lens 926 is attached to the camera 920.

The light-emitting device manufactured using one embodiment of the present invention can be used for the display portion 922. Thus, a camera with low power consumption can be manufactured.

Although the lens 926 of the camera 920 here is detachable from the housing 921 for replacement, the lens 926 may be incorporated into the housing 921.

A still image or a moving image can be taken with the camera 920 at the press of the shutter button 924. In addition, images can also be taken by the touch of the display portion 922 which has a function of a touch panel.

Note that a stroboscope, a viewfinder, or the like can be additionally attached to the camera 920. Alternatively, these may be incorporated into the housing 921.

Figure 9A:
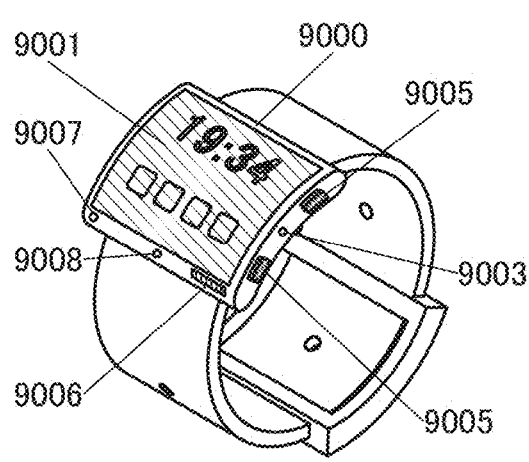
FIGS. 9A to 9E are perspective views illustrating display devices of one embodiment of the present invention.
Figure 9B:
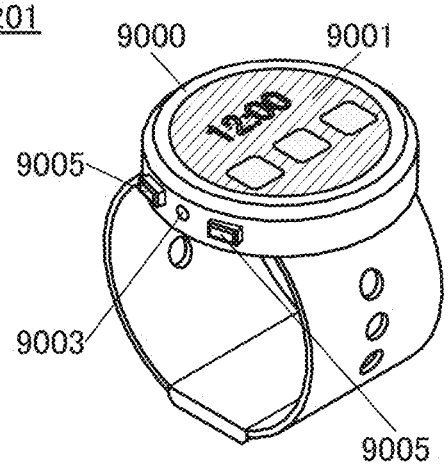

FIG. 9A is a perspective view of a watch-type portable information terminal 9200. FIG. 9B is a perspective view of a watch-type portable information terminal 9201.

The portable information terminal 9200 shown in FIG. 9A is capable of executing a variety of applications such as mobile phone calls, e-mailing, viewing and editing texts, music reproduction, Internet communication, and computer games. The display surface of the display portion 9001 is bent, and an image can be displayed on the bent display surface. The portable information terminal 9200 can employ near field communication conformable to a communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Unlike in the portable information terminal shown in FIG. 9A, the display surface of the display portion 9001 is not curved in the portable information terminal 9201 shown in FIG. 9B. Furthermore, the external state of the display portion of the portable information terminal 9201 is a non-rectangular shape (a circular shape in FIG. 9B).

Figure 9C:
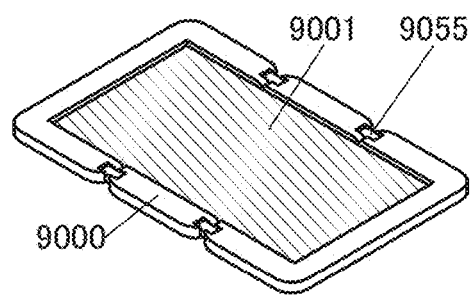
Figure 9D:
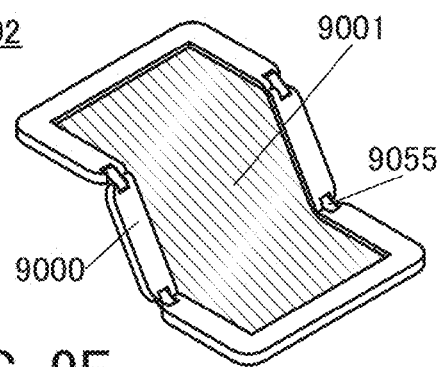
Figure 9E:
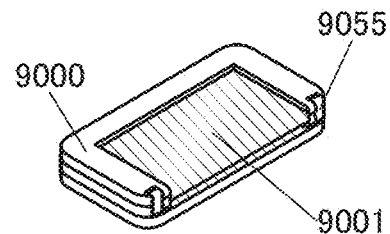

FIGS. 9C to 9E are perspective views of a foldable portable information terminal 9202. FIG. 9C is a perspective view illustrating the portable information terminal 9202 that is opened. FIG. 9D is a perspective view illustrating the portable information terminal 9202 that is being opened or being folded. FIG. 9E is a perspective view illustrating the portable information terminal 9202 that is folded.

The folded portable information terminal 9202 is highly portable, and the opened portable information terminal 9202 is highly browsable due to a seamless large display region. The display portion 9001 of the portable information terminal 9202 is supported by three housings 9000 joined together by hinges 9055. By folding the portable information terminal 9202 at a connection portion between two housings 9000 with the hinges 9055, the portable information terminal 9202 can be reversibly changed in shape from opened to folded. For example, the portable information terminal 9202 can be bent with a radius of curvature of greater than or equal to 1 mm and less than or equal to 150 mm.

Note that this embodiment can be combined with any of the other embodiments as appropriate.

Embodiment 6

In this embodiment, examples in which the light-emitting element of one embodiment of the present invention is used for various lighting devices will be described with reference to FIGS. 10A to 10C and FIG. 11. With the use of the light-emitting element of one embodiment of the present invention, a highly reliable lighting device with favorable emission efficiency can be manufactured.

An electronic device or a lighting device that has a light-emitting region with a curved surface can be obtained with use of the light-emitting element of one embodiment of the present invention which is manufactured over a substrate having flexibility.

Furthermore, a light-emitting device in which the light-emitting element of one embodiment of the present invention is used can also be used for lighting for motor vehicles, examples of which are lighting for a windshield, a ceiling, and the like.

Figure 10A:
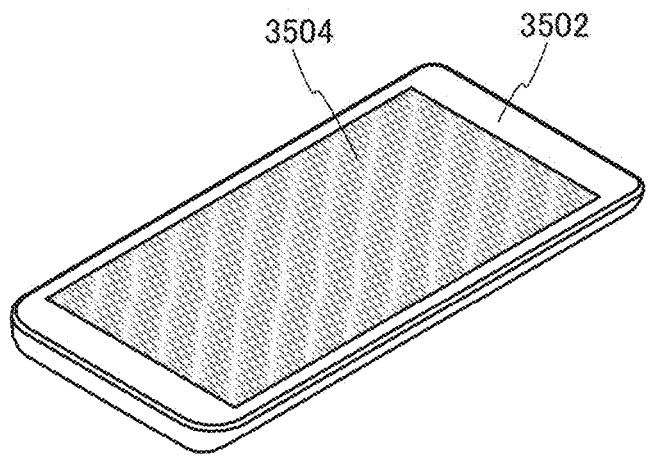
FIGS. 10A to 10C show lighting devices of one embodiment of the present invention.
Figure 10B:
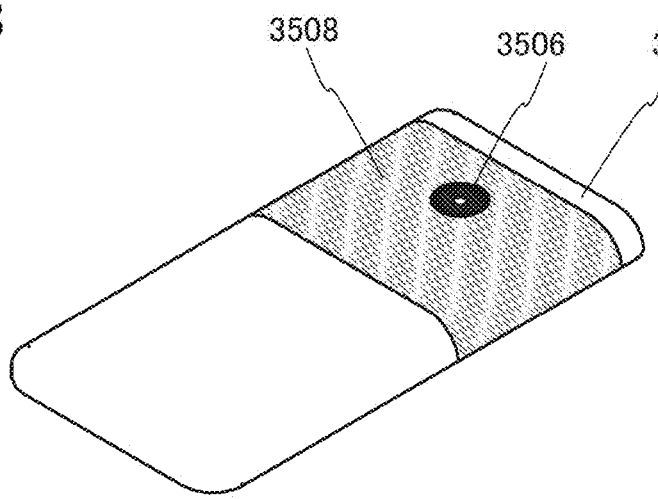

FIG. 10A is a perspective view illustrating one surface of a multifunction terminal 3500, and FIG. 10B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 shown in FIGS. 10A and 10B can have a variety of functions as in the electronic devices shown in FIGS. 9A to 9C.

The housing 3502 can include a speaker, a sensor (a sensor having a function of measuring or sensing force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone, and the like. When a detection device including a sensor for detecting inclination, such as a gyroscope sensor or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 10C:
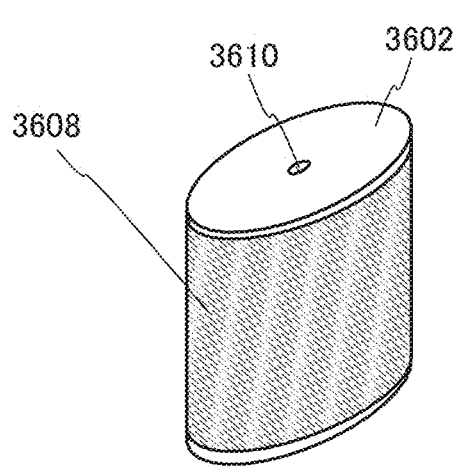

FIG. 10C is a perspective view of a security light 3600. The light 3600 includes lighting 3608 on the outside of the housing 3602, and a speaker 3610 and the like are incorporated in the housing 3602. The light-emitting element of one embodiment of the present invention can be used for the lighting 3608.

The light 3600 emits light when the lighting 3608 is gripped or held, for example. An electronic circuit that can control the manner of light emission from the light 3600 may be provided in the housing 3602. The electronic circuit may be a circuit that enables light emission once or intermittently a plurality of times or may be a circuit that can adjust the amount of emitted light by controlling the current value for light emission. A circuit with which a loud audible alarm is output from the speaker 3610 at the same time as light emission from the lighting 3608 may be incorporated.

The light 3600 can emit light in various directions; therefore, it is possible to intimidate a thug or the like with light, or light and sound. Moreover, the light 3600 may include a camera such as a digital still camera to have a photography function.

Figure 11:
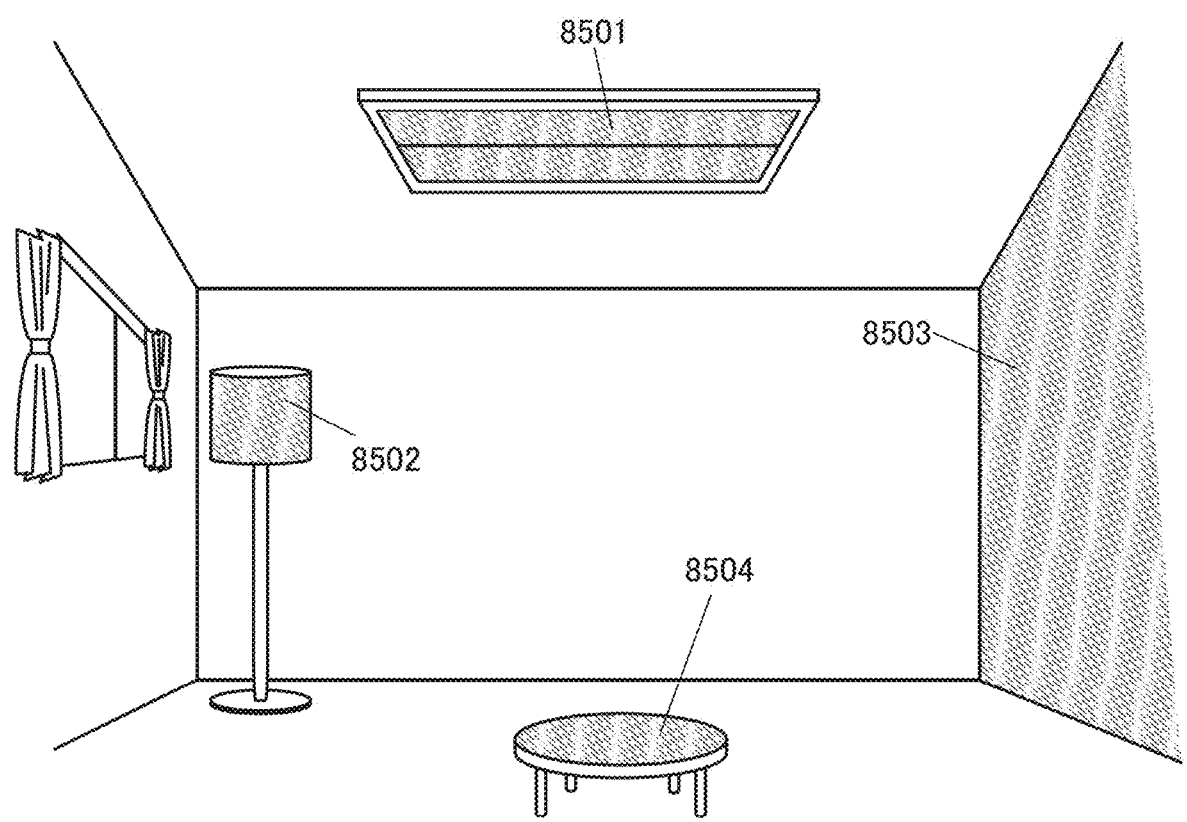
FIG. 11 shows lighting devices of one embodiment of the present invention.

FIG. 11 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

As described above, lighting devices and electronic devices can be obtained by application of the light-emitting device of one embodiment of the present invention. Note that the light-emitting device can be used for lighting devices and electronic devices in a variety of fields without being limited to the lighting devices and the electronic devices described in this embodiment.

The structure described above in this embodiment can be combined with any of the structures described in the other embodiments as appropriate.

Example 1

Figure 12:
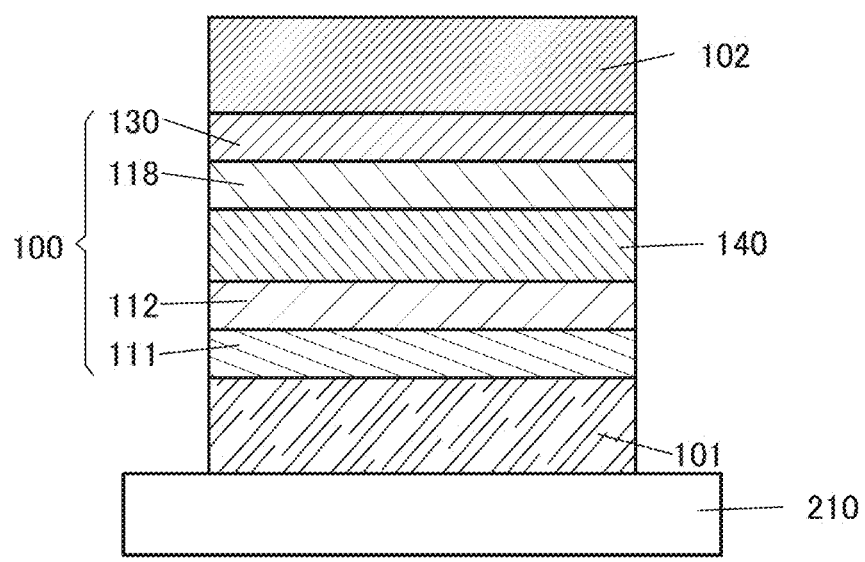
FIG. 12 is a schematic cross-sectional view illustrating a light-emitting element in Example.

Described in this example are examples of fabricating light-emitting elements 2 to 4 according to one embodiment of the present invention and a comparative light-emitting element 1. A schematic cross-sectional view of the light-emitting elements fabricated in this example is shown in FIG. 12. Details of the element structures are shown in Table 4. Chemical formulae of organic compounds used in this example are shown below. Note that Embodiment 1 can be referred to for the structures and abbreviations of the other compounds.

[Chemical Formula 3]

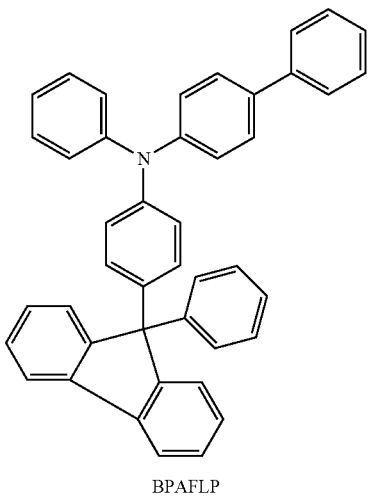

BPAFLP

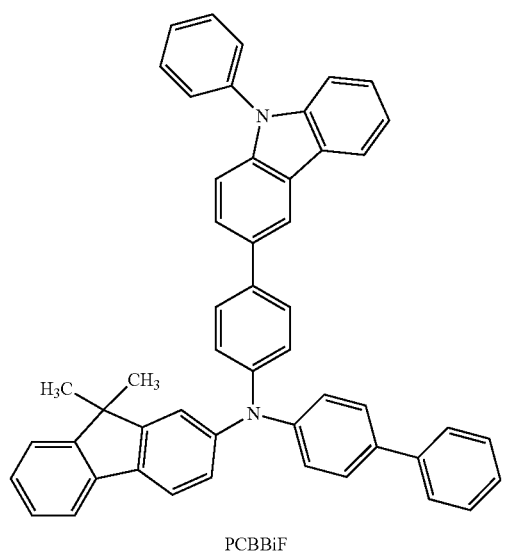

PCBBiF

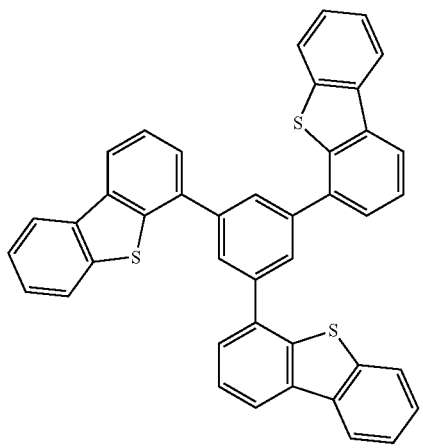

DBT3P-II

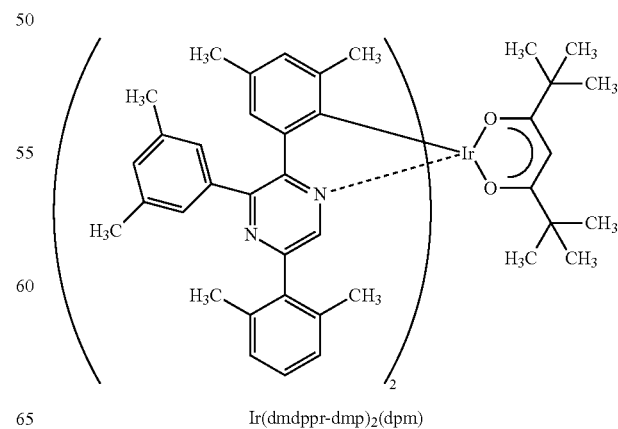

Ir(dmdppr-dmp)$_2$(dpm)

TABLE 4

| | Layer | Reference numeral | Thickness (nm) | Material | Weight ratio |
|---|---|---|---|---|---|
| Comparative light-emitting element 1 | Electrode | 102 | 200 | Al | — |
| | Electron-injection layer | 130 | 1 | LiF | — |
| | Electron-transport layer | 118(2) | 20 | NBPhen | — |
| | | 118(1) | 25 | 2mDBTBPDBq-II | — |
| | Light-emitting layer | 140 | 40 | 2mDBTBPDBq-II:PCBBiF:Ir(dmdppr-dmp)$_2$(dpm) | 0.75:0.25:0.06 |
| | Hole-transport layer | 112 | 20 | BPAFLP | — |
| | Hole-injection layer | 111 | 65 | DBT3P-II:MoO$_3$ | 1:0.5 |
| | Electrode | 101 | 70 | ITSO | — |
| Light-emitting element 2 | Electrode | 102 | 200 | Al | — |
| | Electron-injection layer | 130 | 10 | NBPhen:Ag | 1:0.38 |
| | Electron-transport layer | 118(2) | 10 | NBPhen | — |
| | | 118(1) | 25 | 2mDBTBPDBq-II | — |
| | Light-emitting layer | 140 | 40 | 2mDBTBPDBq-II:PCBBiF:Ir(dmdppr-dmp)$_2$(dpm) | 0.75:0.25:0.06 |
| | Hole-transport layer | 112 | 20 | BPAFLP | — |
| | Hole-injection layer | 111 | 65 | DBT3P-II:MoO$_3$ | 1:0.5 |
| | Electrode | 101 | 70 | ITSO | — |
| Light-emitting element 3 | Electrode | 102 | 200 | Al | — |
| | Electron-injection layer | 130 | 10 | Alq3:Ag | 1:0.48 |
| | Electron-transport layer | 118(2) | 10 | NBPhen | — |
| | | 118(1) | 25 | 2mDBTBPDBq-II | — |
| | Light-emitting layer | 140 | 40 | 2mDBTBPDBq-II:PCBBiF:Ir(dmdppr-dmp)$_2$(dpm) | 0.75:0.25:0.06 |
| | Hole-transport layer | 112 | 20 | BPAFLP | — |
| | Hole-injection layer | 111 | 65 | DBT3P-II:MoO$_3$ | 1:0.5 |
| | Electrode | 101 | 70 | ITSO | — |
| Light-emitting element 4 | Electrode | 102 | 200 | Al | — |
| | Electron-injection layer | 130 | 10 | 2mDBTBPDBq-II:Ag | 1:0.40 |
| | Electron-transport layer | 118(2) | 10 | NBPhen | — |
| | | 118(1) | 25 | 2mDBTBPDBq-II | — |
| | Light-emitting layer | 140 | 40 | 2mDBTBPDBq-II:PCBBiF:Ir(dmdppr-dmp)$_2$(dpm) | 0.75:0.25:0.06 |
| | Hole-transport layer | 112 | 20 | BPAFLP | — |
| | Hole-injection layer | 111 | 65 | DBT3P-II:MoO$_3$ | 1:0.5 |
| | Electrode | 101 | 70 | ITSO | — |

The LUMO levels of organic compounds used in the electron-injection layer 130 of the light-emitting elements 2 to 4 were calculated by cyclic voltammetry (CV) measurement.

An electrochemical analyzer (ALS model 600A or 600C, manufactured by BAS Inc.) was used as a measurement apparatus. To prepare a solution for the CV measurement, dehydrated dimethylformamide (DMF; produced by Sigma-Aldrich Inc., 99.8%, catalog No. 22705-6) was used as a solvent, and tetra-n-butylammonium perchlorate (n-Bu$_4$NClO$_4$; produced by Tokyo Chemical Industry Co., Ltd., catalog No. T0836) as a supporting electrolyte was dissolved at a concentration of 100 mmol/L. Furthermore, the object to be measured was also dissolved at a concentration of 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an Ag/Ag$^+$electrode (RE7 reference electrode for non-aqueous solvent, manufactured by BAS Inc.) was used as a reference electrode. Note that the measurement was performed at room temperature (20° C. to 25° C.). In addition, the scan speed in the CV measurement was fixed to 0.1 V/sec, and an oxidation potential Ea [V] and a reduction potential Ec [V] with respect to the reference electrode were measured. The potential Ea is an intermediate potential of an oxidation-reduction wave, and the potential Ec is an intermediate potential of a reduction-oxidation wave. Here, since the potential energy of the reference electrode used in this example with respect to the vacuum level is known to be −4.94 [eV], the HOMO level and the LUMO level can be calculated by the following formulae: HOMO level [eV]−4.94−Ea and LUMO level [eV]−4.94−Ec.

From the above measurement, the LUMO levels of NBPhen, Alq$_3$, and 2mDBTBPDBq-II were calculated to be −2.83 eV, −2.80 eV, and −2.94 eV, respectively.

<Fabrication of Light-Emitting Elements>

Fabrication methods of the light-emitting elements in this example will be described below. The comparative light-emitting element 1 uses LiF, which is a Li compound typically used for the electron-injection layer. The light-emitting elements 2 to 4 each use for the electron-injection layer a composite material of a transition metal and an organic compound having an unshared electron pair according to one embodiment of the present invention.

«Fabrication of Comparative Light-Emitting Element 1»

As the electrode 101, an ITSO film was formed to a thickness of 70 nm over a substrate 210. Note that the electrode area of the electrode 101 was set to 4 mm² (2 mm×2 mm).

Next, as the hole-injection layer 111, DBT3P-II and molybdenum oxide ($MoO_3$) were deposited over the electrode 101 by co-evaporation in a weight ratio of DBT3P-II:$MoO_3$=1:0.5 to a thickness of 65 nm.

Then, as the hole-transport layer 112, BPAFLP was deposited over the hole-injection layer 111 by evaporation to a thickness of 20 nm.

Then, as the light-emitting layer 140, 2mDBTBPDBq-II, PCBBiF, and bis{4,6-dimethyl-2-[5-(2,6-dimethylphenyl)-3-(3,5-dimethylphenyl)-2-pyrazinyl-κN]phenyl-κC}(2,2',6,6'-tetramethyl-3,5-heptanedionato-κ²O,O')iridium(III) (abbreviation: Ir(dmdppr-dmp)₂(dpm)) were deposited over the hole-transport layer 112 by co-evaporation in a weight ratio of 2mDBTBPDBq-II:PCBBiF:Ir(dmdppr-dmp)₂(dpm)=0.75:0.25:0.06 to a thickness of 40 nm. Note that in the light-emitting layer 140, 2mDBTBPDBq-II and PCBBiF are host materials and Ir(dmdppr-dmp)₂(dpm) is a guest material (a phosphorescent material).

Next, as an electron-transport layer 118(1), 2mDBTBPDBq-II was deposited over the light-emitting layer 140 by evaporation to a thickness of 25 nm.

Then, as an electron-transport layer 118(2), NBPhen was deposited over the electron-transport layer 118(1) by evaporation to a thickness of 20 nm.

As the electron-injection layer 130, lithium fluoride (LiF) was deposited over the electron-transport layer 118(2) by evaporation to a thickness of 1 nm.

Next, as the electrode 102, aluminum (Al) was deposited over the electron-injection layer 130 by evaporation to a thickness of 200 nm.

Then, heat treatment at 80° C. for one hour was performed in the air without sealing. Through the above steps, the comparative light-emitting element 1 was obtained.

«Fabrication of light-emitting element 2»

The light-emitting element 2 was fabricated through the same steps as those for the comparative light-emitting element 1 except for the steps of forming the electron-transport layer 118(2) and the electron-injection layer 130.

As the electron-transport layer 118(2) of the light-emitting element 2, NBPhen was deposited over the electron-transport layer 118(1) by evaporation to a thickness of 10 nm.

As the electron-injection layer 130, NBPhen and Ag were deposited over the electron-transport layer 118(2) by co-evaporation in a weight ratio of NBPhen:Ag=1:0.38 to a thickness of 10 nm.

«Fabrication of Light-Emitting Elements 3 and 4»

The light-emitting elements 3 and 4 were fabricated through the same steps as those for the light-emitting element 2 except for the step of forming the electron-injection layer 130.

<Fabrication of Light-Emitting Element 3>

As the electron-injection layer 130, $Alq_3$ and Ag were deposited over the electron-transport layer 118(2) of the light-emitting element 3 by co-evaporation in a weight ratio of $Alq_3$:Ag=1:0.48 to a thickness of 10 nm.

<Fabrication of Light-Emitting Element 4>

As the electron-injection layer 130, 2mDBTBPDBq-II and Ag were deposited over the electron-transport layer 118(2) of the light-emitting element 4 by co-evaporation in a weight ratio of 2mDBTBPDBq-II:Ag=1:0.40 to a thickness of 10 nm.

<Characteristics of Light-Emitting Elements>

Next, the element characteristics of the fabricated comparative light-emitting element 1 and light-emitting elements 2 to 4 were measured. Luminance and CIE chromaticity were measured with a luminance colorimeter (BM-5A manufactured by TOPCON TECHNOHOUSE CORPORATION), and electroluminescence spectra were measured with a multi-channel spectrometer (PMA-11 manufactured by Hamamatsu Photonics K. K.).

Figure 13:
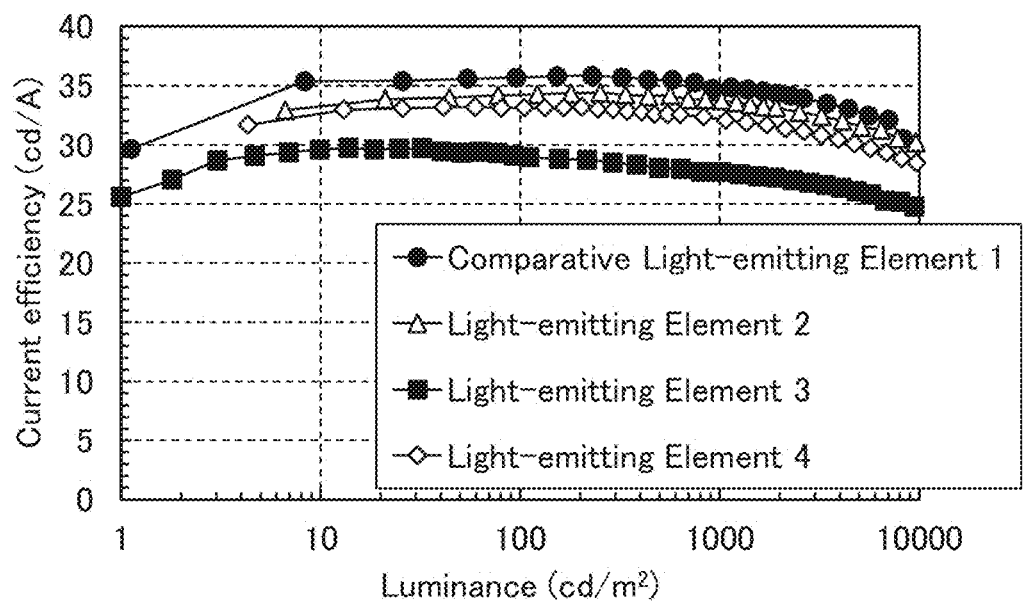
FIG. 13 shows current efficiency-luminance characteristics of light-emitting elements in Example.
Figure 14:
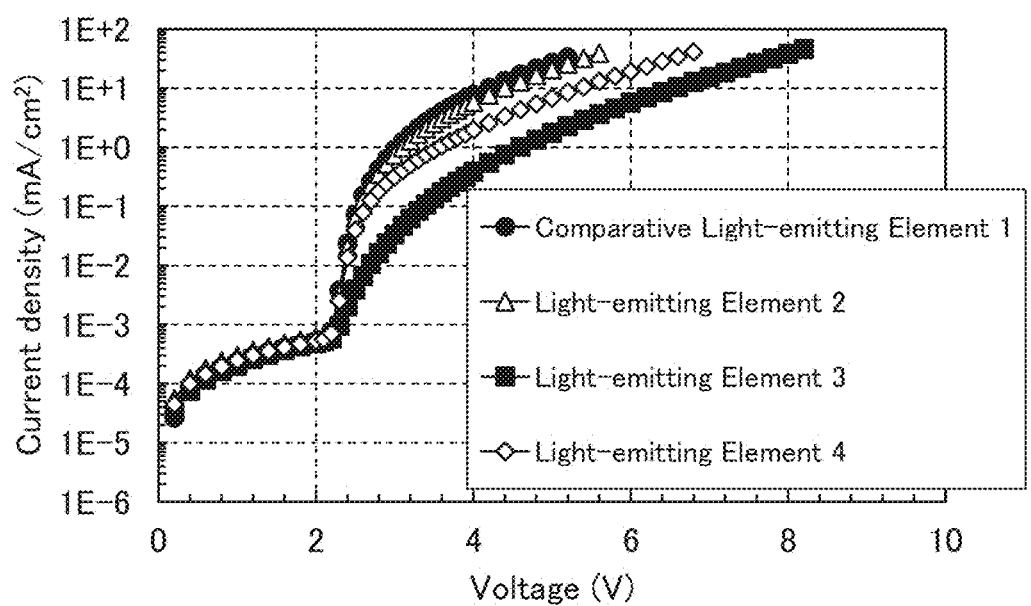
FIG. 14 shows current density-voltage characteristics of light-emitting elements in Example.
Figure 15:
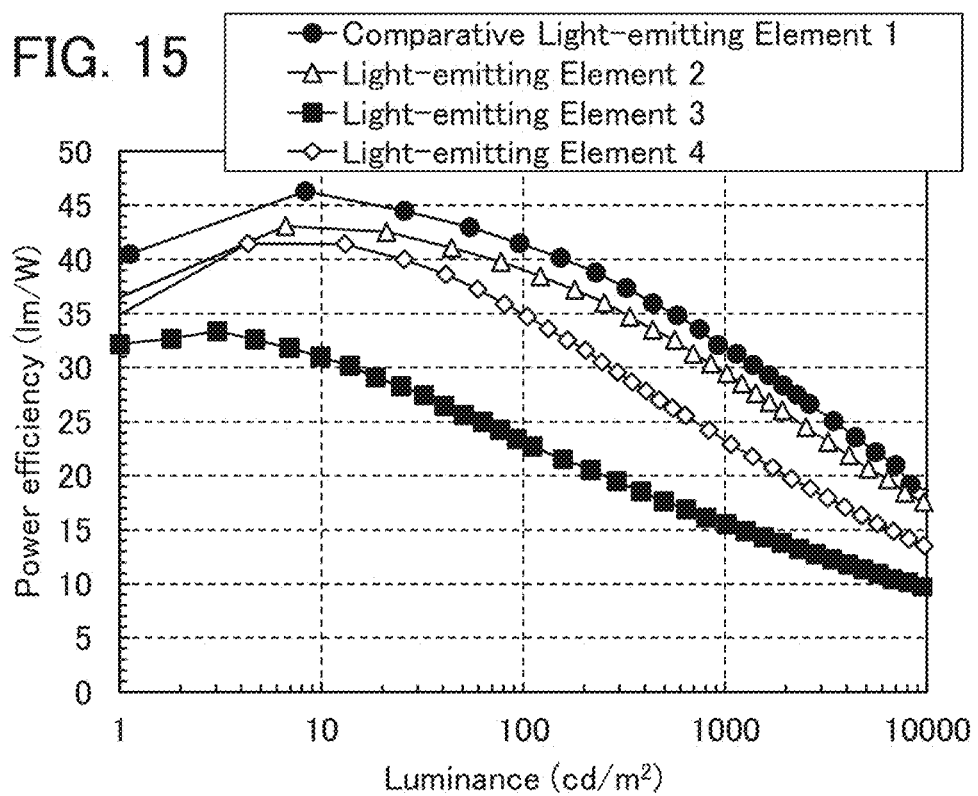
FIG. 15 shows power efficiency-luminance characteristics of light-emitting elements in Example.

FIG. 13 shows the current efficiency-luminance characteristics of the fabricated comparative light-emitting element 1 and light-emitting elements 2 to 4; FIG. 14, the current density-voltage characteristics thereof; FIG. 15, the power efficiency-luminance characteristics thereof; and FIG. 16, the external quantum efficiency-luminance characteristics thereof. Note that the measurements of the light-emitting elements were performed at room temperature (in an atmosphere maintained at 23° C.). FIG. 17 shows the electroluminescence spectra of the light-emitting elements through which current flows at a current density of 2.5 mA/cm². Note that the measurement was performed at room temperature.

Table 5 shows the element characteristics of the comparative light-emitting element 1 and the light-emitting elements 2 to 4 at around 1000 cd/m².

TABLE 5

| | Voltage (V) | Current density (mA/cm²) | CIE chromaticity (x, y) | Luminance (cd/m²) | Current efficiency (cd/A) | Power efficiency (lm/W) | External quantum efficiency (%) |
|---|---|---|---|---|---|---|---|
| Comparative light-emitting element 1 | 3.3 | 2.1 | (0.67, 0.33) | 747 | 35 | 34 | 31 |
| Light-emitting element 2 | 3.6 | 3.0 | (0.67, 0.33) | 1021 | 34 | 30 | 29 |
| Light-emitting element 3 | 5.6 | 3.7 | (0.66, 0.34) | 1017 | 28 | 17 | 23 |
| Light-emitting element 4 | 4.4 | 3.3 | (0.66, 0.34) | 1072 | 32 | 23 | 27 |

Figure 16:
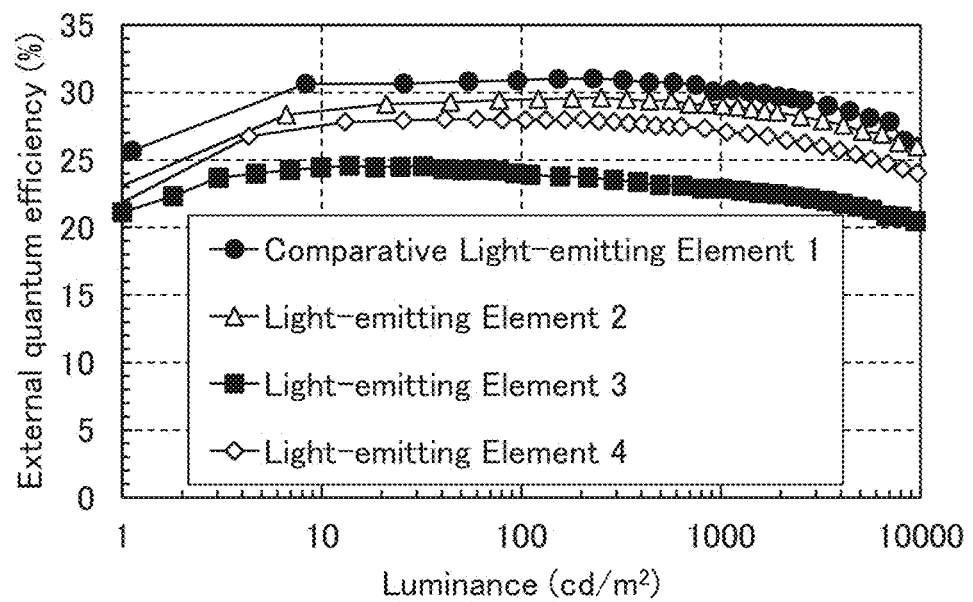
FIG. 16 shows external quantum efficiency-luminance characteristics of light-emitting elements in Example.
Figure 17:
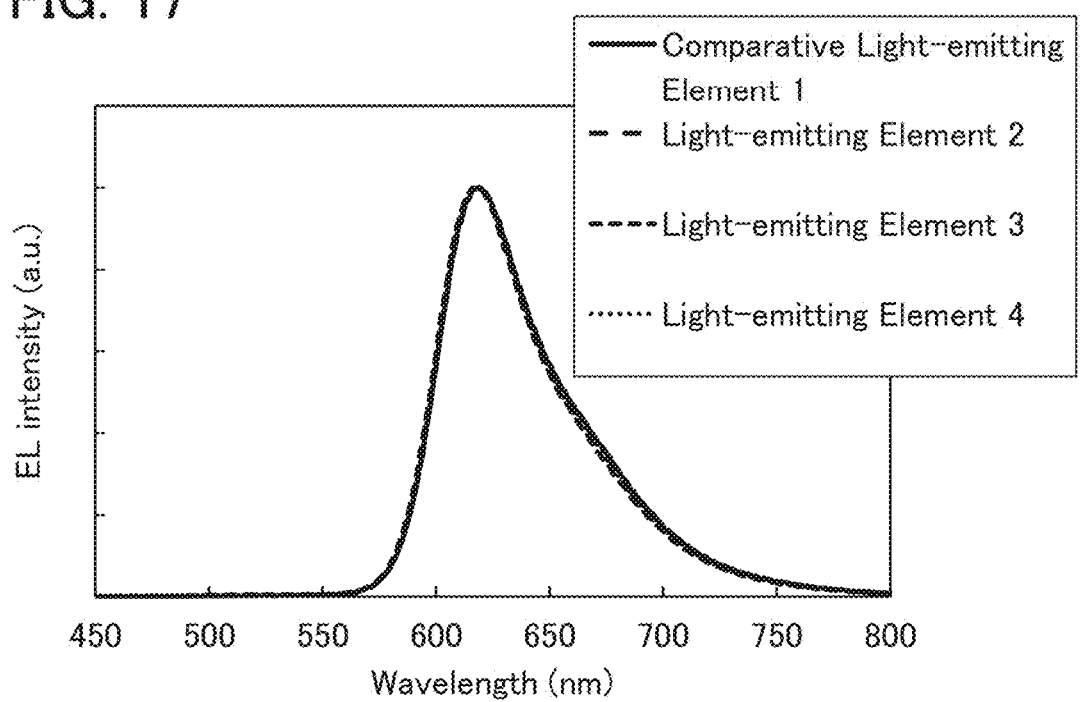
FIG. 17 shows electroluminescence spectra of light-emitting elements in Example.

As shown in FIG. 16 and Table 5, the comparative light-emitting element 1 and the light-emitting elements 2 to 4 each exhibited high emission efficiency with an external quantum efficiency exceeding 20%. The comparative light-emitting element 1 and the light-emitting elements 2 to 4 also exhibited high current efficiency and power efficiency as shown in FIGS. 13 and 15. In particular, the comparative light-emitting element 1, the light-emitting element 2, and the light-emitting element 4 exhibited a significantly high external quantum efficiency exceeding 25%. The light-emitting elements 2 and 4 according to one embodiment of the present invention exhibited high efficiency equivalent to that of the comparative light-emitting element 1, which uses LiF typically used for the electron-injection layer.

As shown in FIG. 14, the comparative light-emitting element 1 and the light-emitting elements 2 to 4 exhibited favorable current density-voltage characteristics. In particular, the current density-voltage characteristics of the light-emitting element 2 are equivalent to those of the comparative light-emitting element 1, indicating that the composite material of NBPhen and Ag has significantly high electron-injection properties.

As shown in FIG. 17, the comparative light-emitting element 1 and the light-emitting elements 2 to 4 each exhibited red emission whose electroluminescence spectrum has a peak wavelength at approximately 619 nm and a full width at half maximum of 58 nm. The obtained electroluminescence spectrum reveals that the light is emitted from the guest material, Ir(dmdppr-dmp)$_2$(dmp).

<Reliability Test of Light-Emitting Elements>

A preservation test under constant temperature and humidity was performed on the comparative light-emitting element 1 and the light-emitting elements 2 to 4. Since each of the light-emitting elements is not sealed, the cathode and the EL layer are exposed to the atmosphere of the test environment. In general, moisture entering the light-emitting element causes dark spots (non-emission regions in a light-emitting portion) or shrinkage (non-emission regions at the end of the light-emitting portion), thereby adversely affecting the reliability of the light-emitting element. Thus, the preservation test under constant temperature and humidity allows evaluating of the reliability of the light-emitting element against moisture.

In a thermostatic bath kept at a temperature of 65° C. and a humidity of 95%, the comparative light-emitting element 1 and the light-emitting elements 2 to 4 were placed for 48 hours; then, the emission state of each light-emitting element was measured.

The emission state was measured by estimating the proportion of the emission area before and after the preservation test under constant temperature and humidity. The results are shown in Table 6.

TABLE 6

| | Proportion of emission area |
|---|---|
| Comparative light-emitting element 1 | 6% |
| Light-emitting element 2 | 56% |
| Light-emitting element 3 | 83% |
| Light-emitting element 4 | 68% |

In Table 6, the proportion of emission area (%) is the emission area after the preservation test under constant temperature and humidity/the emission area before the preservation test under constant temperature and humidity×100. Table 6 reveals that the light-emitting elements 2 to 4 according to one embodiment of the present invention each have a larger emission area than the comparative light-emitting element 1, which uses LiF, an alkali metal compound, for the electron-injection layer. This indicates that the light-emitting elements according to one embodiment of the present invention have higher moisture resistance than the light-emitting element that uses for the electron-injection layer a material with a low work function, e.g., an alkali metal. This is because the material with a low work function strongly reacts with water, allowing moisture to penetrate the light-emitting element. In contrast, moisture does not easily penetrate the light-emitting elements according to one embodiment of the present invention, which use a transition metal prone to react with water. Hence, highly moisture resistant light-emitting elements can be achieved.

<Absorption Spectrum of Composite Material of Organic Compound and Transition Metal>

Figure 18:
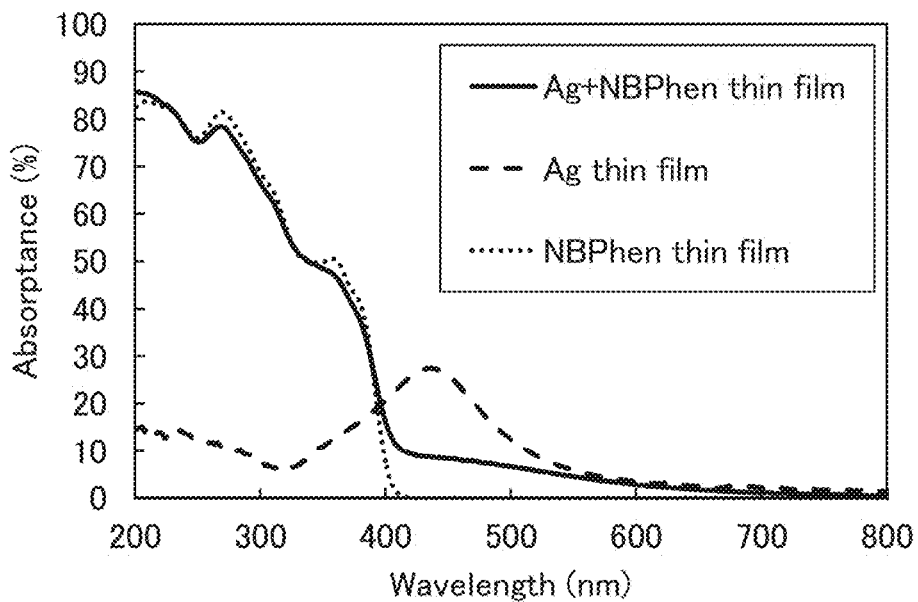
FIG. 18 shows absorption spectra of thin films in Example.
Figure 19:
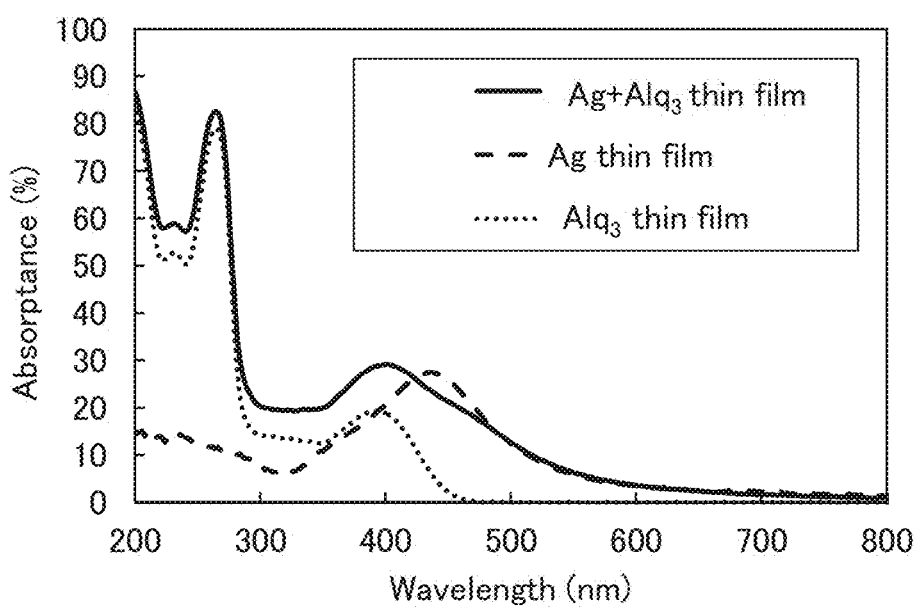
FIG. 19 shows absorption spectra of thin films in Example.
Figure 20:
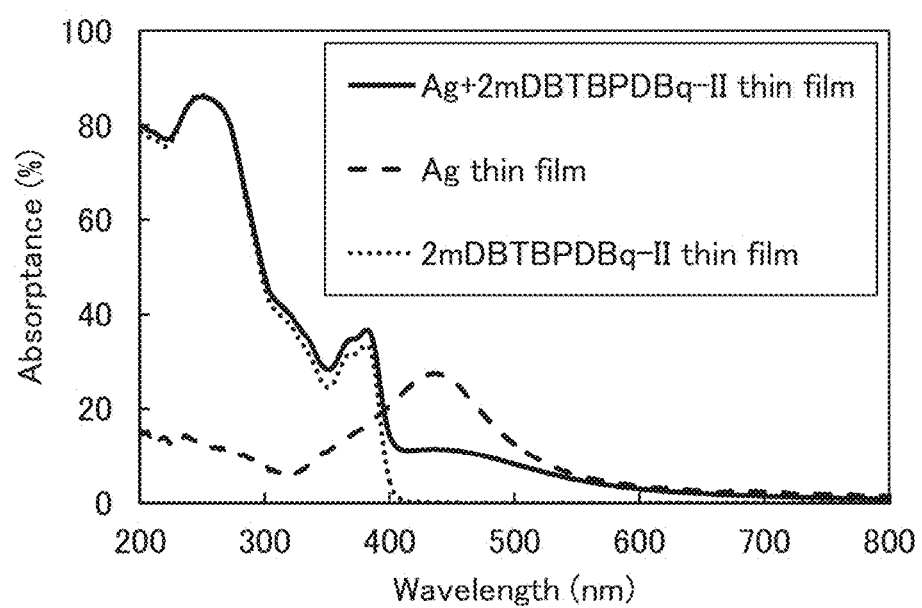
FIG. 20 shows absorption spectra of thin films in Example.

Next, the absorption spectrum of a thin film made with a composite material of an organic compound and Ag, which is used for the electron-injection layers of the light-emitting elements 2 to 4, was measured. In addition, the absorption spectra of an Ag thin film and an organic compound thin film were measured. The results are shown in FIGS. 18 to 20. The thin film made with the composite material of the organic compound and Ag was formed over a quartz substrate by vacuum evaporation in a molar ratio of organic compound:Ag=1:1 to a thickness of 50 nm. The organic compound thin film was formed over a quartz substrate by vacuum evaporation to a thickness of 50 nm. The Ag thin film was formed over a quartz substrate by vacuum evaporation to a thickness of 2 nm. Note that the amount of Ag contained in the 2-nm-thick Ag thin film is approximately the same as the amount of Ag contained in the 50-nm-thick thin film made with the composite material of the organic compound and Ag. The absorption spectrum was measured with a spectrophotometer (U-4100 Spectrophotometer, manufactured by Hitachi High-Technologies Corporation).

As shown in FIGS. 18 to 20, a surface plasmon peak specific to a metal thin film was observed at around 450 nm for the Ag thin film. In contrast, the surface plasmon peak was not observed for the composite material of the organic compound and Ag. Surface plasmons are observed on a surface of a minute (nanometer-scale) metal such as a metal thin film or a metal nanoparticle. Hence, in the composite material of the organic compound and Ag, Ag is present not as a group of Ag atoms like an Ag thin film or Ag nanoparticles, but in such a state that an Ag atom interacts with the organic compound. In other words, in the composite film of the organic compound and Ag as a transition metal, they interact with each other.

From the above, the light-emitting element according to one embodiment of the present invention has favorable electron-injection properties, and therefore, has a low driving voltage and a high emission efficiency. In addition, the light-emitting element is highly resistant to moisture because it does not use a material with a low work function. The structures shown in this example can be used in appropriate combination with any of the other embodiments and examples.

Example 2

Described in this example are examples of fabricating a light-emitting element 6 according to one embodiment of the present invention and a comparative light-emitting element 5. A schematic cross-sectional view of the light-emitting elements fabricated in this example is shown in FIG. 12.

Details of the element structures are shown in Table 7. The structure and abbreviation of a compound used in this example are shown below. Note that the above embodiments and example can be referred to for the structures and abbreviations of the other compounds.

[Chemical Formula 4]

4mCzBPBfpm

«Fabrication of Comparative Light-Emitting Element 5»

As the electrode 101, an ITSO film was formed to a thickness of 70 nm over the substrate 210. Note that the electrode area of the electrode 101 was set to 4 mm² (2 mm×2 mm).

Next, as the hole-injection layer 111, DBT3P-II and $MoO_3$ were deposited over the electrode 101 by co-evaporation in a weight ratio of DBT3P-II:$MoO_3$=1:0.5 to a thickness of 70 nm.

Then, as the hole-transport layer 112, BPAFLP was deposited over the hole-injection layer 111 by evaporation to a thickness of 20 nm.

Then, as the light-emitting layer 140, 4mCzBPBfpm, PCBBiF, and Ir(dmdppr-dmp)$_2$(dpm) were deposited over the hole-transport layer 112 by co-evaporation in a weight ratio of 4mCzBPBfpm:PCBBiF:Ir(dmdppr-dmp)$_2$(dpm)= 0.75:0.25:0.06 to a thickness of 40 nm. Note that in the light-emitting layer 140, 4mCzBPBfpm and PCBBiF are host materials and Ir(dmdppr-dmp)$_2$(dpm) is a guest material (a phosphorescent compound).

Next, as the electron-transport layer 118, 4mCzBPBfpm was deposited over the light-emitting layer 140 by evaporation to a thickness of 40 nm.

As the electron-injection layer 130, lithium fluoride (LiF) was deposited over the electron-transport layer 118 by evaporation to a thickness of 1 nm.

TABLE 7

| | Layer | Reference numeral | Thickness (nm) | Material | Weight ratio |
|---|---|---|---|---|---|
| Comparative light-emitting element 5 | Electrode | 102 | 200 | Al | — |
| | Electron-injection layer | 130 | 1 | LiF | — |
| | Electron-transport layer | 118 | 40 | 4mCzBPBfpm | — |
| | Light-emitting layer | 140 | 40 | 4mCzBPBfpm:PCBBiF:Ir(dmdppr-dmp)$_2$(dpm) | 0.75:0.25:0.06 |
| | Hole-transport layer | 112 | 20 | BPAFLP | — |
| | Hole-injection layer | 111 | 65 | DBT3P-II:$MoO_3$ | 1:0.5 |
| | Electrode | 101 | 70 | ITSO | — |
| Light-emitting element 6 | Electrode | 102 | 200 | Al | — |
| | Electron-injection layer | 130 | 15 | 4mCzBPBfpm:Ag | 1:0.22 |
| | Electron-transport layer | 118 | 25 | 4mCzBPBfpm | — |
| | Light-emitting layer | 140 | 40 | 4mCzBPBfpm:PCBBiF:Ir(dmdppr-dmp)$_2$(dpm) | 0.75:0.25:0.06 |
| | Hole-transport layer | 112 | 20 | BPAFLP | — |
| | Hole-injection layer | 111 | 65 | DBT3P-II:$MoO_3$ | 1:0.5 |
| | Electrode | 101 | 70 | ITSO | — |

The LUMO level of 4mCzBPBfpm, which was used in the electron-injection layer 130 of the light-emitting element 6, was calculated by cyclic voltammetry (CV) measurement. The measurement was performed in a manner similar to that in Example 1.

As a result, the LUMO levels of 4mCzBPBfpm and Alq$_3$ were calculated to be −2.83 eV and −2.97 eV, respectively.

<Fabrication of Light-Emitting Elements>

Fabrication methods of the light-emitting elements in this example will be described below. In this example, the electron-transport layer is a single layer. The comparative light-emitting element 5 uses LiF, which is a Li compound typically used for the electron-injection layer. The light-emitting element 6 uses for the electron-injection layer a composite material of a transition metal and an organic compound having an unshared electron pair according to one embodiment of the present invention. In the light-emitting elements in this example, an organic compound including a pyrimidine ring is used as the organic compound having an unshared electron pair.

Next, as the electrode 102, aluminum (Al) was deposited over the electron-injection layer 130 by evaporation to a thickness of 200 nm.

Then, heat treatment at 80° C. for one hour was performed in the air without sealing. Through the above steps, the comparative light-emitting element 5 was obtained.

«Fabrication of Light-Emitting Element 6»

The light-emitting element 6 was fabricated through the same steps as those for the comparative light-emitting element 5 except for the steps of forming the electron-transport layer 118 and the electron-injection layer 130.

As the electron-transport layer 118 of the light-emitting element 6, 4mCzBPBfpm was deposited over the light-emitting layer 140 by evaporation to a thickness of 25 nm.

As the electron-injection layer 130, 4mCzBPBfpm and Ag were deposited over the electron-transport layer 118 by co-evaporation in a weight ratio of 4mCzBPBfpm:Ag=1: 0.22 to a thickness of 15 nm.

<Characteristics of Light-Emitting Elements>

Next, the element characteristics of the fabricated comparative light-emitting element 5 and light-emitting element 6 were measured. The measurement was performed in a manner similar to that in Example 1.

Figure 21:
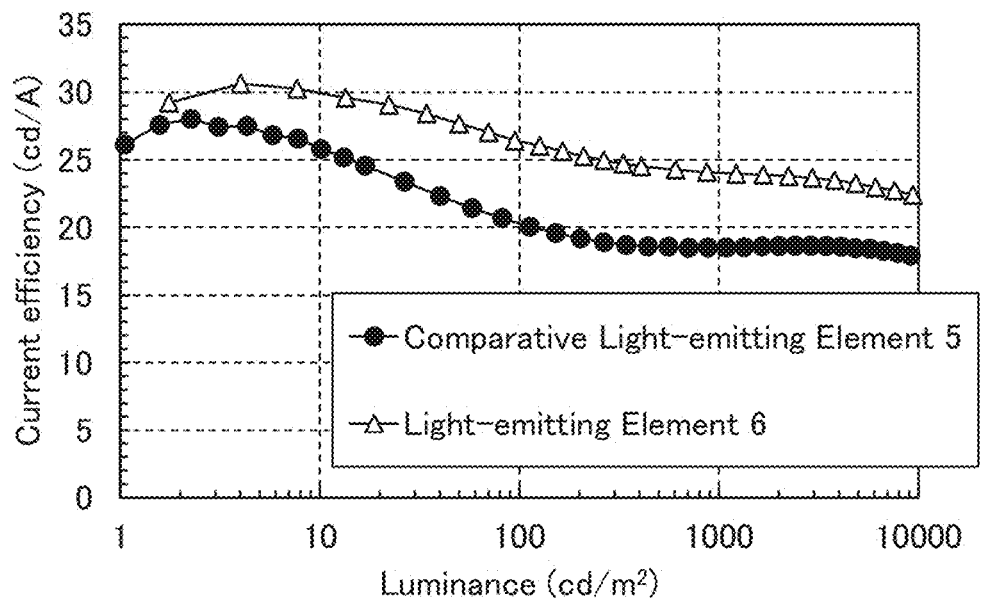
FIG. 21 shows current efficiency-luminance characteristics of light-emitting elements in Example.
Figure 22:
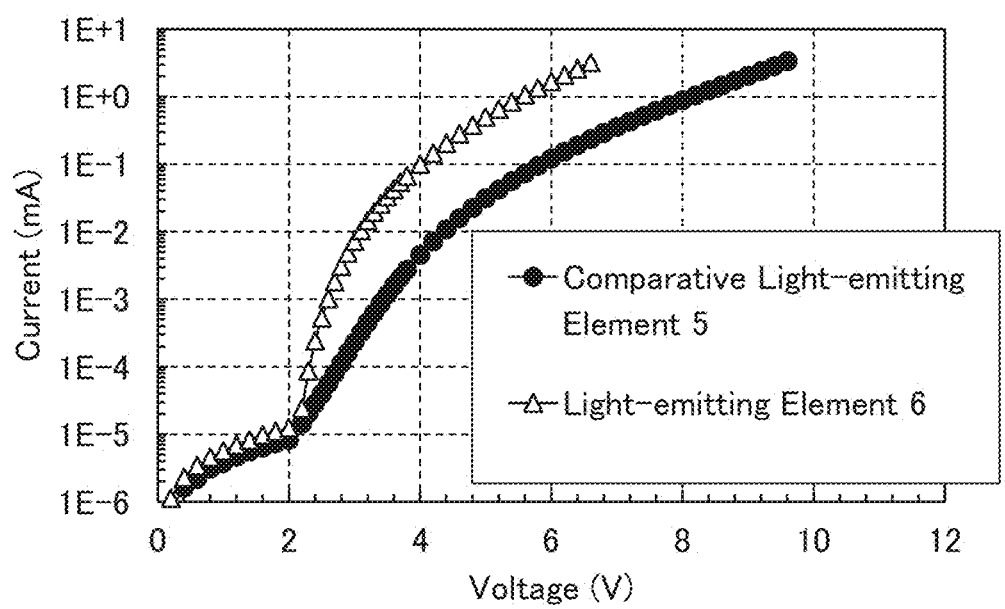
FIG. 22 shows current-voltage characteristics of light-emitting elements in Example.
Figure 23:
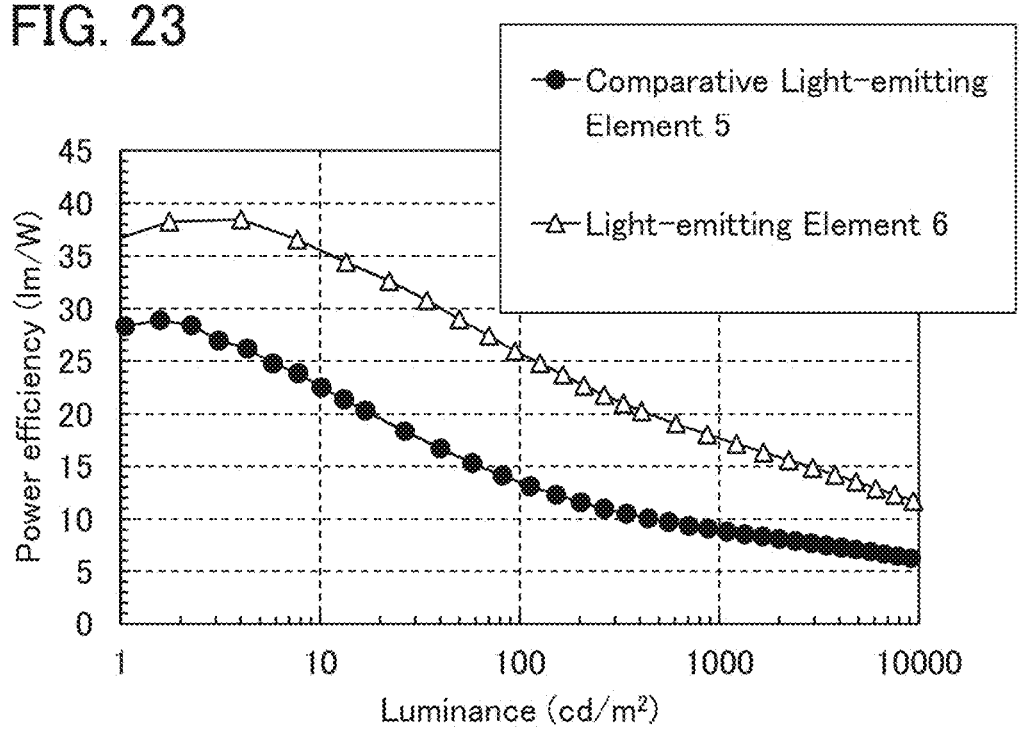
FIG. 23 shows power efficiency-luminance characteristics of light-emitting elements in Example.

FIG. 21 shows the current efficiency-luminance characteristics of the fabricated light-emitting element 5 and light-emitting element 6; FIG. 22, the current-voltage characteristics thereof; FIG. 23, the power efficiency-luminance characteristics thereof; and FIG. 24, the external quantum efficiency-luminance characteristics thereof. FIG. 25 shows the electroluminescence spectra of the light-emitting elements through which current flows at a current density of 2.5 mA/cm$^2$.

Table 8 shows the element characteristics of the comparative light-emitting element 5 and the light-emitting element 6 at around 1000 cd/m$^2$.

TABLE 8

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Comparative light-emitting element 5 | 6.6 | 5.9 | (0.66, 0.34) | 1092 | 19 | 9 | 14 |
| Light-emitting element 6 | 4.2 | 3.6 | (0.66, 0.34) | 872 | 24 | 18 | 18 |

As shown in FIG. 22, the light-emitting element 6 exhibited favorable current density-voltage characteristics compared with the comparative light-emitting element 5. This indicates that in the case where the host material of the light-emitting layer is used for the electron-transport layer and the electron-injection layer is in contact with the electron-transport layer, the light-emitting element according to one embodiment of the present invention has electron-injection properties superior to those of the light-emitting element using LiF which is a material typically used for the electron-injection layer.

Figure 24:
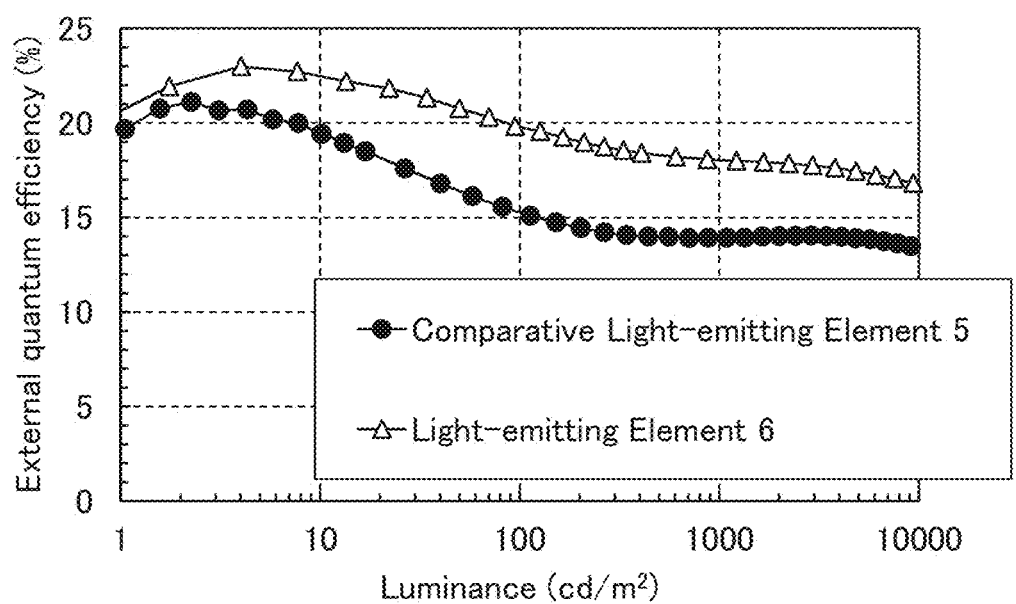
FIG. 24 shows external quantum efficiency-luminance characteristics of light-emitting elements in Example.
Figure 25:
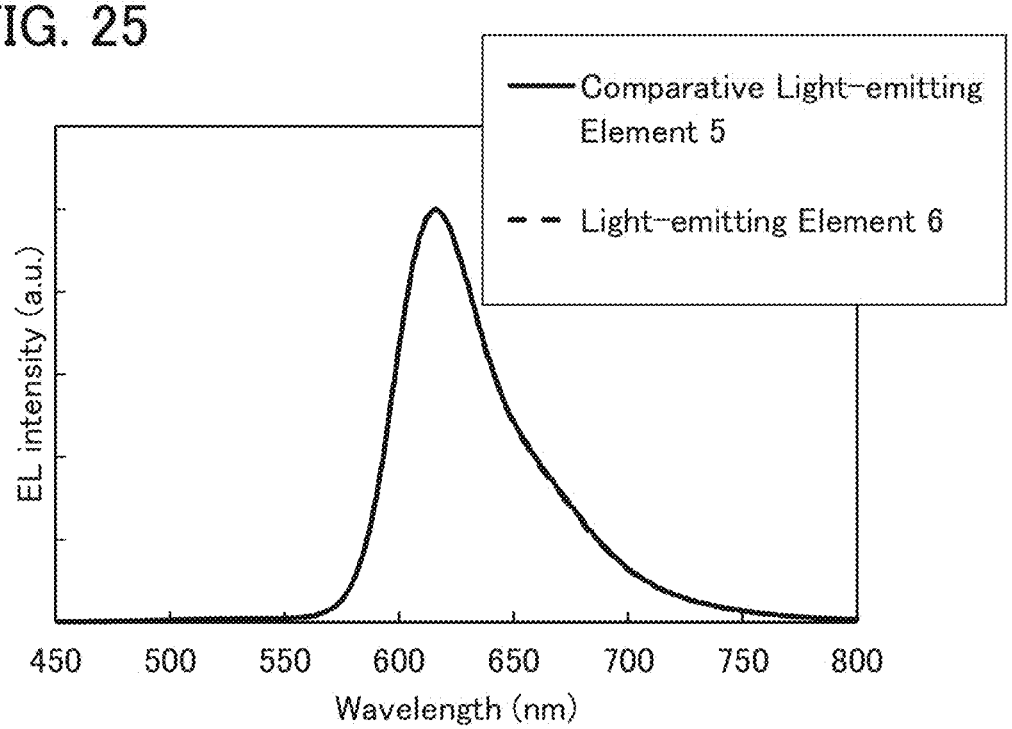
FIG. 25 shows electroluminescence spectra of light-emitting elements in Example.

As shown in FIGS. 21, 23, and 24 and Table 8, the light-emitting element 6 exhibited higher emission efficiency (current efficiency, power efficiency, and external quantum efficiency) than the comparative light-emitting element 5. That is, the light-emitting element 6 has electron-injection properties superior to those of the comparative light-emitting element 5 as described above, and thus has a favorable carrier balance.

As shown in FIG. 25, the comparative light-emitting element 5 and the light-emitting element 6 each exhibited red emission whose electroluminescence spectrum has a peak wavelength at approximately 616 nm and a full width at half maximum of 53 nm. The obtained electroluminescence spectrum reveals that the light is emitted from the guest material, Ir(dmdppr-dmp)$_2$(dmp).

Figure 43:
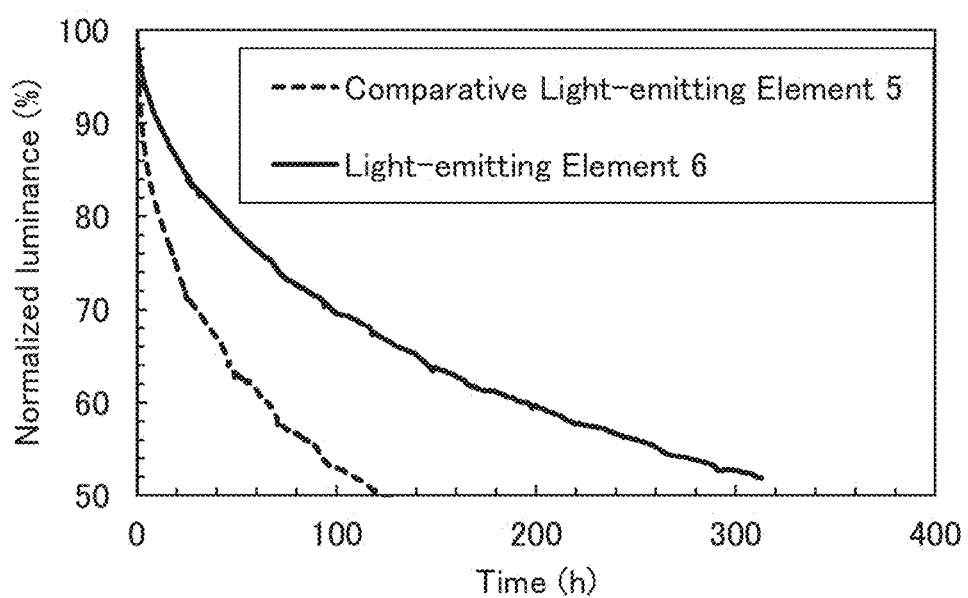
FIG. 43 shows results of driving lifetime tests of light-emitting elements in Example.

Next, driving lifetime tests of the comparative light-emitting element 5 and the light-emitting element 6 were performed. The measurement results of the driving lifetime tests are shown in FIG. 43. Note that in the driving lifetime tests, each light-emitting element was continuously driven at a constant current density of 25 mA/cm$^2$.

As shown in FIG. 43, the light-emitting element 6, which had a longer driving lifetime than the comparative light-emitting element 5, exhibited a favorable driving lifetime.

That is, the light-emitting element including the electron-injection layer according to one embodiment of the present invention has a favorable driving lifetime.

<Absorption Spectrum of Composite Material of Organic Compound and Transition Metal>

Figure 26:
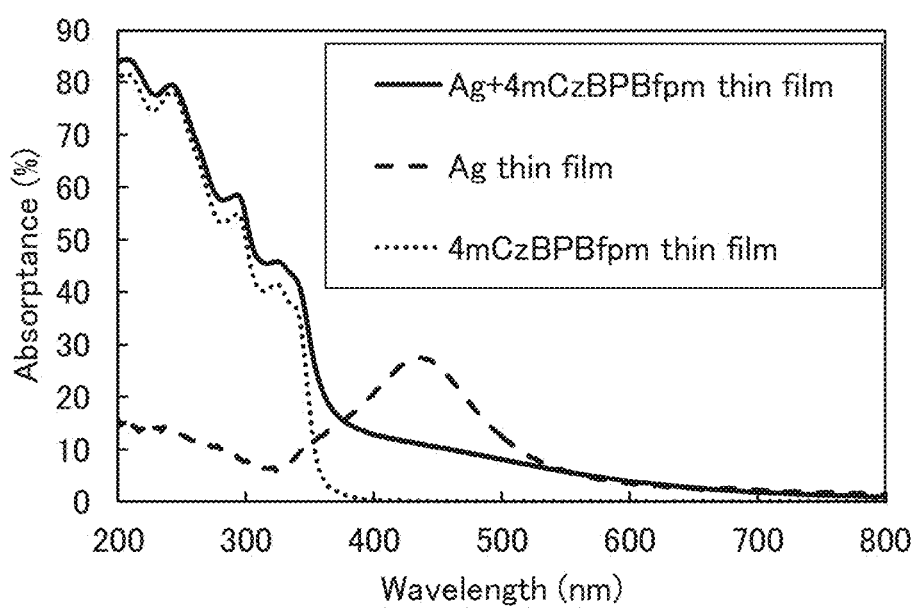
FIG. 26 shows absorption spectra of thin films in Example.

Next, the absorption spectrum of a composite material of 4mCzBPBfpm and Ag, which is used for the electron-injection layer of the light-emitting element 6, was measured. The results are shown in FIG. 26. The fabrication and measurement of the samples were performed in a manner similar to that in Example 1.

As shown in FIG. 26, a surface plasmon peak specific to a metal thin film was observed at around 450 nm for the Ag thin film. In contrast, the surface plasmon peak was not observed for the composite material of 4mCzBPBfpm and Ag as in Example 1. Hence, in the thin film made with the composite material of 4mCzBPBfpm and Ag, 4mCzBPBfpm and Ag probably interact with each other.

From the above, the light-emitting element according to one embodiment of the present invention can be favorably used as an element in which a host material of a light-emitting layer is used for an electron-injection layer and an electron-transport layer and the electron-injection layer is in contact with the electron-transport layer. In addition, a material including a pyrimidine ring can be favorably used for the light-emitting element according to one embodiment of the present invention. The structures shown in this example can be used in appropriate combination with any of the other embodiments and examples.

Example 3

Described in this example are examples of fabricating light-emitting elements 8 to 10 according to one embodiment of the present invention and a comparative light-emitting element 7. A schematic cross-sectional view of the light-emitting elements fabricated in this example is shown in FIG. 12. Details of the element structures are shown in Table 9. Note that the above embodiments and examples can be referred to for the structures and abbreviations of compounds used in this example.

TABLE 9

| Layer | Reference numeral | Thickness (nm) | Material | Weight ratio |
|---|---|---|---|---|
| Comparative light-emitting element 7 | | | | |
| Electrode | 102 | 200 | Al | — |
| Electron-injection layer | 130 | 0.2 | Li$_2$O | — |
| Electron-transport layer | 118(2) | 20 | NBPhen | — |
| | 118(1) | 20 | 2mDBTBPDBq-II | — |
| Light-emitting layer | 140 | 40 | 2mDBTBPDBq-II:PCBBiF:Ir(dmdppr-dmp)$_2$(dpm) | 0.75:0.25:0.06 |
| Hole-transport layer | 112 | 20 | BPAFLP | — |
| Hole-injection layer | 111 | 65 | DBT3P-II:MoO$_3$ | 1:0.5 |
| Electrode | 101 | 70 | ITSO | — |
| Light-emitting element 8 | | | | |
| Electrode | 102 | 200 | Al | — |
| Electron-injection layer | 130 | 5 | NBPhen:Ag | 1:0.19 |
| Electron-transport layer | 118(2) | 15 | NBPhen | — |
| | 118(1) | 20 | 2mDBTBPDBq-II | — |
| Light-emitting layer | 140 | 40 | 2mDBTBPDBq-II:PCBBiF:Ir(dmdppr-dmp)$_2$(dpm) | 0.75:0.25:0.06 |
| Hole-transport layer | 112 | 20 | BPAFLP | — |
| Hole-injection layer | 111 | 65 | DBT3P-II:MoO$_3$ | 1:0.5 |
| Electrode | 101 | 70 | ITSO | — |
| Light-emitting element 9 | | | | |
| Electrode | 102 | 200 | Al | — |
| Electron-injection layer | 130 | 5 | 2Py3Tzn:Ag | 1:0.35 |
| Electron-transport layer | 118(3) | 5 | NBPhen:Ag | 1:0.19 |
| | 118(2) | 10 | NBPhen | — |
| | 118(1) | 20 | 2mDBTBPDBq-II | — |
| Light-emitting layer | 140 | 40 | 2mDBTBPDBq-II:PCBBiF:Ir(dmdppr-dmp)$_2$(dpm) | 0.75:0.25:0.06 |
| Hole-transport layer | 112 | 20 | BPAFLP | — |
| Hole-injection layer | 111 | 65 | DBT3P-II:MoO$_3$ | 1:0.5 |
| Electrode | 101 | 70 | ITSO | — |
| Light-emitting element 10 | | | | |
| Electrode | 102 | 200 | Al | — |
| Electron-injection layer | 130 | 5 | TmPPPyTz:Ag | 1:0.15 |
| Electron-transport layer | 118(2) | 15 | NBPhen | — |
| | 118(1) | 20 | 2mDBTBPDBq-II | — |
| Light-emitting layer | 140 | 40 | 2mDBTBPDBq-II:PCBBiF:Ir(dmdppr-dmp)$_2$(dpm) | 0.75:0.25:0.06 |
| Hole-transport layer | 112 | 20 | BPAFLP | — |
| Hole-injection layer | 111 | 65 | DBT3P-II:MoO$_3$ | 1:0.5 |
| Electrode | 101 | 70 | ITSO | — |

The LUMO levels of the organic compounds that were used in the electron-injection layer 130 of the light-emitting elements 9 and 10, were calculated by cyclic voltammetry (CV) measurement. The measurement was performed in a manner similar to that in Example 1.

As a result, the LUMO levels of 2Py3Tzn and TmPPPyTz were calculated to be −3.15 eV and −3.00 eV, respectively.

<Fabrication of Light-Emitting Elements>

Fabrication methods of the light-emitting elements in this example will be described below. The comparative light-emitting element 7 uses Li$_2$O, which is a Li compound typically used for the electron-injection layer. The light-emitting elements 8 to 10 each use for the electron-injection layer a composite material of a transition metal and an organic compound having an unshared electron pair according to one embodiment of the present invention. In the light-emitting elements in this example, an organic compound including a triazine ring is used as the organic compound having an unshared electron pair.

«Fabrication of Comparative Light-Emitting Element 7»

The comparative light-emitting element 7 was fabricated through the same steps as those for the comparative light-emitting element 1 except for the steps of forming the electron-transport layer 118 and the electron-injection layer 130.

As the electron-transport layer 118(1), 2mDBTBPDBq-II was deposited over the light-emitting layer 140 by evaporation to a thickness of 20 nm. Subsequently, as the electron-transport layer 118(2), NBPhen was deposited by evaporation to a thickness of 20 nm. Then, as the electron-injection layer 130, Li$_2$O was deposited over the electron-transport layer 118(2) by evaporation to a thickness of 0.2 nm.

«Fabrication of Light-Emitting Elements 8 to 10»

The light-emitting elements 8 to 10 were fabricated through the same steps as those for the comparative light-emitting element 7 except for the steps of forming the electron-transport layer 118(2) and the electron-injection layer 130.

<Fabrication of Light-Emitting Element 8>

As the electron-transport layer 118(2) of the light-emitting element 8, NBPhen was deposited over the electron-transport layer 118(1) by evaporation to a thickness of 15 nm.

As the electron-injection layer 130, NBPhen and Ag were deposited over the electron-transport layer 118(2) by co-evaporation in a weight ratio of NBPhen:Ag=1:0.19 to a thickness of 5 nm.

<Fabrication of Light-Emitting Element 9>

As the electron-transport layer 118(2) of the light-emitting element 9, NBPhen was deposited over the electron-transport layer 118(1) by evaporation to a thickness of 10 nm. Subsequently, as an electron-transport layer 118(3), NBPhen and Ag were deposited by co-evaporation in a weight ratio of NBPhen:Ag=1:0.19 to a thickness of 5 nm.

As the electron-injection layer 130, 2Py3Tzn and Ag were deposited over the electron-transport layer 118(3) by co-evaporation in a weight ratio of 2Py3Tzn:Ag=1:0.35 to a thickness of 5 nm.

<Fabrication of Light-Emitting Element 10>

As the electron-transport layer 118(2) of the light-emitting element 10, NBPhen was deposited over the electron-transport layer 118(1) by evaporation to a thickness of 15 nm.

As the electron-injection layer 130, TmPPPyTz and Ag were deposited over the electron-transport layer 118(2) by co-evaporation in a weight ratio of TmPPPyTz:Ag=1:0.15 to a thickness of 5 nm.

<Characteristics of Light-Emitting Elements>

Next, the element characteristics of the fabricated comparative light-emitting element 7 and light-emitting elements 8 to 10 were measured. The measurement was performed in a manner similar to that in Example 1.

Figure 27:
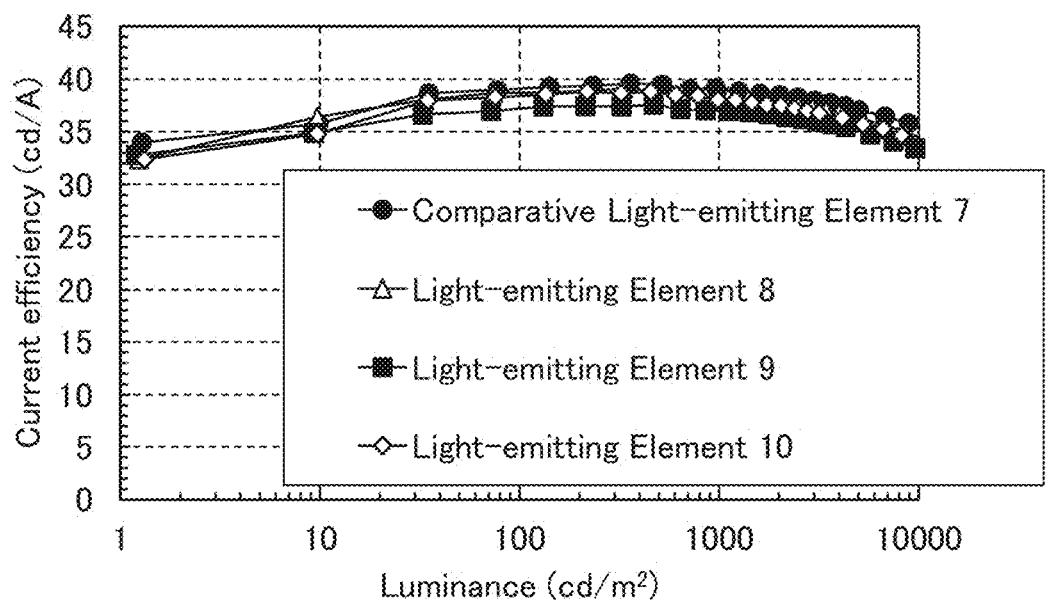
FIG. 27 shows current efficiency-luminance characteristics of light-emitting elements in Example.
Figure 28:
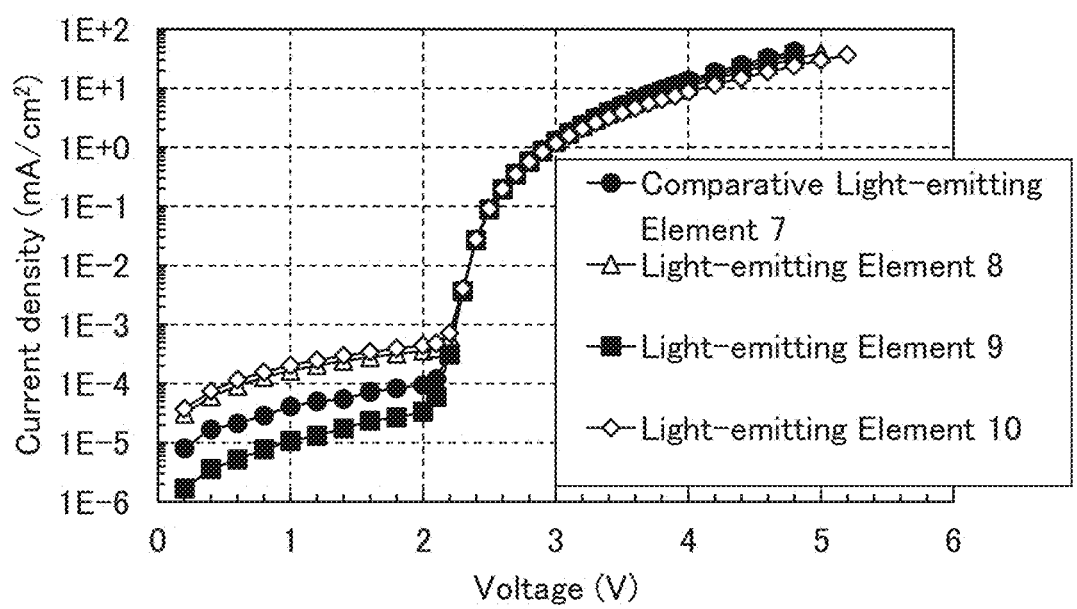
FIG. 28 shows current density-voltage characteristics of light-emitting elements in Example.
Figure 29:
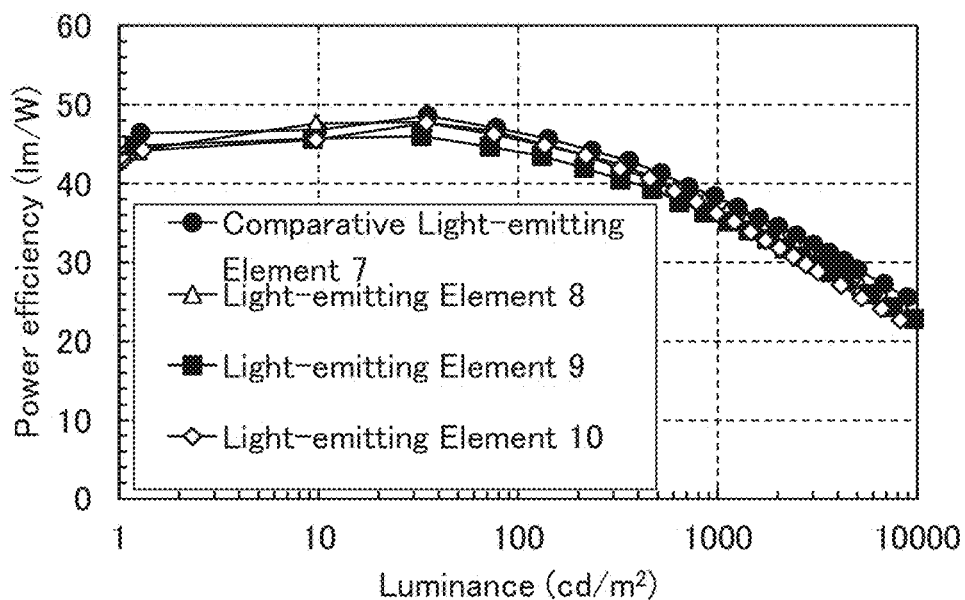
FIG. 29 shows power efficiency-luminance characteristics of light-emitting elements in Example.

FIG. 27 shows the current efficiency-luminance characteristics of the fabricated comparative light-emitting element 7 and light-emitting elements 8 to 10; FIG. 28, the current density-voltage characteristics thereof; FIG. 29, the power efficiency-luminance characteristics thereof, and FIG. 30, the external quantum efficiency-luminance characteristics thereof. FIG. 31 shows the electroluminescence spectra of the light-emitting elements through which current flows at a current density of 2.5 mA/cm².

Table 10 shows the element characteristics of the comparative light-emitting element 7 and the light-emitting elements 8 to 10 at around 1000 cd/m².

As shown in FIG. 28, the comparative light-emitting element 7 and the light-emitting elements 8 to 10 exhibited favorable current density-voltage characteristics. It was also found that the light-emitting elements 8 to 10 according to one embodiment of the present invention had the electron-injection properties equivalent to those of the comparative light-emitting element 7, which uses $Li_2O$ typically used for the electron-injection layer.

As shown in FIG. 31, the comparative light-emitting element 7 and the light-emitting elements 8 to 10 each exhibited red emission whose electroluminescence spectrum has a peak wavelength at approximately 616 nm and a full width at half maximum of approximately 53 nm. The obtained electroluminescence spectrum reveals that the light is emitted from the guest material, $Ir(dmdppr-dmp)_2(dmp)$.

Figure 44:
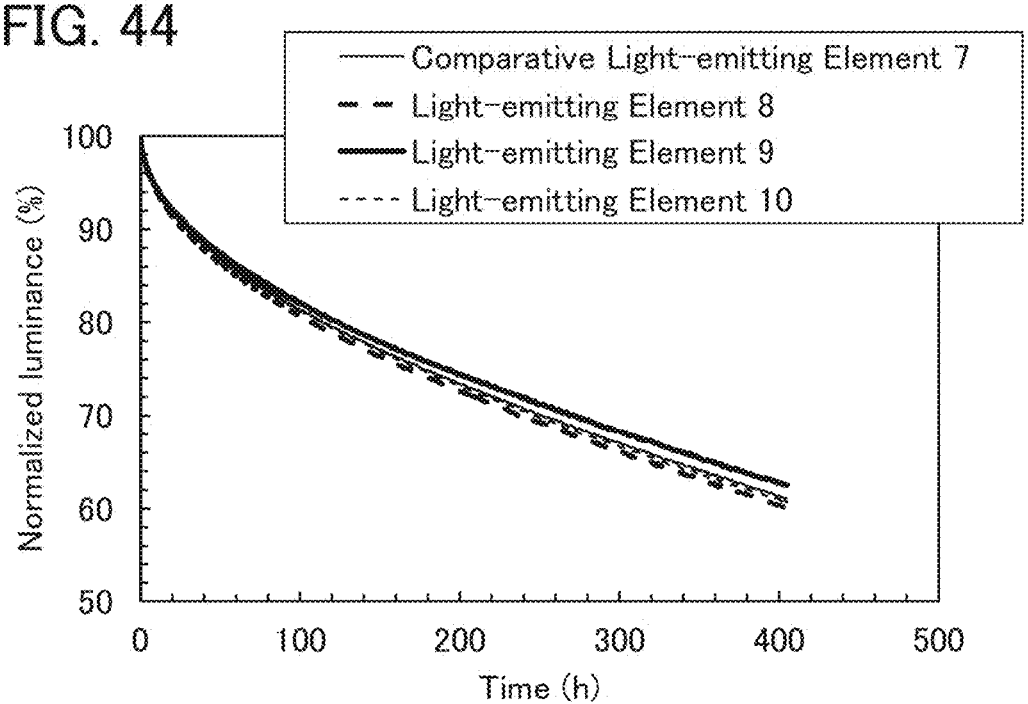
FIG. 44 shows results of driving lifetime tests of light-emitting elements in Example.

Next, driving lifetime tests of the comparative light-emitting element 7 and the light-emitting elements 8 to 10 were performed. The measurement results of the driving lifetime tests are shown in FIG. 44. Note that in the driving lifetime tests, each light-emitting element was continuously driven at a constant current density of 25 mA/cm².

As shown in FIG. 44, the light-emitting elements 8 to 10 exhibited a driving lifetime equivalent to that of the comparative light-emitting element 7.

From the above, an organic compound including a triazine ring can be favorably used for the light-emitting element according to one embodiment of the present invention. The structures shown in this example can be used in appropriate combination with any of the other embodiments and examples.

TABLE 10

| | Voltage (V) | Current density (mA/cm²) | CIE chromaticity (x, y) | Luminance (cd/m²) | Current efficiency (cd/A) | Power efficiency (lm/W) | External quantum efficiency (%) |
|---|---|---|---|---|---|---|---|
| Comparative light-emitting element 7 | 3.2 | 2.5 | (0.66, 0.34) | 964 | 39 | 38 | 31 |
| Light-emitting element 8 | 3.3 | 2.9 | (0.66, 0.34) | 1111 | 38 | 36 | 30 |
| Light-emitting element 9 | 3.3 | 3.0 | (0.66, 0.34) | 1123 | 37 | 35 | 29 |
| Light-emitting element 10 | 3.3 | 2.6 | (0.66, 0.34) | 988 | 38 | 36 | 30 |

Figure 30:
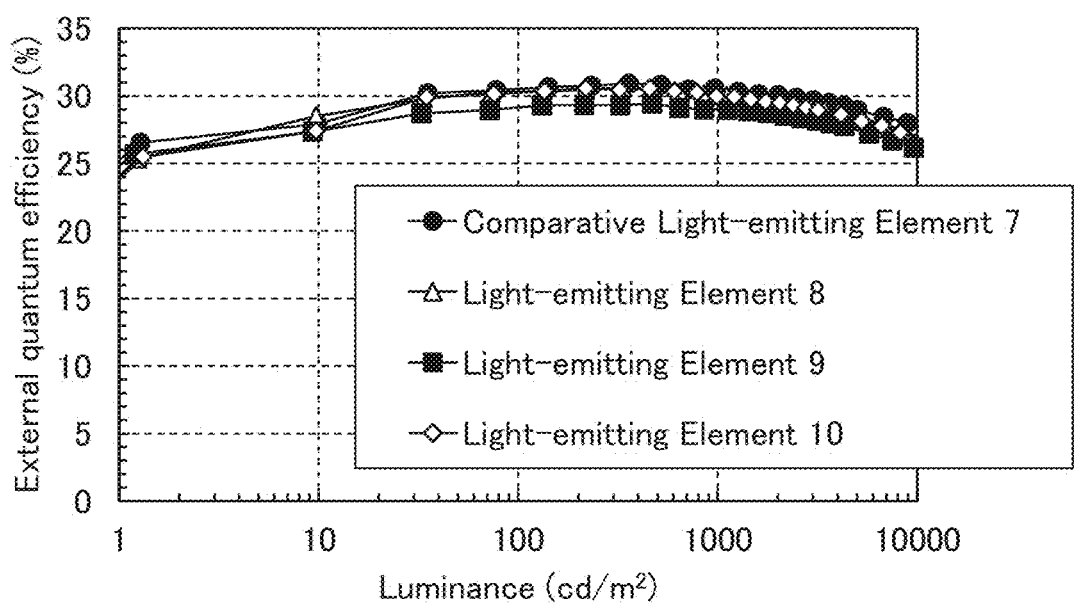
FIG. 30 shows external quantum efficiency-luminance characteristics of light-emitting elements in Example.
Figure 31:
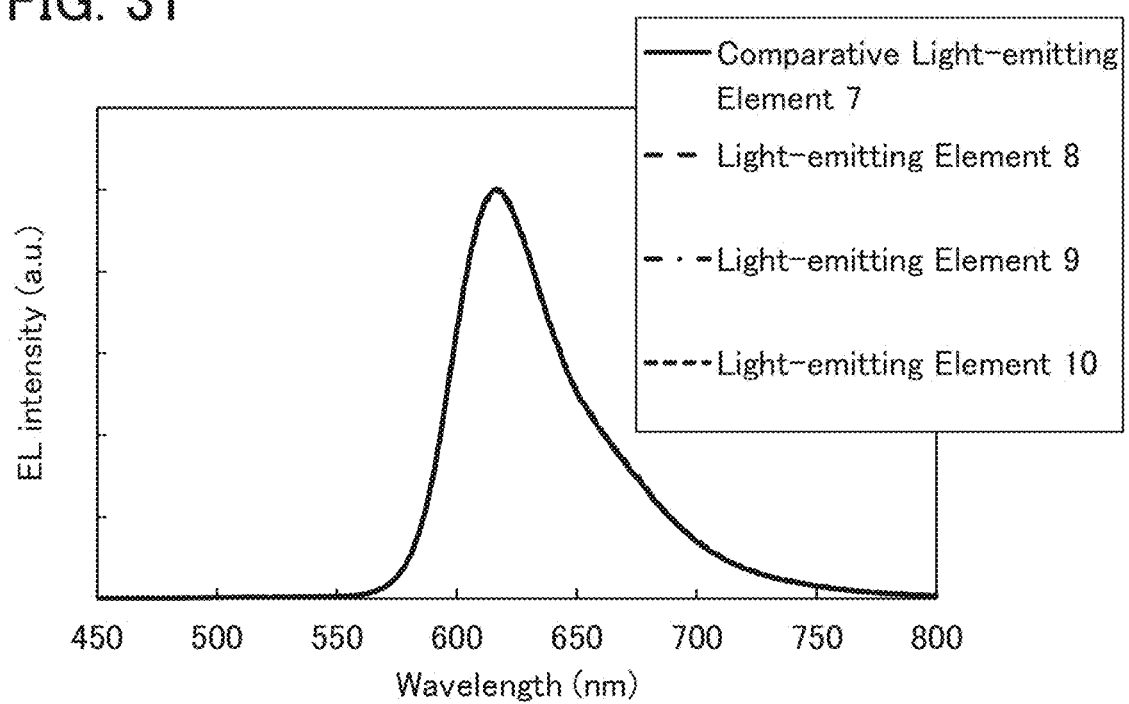
FIG. 31 shows electroluminescence spectra of light-emitting elements in Example.

As shown in FIG. 30 and Table 10, the comparative light-emitting element 7 and the light-emitting elements 8 to 10 each exhibited high emission efficiency with an external quantum efficiency exceeding 25%. The comparative light-emitting element 7 and the light-emitting elements 8 to 10 also exhibited high current efficiency and power efficiency as shown in FIGS. 27 and 29. The light-emitting elements 8 to 10 according to one embodiment of the present invention exhibited high efficiency equivalent to that of the comparative light-emitting element 7, which uses $Li_2O$ typically used for the electron-injection layer.

Example 4

Described in this example are examples of fabricating light-emitting elements 12 to 14 according to one embodiment of the present invention and a comparative light-emitting element 11. A schematic cross-sectional view of the light-emitting elements fabricated in this example is shown in FIG. 12. Details of the element structures are shown in Table 11. The structure and abbreviation of a compound used in this example are shown below. Note that the above embodiments and examples can be referred to for the structures and abbreviations of the other compounds.

[Chemical Formula 5]

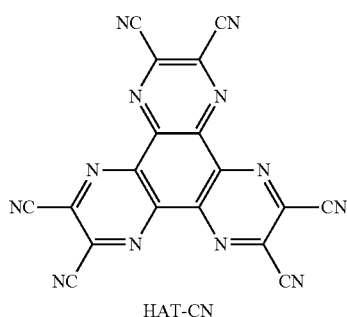

HAT-CN

«Fabrication of Comparative Light-Emitting Element 11»

The comparative light-emitting element 11 was fabricated through the same steps as those for the comparative light-emitting element 1 except for the steps of forming the electron-transport layer 118 and the electron-injection layer 130.

As the electron-transport layer 118(1) of the comparative light-emitting element 11, 2mDBTBPDBq-II was deposited by evaporation to a thickness of 20 nm.

Next, as the electron-transport layer 118(2), NBPhen was deposited over the electron-transport layer 118(1) by evaporation to a thickness of 15 nm. In the comparative light-emitting element 11, the electron-injection layer 130 was not provided over the electron-transport layer 118(2).

TABLE 11

| Layer | | Reference numeral | Thickness (nm) | Material | Weight ratio |
|---|---|---|---|---|---|
| Comparative light-emitting element 11 | Electrode | 102 | 200 | Al | — |
| | Electron-transport layer | 118(2) | 15 | NBPhen | — |
| | | 118(1) | 20 | 2mDBTBPDBq-II | — |
| | Light-emitting layer | 140 | 40 | 2mDBTBPDBq-II:PCBBiF:Ir(dmdppr-dmp)$_2$(dpm) | 0.75:0.25:0.06 |
| | Hole-transport layer | 112 | 20 | BPAFLP | — |
| | Hole-injection layer | 111 | 65 | DBT3P-II:MoO$_3$ | 1:0.5 |
| | Electrode | 101 | 70 | ITSO | — |
| Light-emitting element 12 | Electrode | 102 | 200 | Al | — |
| | Electron-injection layer | 130 | 5 | NBPhen:Ag | 1:0.19 |
| | Electron-transport layer | 118(2) | 15 | NBPhen | — |
| | | 118(1) | 20 | 2mDBTBPDBq-II | — |
| | Light-emitting layer | 140 | 40 | 2mDBTBPDBq-II:PCBBiF:Ir(dmdppr-dmp)$_2$(dpm) | 0.75:0.25:0.06 |
| | Hole-transport layer | 112 | 20 | BPAFLP | — |
| | Hole-injection layer | 111 | 65 | DBT3P-II:MoO$_3$ | 1:0.5 |
| | Electrode | 101 | 70 | ITSO | — |
| Light-emitting element 13 | Electrode | 102 | 200 | Al | — |
| | Electron-injection layer | 130(2) | 5 | HATNA:Ag | 1:0.28 |
| | | 130(1) | 5 | NBPhen:Ag | 1:0.19 |
| | Electron-transport layer | 118(2) | 10 | NBPhen | — |
| | | 118(1) | 20 | 2mDBTBPDBq-II | — |
| | Light-emitting layer | 140(1) | 40 | 2mDBTBPDBq-II:PCBBiF:Ir(dmdppr-dmp)$_2$(dpm) | 0.75:0.25:0.06 |
| | Hole-transport layer | 112 | 20 | BPAFLP | — |
| | Hole-injection layer | 111 | 65 | DBT3P-II:MoO$_3$ | 1:0.5 |
| | Electrode | 101 | 70 | ITSO | — |
| Light-emitting element 14 | Electrode | 102 | 200 | Al | — |
| | Buffer layer | 117 | 5 | HAT-CN | — |
| | Electron-injection layer | 130(2) | 5 | HATNA:Ag | 1:0.28 |
| | | 130(1) | 5 | NBPhen:Ag | 1:0.19 |
| | Electron-transport layer | 118(2) | 10 | NBPhen | — |
| | | 118(1) | 20 | 2mDBTBPDBq-II | — |
| | Light-emitting layer | 140(1) | 40 | 2mDBTBPDBq-II:PCBBiF:Ir(dmdppr-dmp)$_2$(dpm) | 0.75:0.25:0.06 |
| | Hole-transport layer | 112 | 20 | BPAFLP | — |
| | Hole-injection layer | 111 | 65 | DBT3P-II:MoO$_3$ | 1:0.5 |
| | Electrode | 101 | 70 | ITSO | — |

The LUMO level of HATNA used in the electron-injection layer 130 of the light-emitting elements 13 and 14 was calculated by cyclic voltammetry (CV) measurement. The measurement was performed in a manner similar to that in Example 1.

As a result, the LUMO level of HATNA was calculated to be −3.50 eV

«Fabrication of Light-Emitting Element 12»

The light-emitting element 12 was fabricated through the same steps as those for the comparative light-emitting element 11 except for the step of forming the electron-injection layer 130.

As the electron-injection layer 130 of the light-emitting element 12, NBPhen and Ag were deposited over the electron-transport layer 118(2) by co-evaporation in a weight ratio of NBPhen:Ag=1:0.19 to a thickness of 5 nm.

<Fabrication of Light-Emitting Element 13>

The light-emitting element 13 was fabricated through the same steps as those for the comparative light-emitting element 11 except for the steps of forming the electron-transport layer 118(2) and the electron-injection layer 130.

As the electron-transport layer 118(2) of the light-emitting element 13, NBPhen was deposited over the electron-transport layer 118(1) by evaporation to a thickness of 10 nm.

As the electron-injection layer 130, NBPhen and Ag were deposited over the electron-transport layer 118(2) by co-evaporation in a weight ratio of NBPhen:Ag=1:0.19 to a thickness of 5 nm. Furthermore, HATNA and Ag were deposited by co-evaporation in a weight ratio of HATNA:Ag=1:0.28 to a thickness of 5 nm.

«Fabrication of Light-Emitting Element 14»

The light-emitting element 14 was fabricated through the same steps as those for the light-emitting element 13 except for the step of additionally forming the buffer layer 117.

As the buffer layer 117, HAT-CN was deposited over the electron-injection layer 130 by evaporation to a thickness of 5 nm.

<Characteristics of Light-Emitting Elements>

Next, the element characteristics of the fabricated comparative light-emitting element 11 and light-emitting elements 12 to 14 were measured. The measurement was performed in a manner similar to that in Example 1.

Figure 32:
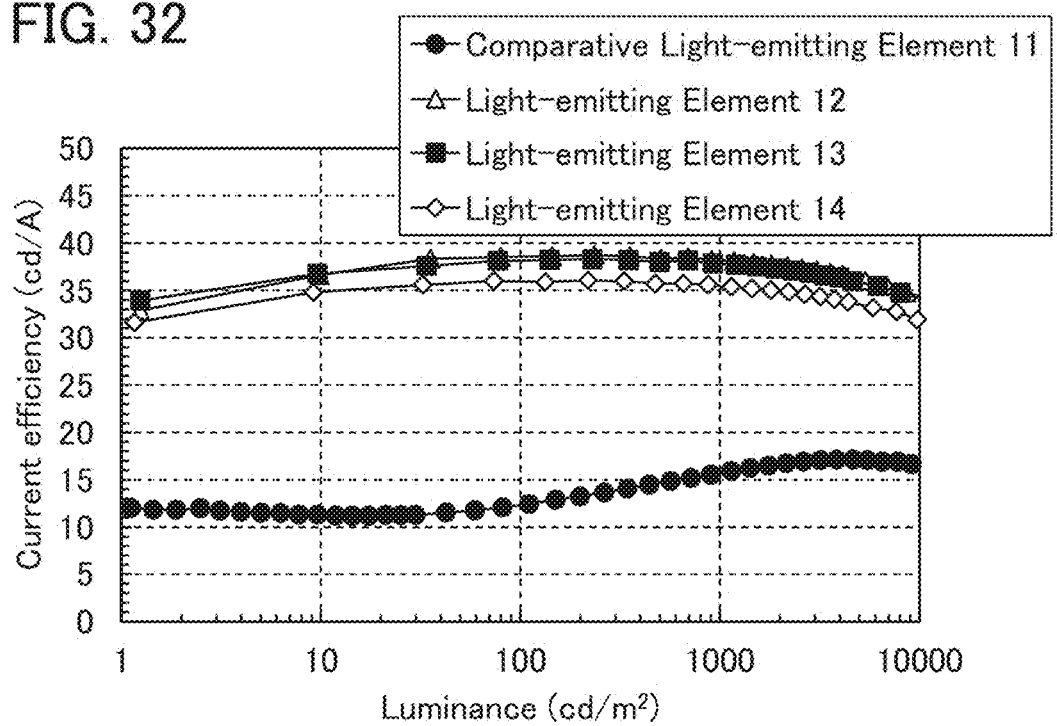
FIG. 32 shows current efficiency-luminance characteristics of light-emitting elements in Example.
Figure 33:
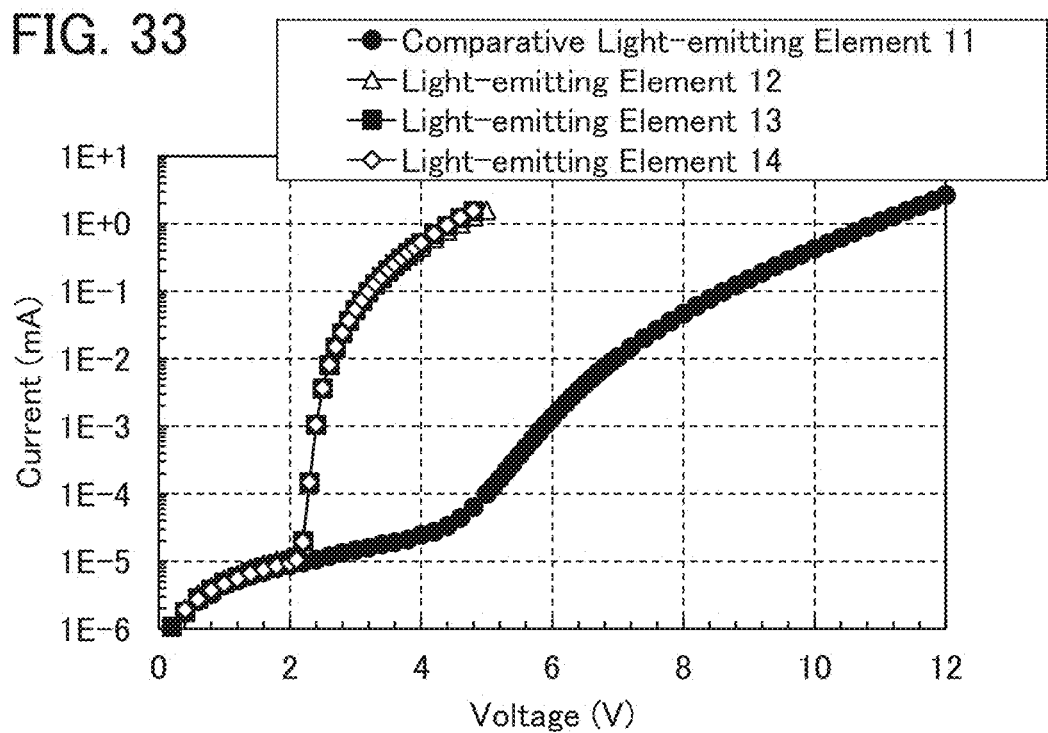
FIG. 33 shows current-voltage characteristics of light-emitting elements in Example.
Figure 34:
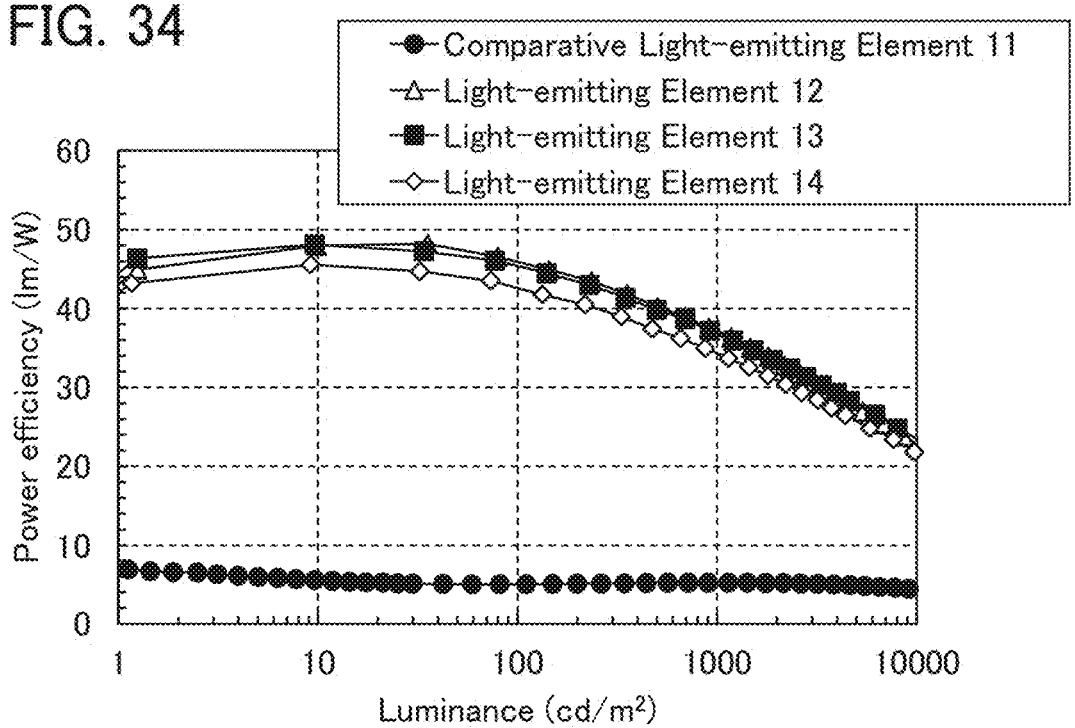
FIG. 34 shows power efficiency-luminance characteristics of light-emitting elements in Example.

FIG. 32 shows the current efficiency-luminance characteristics of the fabricated comparative light-emitting element 11 and light-emitting elements 12 to 14; FIG. 33, the current-voltage characteristics thereof; FIG. 34, the power efficiency-luminance characteristics thereof; and FIG. 35, the external quantum efficiency-luminance characteristics thereof. FIG. 36 shows the electroluminescence spectra of the light-emitting elements through which current flows at a current density of 2.5 mA/cm$^2$.

Table 12 shows the element characteristics of the comparative light-emitting element 11 and the light-emitting elements 12 to 14 at around 1000 cd/m$^2$.

TABLE 12

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Comparative light-emitting element 11 | 9.4 | 5.8 | (0.66, 0.34) | 904 | 16 | 5 | 12 |
| Light-emitting element 12 | 3.2 | 2.4 | (0.66, 0.34) | 912 | 38 | 38 | 31 |
| Light-emitting element 13 | 3.2 | 2.4 | (0.66, 0.34) | 920 | 38 | 37 | 30 |
| Light-emitting element 14 | 3.2 | 2.5 | (0.66, 0.34) | 876 | 36 | 36 | 30 |

Figure 35:
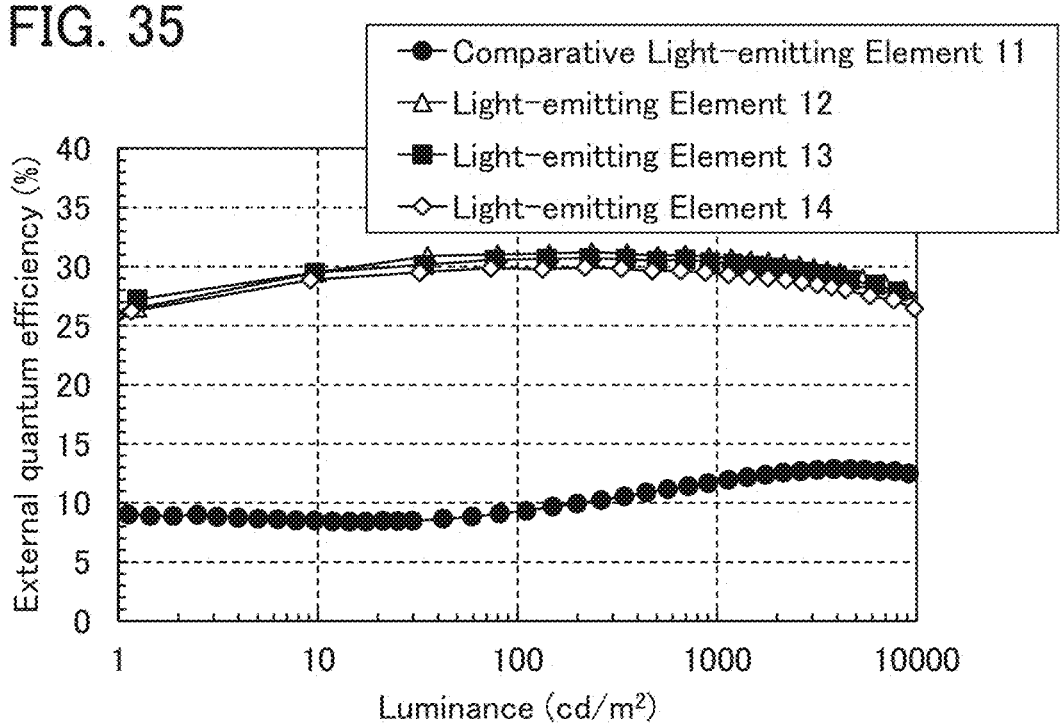
FIG. 35 shows external quantum efficiency-luminance characteristics of light-emitting elements in Example.
Figure 36:
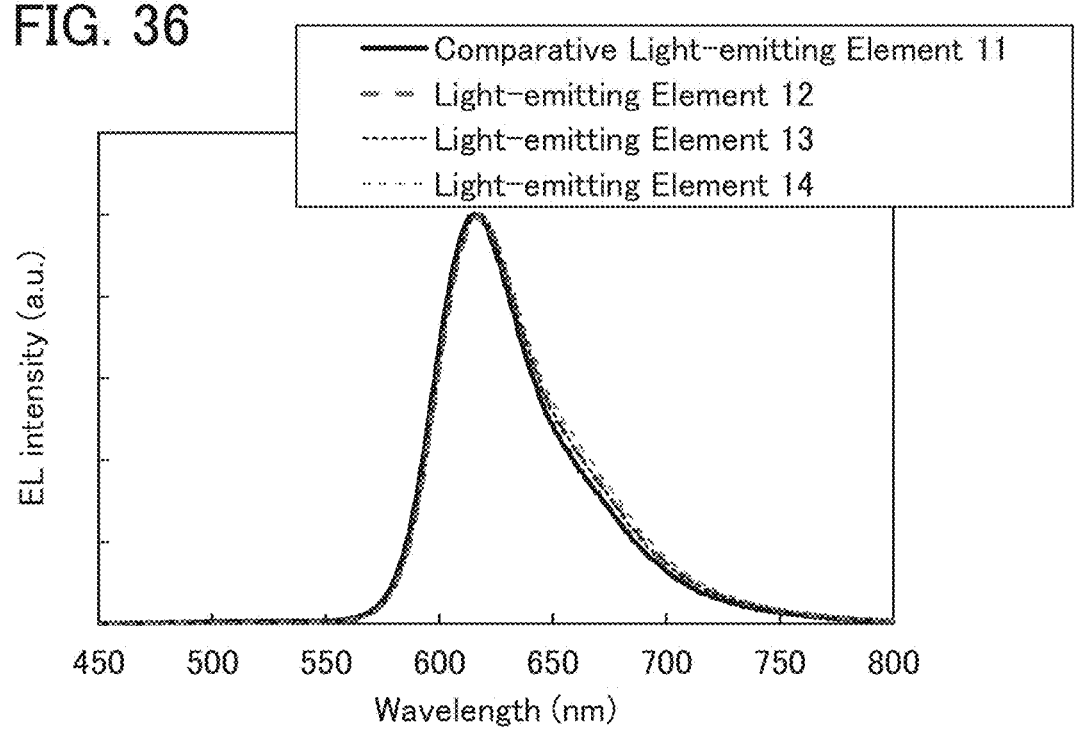
FIG. 36 shows electroluminescence spectra of light-emitting elements in Example.

As shown in FIG. 35 and Table 12, the light-emitting elements 12 to 14 each exhibited high emission efficiency with an external quantum efficiency of approximately 30%. The light-emitting elements 12 to 14 also exhibited high current efficiency and power efficiency as shown in FIGS. 32 and 34. In contrast, the comparative light-emitting element 11, which does not include the electron-injection layer 130, has a low efficiency, indicating that the light-emitting element including the electron-injection layer according to one embodiment of the present invention has a favorable carrier balance. In addition, the efficiency of the light-emitting elements 13 and 14 is equivalent to that of the light-emitting element 12; thus, HATNA can be favorably used as the organic compound having an unshared electron pair. The light-emitting element 14, which includes the buffer layer stacked between the cathode and the electron-injection layer, exhibited characteristics similar to those of the light-emitting element 12.

As shown in FIG. 33, the light-emitting elements 12 to 14 exhibited favorable current-voltage characteristics. Furthermore, the equivalent current-voltage characteristics of the light-emitting elements 12 to 14 indicate that the electron-injection layer including the composite material of HATNA and the transition metal exhibits favorable characteristics. The light-emitting element 14, which includes the buffer layer stacked between the cathode and the electron-injection layer, also exhibited characteristics similar to those of the light-emitting element 12. In contrast, the comparative light-emitting element 11 that does not include the electron-injection layer 130 has a high driving voltage, indicating that the light-emitting element including the electron-injection layer according to one embodiment of the present invention has improved electron-injection properties.

As shown in FIG. 36, the comparative light-emitting element 11 and the light-emitting elements 12 to 14 each exhibited red emission whose electroluminescence spectrum has a peak wavelength at approximately 618 nm and a full width at half maximum of 58 nm. The obtained electroluminescence spectrum reveals that the light is emitted from the guest material, Ir(dmdppr-dmp)$_2$(dmp).

From the above, it was found that an organic compound with a conjugate double bond N—C—C—N over a plurality of ring structures, such as HATNA, can be favorably used for the light-emitting element according to one embodiment of the present invention. In addition, the light-emitting element according to one embodiment of the present invention, which includes the buffer layer stacked between the cathode and the electron-injection layer including the composite material of a transition metal and an organic compound having an unshared electron pair, has a high emission efficiency and a low driving voltage, and consumes low power.

<Reliability Test of Light-Emitting Elements>

Figure 45:
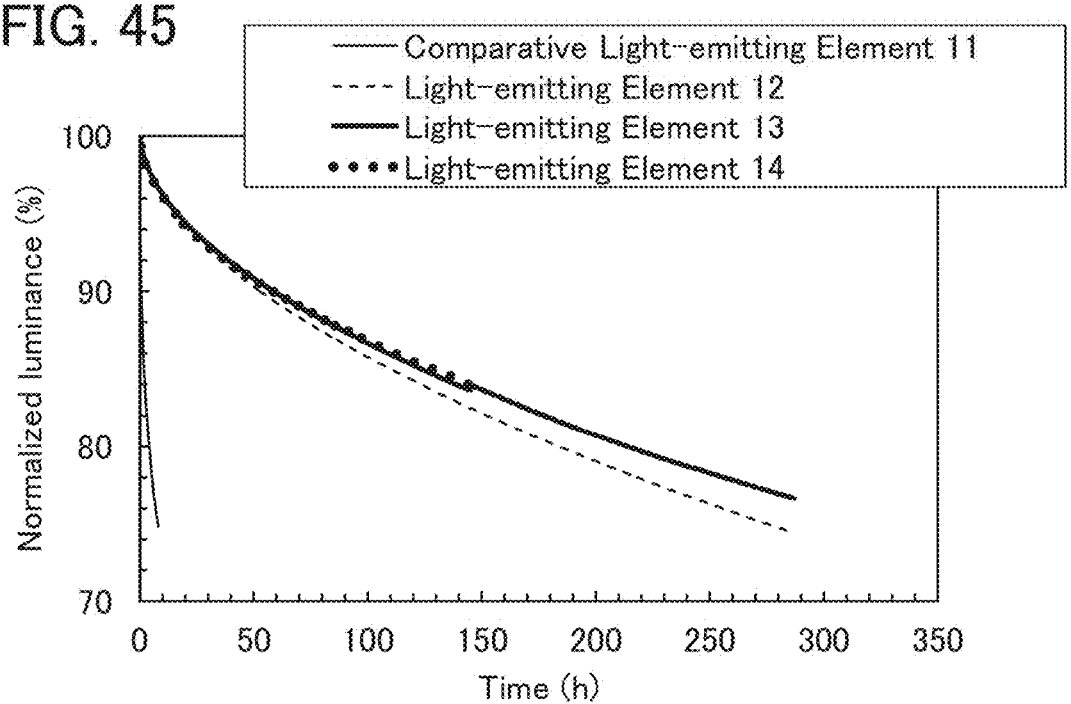
FIG. 45 shows results of driving lifetime tests of light-emitting elements in Example.

Next, driving lifetime tests of the comparative light-emitting element 11 and the light-emitting elements 12 to 14 were performed. The measurement results of the driving lifetime tests are shown in FIG. 45. Note that in the driving lifetime tests, each light-emitting element was continuously driven at a constant current density of 25 mA/cm$^2$.

As shown in FIG. 45, the light-emitting elements 12 to 14 exhibited a longer driving lifetime than the comparative light-emitting element 11. Furthermore, the light-emitting elements 13 and 14 exhibited a longer driving lifetime than the light-emitting element 12, indicating that the light-emitting element including the electron-injection layer according to one embodiment of the present invention has good reliability.

Next, a preservation test under constant temperature and humidity was performed on the light-emitting elements 13 and 14. Since each of the light-emitting elements is not sealed, the cathode and the EL layer are exposed to the atmosphere of the test environment.

In a thermostatic bath kept at a temperature of 65° C. and a humidity of 95%, the light-emitting elements 13 and 14 were placed for 48 hours; then, the emission state of each light-emitting element was measured. The measurement was performed in a manner similar to that in Example 1. Table 13 shows the measurement results.

TABLE 13

|  | Proportion of emission area |
|---|---|
| Light-emitting element 13 | 83% |
| Light-emitting element 14 | 67% |

The proportion of the emission area before and after the preservation test under constant temperature and humidity was estimated to be 83% (the light-emitting element 13) and 67% (the light-emitting element 14). That is, the light-emitting elements according to one embodiment of the present invention were found to be highly resistant to moisture.

The structures shown in this example can be used in appropriate combination with any of the other embodiments and examples.

Example 5

Figure 37:
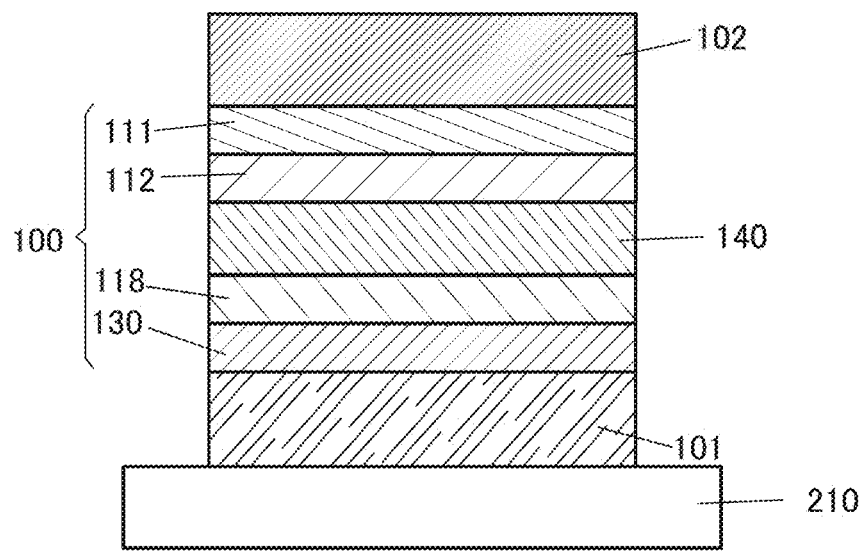
FIG. 37 is a schematic cross-sectional view illustrating a light-emitting element in Example.

Described in this example are examples of fabricating light-emitting elements 16 to 18 according to one embodiment of the present invention and a comparative light-emitting element 15. A schematic cross-sectional view of the light-emitting elements fabricated in this example is shown in FIG. 37. Details of the element structures are shown in Table 14. The element shown in this example has a so-called inverted stacked structure in which an EL layer is provided over a cathode (a structure in which an EL layer is provided over an anode is referred to as an ordered stacked structure). The above examples and Embodiment 1 can be referred to for the structures and abbreviations of organic compounds used in this example.

TABLE 14

|  | Layer | Reference numeral | Thickness (nm) | Material | Weight ratio |
|---|---|---|---|---|---|
| Comparative light-emitting element 15 | Electrode | 102 | 200 | Al | — |
|  | Hole-injection layer | 111 | 25 | DBT3P-II:MoO$_3$ | 1:0.5 |
|  | Hole-transport layer | 112 | 20 | BPAFLP | — |
|  | Light-emitting layer | 140 | 40 | 2mDBTBPDBq-II:PCBBiF:Ir(dmdppr-dmp)$_2$(dpm) | 0.75:0.25:0.06 |
|  | Electron-transport layer | 118(2) | 30 | 2mDBTBPDBq-II | — |
|  |  | 118(1) | 30 | NBPhen | — |
|  | Electron-injection layer | 130(2) | 0.2 | Li$_2$O | — |
|  |  | 130(1) | 5 | NBPhen | — |
|  | Electrode | 101 | 70 | ITSO | — |
| Light-emitting element 16 | Electrode | 102 | 200 | Al | — |
|  | Hole-injection layer | 111 | 25 | DBT3P-II:MoO$_3$ | 1:0.5 |
|  | Hole-transport layer | 112 | 20 | BPAFLP | — |
|  | Light-emitting layer | 140 | 40 | 2mDBTBPDBq-II:PCBBiF:Ir(dmdppr-dmp)$_2$(dpm) | 0.75:0.25:0.06 |
|  | Electron-transport layer | 118(2) | 30 | 2mDBTBPDBq-II | — |
|  |  | 118(1) | 30 | NBPhen | — |
|  | Electron-injection layer | 130 | 5 | NBPhen:Ag | 1:0.19 |
|  | Electrode | 101 | 70 | ITSO | — |
| Light-emitting element 17 | Electrode | 102 | 200 | Al | — |
|  | Hole-injection layer | 111 | 25 | DBT3P-II:MoO$_3$ | 1:0.5 |
|  | Hole-transport layer | 112 | 20 | BPAFLP | — |
|  | Light-emitting layer | 140 | 40 | 2mDBTBPDBq-II:PCBBiF:Ir(dmdppr-dmp)$_2$(dpm) | 0.75:0.25:0.06 |
|  | Electron-transport layer | 118(2) | 30 | 2mDBTBPDBq-II | — |
|  |  | 118(1) | 25 | NBPhen | — |
|  | Electron-injection layer | 130(2) | 5 | NBPhen:Ag | 1:0.19 |
|  |  | 130(1) | 5 | 2Py3Tz:Ag | 1:0.35 |
|  | Electrode | 101 | 70 | ITSO | — |
| Light-emitting element 18 | Electrode | 102 | 200 | Al | — |
|  | Hole-injection layer | 111 | 25 | DBT3P-II:MOO$_3$ | 1:0.5 |
|  | Hole-transport layer | 112 | 20 | BPAFLP | — |
|  | Light-emitting layer | 140 | 40 | 2mDBTBPDBq-II:PCBBiF:Ir(dmdppr-dmp)$_2$(dpm) | 0.75:0.25:0.06 |
|  | Electron-transport layer | 118(2) | 30 | 2mDBTBPDBq-II | — |
|  |  | 118(1) | 25 | NBPhen | — |
|  | Electron-injection layer | 130(2) | 5 | NBPhen:Ag | 1:0.19 |
|  |  | 130(1) | 5 | TmPPPyTz:Ag | 1:0.15 |
|  | Electrode | 101 | 70 | ITSO | — |

«Fabrication of Comparative Light-Emitting Element 15»

As the electrode 101, an ITSO film was formed to a thickness of 70 nm over the substrate 210. Note that the electrode area of the electrode 101 was set to 4 mm$^2$ (2 mm×2 mm).

Then, as the electron-injection layer 130, NBPhen was deposited over the electrode 101 by evaporation to a thickness of 5 nm. Subsequently, Li$_2$O was deposited by evaporation to a thickness of 0.2 nm.

Next, as the electron-transport layer 118(1), NBPhen was deposited over the electron-injection layer 130 by evaporation to a thickness of 30 nm. Subsequently, as the electron-transport layer 118(2), 2mDBTBPDBq-II was deposited by evaporation to a thickness of 30 nm.

Then, as the light-emitting layer 140, 2mDBTBPDBq-II, PCBBiF, and Ir(dmdppr-dmp)$_2$(dpm) were deposited over the electron-transport layer 118(2) by co-evaporation in a weight ratio of 2mDBTBPDBq-II:PCBBiF:Ir(dmdppr-dmp)$_2$ (dpm)=0.75:0.25:0.06 to a thickness of 40 nm. Note that in the light-emitting layer 140, 2mDBTBPDBq-II and PCBBiF are host materials and Ir(dmdppr-dmp)$_2$(dpm) is a guest material (a phosphorescent compound).

Then, as the hole-transport layer 112, BPAFLP was deposited over the light-emitting layer 140 by evaporation to a thickness of 20 nm.

Next, as the hole-injection layer 111, DBT3P-II and MoO$_3$ were deposited over the hole-transport layer 112 by co-evaporation in a weight ratio of DBT3P-II:MoO$_3$=1:0.5 to a thickness of 25 nm.

Next, as the electrode 102, aluminum (Al) was deposited over the hole-injection layer 111 by evaporation to a thickness of 200 nm.

Then, heat treatment at 80° C. for one hour was performed in the air without sealing. Through the above steps, the comparative light-emitting element 13 was obtained.

«Fabrication of Light-Emitting Elements 16 to 18

The light-emitting elements 16 to 18 were fabricated through the same steps as those for the comparative light-emitting element 15 except for the steps of forming the electron-injection layer 130 and the electron-transport layer 118(1).

<Fabrication of Light-Emitting Element 16>

As the electron-injection layer 130 of the light-emitting element 16, NBPhen and Ag were deposited over the electrode 101 by co-evaporation in a weight ratio of NBPhen:Ag=1:0.19 to a thickness of 5 nm.

As the electron-transport layer 118(1), NBPhen was deposited over the electron-injection layer 130 by evaporation to a thickness of 30 nm.

<Fabrication of Light-Emitting Element 17>

As the electron-injection layer 130 of the light-emitting element 17, 2Py3Tzn and Ag were deposited over the electrode 101 by co-evaporation in a weight ratio of 2Py3Tzn:Ag=1:0.35 to a thickness of 5 nm. Subsequently, NBPhen and Ag were deposited by co-evaporation in a weight ratio of NBPhen:Ag=1:0.19 to a thickness of 5 nm.

As the electron-transport layer 118(1), NBPhen was deposited over the electron-injection layer 130 by evaporation to a thickness of 25 nm.

<Fabrication of Light-Emitting Element 18>

As the electron-injection layer 130 of the light-emitting element 18, TmPPPyTz and Ag were deposited over the electrode 101 by co-evaporation in a weight ratio of TmPPPyTz:Ag=1:0.15 to a thickness of 5 nm. Subsequently, NBPhen and Ag were deposited by co-evaporation in a weight ratio of NBPhen:Ag=1:0.19 to a thickness of 5 nm.

As the electron-transport layer 118(1), NBPhen was deposited over the electron-injection layer 130 by evaporation to a thickness of 25 nm.

<Characteristics of Light-Emitting Elements>

Next, the element characteristics of the fabricated comparative light-emitting element 15 and light-emitting elements 16 to 18 were measured. The measurement was performed in a manner similar to that in Example 1.

Figure 38:
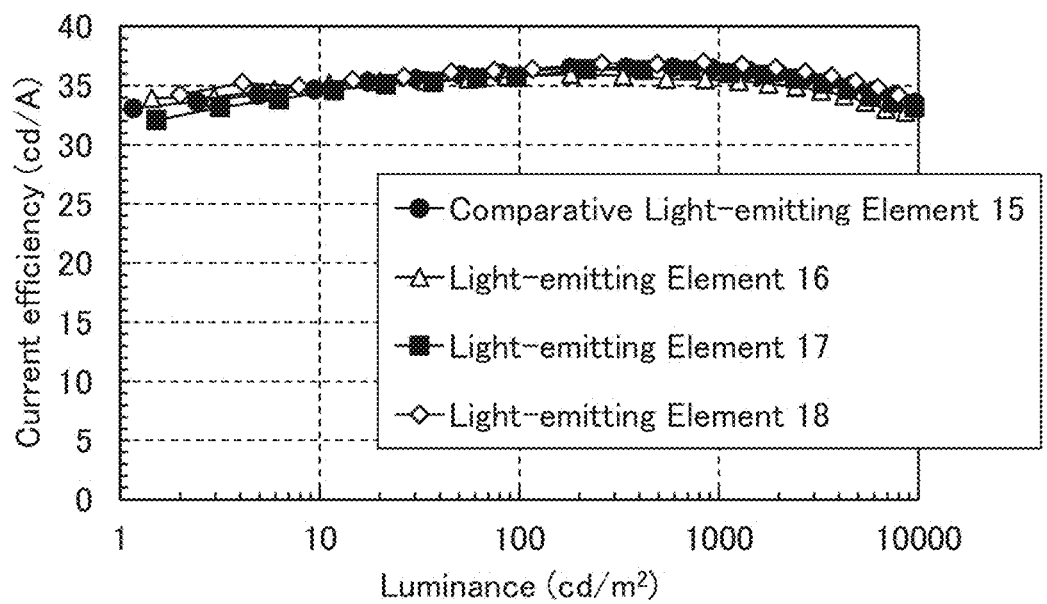
FIG. 38 shows current efficiency-luminance characteristics of light-emitting elements in Example.
Figure 39:
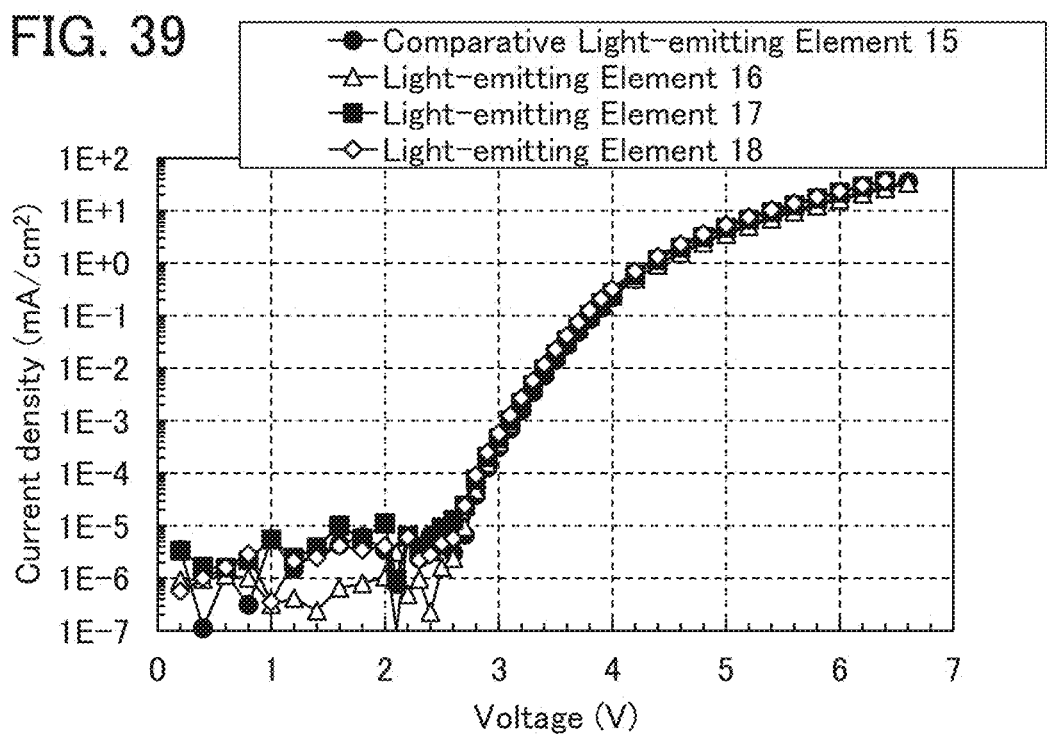
FIG. 39 shows current density-voltage characteristics of light-emitting elements in Example.
Figure 40:
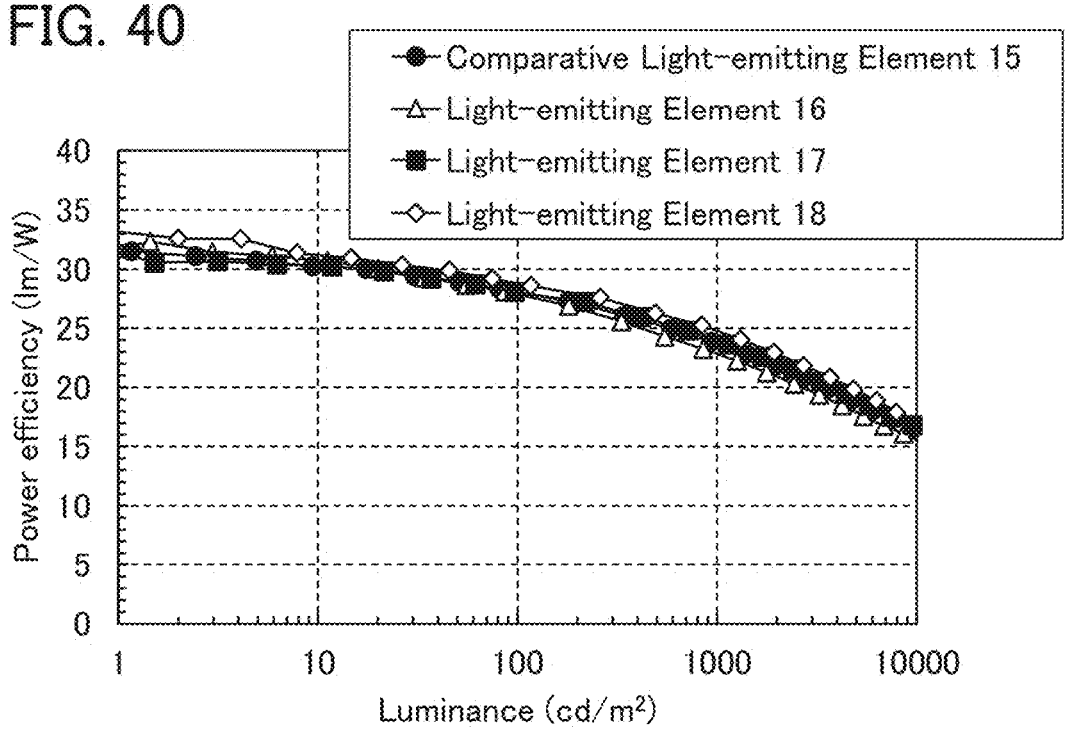
FIG. 40 shows power efficiency-luminance characteristics of light-emitting elements in Example.

FIG. 38 shows the current efficiency-luminance characteristics of the fabricated comparative light-emitting element 15 and light-emitting elements 16 to 18; FIG. 39, the current density-voltage characteristics thereof; FIG. 40, the power efficiency-luminance characteristics thereof, and FIG. 41, the external quantum efficiency-luminance characteristics thereof. FIG. 42 shows the electroluminescence spectra of the light-emitting elements through which current flows at a current density of 2.5 mA/cm$^2$.

Table 15 shows the element characteristics of the comparative light-emitting element 15 and the light-emitting elements 16 to 18 at around 1000 cd/m$^2$.

TABLE 15

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Comparative light-emitting element 15 | 4.8 | 2.6 | (0.66, 0.34) | 933 | 36 | 24 | 27 |
| Light-emitting element 16 | 4.8 | 2.4 | (0.66, 0.34) | 853 | 36 | 23 | 27 |
| Light-emitting element 17 | 4.8 | 3.1 | (0.66, 0.34) | 1135 | 37 | 24 | 27 |
| Light-emitting element 18 | 4.6 | 2.3 | (0.66, 0.34) | 937 | 38 | 25 | 28 |

Figure 41:
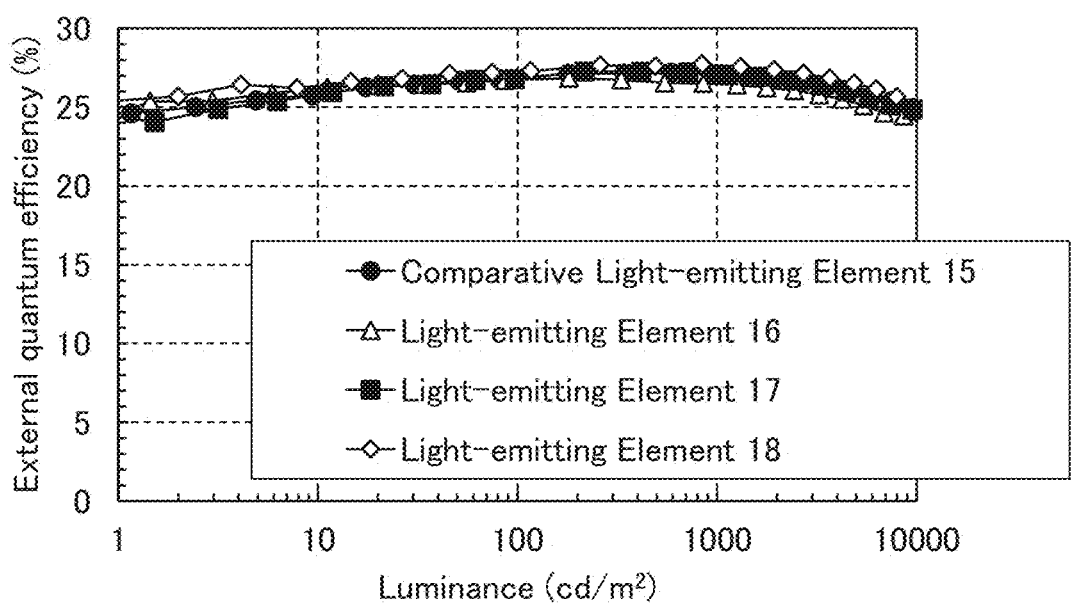
FIG. 41 shows external quantum efficiency-luminance characteristics of light-emitting elements in Example.
Figure 42:
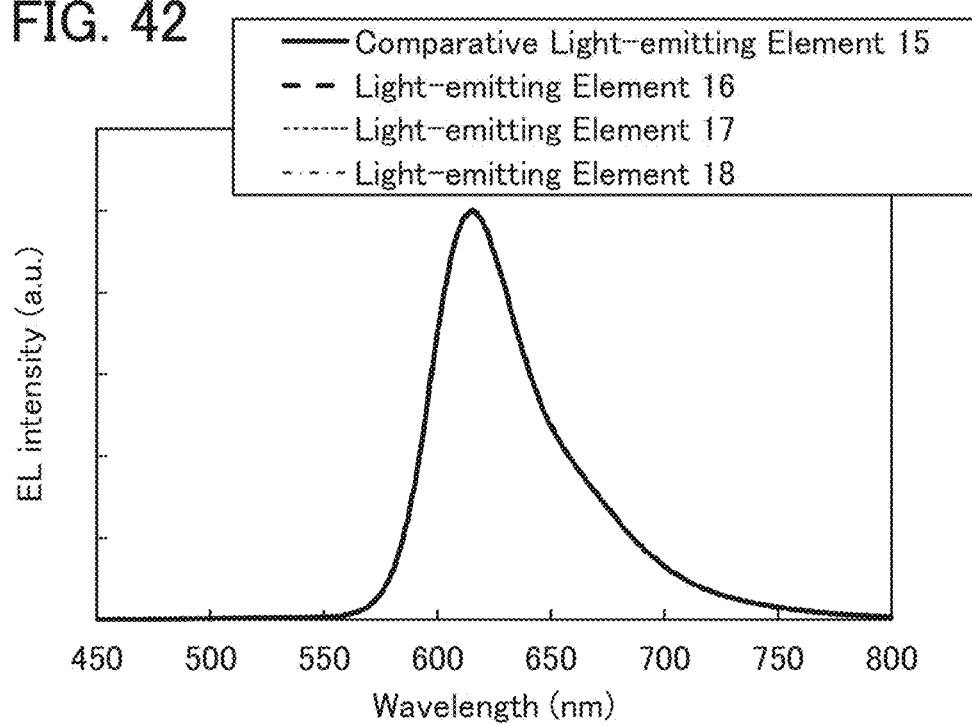
FIG. 42 shows electroluminescence spectra of light-emitting elements in Example.

As shown in FIG. 41 and Table 15, the comparative light-emitting element 15 and the light-emitting elements 16 to 18 each exhibited high emission efficiency with an external quantum efficiency exceeding 25%. The comparative light-emitting element 15 and the light-emitting elements 16 to 18 also exhibited high current efficiency and power efficiency as shown in FIGS. 38 and 40. In addition, the efficiency of the light-emitting elements 16 to 18 is equivalent to that of the comparative light-emitting element 15, indicating that the light-emitting element according to one embodiment of the present invention can obtain favorable emission efficiency when applied to the inverted stacked element.

As shown in FIG. 39, the comparative light-emitting element 15 and the light-emitting elements 16 to 18 exhibited favorable current density-voltage characteristics. Furthermore, the comparative light-emitting element 15 and the light-emitting elements 16 to 18 have equivalent current density-voltage characteristics, indicating that the light-emitting element according to one embodiment of the present invention can obtain favorable current density-voltage characteristics when applied to the inverted stacked element.

As shown in FIG. 42, the comparative light-emitting element 15 and the light-emitting elements 16 to 18 each exhibited red emission whose electroluminescence spectrum has a peak wavelength at approximately 619 nm and a full width at half maximum of 58 nm. The obtained electroluminescence spectrum reveals that the light is emitted from the guest material, Ir(dmdppr-dmp)$_2$(dmp).

As described above, the light-emitting element according to one embodiment of the present invention can also be applied to the inverted stacked element. The structures shown in this example can be used in appropriate combination with any of the other embodiments and examples.

Example 6

Described in this example is an example of fabricating a light-emitting element 19 according to one embodiment of the present invention. A schematic cross-sectional view of the light-emitting element fabricated in this example is similar to FIG. 12. Details of the element structure are shown in Table 16. Note that Embodiment 1 can be referred to for the structures and abbreviations of organic compounds used in this example.

TABLE 16

| Layer | | Reference numeral | Thickness (nm) | Material | Weight ratio |
|---|---|---|---|---|---|
| Light-emitting element 19 | Electrode | 102(2) | 70 | DBT3P-II | — |
| | | 102(1) | 25 | Ag | — |
| | Electron-injection layer | 130 | 5 | NBphen:Ag | 1:0.19 |
| | Electron-transport layer | 118(2) | 15 | NBphen | — |
| | | 118(1) | 25 | 2mDBTBPDBq-II | — |
| | Light-emitting layer | 140(1) | 40 | 2mDBTBPDBq-II:PCBBiF:Ir(dmdppr-dmp)$_2$(dpm) | 0.75:0.25:0.06 |
| | Hole-transport layer | 112 | 20 | BPAFLP | — |
| | Hole-injection layer | 111 | 65 | DBT3P-II:MoO$_3$ | 1:0.5 |
| | Electrode | 101(2) | 110 | ITSO | — |
| | | 101(1) | 100 | APC | — |

<Fabrication of Light-Emitting Element 19>

A fabrication method of the light-emitting element in this example will be described below.

As the electrode 101 over the substrate 210, an alloy of silver, palladium, and copper (Ag—Pd—Cu, or APC) was formed to a thickness of 100 nm, and then, ITSO was formed to a thickness of 110 nm. Note that the electrode area of the electrode 101 was set to 4 mm$^2$ (2 mm×2 mm).

Next, as the hole-injection layer 111, DBT3P-II and molybdenum oxide (MoO$_3$) were deposited over the electrode 101 by co-evaporation in a weight ratio of DBT3P-II:MoO$_3$=1:0.5 to a thickness of 65 nm.

Then, as the hole-transport layer 112, BPAFLP was deposited over the hole-injection layer 111 by evaporation to a thickness of 20 nm.

Then, as the light-emitting layer 140, 2mDBTBPDBq-II, PCBBiF, and Ir(dmdppr-dmp)$_2$(dpm) were deposited over the hole-transport layer 112 by co-evaporation in a weight ratio of 2mDBTBPDBq-II:PCBBiF:Ir(dmdppr-dmp)$_2$(dpm)=0.75:0.25:0.06 to a thickness of 40 nm. Note that in the light-emitting layer 140, 2mDBTBPDBq-II and PCBBiF are host materials and Ir(dmdppr-dmp)$_2$(dpm) is a guest material (a phosphorescent compound).

Next, as the electron-transport layer 118(1), 2mDBTBPDBq-II was deposited over the light-emitting layer 140 by evaporation to a thickness of 25 nm.

Next, as the electron-transport layer 118(2), NBPhen was deposited over the electron-transport layer 118(1) by evaporation to a thickness of 15 nm.

Then, as the electron-injection layer 130, NBPhen and Ag were deposited over the electron-transport layer 118(2) by co-evaporation in a weight ratio of NBPhen:Ag=1:0.19 to a thickness of 5 nm.

Next, as the electrode 102, Ag was deposited over the electron-injection layer 130 by evaporation to a thickness of 25 nm; subsequently, DBT3P-II was deposited by evaporation to a thickness of 70 nm.

Then, heat treatment at 80° C. for one hour was performed in the air without sealing. Through the above steps, the light-emitting element 19 was obtained.

<Characteristics of Light-Emitting Element>

Next, the element characteristics of the fabricated light-emitting element 19 were measured. The measurement was performed in a manner similar to that in Example 1.

Figure 46:
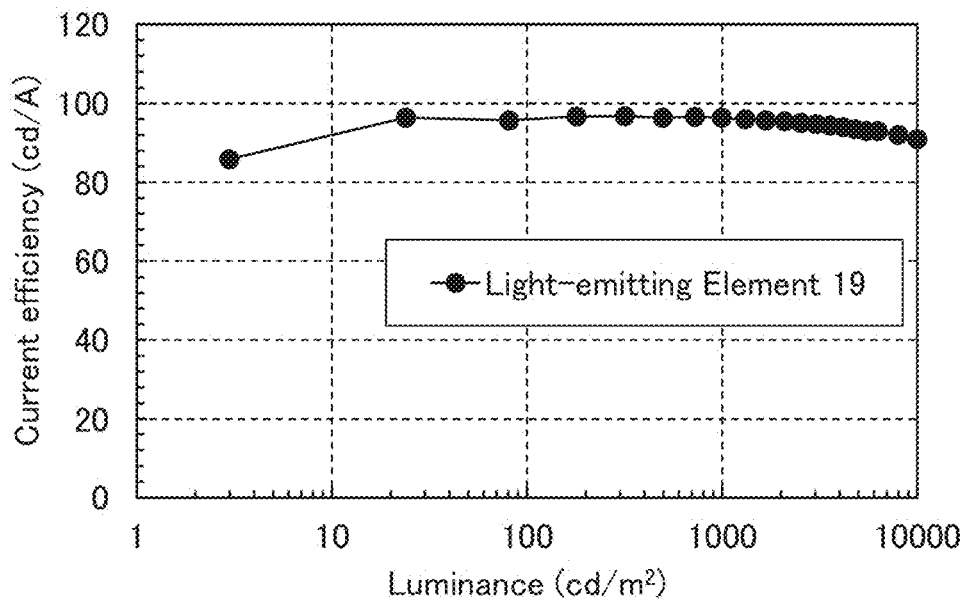
FIG. 46 shows current efficiency-luminance characteristics of a light-emitting element in Example.
Figure 47:
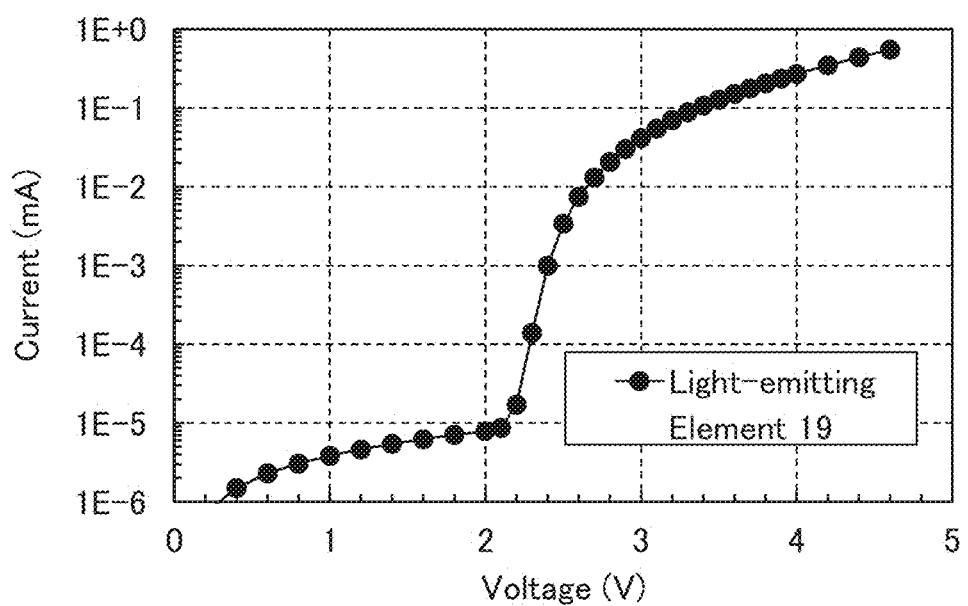
FIG. 47 shows current-voltage characteristics of a light-emitting element in Example.
Figure 48:
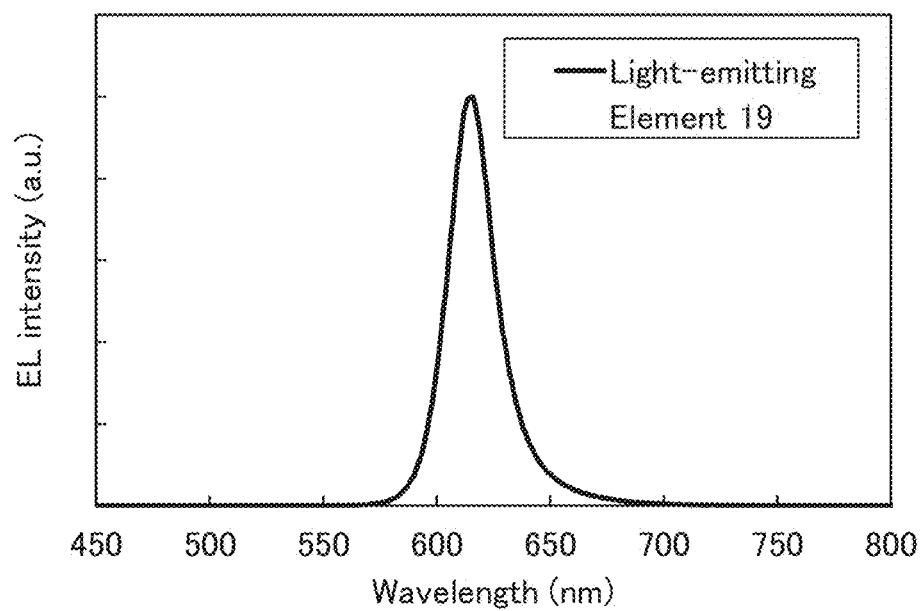
FIG. 48 shows an electroluminescence spectrum of a light-emitting element in Example.

FIG. 46 shows the current efficiency-luminance characteristics of the fabricated light-emitting element 19 and FIG. 47 shows the current-voltage characteristics thereof. FIG. 48 shows the electroluminescence spectrum of the light-emitting element 19 through which current flows at a current density of 2.5 mA/cm$^2$. Note that the measurement was performed at room temperature.

Table 17 shows the element characteristics of the light-emitting element 19 at around 1000 cd/m$^2$.

TABLE 17

| | Voltage (V) | Current density (mA/cm$^2$) | CIE chromaticity (x, y) | Luminance (cd/m$^2$) | Current efficiency (cd/A) |
|---|---|---|---|---|---|
| Light-emitting element 19 | 3.0 | 1.0 | (0.67, 0.33) | 998 | 96 |

As shown in FIG. 48, the light-emitting element 19 exhibited red emission whose electroluminescence spectrum has a peak wavelength at 616 nm and a full width at half maximum of 24 nm. The obtained electroluminescence spectrum reveals that the light is emitted from the guest material, Ir(dmdppr-dmp)$_2$(dmp).

As shown in FIG. 46 and Table 17, the light-emitting element 19 showed a favorable current efficiency exceeding 96 cd/A while exhibiting deep red.

As shown in FIG. 47, the light-emitting element 19 exhibited favorable current-voltage characteristics, indicating that the composite material of NBPhen and Ag has favorable electron-injection properties. Hence, the light-emitting element that uses the same metal for the electron-injection layer 130 and the electrode 102 as the cathode has favorable characteristics.

The structures shown in this example can be used in appropriate combination with any of the other embodiments and examples.

Example 7

In this example, a passive matrix panel with a pixel density of 326 ppi was fabricated to evaluate crosstalk. The panel includes R, G, and B pixels arranged in a stripe. The pixel size was 78 μm×78 μm. The size of a subpixel (each of R, G, and B pixels) was 26 μm×78 μm. The aperture ratio was 65.7%.

Figure 51:
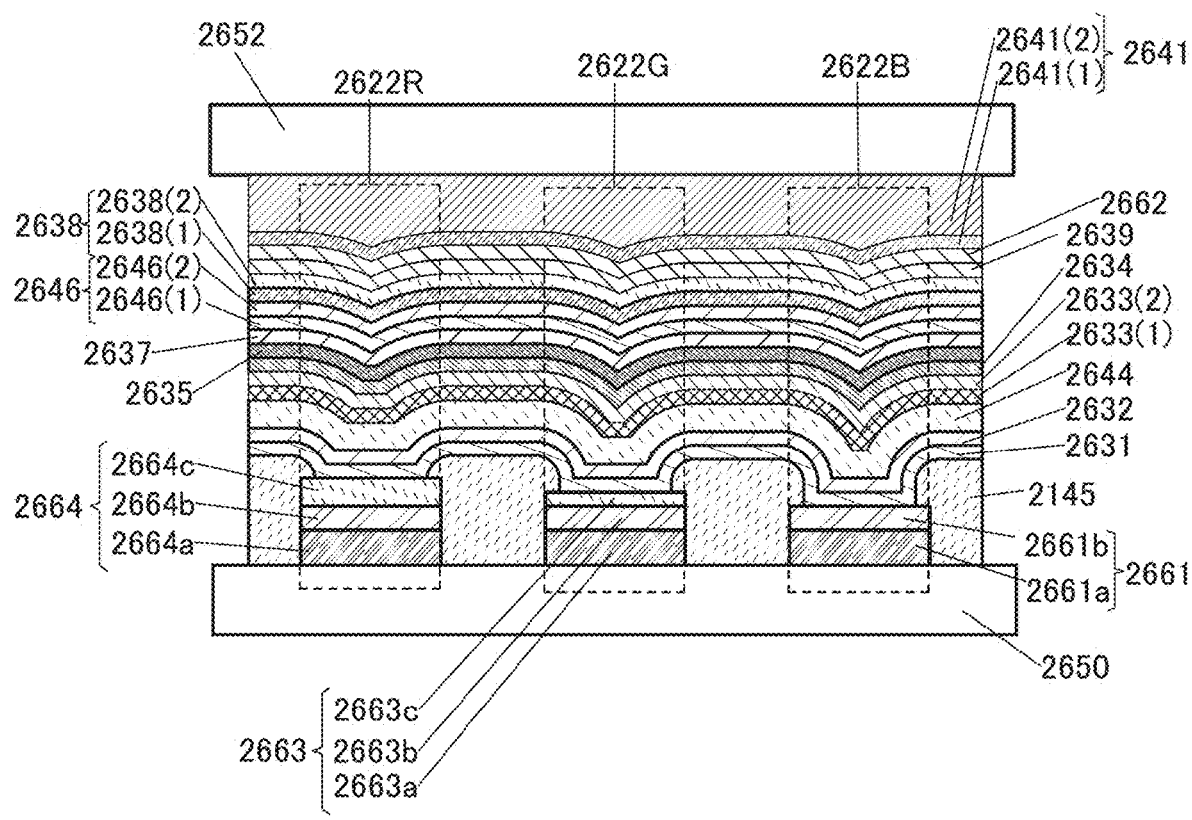
FIG. 51 is a schematic cross-sectional view illustrating light-emitting elements in Example.

Described are examples of fabricating a light-emitting element 20 according to one embodiment of the present invention and a comparative light-emitting element 21. A schematic cross-sectional view of the light-emitting elements fabricated in this example is shown in FIG. 51. Details of the element structures are shown in Tables 18 and 19. In FIG. 51, a region 2622R, a region 2622G, and a region 2622B represent a red pixel, a green pixel, and a blue pixel, respectively. The light-emitting element fabricated in this example includes a plurality of red (R) pixels, a plurality of green (G) pixels, and a plurality of blue (B) pixels. In the light-emitting element fabricated in this example, the plurality of pixels are arranged in the order of R, G, and B pixels. The structures and abbreviations of compounds used in this example are shown below. Note that the above embodiments and examples can be referred to for the structures and abbreviations of the other compounds.

[Chemical Formula 6]

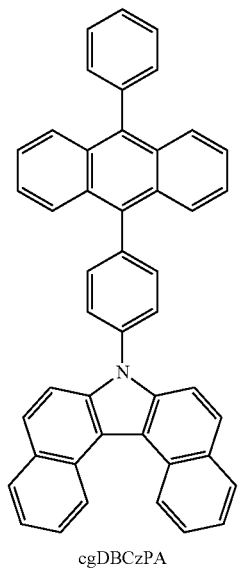

cgDBCzPA

-continued

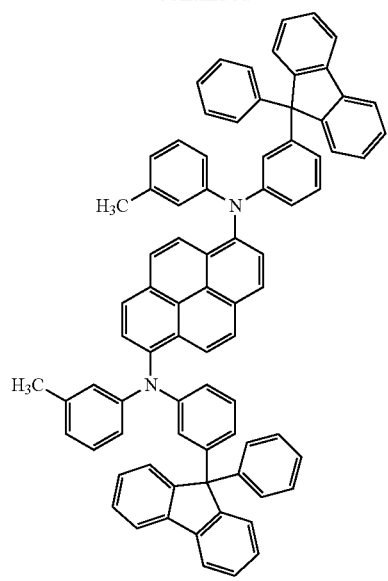

1,6mMemFLPAPrn

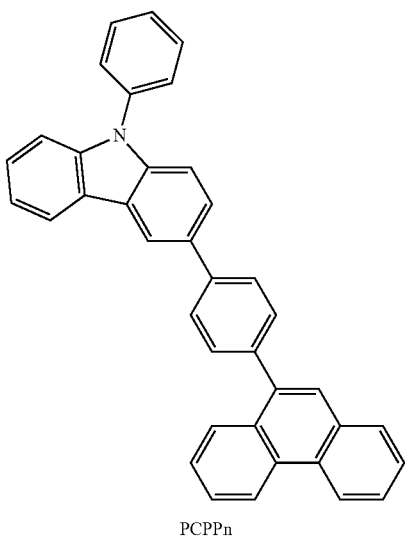

PCPPn

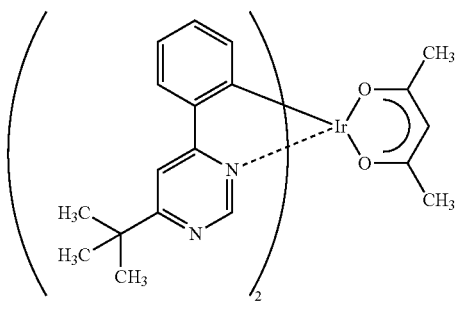

Ir(tBuppm)$_2$(acac)

TABLE 18

| Layer | | Reference numeral | Thickness (nm) | Material | Weight ratio |
|---|---|---|---|---|---|
| Light-emitting element 20 | Electrode | 2641(2) | 70 | DBT3P-II | — |
| | | 2641(1) | 20 | Ag | — |
| | Electron-injection layer | 2639 | 0.2 | $Li_2O$ | — |
| | Electron-transport layer | 2638(2) | 15 | NBPhen | — |
| | | 2638(1) | 15 | 2mDBTBPDBq-II | — |
| | Light-emitting layer | 2646(2) | 20 | 2mDBTBPDBq-II:PCBBiF: Ir(dmdppr-dmp)$_2$(dpm) | 0.8:0.2:0.06 |
| | | 2646(1) | 20 | 2mDBTBPDBq-II:PCBBiF: Ir(tBuppm)$_2$(acac) | 0.7:0.3:0.06 |
| | Hole-transport layer | 2637 | 20 | BPAFLP | — |
| | Charge-generation layer | 2635 | 13 | DBT3P-II:MoO$_3$ | 1:0.5 |
| | Electron-injection layer | 2634 | 5 | NBPhen:Ag | 1:0.19 |
| | Electron-transport layer | 2633(2) | 10 | NBPhen | — |
| | | 2633(1) | 5 | cgDBCzPA | — |
| | Light-emitting layer | 2644 | 30 | cgDBCzPA:1,6mMemFLPAPrn | 1:0.03 |
| | Hole-transport layer | 2632 | 20 | PCPPn | — |
| | Hole-injection layer | 2631 | 13 | DBT3P-II:MoO$_3$ | 1:0.5 |
| | Electrode | | | See Table 19 | |
| Comparative light-emitting element 21 | Electrode | 2641(2) | 70 | DBT3P-II | — |
| | | 2641(1) | 20 | Ag | — |
| | Electron-injection layer | 2639 | 0.2 | $Li_2O$ | — |
| | Electron-transport layer | 2638(2) | 20 | NBPhen | — |
| | | 2638(1) | 15 | 2mDBTBPDBq-II | — |
| | Light-emitting layer | 2646(2) | 20 | 2mDBTBPDBq-II:PCBBiF: Ir(dmdppr-dmp)$_2$(dpm) | 0.8:0.2:0.06 |
| | | 2646(1) | 20 | 2mDBTBPDBq-II:PCBBiF: Ir(tBuppm)$_2$(acac) | 0.7:0.3:0.06 |
| | Hole-transport layer | 2637 | 20 | BPAFLP | — |
| | Charge-generation layer | 2635 | 13 | DBT3P-II:MoO$_3$ | 1:0.5 |
| | Electron-injection layer | 2634(2) | 1 | CuPc | — |
| | | 2634(1) | 0.2 | $Li_2O$ | — |
| | Electron-transport layer | 2633(1) | 15 | NBPhen | — |
| | | 2644 | 5 | cgDBCzPA | — |
| | Light-emitting layer | 2632 | 30 | cgDBCzPA:1,6mMemFLPAPrn | 1:0.03 |
| | Hole-transport layer | 2631 | 20 | PCPPn | — |
| | Hole-injection layer | 631 | 13 | DBT3P-II:MoO$_3$ | 1:0.5 |
| | Electrode | | | See Table 19 | |

TABLE 19

| Pixel | Reference numeral | Thickness (nm) | Material |
|---|---|---|---|
| R pixel | 2664c | 80 | ITSO |
| | 2664b | 6 | Ti |
| | 2664a | 200 | Al—Ni—La |
| G pixel | 2663c | 40 | ITSO |
| | 2663b | 6 | Ti |
| | 2663a | 200 | Al—Ni—La |
| B pixel | 2661b | 6 | Ti |
| | 2661a | 200 | Al—Ni—La |

<Fabrication of Light-Emitting Element>

A fabrication method of the light-emitting element in this example will be described below. The light-emitting element 20 is a light-emitting element according to one embodiment of the present invention, which uses a composite film of a transition metal and an organic compound having an unshared electron pair for an electron-injection layer between two emission units. The comparative light-emitting element 21 uses lithium oxide ($Li_2O$), which is a Li compound typically used for the electron-injection layer.

«Fabrication of Light-Emitting Element 20»

As electrodes 2661, 2663, and 2664, an aluminum (Al)-nickel (Ni)-lanthanum (La) alloy film was formed over a substrate 2650 to a thickness of 200 nm. Subsequently, a titanium (Ti) film was formed to a thickness of 6 nm and heat treatment was performed at 300° C. for one hour. Then, an ITSO film was formed to a thickness of 80 nm in the R pixel and a thickness of 40 nm in the G pixel.

Next, as a hole-injection layer 2631, DBT3P-II and molybdenum oxide ($MoO_3$) were deposited over the electrodes 2661, 2663, and 2664 by co-evaporation in a weight ratio of DBT3P-II:MoO$_3$=1:0.5 to a thickness of 13 nm.

Then, as a hole-transport layer 2632, PCPPn was deposited over the hole-injection layer 2631 by evaporation to a thickness of 20 nm.

Then, as a light-emitting layer 2644, cgDBCzPA and 1,6mMemFLPAPrn were deposited over the hole-transport layer 2632 by co-evaporation in a weight ratio of cgDBCzPA: 1,6mMemFLPAPrn=1:0.03 to a thickness of 30 nm. Note that in the light-emitting layer 2644, cgDBCzPA is a host material and 1,6mMemFLPAPrn is a guest material (a fluorescent compound).

Next, as an electron-transport layer 2633(1), cgDBCzPA was deposited over the light-emitting layer 2644 by evaporation to a thickness of 5 nm.

Next, as an electron-transport layer 2633(2), NBPhen was deposited over the electron-transport layer 2633(1) by evaporation to a thickness of 10 nm.

As an electron-injection layer 2634, NBPhen and Ag were deposited over the electron-transport layer 2633(2) by co-evaporation in a weight ratio of NBPhen:Ag=1:0.19 to a thickness of 5 nm.

Then, as a charge-generation layer 2635, DBT3P-II and MoO$_3$ were deposited over the electron-injection layer 2634 by co-evaporation in a weight ratio of DBT3P-II:MoO$_3$=1: 0.5 to a thickness of 13 nm.

Then, as a hole-transport layer 2637, BPAFLP was deposited over the charge-generation layer 2635 by evaporation to a thickness of 20 nm.

Then, as a light-emitting layer 2646, 2mDBTBPDBq-II, PCBBiF, and Ir(tBuppm)$_2$(acac) were deposited over the hole-transport layer 2637 by co-evaporation in a weight ratio of 2mDBTBPDBq-II:PCBBiF:Ir(tBuppm)$_2$(acac)=0.7:0.3:0.06 to a thickness of 20 nm. Subsequently, 2mDBTBPDBq-II, PCBBiF, and Ir(dmdppr-dmp)$_2$(dpm) were deposited by co-evaporation in a weight ratio of 2mDBTBPDBq-II:PCBBiF:Ir(dmdppr-dmp)$_2$(dpm)=0.8:0.2:0.06 to a thickness of 20 nm. Note that in the light-emitting layer 2646, 2mDBTBPDBq-II and PCBBiF are host materials and Ir(dmdppr-dmp)$_2$(dpm) and Ir(tBuppm)$_2$(acac) are guest materials (phosphorescent compounds).

Next, as an electron-transport layer 2638(1), 2mDBTBPDBq-II was deposited over the light-emitting layer 2646 by evaporation to a thickness of 15 nm.

Next, as an electron-transport layer 2638(2), NBPhen was deposited over the electron-transport layer 2638(1) by evaporation to a thickness of 15 nm.

As the electron-injection layer 2639, Li$_2$O was deposited over the electron-transport layer 2638(2) by evaporation to a thickness of 0.2 nm.

Then, as an electrode 2662, Ag was deposited over the electron-injection layer 2639 by evaporation to a thickness of 20 nm. Subsequently, DBT3P-II was deposited by evaporation to a thickness of 70 nm.

Next, in a glove box containing a nitrogen atmosphere, the light-emitting element 20 was sealed by fixing a substrate 2652 to the substrate 2650 over which the organic compound was deposited using a sealant for an organic EL device. Specifically, the sealant was applied to the periphery of the substrate 2652 and the substrate 2652 was bonded to the substrate 2650 over which the organic compound was deposited; then, irradiation with ultraviolet light having a wavelength of 365 nm at 6 J/cm$^2$ and heat treatment at 80° C. for one hour were performed. Through the above steps, the light-emitting element 20 was obtained.

«Fabrication of Comparative Light-Emitting Element 21»

The comparative light-emitting element 21 was fabricated through the same steps as those for the light-emitting element 20 except for the steps of forming the electron-transport layer 2633(2) and the electron-injection layer 2634.

As the electron-transport layer 2633(2) of the comparative light-emitting element 21, NBPhen was deposited by evaporation to a thickness of 15 nm. Then, as the electron-injection layer 2634, Li$_2$O was deposited by evaporation to a thickness of 0.2 nm and subsequently, CuPc was deposited by evaporation to a thickness of 1 nm.

<Observation of Crosstalk of Each Light-Emitting Element>

Figure 52A:
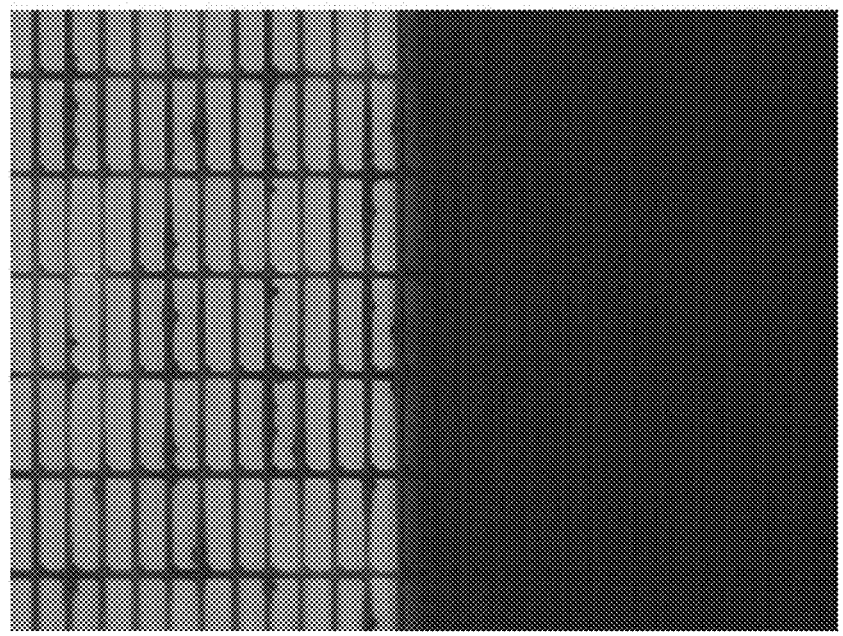
FIGS. 52A and 52B are enlarged photographs of light-emitting elements in Example.
Figure 52B:
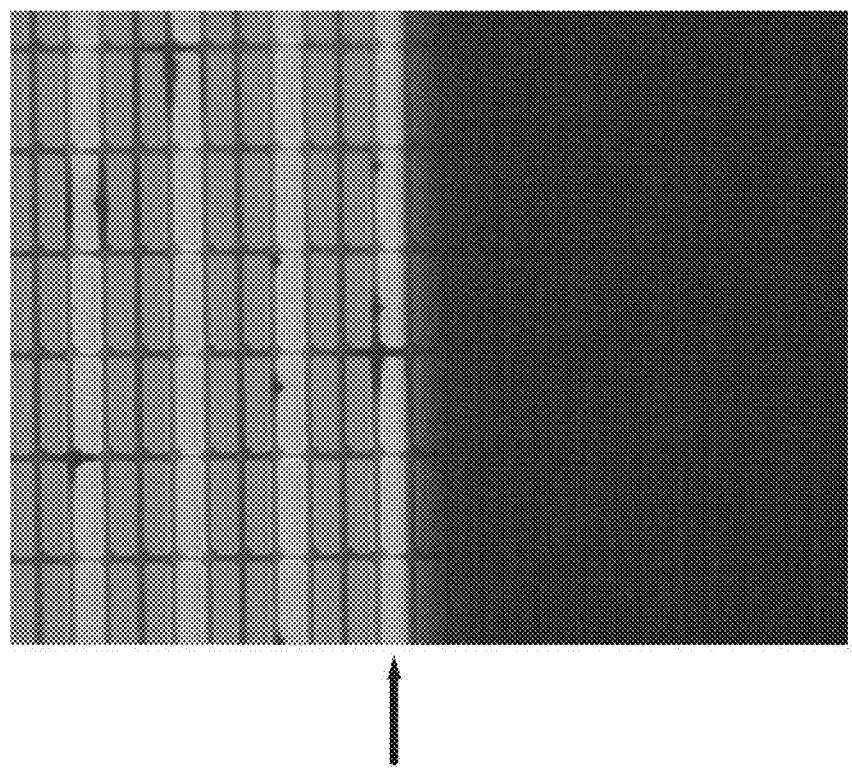

The crosstalk of the light-emitting element 20 and the comparative light-emitting element 21 was evaluated. The results are shown in FIGS. 52A and 52B. FIG. 52A is an enlarged photograph of pixels of the light-emitting element 20 in which blue pixels emit light, and FIG. 52B is an enlarged photograph of pixels of the comparative light-emitting element 21 in which blue pixels emit light. In FIGS. 52A and 52B, current flows in blue pixels denoted by arrows and blue pixels on the left of the blue pixels denoted by the arrows, whereas no current flows in red pixels, green pixels, and blue pixels on the right of the blue pixels denoted by the arrows.

FIGS. 52A and 52B reveal that in the comparative light-emitting element 21, light is emitted not only from the blue pixels supplied with current but also from green and red pixels adjacent to those blue pixels, whereas in the light-emitting element 20, light emitted from the green and red pixels adjacent to the blue pixels is reduced compared with that in the comparative light-emitting element 21. In the comparative light-emitting element 21, Li$_2$O, an alkali metal compound, is used for the electron-transport layer adjacent to the charge-generation layer; thus, Li easily diffuses in the electron-transport layer and a current that is supplied to the blue pixels to emit light flows through the electron-transport layer into the green and red pixels adjacent to the blue pixels, causing crosstalk. In contrast, the light-emitting element 20 according to one embodiment of the present invention uses a transition metal for the electron-transport layer, so that the diffusion of the metal is not caused easily and crosstalk can be reduced.

Figure 53:
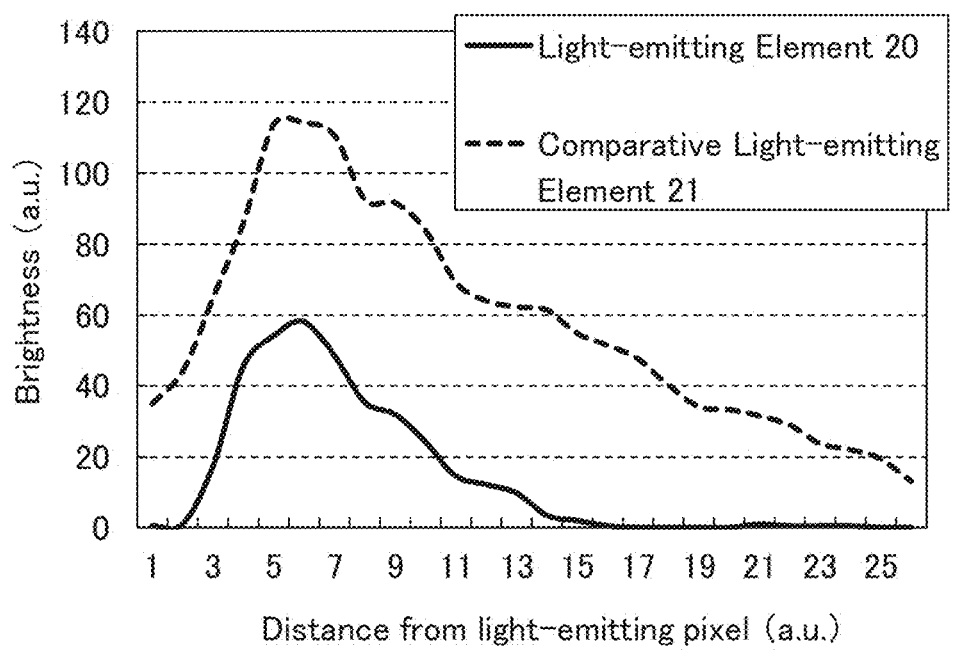
FIG. 53 shows the relationship between the brightness and the distance from an adjacent pixel in Example.

Next, the intensity of light emitted from pixels adjacent to the blue-emitting pixels due to crosstalk was estimated with respect to the distance from the blue pixels. The results are shown in FIG. 53. In FIG. 53, the longitudinal axis represents the brightness of red light extracted from the data shown in FIGS. 52A and 52B, and the lateral axis represents the distance from the blue pixels denoted by the arrows in FIGS. 52A and 52B to the red pixels on the right of those blue pixels, which is extracted from the data shown in FIGS. 52A and 52B. The longitudinal and lateral axes each represent an arbitrary unit. FIG. 53 indicates that the emission intensity of the light-emitting element 20 is lower than that of the comparative light-emitting element 21. In other words, crosstalk covers a smaller distance in the light-emitting element 20 than in the comparative light-emitting element 21.

From the above, the light-emitting element according to one embodiment of the present invention was found to be effective in reducing crosstalk.

Example 8

Figure 54:
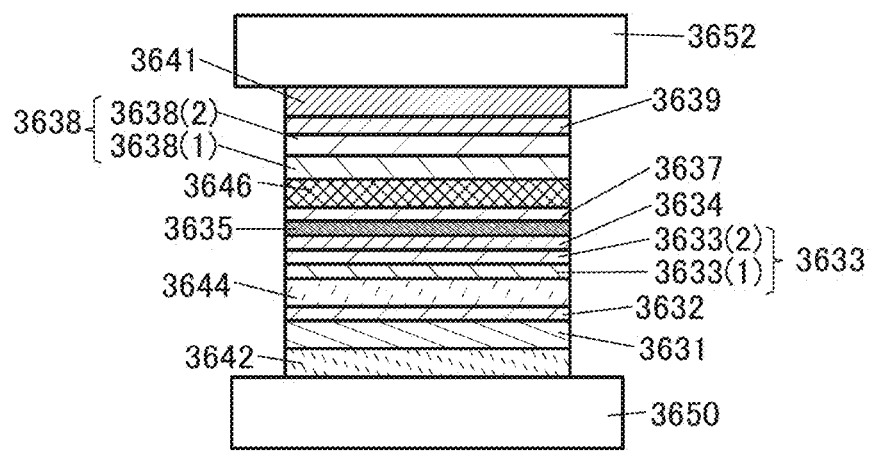
FIG. 54 is a schematic cross-sectional view illustrating a light-emitting element in Example.

Described are examples of fabricating a light-emitting element 22 according to one embodiment of the present invention and a comparative light-emitting element 23. A schematic cross-sectional view of the light-emitting elements fabricated in this example is shown in FIG. 54. Details of the element structures are shown in Table 20. The above examples and Embodiment 1 can be referred to for the structures and abbreviations of organic compounds used in this example.

<Fabrication of Light-Emitting Elements>

A fabrication method of the light-emitting elements in this example will be described below. The light-emitting element 22 is a light-emitting element according to one embodiment of the present invention, which uses a composite film of a transition metal and an organic compound having an unshared electron pair for an electron-injection layer between two emission units. The comparative light-emitting element 23 uses Li$_2$O, which is a Li compound typically used for the electron-injection layer.

TABLE 20

| | Layer | Reference numeral | Thickness (nm) | Material | Weight ratio |
|---|---|---|---|---|---|
| Light-emitting element 22 | Electrode | 3641 | 200 | Al | — |
| | Electron-injection layer | 3639 | 5 | NBPhen:Ag | 1:0.19 |
| | Electron-transport layer | 3638(2) | 10 | NBPhen | — |
| | | 3638(1) | 15 | 2mDBTBPDBq-II | — |
| | Light-emitting layer | 3646(2) | 20 | 2mDBTBPDBq-II:PCBBiF: Ir(dmdppr-dmp)$_2$(dpm) | 0.8:0.2:0.06 |
| | | 3646(1) | 20 | 2mDBTBPDBq-II:PCBBiF: Ir(tBuppm)$_2$(acac) | 0.7:0.3:0.06 |
| | Hole-transport layer | 3637 | 20 | BPAFLP | — |
| | Charge-generation layer | 3635 | 30 | DBT3P-II:MoO$_3$ | 1:0.5 |
| | Electron-injection layer | 3634 | 5 | NBPhen:Ag | 1:0.19 |
| | Electron-transport layer | 3633(2) | 10 | NBPhen | — |
| | | 3633(1) | 5 | cgDBCzPA | — |
| | Light-emitting layer | 3644 | 25 | cgDBCzPA:1,6mMemFLPAPrn | 1:0.03 |
| | Hole-transport layer | 3632 | 10 | PCPPn | — |
| | Hole-injection layer | 3631 | 10 | DBT3P-II:MoO$_3$ | 1:0.5 |
| | Electrode | 3642 | 70 | ITSO | — |
| Comparative light-emitting element 23 | Electrode | 3641 | 200 | Al | — |
| | Electron-injection layer | 3639 | 1 | LiF | 1:0.19 |
| | Electron-transport layer | 3638(2) | 15 | NBPhen | — |
| | | 3638(1) | 15 | 2mDBTBPDBq-II | — |
| | Light-emitting layer | 3646(2) | 20 | 2mDBTBPDBq-II:PCBBiF: Ir(dmdppr-dmp)$_2$(dpm) | 0.8:0.2:0.06 |
| | | 3646(1) | 20 | 2mDBTBPDBq-II:PCBBiF: Ir(tBuppm)$_2$(acac) | 0.7:0.3:0.06 |
| | Hole-transport layer | 3637 | 20 | BPAFLP | — |
| | Charge-generation layer | 3635(2) | 30 | DBT3P-II:MoO$_3$ | 1:0.5 |
| | | 3635(1) | 1 | CuPc | — |
| | Electron-injection layer | 3634(1) | 0.2 | Li$_2$O | — |
| | Electron-transport layer | 3633(2) | 15 | NBPhen | — |
| | | 3633(1) | 5 | cgDBCzPA | — |
| | Light-emitting layer | 3644 | 25 | cgDBCzPA:1,6mMemFLPAPrn | 1:0.03 |
| | Hole-transport layer | 3632 | 10 | PCPPn | — |
| | Hole-injection layer | 3631 | 10 | DBT3P-II:MoO$_3$ | 1:0.5 |
| | Electrode | 3642 | 70 | ITSO | — |

«Fabrication of light-emitting element»

As an electrode 3642, an JTSO film was formed to a thickness of 70 nm over a substrate 3650. The electrode area was set to 4 mm$^2$ (2 mm×2 mm).

Then, as a hole-injection layer 3631, DBT3P-JJ and MoO$_3$ were deposited over the electrode 3642 by co-evaporation in a weight ratio of DBT3P-JJ:MoOO$_3$=1:0.5 to a thickness of 10 nm.

Then, as a hole-transport layer 3632, PCPPn was deposited over the hole-injection layer 3631 by evaporation to a thickness of 10 nm.

Then, as a light-emitting layer 3644, cgDBCzPA and 1,6mMemFLPAPrn were deposited over the hole-transport layer 3632 by co-evaporation in a weight ratio of cgDBCzPA: 1,6mMemFLPAPrn=1:0.03 to a thickness of 25 nm. Note that in the light-emitting layer 3644, cgDBCzPA is a host material and 1,6mMemFLPAPrn is a guest material (a fluorescent compound).

Next, as an electron-transport layer 3633(1), cgDBCzPA was deposited over the light-emitting layer 3644 by evaporation to a thickness of 5 nm.

Next, as an electron-transport layer 3633(2), NBPhen was deposited over the electron-transport layer 3633(1) by evaporation to a thickness of 10 nm.

As an electron-injection layer 3634, NBPhen and Ag were deposited over the electron-transport layer 3633(2) by co-evaporation in a weight ratio of NBPhen:Ag=1:0.19 to a thickness of 5 nm.

Then, as a charge-generation layer 3635, DBT3P-II and MoO$_3$ were deposited over the electron-injection layer 3634 by co-evaporation in a weight ratio of DBT3P-II:MoO$_3$=1: 0.5 to a thickness of 30 nm.

Then, as a hole-transport layer 3637, BPAFLP was deposited over the charge-generation layer 3635 by evaporation to a thickness of 20 nm.

Then, as a light-emitting layer 3646, 2mDBTBPDBq-II, PCBBiF, and Ir(tBuppm)$_2$(acac) were deposited over the hole-transport layer 3637 by co-evaporation in a weight ratio of 2mDBTBPDBq-II:PCBBiF:Ir(tBuppm)$_2$(acac)=0.7:0.3: 0.06 to a thickness of 20 nm. Subsequently, 2mDBTBPDBq-II, PCBBiF, and Ir(dmdppr-dmp)$_2$(dpm) were deposited by co-evaporation in a weight ratio of 2mDBTBPDBq-II:PCBBiF:Ir(dmdppr-dmp)$_2$(dpm)=0.8:0.2:0.06 to a thickness of 20 nm. Note that in the light-emitting layer 3646, 2mDBTBPDBq-II and PCBBiF are host materials and Ir(dmdppr-dmp)$_2$(dpm) and Ir(tBuppm)$_2$(acac) are guest materials (phosphorescent compounds).

Next, as an electron-transport layer 3638(1), 2mDBTBPDBq-II was deposited over the light-emitting layer 3646 by evaporation to a thickness of 15 nm.

Next, as an electron-transport layer 3638(2), NBPhen was deposited over the electron-transport layer 3638(1) by evaporation to a thickness of 10 nm.

As an electron-injection layer 3639, NBPhen and Ag were deposited over the electron-transport layer 3638(2) by co-evaporation in a weight ratio of NBPhen:Ag=1:0.19 to a thickness of 5 nm.

Then, as an electrode 3641, Al was deposited over the electron-injection layer 3639 by evaporation to a thickness of 200 nm.

Next, in a glove box containing a nitrogen atmosphere, the light-emitting element 22 was sealed by fixing a substrate 3652 to the substrate 3650 over which the organic compound was deposited using a sealant for an organic EL device. Specifically, the sealant was applied to the periphery of the substrate 3652 and the substrate 3652 was bonded to the substrate 3650 over which the organic compound film was deposited; then, irradiation with ultraviolet light having a wavelength of 365 nm at 6 J/cm$^2$ and heat treatment at 80° C. for one hour were performed. Through the above steps, the light-emitting element 22 was obtained.

«Fabrication of Comparative Light-Emitting Element 23»

The comparative light-emitting element 23 was fabricated through the same steps as those for the light-emitting element 22 except for the steps of forming the electron-transport layer 3633(2), the electron-injection layer 3634, the electron-transport layer 3638(2), and the electron-injection layer 3639.

As the electron-transport layer 3633(2) of the comparative light-emitting element 23, NBPhen was deposited over the electron-transport layer 3633(1) by evaporation to a thickness of 15 nm.

As the electron-injection layer 3634, Li$_2$O was deposited over the electron-transport layer 3633(2) by evaporation to a thickness of 0.2 nm and subsequently, CuPc was deposited by evaporation to a thickness of 1 nm.

As the electron-transport layer 3638(2), NBPhen was deposited over the electron-transport layer 3638(1) by evaporation to a thickness of 15 nm.

As the electron-injection layer 3639, LiF was deposited over the electron-transport layer 3638(2) by evaporation to a thickness of 1 nm.

«Measurement of Light-Emitting Elements»

The element characteristics of the fabricated light-emitting element 22 and comparative light-emitting element 23 were measured. Luminance and CIE chromaticity were measured with a luminance colorimeter (BM-5A manufactured by TOPCON TECHNOHOUSE CORPORATION), and electroluminescence spectra were measured with a multi-channel spectrometer (PMA-11 manufactured by Hamamatsu Photonics K.K.).

Figure 55:
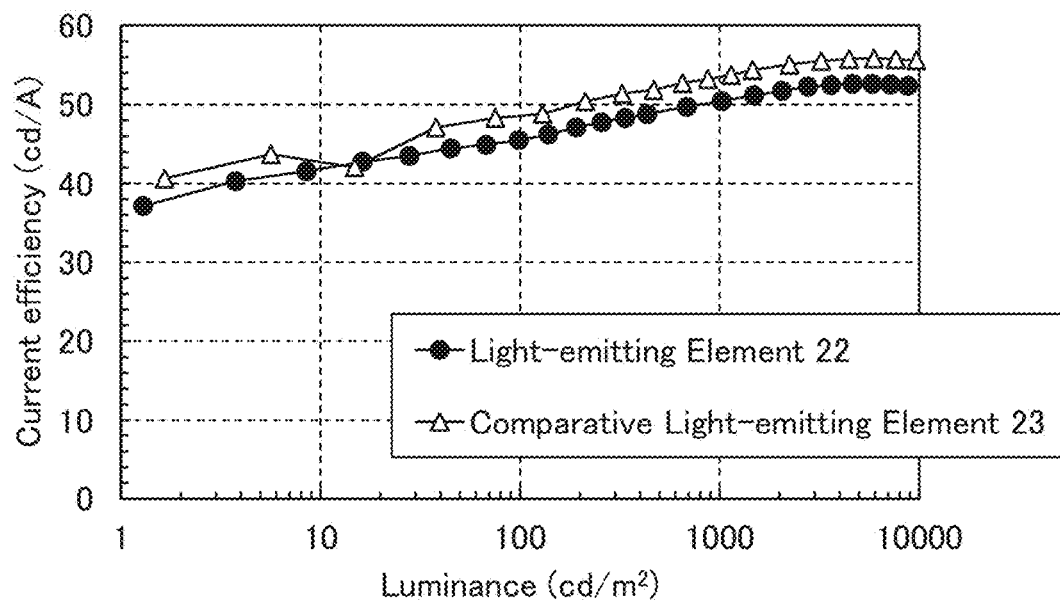
FIG. 55 shows current efficiency-luminance characteristics of light-emitting elements in Example.
Figure 56:
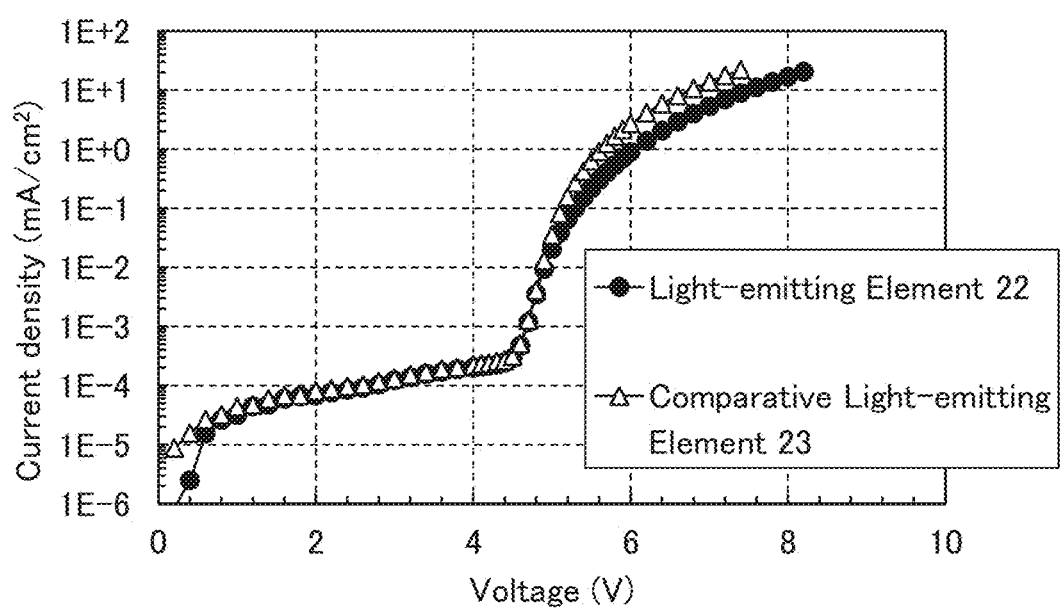
FIG. 56 shows current density-voltage characteristics of light-emitting elements in Example.
Figure 57:
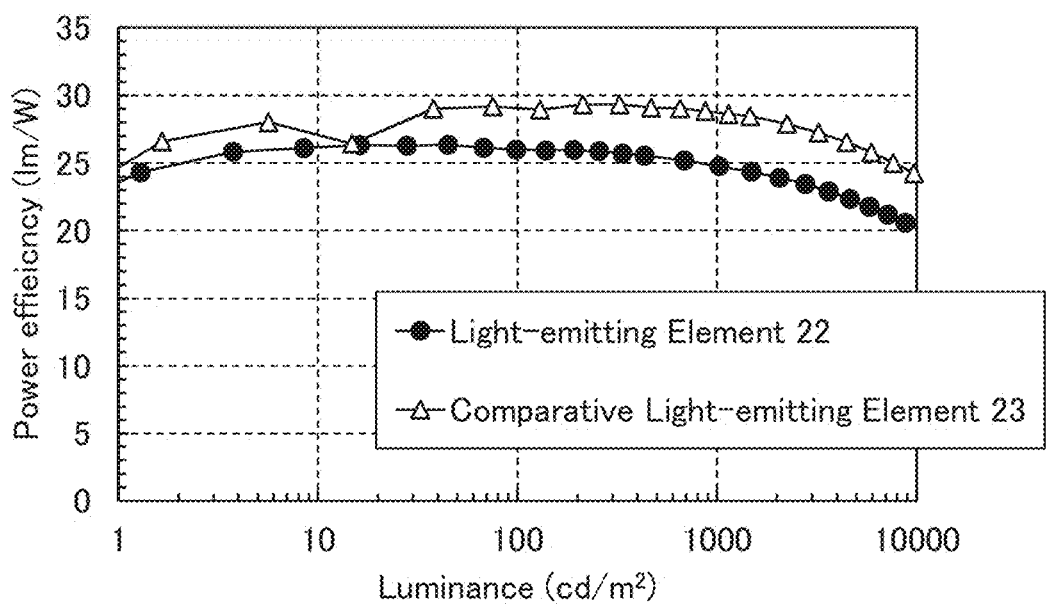
FIG. 57 shows power efficiency-luminance characteristics of light-emitting elements in Example.

FIG. 55 shows the current efficiency-luminance characteristics of the fabricated light-emitting element 22 and comparative light-emitting element 23; FIG. 56, the current density-voltage characteristics thereof; FIG. 57, the power efficiency-luminance characteristics thereof; and FIG. 58, the external quantum efficiency-luminance characteristics thereof. Note that the measurements of the light-emitting elements were performed at room temperature (in an atmosphere maintained at 23° C.). FIG. 59 shows the electroluminescence spectra of the light-emitting elements through which current flows at a current density of 2.5 mA/cm$^2$. Note that the measurement was performed at room temperature.

Table 21 shows the element characteristics of the light-emitting element 22 and the comparative light-emitting element 23 at around 1000 cd/m$^2$.

Figure 58:
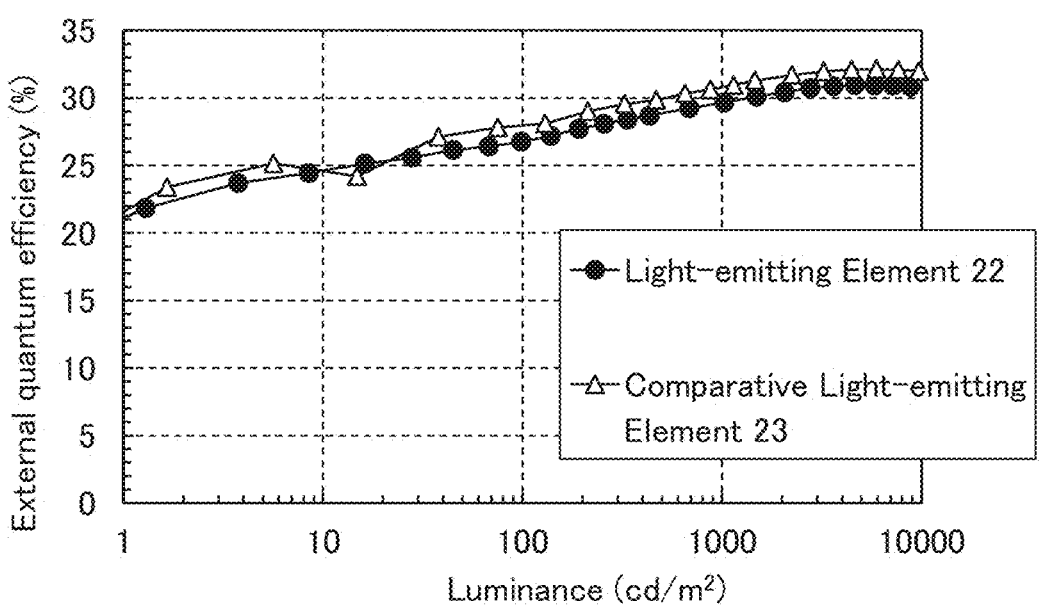
FIG. 58 shows external quantum efficiency-luminance characteristics of light-emitting elements in Example.
Figure 59:
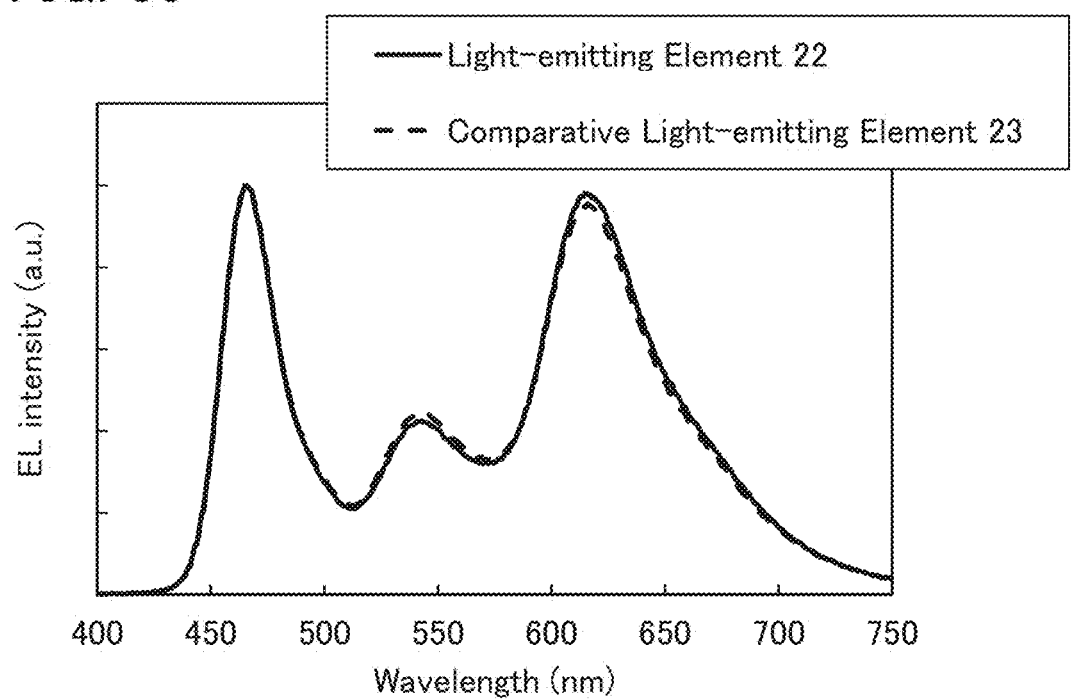
FIG. 59 shows electroluminescence spectra of light-emitting elements in Example.

As shown in FIG. 58 and Table 21, the light-emitting element 22 and the comparative light-emitting element 23 each exhibited high emission efficiency with an external quantum efficiency exceeding 30%. The light-emitting element 22 and the comparative light-emitting element 23 also exhibited high current efficiency and power efficiency as shown in FIGS. 55 and 57. From FIGS. 55, 57, and 58, the light-emitting element 22 and the comparative light-emitting element 23 exhibited equivalent emission efficiency. That is, the light-emitting element 22 according to one embodiment of the present invention exhibited high efficiency equivalent to that of the comparative light-emitting element 23, which uses Li$_2$O and LiF typically used for the electron-injection layer.

As shown in FIG. 56, the light-emitting element 22 and the comparative light-emitting element 23 exhibited favorable current density-voltage characteristics. It was also found that the composite film of NBPhen and Ag had significantly high electron-injection properties.

As shown in FIG. 59, the electroluminescence spectra of the light-emitting element 22 and the comparative light-emitting element 23 each have peak wavelengths at approximately 467 nm, 538 nm, and 617 nm, indicating that the light-emitting element 22 and the comparative light-emitting element 23 emit white light that has peaks in all the three wavelength regions of blue, green, and red. In addition, the light-emitting element 22 and the comparative light-emitting element 23 exhibit almost the same electroluminescence spectrum, that is, the light-emitting element 22 according to one embodiment of the present invention has high electron-injection properties equivalent to those of the comparative light-emitting element 23, which uses a Li compound typically used for the electron-injection layer.

From the above, the light-emitting element according to one embodiment of the present invention has favorable electron-injection properties equivalent to those of the light-emitting element that uses a Li compound typically used for the electron-injection layer, and therefore, has a low driving voltage and a high emission efficiency.

Example 9

Described are examples of fabricating light-emitting elements 24 to 26 according to one embodiment of the present invention. A schematic cross-sectional view of the light-emitting elements fabricated in this example is shown in FIG. 54. Details of the element structures are shown in Table 22. Note that the above examples and Embodiment 1 can be referred to for the structures and abbreviations of compounds used in this example.

TABLE 21

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 22 | 6.40 | 2.04 | (0.391, 0.391) | 1030 | 50.4 | 24.8 | 29.7 |
| Comparative light-emitting element 23 | 5.80 | 1.64 | (0.390, 0.323) | 876 | 53.2 | 28.8 | 30.6 |

TABLE 22

| Layer | | Reference numeral | Thickness (nm) | Material | Weight ratio |
|---|---|---|---|---|---|
| Light-emitting element 24 | Electrode | 3641 | 200 | Al | — |
| | Electron-injection layer | 3639 | 1 | LiF | — |
| | Electron-transport layer | 3638(2) | 15 | NBPhen | — |
| | | 3638(1) | 25 | 2mDBTBPDBq-II | — |
| | Light-emitting layer | 3646 | 40 | 2mDBTBPDBq-II:PCBBiF: Ir(dmdppr-dmp)$_2$(dpm) | 0.75:0.25:0.06 |
| | Hole-transport layer | 3637 | 20 | BPAFLP | — |
| | Charge-generation layer | 3635 | 80 | DBT3P-II:MoO$_3$ | 1:0.5 |
| | Electron-injection layer | 3634 | 5 | NBPhen:Ag | 1:0.19 |
| | Electron-transport layer | 3633(2) | 15 | NBPhen | — |
| | | 3633(1) | 10 | 2mDBTBPDBq-II | — |
| | Light-emitting layer | 3644 | 40 | 2mDBTBPDBq-II:PCBBiF: Ir(dmdppr-dmp)$_2$(dpm) | 0.75:0.25:0.06 |
| | Hole-transport layer | 3632 | 20 | BPAFLP | — |
| | Hole-injection layer | 3631 | 65 | DBT3P-II:MoO$_3$ | 1:0.5 |
| | Electrode | 3642 | 70 | ITSO | — |
| Light-emitting element 25 | Electrode | 3641 | 200 | Al | — |
| | Electron-injection layer | 3639 | 1 | LiF | — |
| | Electron-transport layer | 3638(2) | 15 | NBPhen | — |
| | | 3638(1) | 25 | 2mDBTBPDBq-II | — |
| | Light-emitting layer | 3646 | 40 | 2mDBTBPDBq-II:PCBBiF: Ir(dmdppr-dmp)$_2$(dpm) | 0.75:0.25:0.06 |
| | Hole-transport layer | 3637 | 20 | BPAFLP | — |
| | Charge-generation layer | 3635 | 80 | DBT3P-II:MoO$_3$ | 1:0.5 |
| | Electron-injection layer | 3634 | 5 | Alq:Ag | 1:0.24 |
| | Electron-transport layer | 3633(2) | 15 | NBPhen | — |
| | | 3633(1) | 10 | 2mDBTBPDBq-II | — |
| | Light-emitting layer | 3644 | 40 | 2mDBTBPDBq-II:PCBBiF: Ir(dmdppr-dmp)$_2$(dpm) | 0.75:0.25:0.06 |
| | Hole-transport layer | 3632 | 20 | BPAFLP | — |
| | Hole-injection layer | 3631 | 65 | DBT3P-II:MoO$_3$ | 1:0.5 |
| | Electrode | 3642 | 70 | ITSO | — |
| Light-emitting element 26 | Electrode | 3641 | 200 | Al | — |
| | Electron-injection layer | 3639 | 1 | LiF | — |
| | Electron-transport layer | 3638(2) | 15 | NBPhen | — |
| | | 3638(1) | 25 | 2mDBTBPDBq-II | — |
| | Light-emitting layer | 3646 | 40 | 2mDBTBPDBq-II:PCBBiF: Ir(dmdppr-dmp)$_2$(dpm) | 0.75:0.25:0.06 |
| | Hole-transport layer | 3637 | 20 | BPAFLP | — |
| | Charge-generation layer | 3635 | 80 | DBT3P-II:MoO$_3$ | 1:0.5 |
| | Electron-injection layer | 3634 | 5 | 2mDBTBPDBq-II:Ag | 1:0.20 |
| | Electron-transport layer | 3633(2) | 15 | NBPhen | — |
| | | 3633(1) | 10 | 2mDBTBPDBq-II | — |
| | Light-emitting layer | 3644 | 40 | 2mDBTBPDBq-II:PCBBiF: Ir(dmdppr-dmp)$_2$(dpm) | 0.75:0.25:0.06 |
| | Hole-transport layer | 3632 | 20 | BPAFLP | — |
| | Hole-injection layer | 3631 | 65 | DBT3P-II:MoO$_3$ | 1:0.5 |
| | Electrode | 3642 | 70 | ITSO | — |

«Fabrication of light-emitting element 24»

As the electrode 3642, an JTSO film was formed to a thickness of 70 nm over the substrate 3650. The electrode area was set to 4 mm$^2$ (2 mm×2 mm).

Then, as the hole-injection layer 3631, DBT3P-JJ and MoO$_3$ were deposited over the electrode 3642 by co-evaporation in a weight ratio of DBT3P-JJ:MoO$_3$=1:0.5 to a thickness of 65 nm.

Then, as the hole-transport layer 3632, BPAFLP was deposited over the hole-injection layer 3631 by evaporation to a thickness of 20 nm.

Then, as the light-emitting layer 3644, 2mDBTBPDBq-II, PCBBiF, and Ir(dmdppr-dmp)$_2$(dpm) were deposited over the hole-transport layer 3632 by co-evaporation in a weight ratio of 2mDBTBPDBq-II:PCBBiF:Ir(dmdppr-dmp)$_2$(dpm) =0.75:0.25:0.06 to a thickness of 40 nm. Note that in the light-emitting layer 3644, 2mDBTBPDBq-II and PCBBiF are host materials and Ir(dmdppr-dmp)$_2$(dpm) is a guest material (a phosphorescent compound).

Next, as the electron-transport layer 3633(1), 2mDBTBPDBq-II was deposited over the light-emitting layer 3644 by evaporation to a thickness of 10 nm.

Next, as the electron-transport layer 3633(2), NBPhen was deposited over the electron-transport layer 3633(1) by evaporation to a thickness of 15 nm.

As the electron-injection layer 3634, NBPhen and Ag were deposited over the electron-transport layer 3633(2) by co-evaporation in a weight ratio of NBPhen:Ag=1:0.19 to a thickness of 5 nm.

Then, as the charge-generation layer 3635, DBT3P-II and MoO$_3$ were deposited over the electron-injection layer 3634 by co-evaporation in a weight ratio of DBT3P-II:MoO$_3$=1: 0.5 to a thickness of 80 nm.

Then, as the hole-transport layer 3637, BPAFLP was deposited over the charge-generation layer 3635 by evaporation to a thickness of 20 nm.

Then, as the light-emitting layer 3646, 2mDBTBPDBq-II, PCBBiF, and Ir(dmdppr-dmp)$_2$(dpm) were deposited over the hole-transport layer 3637 by co-evaporation in a weight ratio of 2mDBTBPDBq-II:PCBBiF:Ir(dmdppr-dmp)$_2$(dpm) =0.75:0.25:0.06 to a thickness of 40 nm. Note that in the light-emitting layer 3646, 2mDBTBPDBq-II and PCBBiF are host materials and Ir(dmdppr-dmp)$_2$(dpm) is a guest material (a phosphorescent compound).

Next, as the electron-transport layer 3638(1), 2mDBTBPDBq-II was deposited over the light-emitting layer 3646 by evaporation to a thickness of 25 nm.

Next, as the electron-transport layer 3638(2), NBPhen was deposited over the electron-transport layer 3638(1) by evaporation to a thickness of 15 nm.

Figure 64:
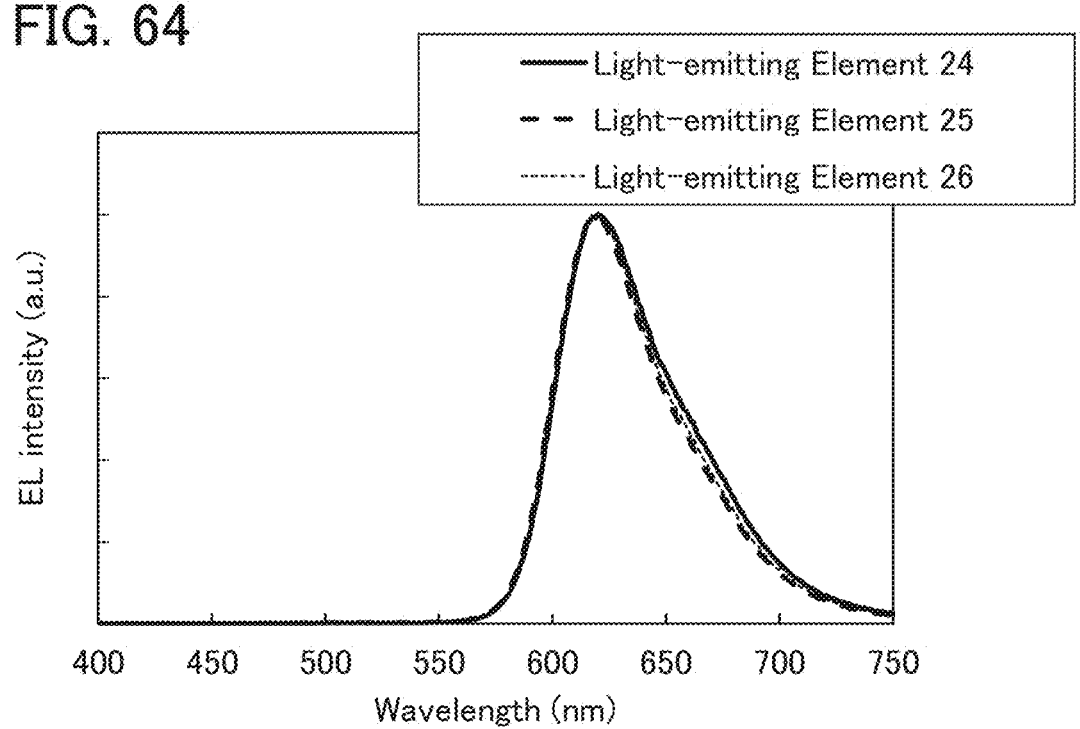
FIG. 64 shows electroluminescence spectra of light-emitting elements in Example.

As the electron-injection layer 3639, LiF was deposited over the electron-transport layer 3638(2) by evaporation to a thickness of 1 nm.

ments of the light-emitting elements were performed at room temperature (in an atmosphere maintained at 23° C.). FIG. 64 shows the electroluminescence spectra of the light-emitting elements through which current flows at a current density of 2.5 mA/cm$^2$. Note that the measurement was performed at room temperature.

Table 23 shows the element characteristics of the light-emitting elements 24 to 26 at around 1000 cd/m$^2$.

TABLE 23

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 24 | 6.30 | 1.41 | (0.675, 0.325) | 947 | 67.0 | 33.4 | 57.9 |
| Light-emitting element 25 | 8.20 | 1.55 | (0.671, 0.329) | 983 | 63.4 | 24.3 | 51.2 |
| Light-emitting element 26 | 7.00 | 1.41 | (0.672, 0.328) | 967 | 69.8 | 30.9 | 56.8 |

Then, as the electrode 3641, Al was deposited over the electron-injection layer 3639 by evaporation to a thickness of 200 nm.

Next, in a glove box containing a nitrogen atmosphere, the light-emitting element 24 was sealed by fixing the substrate 3652 to the substrate 3650 over which the organic compound was deposited using a sealant for an organic EL device. Specifically, the sealant was applied to the periphery of the substrate 3652 and the substrate 3652 was bonded to the substrate 3650 over which the organic compound film was deposited; then, irradiation with ultraviolet light having a wavelength of 365 nm at 6 J/cm$^2$ and heat treatment at 80° C. for one hour were performed. Through the above steps, the light-emitting element 24 was obtained.

«Fabrication of Light-Emitting Elements 25 and 26»

The light-emitting elements 25 and 26 were fabricated through the same steps as those for the light-emitting element 24 except for the step of forming the electron-injection layer 3634.

<Fabrication of Light-Emitting Element 25>

As the electron-injection layer 3634, Alq$_3$ and Ag were deposited over the electron-transport layer 3633(2) of the light-emitting element 25 by co-evaporation in a weight ratio of Alq$_3$:Ag=1:0.24 to a thickness of 5 nm.

<Fabrication of Light-Emitting Element 26>

As the electron-injection layer 3634, 2mDBTBPDBq-II and Ag were deposited over the electron-transport layer 3633(2) of the light-emitting element 26 by co-evaporation in a weight ratio of 2mDBTBPDBq-II:Ag=1:0.20 to a thickness of 5 nm.

«Measurement of Light-Emitting Elements»

The element characteristics of the fabricated light-emitting elements 24 to 26 were measured. The measurement was performed in a manner similar to that in Example 1.

Figure 60:
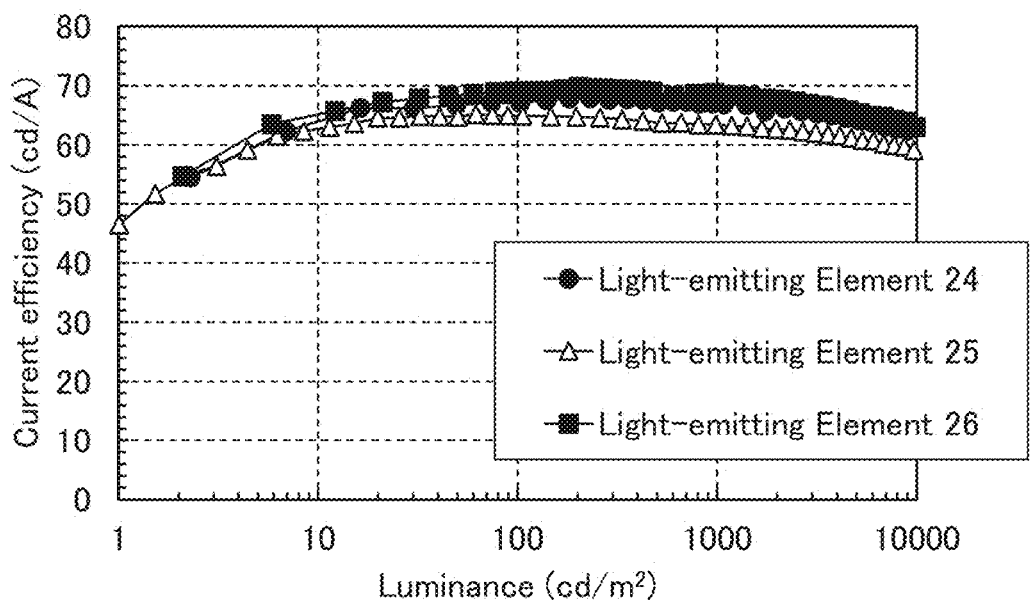
FIG. 60 shows current efficiency-luminance characteristics of light-emitting elements in Example.
Figure 61:
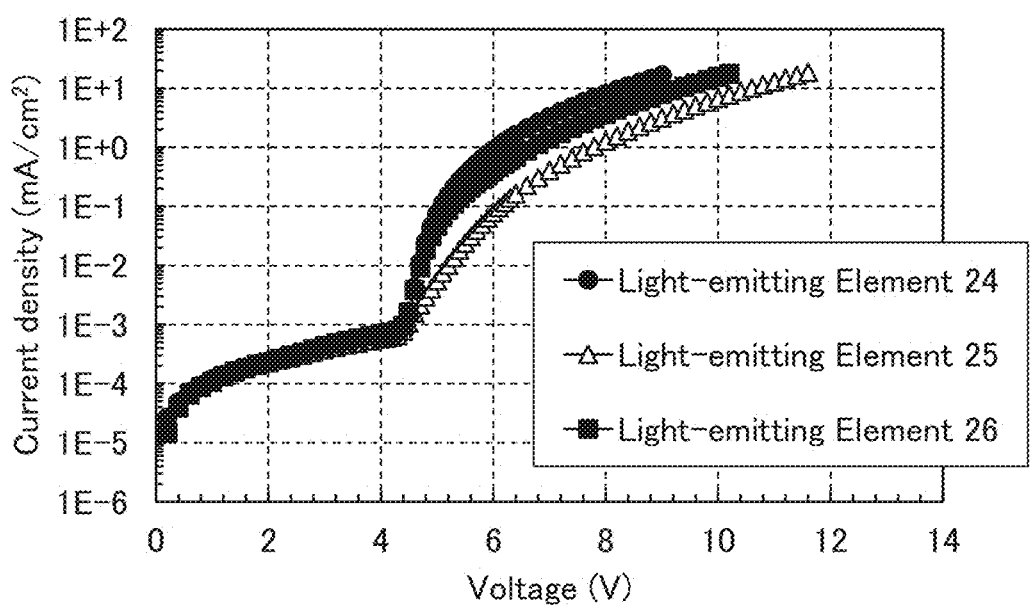
FIG. 61 shows current density-voltage characteristics of light-emitting elements in Example.
Figure 62:
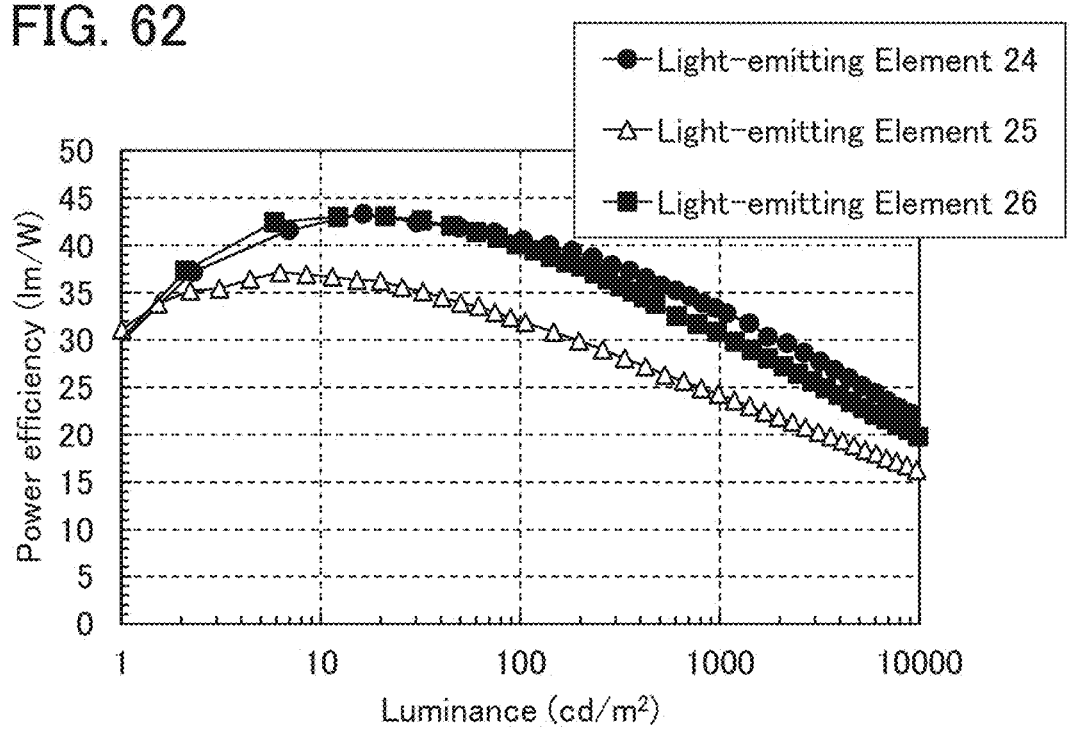
FIG. 62 shows power efficiency-luminance characteristics of light-emitting elements in Example.
Figure 63:
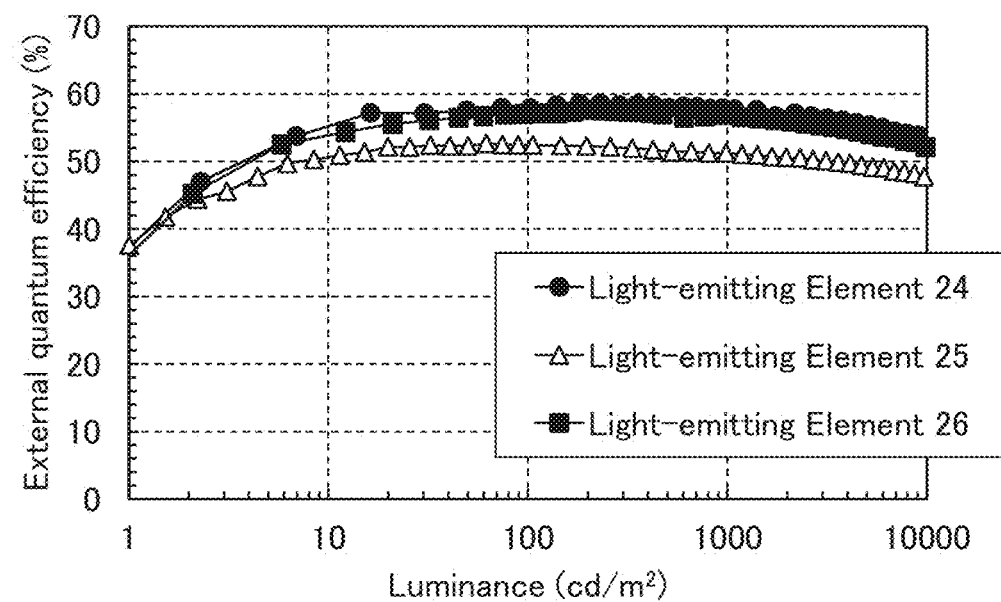
FIG. 63 shows external quantum efficiency-luminance characteristics of light-emitting elements in Example.

FIG. 60 shows the current efficiency-luminance characteristics of the fabricated light-emitting elements 24 to 26; FIG. 61, the current density-voltage characteristics thereof; FIG. 62, the power efficiency-luminance characteristics thereof; and FIG. 63, the external quantum efficiency-luminance characteristics thereof. Note that the measure- As shown in FIG. 63 and Table 23, the light-emitting elements 24 to 26 each exhibited high emission efficiency with an external quantum efficiency exceeding 50%. The light-emitting elements 24 to 26 also exhibited high current efficiency and power efficiency as shown in FIGS. 60 and 62. Thus, the light-emitting elements according to one embodiment of the present invention have a high emission efficiency.

As shown in FIG. 61, the light-emitting elements 24 to 26 exhibited favorable current density-voltage characteristics. In particular, the light-emitting elements 24 and 26 exhibited favorable current density-voltage characteristics, indicating that the composite material of a transition metal and an organic compound having an unshared electron pair has high electron-injection properties.

As shown in FIG. 64, the light-emitting elements 24 to 26 each exhibited red emission whose electroluminescence spectrum has a peak wavelength at approximately 619 nm and a full width at half maximum of 60 nm. The obtained electroluminescence spectrum reveals that the light is emitted from the guest material, Ir(dmdppr-dmp)$_2$(dmp).

From the above, the light-emitting element according to one embodiment of the present invention has favorable electron-injection properties, and therefore, has a low driving voltage and a high emission efficiency. The structures shown in this example can be used in appropriate combination with any of the other embodiments and examples.

Example 10

Described in this example are examples of fabricating light-emitting elements 27 to 29 according to one embodiment of the present invention and a comparative light-emitting element 30. A schematic cross-sectional view of the light-emitting elements fabricated in this example is shown in FIG. 54. Details of the element structures are shown in Tables 24 and 25. The above examples and embodiments can be referred to for the structures and abbreviations of compounds used in this example.

TABLE 24

| | Layer | Reference numeral | Thickness (nm) | Material | Weight ratio |
|---|---|---|---|---|---|
| Light-emitting element 27 | Electrode | 3641 | 200 | Al | — |
| | Electron-injection layer | 3639 | 5 | NBPhen:Ag | 1:0.19 |
| | Electron-transport layer | 3638(2) | 10 | NBPhen | — |
| | | 3638(1) | 25 | 2mDBTBPDBq-II | — |
| | Light-emitting layer | 3646 | 40 | 2mDBTBPDBq-II:PCBBiF:Ir(dmdppr-dmp)$_2$(dpm) | 0.75:0.25:0.06 |
| | Hole-transport layer | 3637 | 20 | BPAFLP | — |
| | Charge-generation layer | 3635 | 80 | DBT3P-II:MoO$_3$ | 1:0.5 |
| | Electron-injection layer | 3634 | 5 | NBPhen:Ag | 1:0.19 |
| | Electron-transport layer | 3633(2) | 15 | NBPhen | — |
| | | 3633(1) | 10 | 2mDBTBPDBq-II | — |
| | Light-emitting layer | 3644 | 40 | 2mDBTBPDBq-II:PCBBiF:Ir(dmdppr-dmp)$_2$(dpm) | 0.75:0.25:0.06 |
| | Hole-transport layer | 3632 | 20 | BPAFLP | — |
| | Hole-injection layer | 3631 | 65 | DBT3P-II:MoO$_3$ | 1:0.5 |
| | Electrode | 3642 | 70 | ITSO | — |
| Light-emitting element 28 | Electrode | 3641 | 200 | Al | — |
| | Electron-injection layer | 3639 | 5 | NBPhen:Ag | 1:0.19 |
| | Electron-transport layer | 3638(2) | 10 | NBPhen | — |
| | | 3638(1) | 25 | 2mDBTBPDBq-II | — |
| | Light-emitting layer | 3646 | 40 | 2mDBTBPDBq-II:PCBBiF:Ir(dmdppr-dmp)$_2$(dpm) | 0.75:0.25:0.06 |
| | Hole-transport layer | 3637 | 20 | BPAFLP | — |
| | Charge-generation layer | 3635 | 80 | DBT3P-II:MoO$_3$ | 1:0.5 |
| | Electron-injection layer | 3634(2) | 5 | 2Py3Tz:Ag | 1:0.35 |
| | | 3634(1) | 5 | NBPhen:Ag | 1:0.19 |
| | Electron-transport layer | 3633(2) | 10 | NBPhen | — |
| | | 3633(1) | 10 | 2mDBTBPDBq-II | — |
| | Light-emitting layer | 3644 | 40 | 2mDBTBPDBq-II:PCBBiF:Ir(dmdppr-dmp)$_2$(dpm) | 0.75:0.25:0.06 |
| | Hole-transport layer | 3632 | 20 | BPAFLP | — |
| | Hole-injection layer | 3631 | 65 | DBT3P-II:MoO$_3$ | 1:0.5 |
| | Electrode | 3642 | 70 | ITSO | — |

TABLE 25

| | Layer | Reference numeral | Thickness (nm) | Material | Weight ratio |
|---|---|---|---|---|---|
| Light-emitting element 29 | Electrode | 3641 | 200 | Al | — |
| | Electron-injection layer | 3639 | 5 | NBPhen:Ag | — |
| | Electron-transport layer | 3638(2) | 10 | NBPhen | — |
| | | 3638(1) | 25 | 2mDBTBPDBq-II | — |
| | Light-emitting layer | 3646 | 40 | 2mDBTBPDBq-II:PCBBiF:Ir(dmdppr-dmp)$_2$(dpm) | 0.75:0.25:0.06 |
| | Hole-transport layer | 3637 | 20 | BPAFLP | — |
| | Charge-generation layer | 3635 | 80 | DBT3P-II:MoO$_3$ | 1:0.5 |
| | Electron-injection layer | 3634(2) | 5 | TmPPPyTz:Ag | 1:0.15 |
| | | 3634(1) | 5 | NBPhen:Ag | 1:0.19 |
| | Electron-transport layer | 3633(2) | 10 | NBPhen | — |
| | | 3633(1) | 10 | 2mDBTBPDBq-II | — |
| | Light-emitting layer | 3644 | 40 | 2mDBTBPDBq-II:PCBBiF:Ir(dmdppr-dmp)$_2$(dpm) | 0.75:0.25:0.06 |
| | Hole-transport layer | 3632 | 20 | BPAFLP | — |
| | Hole-irection layer | 3631 | 65 | DBT3P-II:MoO$_3$ | 1:0.5 |
| | Electrode | 3642 | 70 | ITSO | — |
| Comparative light-emitting element 30 | Electrode | 3641 | 200 | Al | — |
| | Electron-injection layer | 3639 | 1 | LiF | — |
| | Electron-transport layer | 3638(2) | 15 | NBPhen | — |
| | | 3638(1) | 25 | 2mDBTBPDBq-II | — |
| | Light-emitting layer | 3646 | 40 | 2mDBTBPDBq-II:PCBBiF:Ir(dmdppr-dmp)$_2$(dpm) | 0.75:0.25:0.06 |
| | Hole-transport layer | 3637 | 20 | BPAFLP | — |
| | Charge-generation layer | 3635 | 80 | DBT3P-II:MoO$_3$ | 1:0.5 |
| | Electron-injection layer | 3634 | 0.2 | Li$_2$O | — |
| | Electron-transport layer | 3633(2) | 20 | NBPhen | — |
| | | 3633(1) | 10 | 2mDBTBPDBq-II | — |
| | Light-emitting layer | 3644 | 40 | 2mDBTBPDBq-II:PCBBiF:Ir(dmdppr-dmp)$_2$(dpm) | 0.75:0.25:0.06 |
| | Hole-transport layer | 3632 | 20 | BPAFLP | — |
| | Hole-injection layer | 3631 | 65 | DBT3P-II:MoO$_3$ | 1:0.5 |
| | Electrode | 3642 | 70 | ITSO | — |

<Fabrication of Light-Emitting Elements>

Fabrication methods of the light-emitting elements in this example will be described below. The comparative light-emitting element 30 uses Li₂O and LiF, each of which is a Li compound typically used for the electron-injection layer. The light-emitting elements 27 to 29 each use for the electron-injection layer a composite film of a transition metal and an organic compound having an unshared electron pair according to one embodiment of the present invention. In the light-emitting elements 27 to 29, an organic compound including a triazine ring is used as the organic compound having an unshared electron pair.

«<Fabrication of Light-Emitting Element 27»

The light-emitting element 27 was fabricated through the same steps as those for the light-emitting element 24 except for the steps of forming the electron-transport layer 3638 and the electron-injection layer 3639.

As the electron-transport layer 3638(2), NBPhen was deposited over the electron-transport layer 3638(1) of the light-emitting element 27 by evaporation to a thickness of 10 nm.

As the electron-injection layer 3639, NBPhen and Ag were deposited over the electron-transport layer 3638(2) by co-evaporation in a weight ratio of NBPhen:Ag=1:0.19 to a thickness of 5 nm.

<Fabrication of Light-Emitting Elements 28 and 29>

The light-emitting elements 28 and 29 were fabricated through the same steps as those for the light-emitting element 27 except for the steps of forming the electron-transport layer 3633(2) and the electron-injection layer 3634.

<Fabrication of Light-Emitting Element 28>

As the electron-transport layer 3633(2), NBPhen was deposited over the electron-transport layer 3633(1) of the light-emitting element 28 by evaporation to a thickness of 10 nm.

As the electron-injection layer 3634, NBPhen and Ag were deposited over the electron-transport layer 3633(2) by co-evaporation in a weight ratio of NBPhen:Ag=1:0.19 to a thickness of 5 nm. Subsequently, 2Py3Tzn and Ag were deposited by co-evaporation in a weight ratio of 2Py3Tzn:Ag=1:0.35 to a thickness of 5 nm.

<Fabrication of Light-Emitting Element 29>

As the electron-transport layer 3633(2), NBPhen was deposited over the electron-transport layer 3633(1) of the light-emitting element 29 by evaporation to a thickness of 10 nm.

As the electron-injection layer 3634, NBPhen and Ag were deposited over the electron-transport layer 3633(2) by co-evaporation in a weight ratio of NBPhen:Ag=1:0.19 to a thickness of 5 nm. Subsequently, TmPPPyTz and Ag were deposited by co-evaporation in a weight ratio of TmPPPyTz:Ag=1:0.15 to a thickness of 5 nm.

<Fabrication of Comparative Light-Emitting Element 30>

The comparative light-emitting element 30 was fabricated through the same steps as those for the light-emitting element 27 except for the steps of forming the electron-transport layer 3633(2), the electron-injection layer 3634, the electron-transport layer 3638(2), and the electron-injection layer 3639.

As the electron-transport layer 3633(2), NBPhen was deposited over the electron-transport layer 3633(1) of the comparative light-emitting element 30 by evaporation to a thickness of 20 nm.

As the electron-injection layer 3634, Li₂O was deposited over the electron-transport layer 3633(2) by evaporation to a thickness of 0.2 nm.

As the electron-transport layer 3638(2), NBPhen was deposited over the electron-transport layer 3638(1) by evaporation to a thickness of 15 nm.

As the electron-injection layer 3639, LiF was deposited over the electron-transport layer 3638(2) by evaporation to a thickness of 1 nm.

<Characteristics of Light-Emitting Elements>

The element characteristics of the fabricated light-emitting elements 27 to 29 and comparative light-emitting element 30 were measured. The measurement was performed in a manner similar to that in Example 1.

Figure 65:
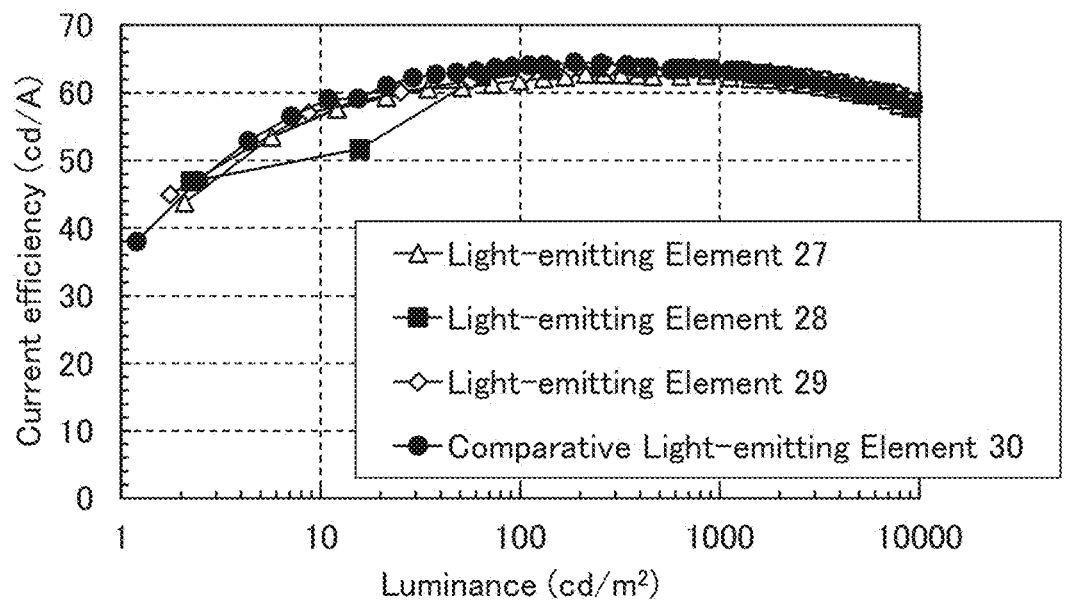
FIG. 65 shows current efficiency-luminance characteristics of light-emitting elements in Example.
Figure 66:
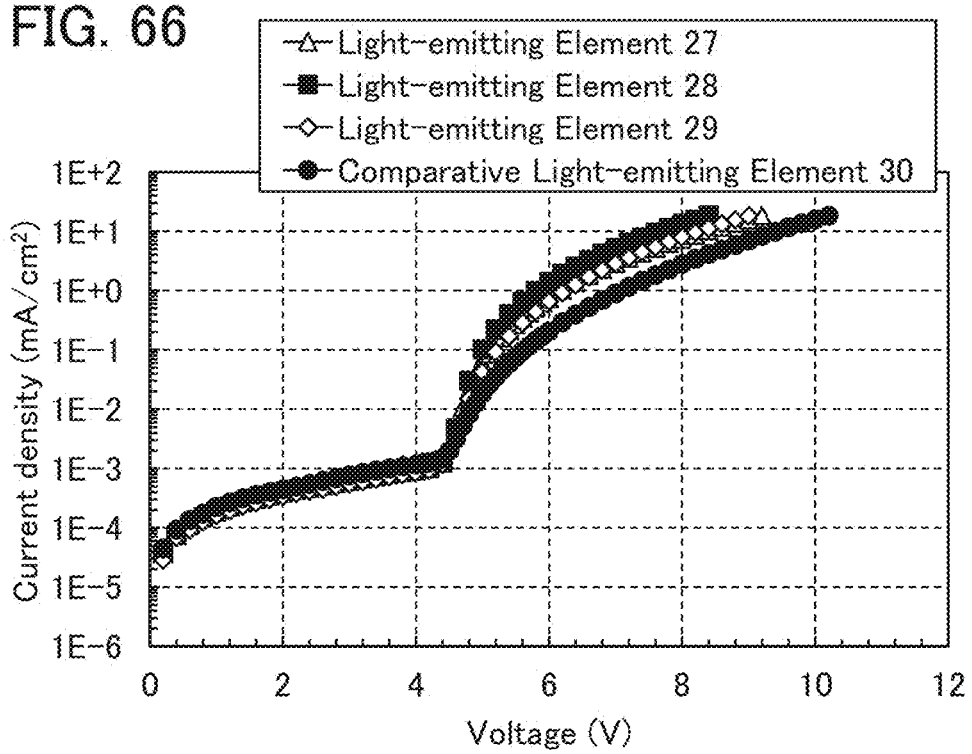
FIG. 66 shows current density-voltage characteristics of light-emitting elements in Example.
Figure 67:
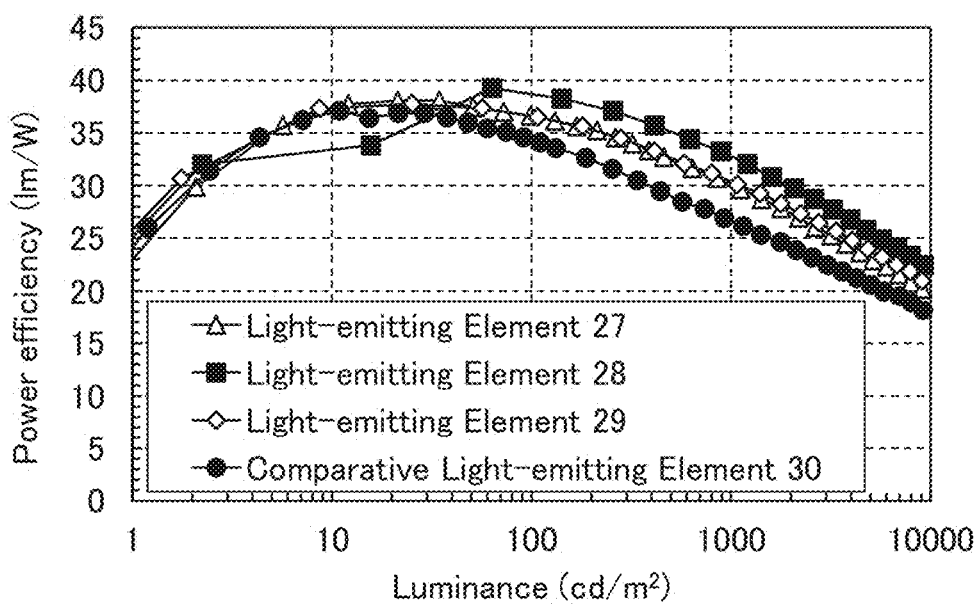
FIG. 67 shows power efficiency-luminance characteristics of light-emitting elements in Example.

FIG. 65 shows the current efficiency-luminance characteristics of the fabricated light-emitting elements 27 to 29 and comparative light-emitting element 30; FIG. 66, the current density-voltage characteristics thereof; FIG. 67, the power efficiency-luminance characteristics thereof; and FIG. 68, the external quantum efficiency-luminance characteristics thereof. FIG. 69 shows the electroluminescence spectra of the light-emitting elements through which current flows at a current density of 2.5 mA/cm².

Table 26 shows the element characteristics of the light-emitting elements 27 to 29 and the comparative light-emitting element 30 at around 1000 cd/m².

TABLE 26

|  | Voltage (V) | Current density (mA/cm²) | CIE chromaticity (x, y) | Luminance (cd/m²) | Current efficiency (cd/A) | Power efficiency (lm/W) | External quantum efficiency (%) |
| --- | --- | --- | --- | --- | --- | --- | --- |
| Light-emitting element 27 | 6.60 | 1.80 | (0.670, 0.331) | 1120 | 63.3 | 29.6 | 52.4 |
| Light-emitting element 28 | 6.00 | 1.40 | (0.670, 0.331) | 889 | 62.3 | 33.2 | 53.0 |
| Light-emitting element 29 | 6.40 | 1.26 | (0.669, 0.331) | 801 | 63.8 | 33.2 | 52.9 |
| Comparative light-emitting element 30 | 7.40 | 1.46 | (0.668, 0.332) | 924 | 63.5 | 26.9 | 52.0 |

Figure 68:
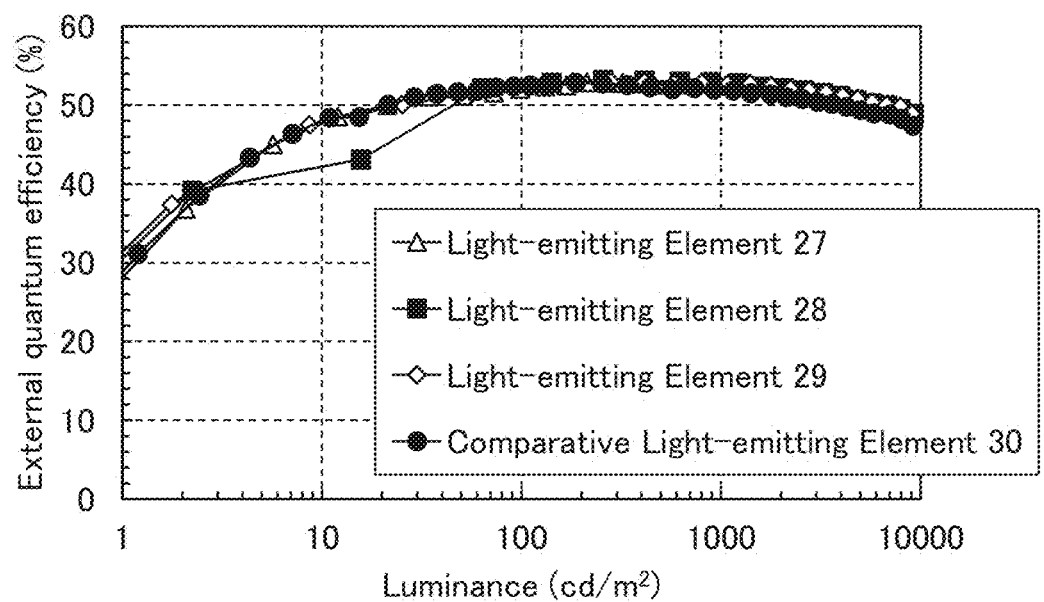
FIG. 68 shows external quantum efficiency-luminance characteristics of light-emitting elements in Example.
Figure 69:
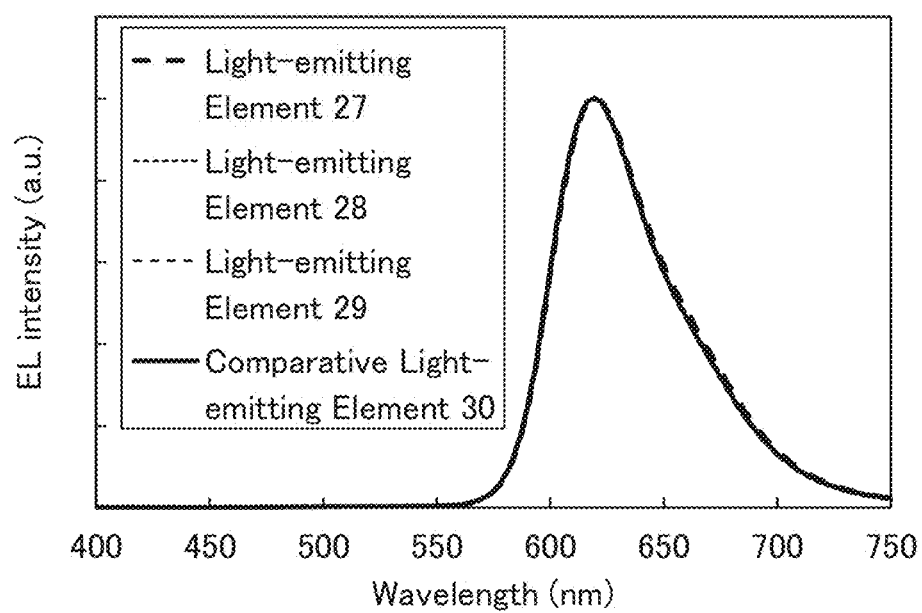
FIG. 69 shows electroluminescence spectra of light-emitting elements in Example.

As shown in FIG. 68 and Table 26, the light-emitting elements 27 to 29 and the comparative light-emitting element 30 each exhibited high emission efficiency with an external quantum efficiency exceeding 50%. The light-emitting elements 27 to 29 and the comparative light-emitting element 30 also exhibited high current efficiency and power efficiency as shown in FIGS. 65 and 67. The light-emitting elements 27 to 29 according to one embodiment of the present invention exhibited high efficiency equivalent to that of the comparative light-emitting element 30, which uses Li₂O and LiF typically used for the electron-injection layer.

As shown in FIG. 66, the light-emitting elements 27 to 29 and the comparative light-emitting element 30 exhibited favorable current density-voltage characteristics. It was also found that the light-emitting elements 27 to 29 according to one embodiment of the present invention had electron-injection properties superior to those of the comparative light-emitting element 30 using $Li_2O$ and LiF which is a material typically used for the electron-injection layer.

As shown in FIG. 69, the light-emitting elements 27 to 29 and the comparative light-emitting element 30 each exhibited red emission whose electroluminescence spectrum has a peak wavelength at approximately 620 nm and a full width at half maximum of approximately 60 nm. The obtained electroluminescence spectrum reveals that the light is emitted from the guest material, $Ir(dmdppr-dmp)_2(dmp)$.

From the above, an organic compound including a triazine ring can be favorably used for the light-emitting element according to one embodiment of the present invention. The structures shown in this example can be used in appropriate combination with any of the other embodiments and examples.

Example 11

Figure 70:
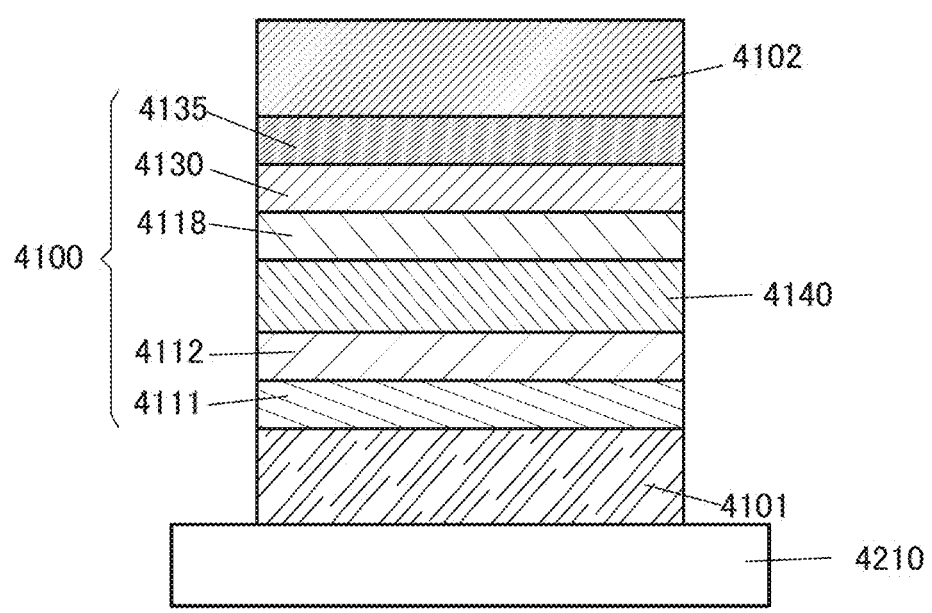
FIG. 70 is a schematic cross-sectional view illustrating a light-emitting element in Example.

Described in this example are examples of fabricating light-emitting elements 32 to 34 according to one embodiment of the present invention and comparative light-emitting elements 31 and 35 to 37. A schematic cross-sectional view of the light-emitting elements fabricated in this example is shown in FIG. 70. Details of the element structures are shown in Tables 27 to 29. Example 1 can be referred to for the structures and abbreviations of compounds used in this example.

TABLE 27

| | Layer | Reference numeral | Thickness (nm) | Material | Weight ratio |
|---|---|---|---|---|---|
| Comparative light-emitting element 31 | Electrode | 4102 | 200 | Al | — |
| | Charge-generation layer | 4135 | 15 | DBT3P-II:MoO$_3$ | 1:0.5 |
| | Electron-injection layer | 4130 | 0.2 | Li$_2$O | — |
| | Electron-transport layer | 4118(2) | 20 | NBPhen | — |
| | | 4118(1) | 5 | 2mDBTBPDBq-II | — |
| | Light-emitting layer | 4140 | 40 | 2mDBTBPDBq-II:PCBBiF:Ir(dmdppr-dmp)$_2$(dpm) | 0.75:0.25:0.06 |
| | Hole-transport layer | 4112 | 20 | BPAFLP | — |
| | Hole-injection layer | 4111 | 25 | DBT3P-II:MoO$_3$ | 1:0.5 |
| | Electrode | 4101 | 110 | ITSO | — |
| Light-emitting element 32 | Electrode | 4102 | 200 | Al | — |
| | Charge-generation layer | 4135 | 15 | DBT3P-II:MoO$_3$ | 1:0.5 |
| | Electron-injection layer | 4130 | 5 | NBPhen:Ag | 1:0.19 |
| | Electron-transport layer | 4118(2) | 15 | NBPhen | — |
| | | 4118(1) | 5 | 2mDBTBPDBq-II | — |
| | Light-emitting layer | 4140 | 40 | 2mDBTBPDBq-II:PCBBiF:Ir(dmdppr-dmp)$_2$(dpm) | 0.75:0.25:0.06 |
| | Hole-transport layer | 4112 | 20 | BPAFLP | — |
| | Hole-injection layer | 4111 | 25 | DBT3P-II:MoO$_3$ | 1:0.5 |
| | Electrode | 4101 | 110 | ITSO | — |
| Light-emitting element 33 | Electrode | 4102 | 200 | Al | — |
| | Charge-generation layer | 4135 | 15 | DBT3P-II:MoO$_3$ | 1:0.5 |
| | Electron-injection layer | 4130(2) | 5 | Alq$_3$:Ag | 1:0.24 |
| | | 4130(1) | 5 | NBPhen:Ag | 1:0.19 |
| | Electron-transport layer | 4118(2) | 10 | NBPhen | — |
| | | 4118(1) | 5 | 2mDBTBPDBq-II | — |
| | Light-emitting layer | 4140 | 40 | 2mDBTBPDBq-II:PCBBiF:Ir(dmdppr-dmp)$_2$(dpm) | 0.75:0.25:0.06 |
| | Hole-transport layer | 4112 | 20 | BPAFLP | — |
| | Hole-injection layer | 4111 | 25 | DBT3P-II:MoO$_3$ | 1:0.5 |
| | Electrode | 4101 | 110 | ITSO | — |

TABLE 28

| | Layer | Reference numeral | Thickness (nm) | Material | Weight ratio |
|---|---|---|---|---|---|
| Light-emitting element 34 | Electrode | 4102 | 200 | Al | — |
| | Charge-generation layer | 4135 | 15 | DBT3P-II:MoO$_3$ | 1:0.5 |
| | Electron-injection layer | 4130(2) | 5 | HATNA:Ag | 1:0.28 |
| | | 4130(1) | 5 | NBPhenAg | 1:0.19 |
| | Electron-transport layer | 4118(2) | 10 | NBPhen | — |
| | | 4118(1) | 5 | 2mDBTBPDBq-II | — |
| | Light-emitting layer | 4140 | 40 | 2mDBTBPDBq-II:PCBBiF:Ir(dmdppr-dmp)$_2$(dpm) | 0.75:0.25:0.06 |
| | Hole-transport layer | 4112 | 20 | BPAFLP | — |
| | Hole-injection layer | 4111 | 25 | DBT3P-II:MoO$_3$ | 1:0.5 |
| | Electrode | 4101 | 110 | ITSO | — |
| Comparative light-emitting element 35 | Electrode | 4102 | 200 | Al | — |
| | Electron-injection layer | 4130 | 5 | NBPhen:Ag | 1:0.19 |
| | Electron-transport layer | 4118(2) | 15 | NBPhen | — |
| | | 4118(1) | 20 | 2mDBTBPDBq-II | — |

TABLE 28-continued

| Layer | Reference numeral | Thickness (nm) | Material | Weight ratio |
|---|---|---|---|---|
| Light-emitting layer | 4140 | 40 | 2mDBTBPDBq-II:PCBBiF: Ir(dmdppr-dmp)$_2$(dpm) | 0.75:0.25:0.06 |
| Hole-transport layer | 4112 | 20 | BPAFLP | — |
| Hole-injection layer | 4111 | 25 | DBT3P-II:MoO$_3$ | 1:0.5 |
| Electrode | 4101 | 110 | ITSO | — |

TABLE 29

| | Layer | Reference numeral | Thickness (nm) | Material | Weight ratio |
|---|---|---|---|---|---|
| Comparative light-emitting element 36 | Electrode | 4102 | 200 | Al | — |
| | Electron-injection layer | 4130(2) | 5 | Alq3Ag | 1:0.24 |
| | | 4130(1) | 5 | NBPhen:Ag | 1:0.19 |
| | Electron-transport layer | 4118(2) | 10 | NBPhen | — |
| | | 4118(1) | 20 | 2mDBTBPDBq-II | — |
| | Light-emitting layer | 4140 | 40 | 2mDBTBPDBq-II:PCBBiF: Ir(dmdppr-dmp)$_2$(dpm) | 0.75:0.25:0.06 |
| | Hole-transport layer | 4112 | 20 | BPAFLP | — |
| | Hole-injection layer | 4111 | 25 | DBT3P-II:MoO$_3$ | 1:0.5 |
| | Electrode | 4101 | 110 | ITSO | — |
| Comparative light-emitting element 37 | Electrode | 4102 | 200 | Al | — |
| | Electron-injection layer | 4130(2) | 5 | HATNA:Ag | 1:0.28 |
| | | 4130(1) | 5 | NBPhen:Ag | 1:0.19 |
| | Electron-transport layer | 4118(2) | 10 | NBPhen | — |
| | | 4118(1) | 20 | 2mDBTBPDBq-II | — |
| | Light-emitting layer | 4140 | 40 | 2mDBTBPDBq-II:PCBBiF: Ir(dmdppr-dmp)$_2$(dpm) | 0.75:0.25:0.06 |
| | Hole-transport layer | 4112 | 20 | BPAFLP | — |
| | Hole-injection layer | 4111 | 25 | DBT3P-II:MoO$_3$ | 1:0.5 |
| | Electrode | 4101 | 110 | ITSO | — |

The LUMO levels of organic compounds used in an electron-injection layer 4130 of the light-emitting elements 32 to 34 and the comparative light-emitting elements 31 and 35 to 37 were calculated by cyclic voltammetry (CV) measurement. The measurement was performed in a manner similar to that in Example 1. The results are shown in Table 30.

TABLE 30

| | LUMO (eV) |
|---|---|
| NBPhen | −2.83 |
| Alq$_3$ | −2.80 |
| HATNA | −3.50 |

<Fabrication of Light-Emitting Elements>

Fabrication methods of the light-emitting elements in this example will be described below. The comparative light-emitting element 31 uses lithium oxide (Li$_2$O), which is a Li compound typically used for the electron-injection layer. The light-emitting elements 32 to 34 each use for the electron-injection layer a composite material of a transition metal and an organic compound having an unshared electron pair according to one embodiment of the present invention. The comparative light-emitting elements 35 to 37 are different from the light-emitting elements 32 to 34 in that a charge-generation layer 4135 is not provided.

«Fabrication of Comparative Light-Emitting Element 31»

As an electrode 4101, an ITSO film was formed to a thickness of 110 nm over a substrate 4210. Note that the electrode area of the electrode 4101 was set to 4 mm$^2$ (2 mm×2 mm).

Then, as a hole-injection layer 4111, DBT3P-II and molybdenum oxide (MoO$_3$) were deposited over the electrode 4101 by co-evaporation in a weight ratio of DBT3P-II:MoO$_3$=1:0.5 to a thickness of 25 nm.

Then, as a hole-transport layer 4112, BPAFLP was deposited over the hole-injection layer 4111 by evaporation to a thickness of 20 nm.

Next, as a light-emitting layer 4140, 2mDBTBPDBq-II, PCBBiF, and Ir(dmdppr-dmp)$_2$(dpm) were deposited over the hole-transport layer 4112 by co-evaporation in a weight ratio of 2mDBTBPDBq-II:PCBBiF:Ir(dmdppr-dmp)$_2$(dpm)= 0.75:0.25:0.06 to a thickness of 40 nm. Note that in the light-emitting layer 4140, 2mDBTBPDBq-II and PCBBiF are host materials and Ir(dmdppr-dmp)$_2$(dpm) is a guest material (a phosphorescent compound).

Next, as an electron-transport layer 4118(1), 2mDBTBPDBq-II was deposited over the light-emitting layer 4140 by evaporation to a thickness of 5 nm.

Next, as an electron-transport layer 4118(2), NBPhen was deposited over the electron-transport layer 4118(1) by evaporation to a thickness of 20 nm.

As the electron-injection layer 4130, Li$_2$O was deposited over the electron-transport layer 4118(2) by evaporation to a thickness of 0.2 nm.

Then, as the charge-generation layer 4135, DBT3P-II and molybdenum oxide (MoO$_3$) were deposited over the electron-injection layer 4130 by co-evaporation in a weight ratio of DBT3P-II:MoO$_3$=1:0.5 to a thickness of 15 nm.

Next, as an electrode 4102, aluminum (Al) was deposited over the charge-generation layer 4135 by evaporation to a thickness of 200 nm.

Then, heat treatment at 80° C. for one hour was performed in the air without sealing. Through the above steps, the comparative light-emitting element 31 was obtained.

«Fabrication of light-emitting elements 32 to 34 The light-emitting elements 32 to 34 were fabricated through the same steps as those for the comparative light-emitting element 31 except for the steps of forming the electron-transport layer 4118(2) and the electron-injection layer 4130.

<Fabrication of Light-Emitting Element 32>

As the electron-transport layer 4118(2) of the light-emitting element 32, NBPhen was deposited over the electron-transport layer 4118(1) by evaporation to a thickness of 15 nm.

As the electron-injection layer 4130, NBPhen and Ag were deposited over the electron-transport layer 4118(2) by co-evaporation in a weight ratio of NBPhen:Ag=1:0.19 to a thickness of 5 nm.

<Fabrication of Light-Emitting Element 33>

As the electron-transport layer 4118(2) of the light-emitting element 33, NBPhen was deposited over the electron-transport layer 4118(1) by evaporation to a thickness of 10 nm.

As the electron-injection layer 4130, NBPhen and Ag were deposited over the electron-transport layer 4118(2) by co-evaporation in a weight ratio of NBPhen:Ag=1:0.19 to a thickness of 5 nm. Subsequently, $Alq_3$ and Ag were deposited by co-evaporation in a weight ratio of $Alq_3$:Ag=1:0.24 to a thickness of 5 nm.

<Fabrication of Light-Emitting Element 34>

As the electron-transport layer 4118(2) of the light-emitting element 34, NBPhen was deposited over the electron-transport layer 4118(1) by evaporation to a thickness of 10 nm.

As the electron-injection layer 4130, NBPhen and Ag were deposited over the electron-transport layer 4118(2) by co-evaporation in a weight ratio of NBPhen:Ag=1:0.19 to a thickness of 5 nm. Subsequently, HATNA and Ag were deposited by co-evaporation in a weight ratio of HATNA:Ag=1:0.28 to a thickness of 5 nm.

«Fabrication of Comparative Light-Emitting Element 35»

The comparative light-emitting element 35 was fabricated through the same steps as those for the light-emitting element 32 except for the steps of forming the electron-transport layer 4118 and the charge-generation layer 4135.

As the electron-transport layer 4118, 2mDBTBPDBq-II was deposited over the light-emitting layer 4140 of the comparative light-emitting element 35 by evaporation to a thickness of 20 nm, and subsequently, NBPhen was deposited by evaporation to a thickness of 15 nm.

The charge-generation layer 4135 was not formed over the electron-injection layer 4130, and as the electrode 4102, aluminum (Al) was deposited by evaporation to a thickness of 200 nm.

«Fabrication of Comparative Light-Emitting Element 36»

The comparative light-emitting element 36 was fabricated through the same steps as those for the light-emitting element 32 except for the steps of forming the electron-transport layer 4118 and the charge-generation layer 4135.

As the electron-transport layer 4118, 2mDBTBPDBq-II was deposited over the light-emitting layer 4140 of the comparative light-emitting element 36 by evaporation to a thickness of 20 nm, and subsequently, NBPhen was deposited by evaporation to a thickness of 10 nm.

The charge-generation layer 4135 was not formed over the electron-injection layer 4130, and as the electrode 4102, aluminum (Al) was deposited by evaporation to a thickness of 200 nm.

«Fabrication of Comparative Light-Emitting Element 37»

The comparative light-emitting element 37 was fabricated through the same steps as those for the light-emitting element 32 except for the steps of forming the electron-transport layer 4118 and the charge-generation layer 4135.

As the electron-transport layer 4118, 2mDBTBPDBq-II was deposited over the light-emitting layer 4140 of the comparative light-emitting element 36 by evaporation to a thickness of 20 nm, and subsequently, NBPhen was deposited by evaporation to a thickness of 10 nm.

The charge-generation layer 4135 was not formed over the electron-injection layer 4130, and as the electrode 4102, aluminum (Al) was deposited by evaporation to a thickness of 200 nm.

<Characteristics of Light-Emitting Elements>

Next, the element characteristics of the fabricated comparative light-emitting element 31, light-emitting elements 32 to 34, and comparative light-emitting elements 35 to 37 were measured. Luminance and CIE chromaticity were measured with a luminance colorimeter (BM-5A manufactured by TOPCON TECHNOHOUSE CORPORATION), and electroluminescence spectra were measured with a multi-channel spectrometer (PMA-11 manufactured by Hamamatsu Photonics K.K.).

Figure 71:
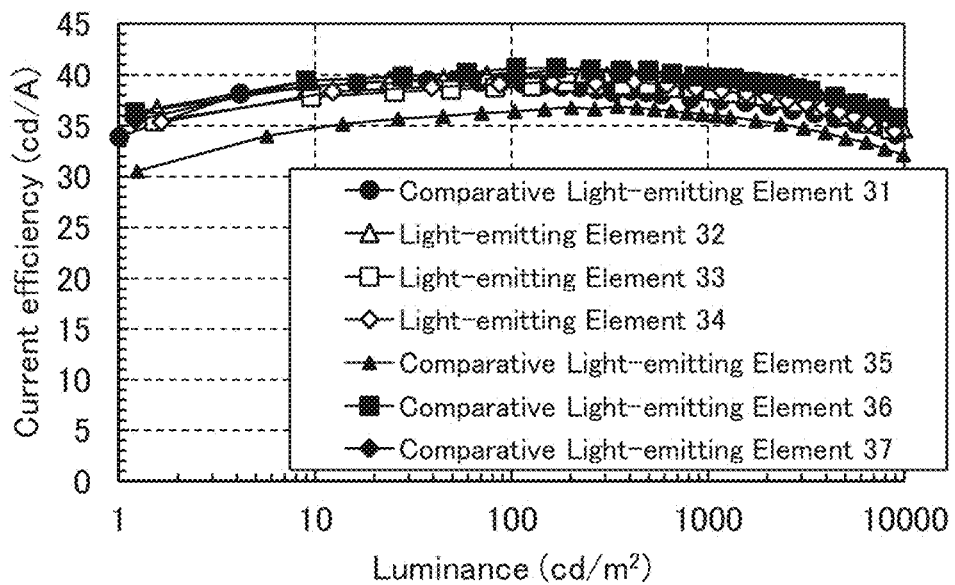
FIG. 71 shows current efficiency-luminance characteristics of light-emitting elements in Example.
Figure 72:
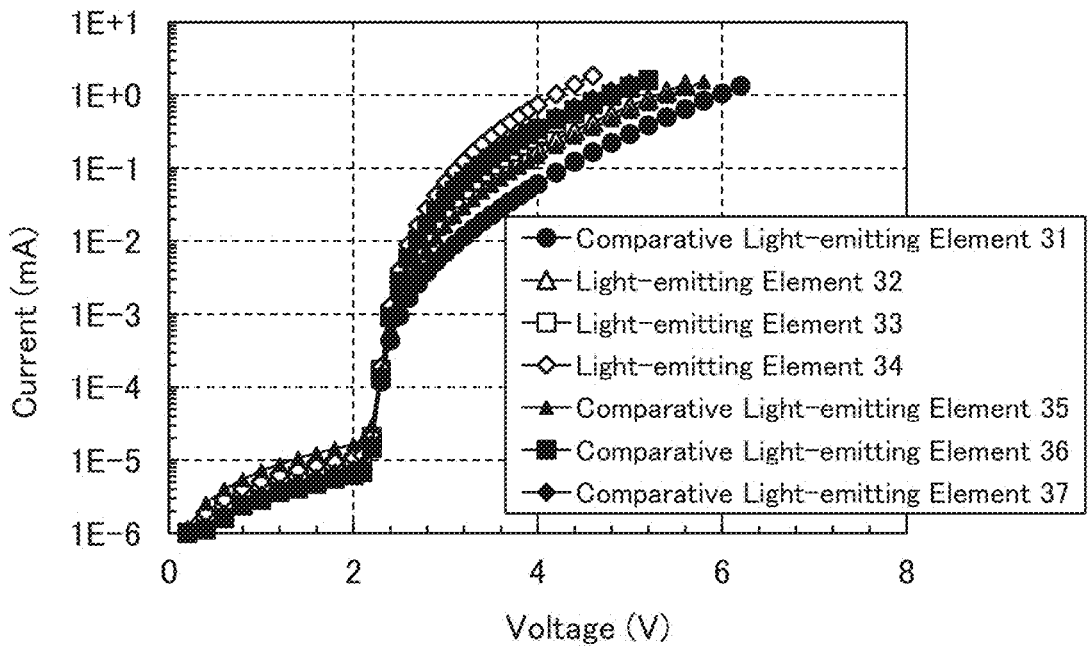
FIG. 72 shows current-voltage characteristics of light-emitting elements in Example.
Figure 73:
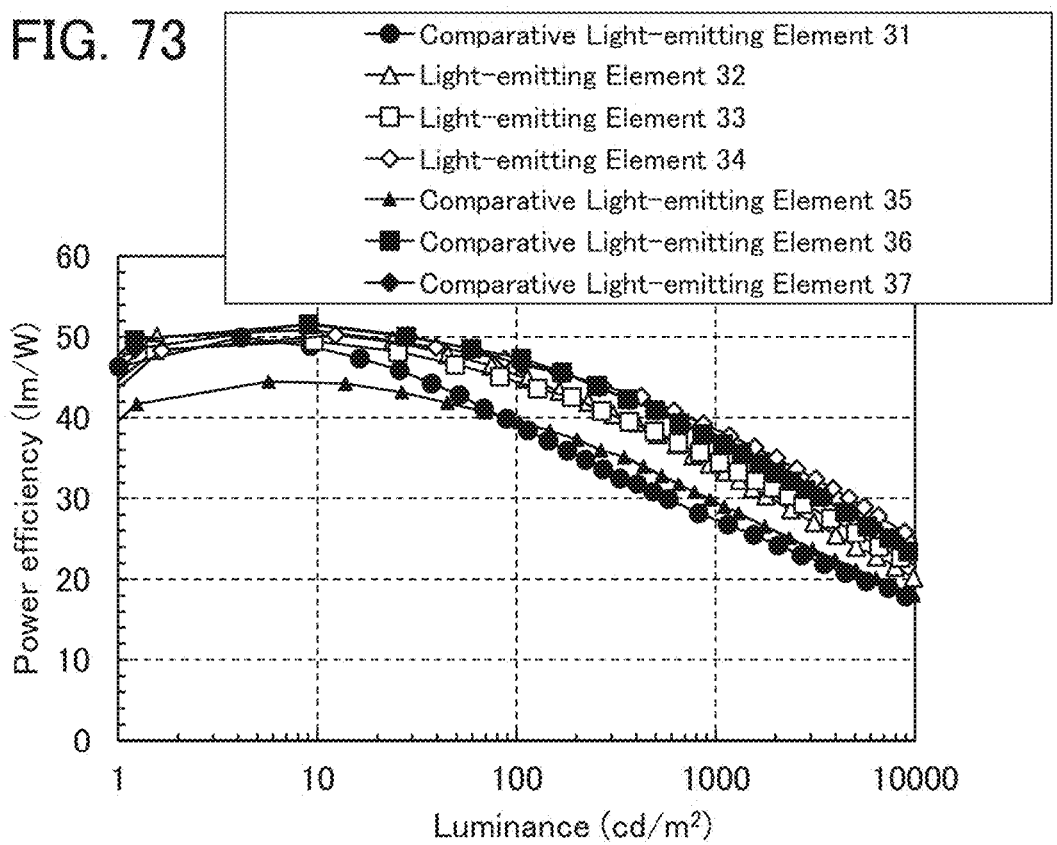
FIG. 73 shows power efficiency-luminance characteristics of light-emitting elements in Example.

FIG. 71 shows the current efficiency-luminance characteristics of the fabricated comparative light-emitting element 31, light-emitting elements 32 to 34, and comparative light-emitting elements 35 to 37; FIG. 72, the current-voltage characteristics thereof; FIG. 73, the power efficiency-luminance characteristics thereof; and FIG. 74, the external quantum efficiency-luminance characteristics thereof. Note that the measurements of the light-emitting elements were performed at room temperature (in an atmosphere maintained at 23° C.). FIG. 75 shows the electroluminescence spectra of the light-emitting elements through which current flows at a current density of 2.5 $mA/cm^2$.

Table 31 shows the element characteristics of the comparative light-emitting element 31, the light-emitting elements 32 to 34, and the comparative light-emitting elements 35 to 37 at around 1000 $cd/m^2$.

TABLE 31

|  | Voltage (V) | Current density ($mA/cm^2$) | CIE chromaticity (x, y) | Luminance ($cd/cm^2$) | Current efficiency (cd/A) | Power efficiency (lm/W) | External quantum efficiency (%) |
|---|---|---|---|---|---|---|---|
| Comparative light-emitting element 31 | 4.40 | 3.07 | (0.662, 0.338) | 1150 | 37.5 | 26.8 | 29.0 |
| Light-emitting element 32 | 3.60 | 2.37 | (0.663, 0.338) | 932 | 39.3 | 34.3 | 30.7 |
| Light-emitting element 33 | 3.50 | 2.72 | (0.662, 0.338) | 1040 | 38.4 | 34.5 | 30.0 |
| Light-emitting element 34 | 3.10 | 2.24 | (0.663, 0.337) | 868 | 38.7 | 39.2 | 30.2 |

TABLE 31-continued

|  | Voltage (V) | Current density (mA/cm$^2$) | CIE chromaticity (x, y) | Luminance (cd/cm$^2$) | Current efficiency (cd/A) | Power efficiency (lm/W) | External quantum efficiency (%) |
|---|---|---|---|---|---|---|---|
| Comparative light-emitting element 35 | 3.30 | 2.28 | (0.663, 0.337) | 924 | 40.5 | 38.6 | 31.3 |
| Comparative light-emitting element 36 | 3.40 | 2.73 | (0.663, 0.337) | 1080 | 39.8 | 36.7 | 30.6 |
| Comparative light-emitting element 37 | 3.30 | 2.23 | (0.663, 0.337) | 888 | 39.9 | 37.9 | 30.8 |

Figure 74:
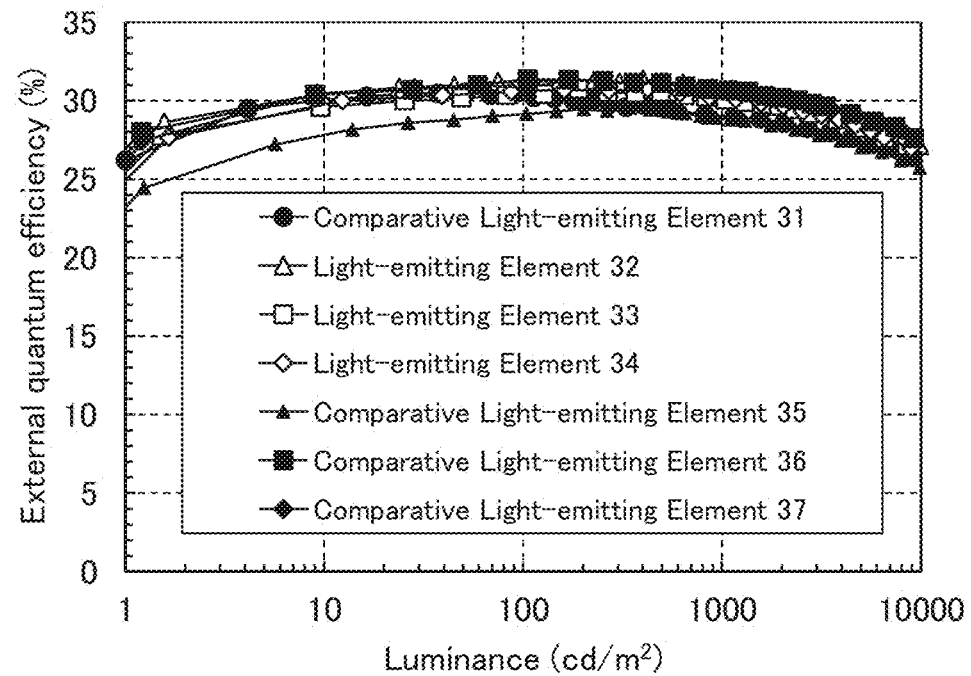
FIG. 74 shows external quantum efficiency-luminance characteristics of light-emitting elements in Example.
Figure 75:
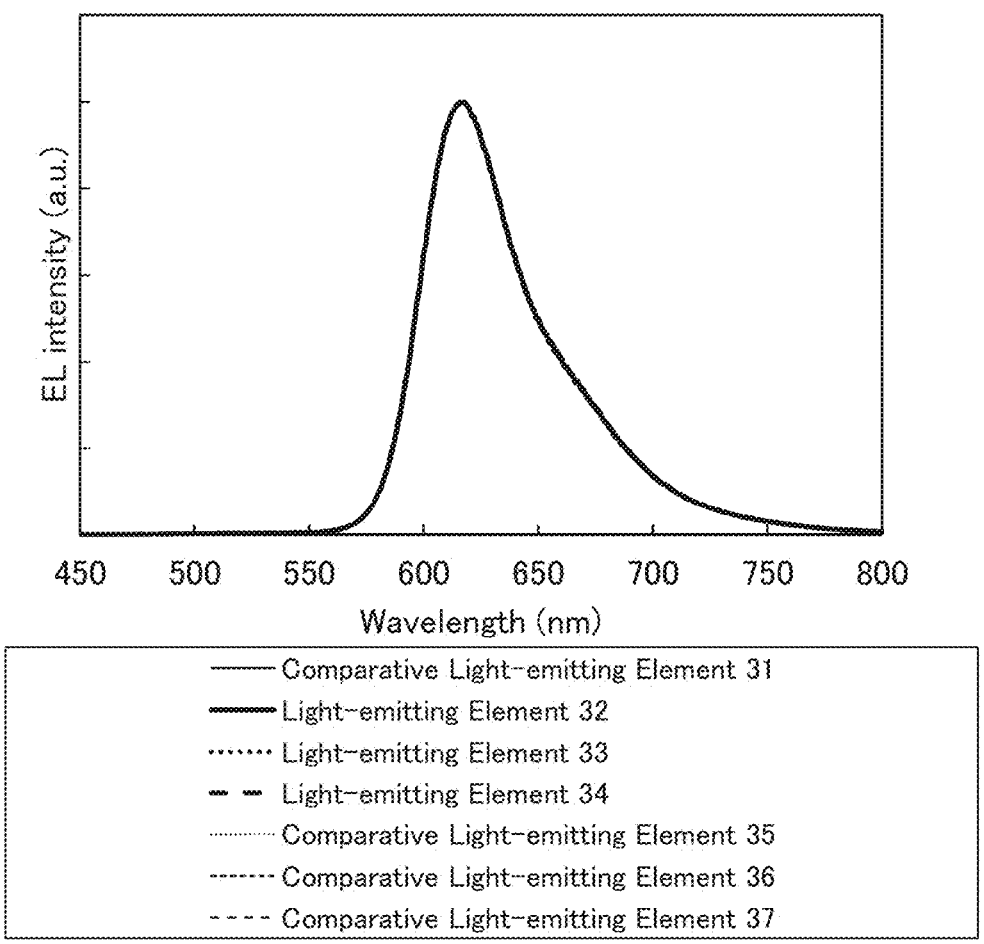
FIG. 75 shows electroluminescence spectra of light-emitting elements in Example.

As shown in FIG. 74 and Table 31, the comparative light-emitting element 31, the light-emitting elements 32 to 34, and the comparative light-emitting elements 35 to 37 each exhibited high emission efficiency with an external quantum efficiency exceeding 25%. The comparative light-emitting element 31, the light-emitting elements 32 to 34, and the comparative light-emitting elements 35 to 37 also exhibited high current efficiency and power efficiency as shown in FIGS. 71 and 73. The light-emitting elements 32 to 34 according to one embodiment of the present invention exhibited high efficiency equivalent to that of the comparative light-emitting element 31, which uses Li$_2$O typically used for the electron-injection layer. In addition, the light-emitting elements 32 to 34 exhibited high efficiency equivalent to that of the comparative light-emitting elements 35 to 37 in which the charge-generation layer 4135 is not provided.

As shown in FIG. 72, the comparative light-emitting element 31, the light-emitting elements 32 to 34, and the comparative light-emitting elements 35 to 37 exhibited favorable current-voltage characteristics. In particular, the light-emitting elements 32 to 34 exhibited current-voltage characteristics superior to those of the comparative light-emitting element 31. This indicates that in the case where the electron-injection layer is in contact with the charge-generation layer, the composite material of a transition metal and an organic compound having an unshared electron pair has electron-injection properties superior to those of the Li compound which is typically used for the electron-injection layer. In addition, the light-emitting elements 32 to 34, each of which includes the charge-generation layer, exhibited favorable current-voltage characteristics equivalent to those of the comparative light-emitting elements 35 to 37, each of which does not include the charge-generation layer.

As shown in FIG. 75, the comparative light-emitting element 31, the light-emitting elements 32 to 34, and the comparative light-emitting elements 35 to 37 each exhibited red emission whose electroluminescence spectrum has a peak wavelength at approximately 616 nm and a full width at half maximum of approximately 58 nm. The obtained electroluminescence spectrum reveals that the light is emitted from the guest material, Ir(dmdppr-dmp)$_2$(dmp).

<Reliability Test of Light-Emitting Elements>

A preservation test under constant temperature and humidity was performed on the light-emitting elements 32 to 34 and the comparative light-emitting elements 35 to 37. Since each of the light-emitting elements is not sealed, the cathode and the EL layer are exposed to the atmosphere of the test environment. In general, moisture entering the light-emitting element causes dark spots (non-emission regions in a light-emitting portion) or shrinkage (non-emission regions at the end of the light-emitting portion), thereby adversely affecting the reliability of the light-emitting element. Thus, the preservation test under constant temperature and humidity allows evaluating of the reliability of the light-emitting element against moisture.

Here, Table 32 shows an element structure of a comparative light-emitting element A that was used in the preservation test under constant temperature and humidity. Note that a fabrication method of the comparative light-emitting element A is not described because it is similar to that shown in Example 1. The comparative light-emitting element A as well as the light-emitting elements 32 to 34 is not sealed.

TABLE 32

|  | Layer | Reference numeral | Thickness (nm) | Material | Weight ratio |
|---|---|---|---|---|---|
| Comparative light-emitting element A | Electrode | 4102 | 200 | Al | — |
|  | Electron-injection layer | 4130 | 0.2 | Li$_2$O | — |
|  | Electron-transport layer | 4118(2) | 20 | NBPhen | — |
|  |  | 4118(1) | 20 | 2mDBTBPDBq-II | — |
|  | Light-emitting layer | 4140 | 40 | 2mDBTBPDBq-II:PCBBiF: Ir(dmdppr-dmp)$_2$(dpm) | 0.75:0.25:0.06 |
|  | Hole-transport layer | 4112 | 20 | BPAFLP | — |
|  | Hole-injection layer | 4111 | 65 | DBT3P-II:MoO$_3$ | 1:0.5 |
|  | Electrode | 4101 | 70 | ITSO | — |

In a thermostatic bath kept at a temperature of 65° C. and a humidity of 95%, the comparative light-emitting element A, the light-emitting elements 32 to 34, and the comparative light-emitting elements 35 to 37 were placed for 48 hours; then, the emission state of each light-emitting element was measured.

The emission state was evaluated by calculating the proportion of the emission area before and after the preservation test under constant temperature and humidity. The preservation test under constant temperature and humidity was performed on six samples of each of the comparative light-emitting element A, the light-emitting elements 32 to 34, and the comparative light-emitting elements 35 to 37. Table 33 shows the average emission area of the top three samples having a high proportion of emission area.

TABLE 33

| | Proportion of emission area |
|---|---|
| Comparative light-emitting element A | 0% |
| Light-emitting element 32 | 84% |
| Light-emitting element 33 | 79% |
| Light-emitting element 34 | 87% |
| Comparative light-emitting element 35 | 78% |
| Comparative light-emitting element 36 | 86% |
| Comparative light-emitting element 37 | 86% |

In Table 33, the proportion of emission area (%) is the emission area after the preservation test under constant temperature and humidity/the emission area before the preservation test under constant temperature and humidity×100. Table 33 reveals that the light-emitting elements 32 to 34 according to one embodiment of the present invention each maintain an emission area proportion greater than or equal to 79% after the preservation test under constant temperature and humidity, i.e., have favorable moisture resistance. The moisture resistance of each of the light-emitting elements 32 to 34 according to one embodiment of the present invention is improved more than that of the comparative light-emitting element A, which uses $Li_2O$, a Li compound, for the electron-injection layer 4130. In addition, the comparative light-emitting elements 35 to 37, each of which does not include the charge-generation layer 4135, exhibited the moisture resistance equivalent to that of the light-emitting elements according to one embodiment of the present invention. Moisture does not easily penetrate the light-emitting elements according to one embodiment of the present invention, which use a transition metal prone to react with water. Hence, highly moisture resistant light-emitting elements can be achieved. Unlike typical light-emitting elements, the light-emitting elements 32 to 34 are not sealed; hence, the moisture resistance of the light-emitting elements 32 to 34 is expected to further increase with sealing.

Example 12

Described in this example are examples of fabricating light-emitting elements 43 to 46 according to one embodiment of the present invention and comparative light-emitting elements 38 to 42. In the light-emitting elements in this example, an organic compound including a triazine ring and/or a pyrimidine ring is used as the organic compound having an unshared electron pair. A schematic cross-sectional view of the light-emitting elements fabricated in this example is shown in FIG. 70. Details of the element structures are shown in Tables 34 to 36. The structures and abbreviations of compounds used in this example are shown below. Note that the above embodiments and examples can be referred to for the structures and abbreviations of the other compounds.

[Chemical Formula 7]

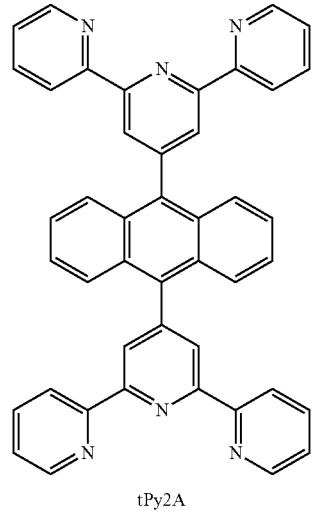

tPy2A

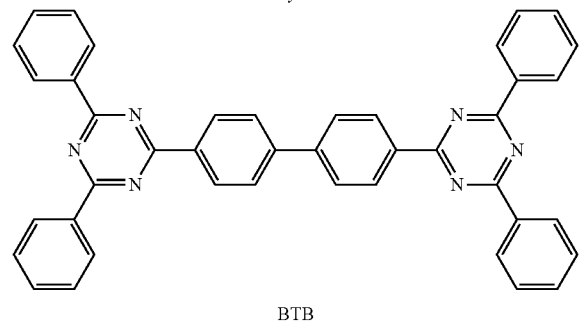

BTB

TABLE 34

| | Layer | Reference numeral | Thickness (nm) | Material | Weight ratio |
|---|---|---|---|---|---|
| Comparative light-emitting element 38 | Electrode | 4102 | 200 | Al | — |
| | Charge-generation layer | 4135 | 15 | DBT3P-II:MoO$_3$ | 1:0.5 |
| | Electron-injection layer | 4130 | 0.2 | Li$_2$O | — |
| | Electron-transport layer | 4118(2) | 20 | NBPhen | — |
| | | 4118(1) | 5 | 2mDBTBPDBq-II | — |
| | Light-emitting layer | 4140 | 40 | 2mDBTBPDBq-II:PCBBiF: Ir(dmdppr-dmp)$_2$(dpm) | 0.75:0.25:0.06 |
| | Hole-transport layer | 4112 | 20 | BPAFLP | — |
| | Hole-injection layer | 4111 | 65 | DBT3P-II:MoO$_3$ | 1:0.5 |
| | Electrode | 4101 | 70 | ITSO | — |
| Comparative light-emitting element 39 | Electrode | 4102 | 200 | Al | — |
| | Electron-injection layer | 4130(1) | 5 | 2Py3Tz:Ag | 1:0.35 |
| | | 4130(1) | 5 | NBPhen:Ag | 1:0.19 |
| | Electron-transport layer | 4118(2) | 10 | NBPhen | — |
| | | 4118(1) | 20 | 2mDBTBPDBq-II | — |
| | Light-emitting layer | 4140 | 40 | 2mDBTBPDBq-II:PCBBiF: Ir(dmdppr-dmp)$_2$(dpm) | 0.75:0.25:0.06 |
| | Hole-transport layer | 4112 | 20 | BPAFLP | — |
| | Hole-injection layer | 4111 | 65 | DBT3P-II:MoO$_3$ | 1:0.5 |
| | Electrode | 4101 | 70 | ITSO | — |

TABLE 34-continued

| Layer | | Reference numeral | Thickness (nm) | Material | Weight ratio |
|---|---|---|---|---|---|
| Comparative light-emitting element 40 | Electrode | 4102 | 200 | Al | — |
| | Electron-injection layer | 4135 | 5 | TmPPPyTz:Ag | 1:0.15 |
| | Electron-transport layer | 4118(2) | 15 | NBPhen | — |
| | | 4118(1) | 20 | 2mDBTBPDBq-II | — |
| | Light-emitting layer | 4140 | 40 | 2mDBTBPDBq-II:PCBBiF:Ir(dmdppr-dmp)$_2$(dpm) | 0.75:0.25:0.06 |
| | Hole-transport layer | 4112 | 20 | BPAFLP | — |
| | Hole-injection layer | 4111 | 65 | DBT3P-II:MoO$_3$ | 1:0.5 |
| | Electrode | 4101 | 70 | ITSO | — |

TABLE 35

| Layer | | Reference numeral | Thickness (nm) | Material | Weight ratio |
|---|---|---|---|---|---|
| Comparative light-emitting element 41 | Electrode | 4102 | 200 | Al | — |
| | Electron-injection layer | 4130(2) | 5 | tPy2A:Ag | 1:0.30 |
| | | 4130(1) | 5 | NBPhen:Ag | 1:0.19 |
| | Electron-transport layer | 4118(2) | 10 | NBPhen | — |
| | | 4118(1) | 20 | 2mDBTBPDBq-II | — |
| | Light-emitting layer | 4140 | 40 | 2mDBTBPDBq-II:PCBBiF:Ir(dmdppr-dmp)$_2$(dpm) | 0.75:0.25:0.06 |
| | Hole-transport layer | 4112 | 20 | BPAFLP | — |
| | Hole-injection layer | 4111 | 65 | DBT3P-II:MoO$_3$ | 1:0.5 |
| | Electrode | 4101 | 70 | ITSO | — |
| Comparative light-emitting element 42 | Electrode | 4102 | 200 | Al | — |
| | Electron-injection layer | 4130(2) | 5 | BTB:Ag | 1:0.18 |
| | | 4130(1) | 5 | NBPhen:Ag | 1:0.19 |
| | Electron-transport layer | 4118(2) | 10 | NBPhen | — |
| | | 4118(1) | 20 | 2mDBTBPDBq-II | — |
| | Light-emitting layer | 4140 | 40 | 2mDBTBPDBq-II:PCBBiF:Ir(dmdppr-dmp)$_2$(dpm) | 0.75:0.25:0.06 |
| | Hole-transport layer | 4112 | 20 | BPAFLP | — |
| | Hole-injection layer | 4111 | 65 | DBT3P-II:MoO$_3$ | 1:0.5 |
| | Electrode | 4101 | 70 | ITSO | — |
| Light-emitting element 43 | Electrode | 4102 | 200 | Al | — |
| | Charge-generation layer | 4135 | 15 | DBT3P-II:MoO$_3$ | 1:0.5 |
| | Electron-injection layer | 4130(2) | 5 | 2Py3Tz:Ag | 1:0.35 |
| | | 4130(1) | 5 | NBPhen:Ag | 1:0.19 |
| | Electron-transport layer | 4118(2) | 10 | NBPhen | — |
| | | 4118(1) | 5 | 2mDBTBPDBq-II | — |
| | Light-emitting layer | 4140 | 40 | 2mDBTBPDBq-II:PCBBiF:Ir(dmdppr-dmp)$_2$(dpm) | 0.75:0.25:0.06 |
| | Hole-transport layer | 4112 | 20 | BPAFLP | — |
| | Hole-injection layer | 4111 | 65 | DBT3P-II:MoO$_3$ | 1:0.5 |
| | Electrode | 4101 | 70 | ITSO | — |

TABLE 36

| Layer | | Reference numeral | Thickness (nm) | Material | Weight ratio |
|---|---|---|---|---|---|
| Light-emitting element 44 | Electrode | 4102 | 200 | Al | — |
| | Charge-generation layer | 4135 | 15 | DBT3P-II:MoO$_3$ | 1:0.5 |
| | Electron-injection layer | 4130 | 5 | TmPPPyTz:Ag | 1:0.15 |
| | Electron-transport layer | 4118(2) | 15 | NBPhen | — |
| | | 4118(1) | 5 | 2mDBTBPDBq-II | — |
| | Light-emitting layer | 4140 | 40 | 2mDBTBPDBq-II:PCBBiF:Ir(dmdppr-dmp)$_2$(dpm) | 0.75:0.25:0.06 |
| | Hole-transport layer | 4112 | 20 | BPAFLP | — |
| | Hole-injection layer | 4111 | 65 | DBT3P-II:MoO$_3$ | 1:0.5 |
| | Electrode | 4101 | 70 | ITSO | — |
| Light-emitting element 45 | Electrode | 4102 | 200 | Al | — |
| | Charge-generation layer | 4135 | 15 | DBT3P-II:MoO$_3$ | 1:0.5 |
| | Electron-injection layer | 4130(2) | 5 | tPy2A:Ag | 1:0.3 |
| | | 4130(1) | 5 | NBPhen:Ag | 1:0.3 |
| | Electron-transport layer | 4118(2) | 10 | NBPhen | — |
| | | 4118(1) | 5 | 2mDBTBPDBq-II | — |

TABLE 36-continued

| | Layer | Reference numeral | Thickness (nm) | Material | Weight ratio |
|---|---|---|---|---|---|
| | Light-emitting layer | 4140 | 40 | 2mDBTBPDBq-II:PCBBiF: Ir(dmdppr-dmp)$_2$(dpm) | 0.75:0.25:0.06 |
| | Hole-transport layer | 4112 | 20 | BPAFLP | — |
| | Hole-injection layer | 4111 | 65 | DBT3P-II:MoO$_3$ | 1:0.5 |
| | Electrode | 4101 | 70 | ITSO | — |
| Light-emitting element 46 | Electrode | 4102 | 200 | Al | — |
| | Charge-generation layer | 4135 | 15 | DBT3P-II:MoO$_3$ | 1:0.5 |
| | Electron-injection layer | 4130(2) | 5 | BTB:Ag | 1:0.18 |
| | | 4130(1) | 5 | NBPhen:Ag | 1:0.19 |
| | Electron-transport layer | 4118(2) | 10 | NBPhen | — |
| | | 4118(1) | 5 | 2mDBTBPDBq-II | — |
| | Light-emitting layer | 4140 | 40 | 2mDBTBPDBq-II:PCBBiF: Ir(dmdppr-dmp)$_2$(dpm) | 0.75:0.25:0.06 |
| | Hole-transport layer | 4112 | 20 | BPAFLP | — |
| | Hole-injection layer | 4111 | 65 | DBT3P-II:MoO$_3$ | 1:0.5 |
| | Electrode | 4101 | 70 | ITSO | — |

The LUMO levels of the organic compounds that were used in the electron-injection layer 4130 of the light-emitting elements 43 to 46 and the comparative light-emitting elements 39 to 42, were calculated by cyclic voltammetry (CV) measurement. The measurement was performed in a manner similar to that in Example 1. The results are shown in Table 37.

TABLE 37

| | LUMO (eV) |
|---|---|
| 2Py3Tzn | −3.15 |
| TmPPPyTz | −3.00 |
| tPy2A | −2.91 |
| BTB | −3.01 |

<Fabrication of Light-Emitting Elements>

Fabrication methods of the light-emitting elements in this example will be described below.

«Fabrication of Comparative Light-Emitting Element 38»

The comparative light-emitting element 38 was fabricated through the same steps as those for the comparative light-emitting element 31 except for the steps of forming the electrode 4101 and the hole-injection layer 4111.

As the electrode 4101, an ITSO film was formed to a thickness of 70 nm over the substrate 4210. Note that the electrode area of the electrode 4101 was set to 4 mm$^2$ (2 mm×2 mm).

Then, as the hole-injection layer 4111, DBT3P-II and MoO$_3$ were deposited over the electrode 4101 by co-evaporation in a weight ratio of DBT3P-II:MoO$_3$=1:0.5 to a thickness of 65 nm.

«Fabrication of Light-Emitting Elements 43 to 46»

The light-emitting elements 43 to 46 were fabricated through the same steps as those for the comparative light-emitting element 38 except for the steps of forming the electron-transport layer 4118(2) and the electron-injection layer 4130.

<Fabrication of Light-Emitting Element 43>

As the electron-transport layer 4118(2) of the light-emitting element 43, NBPhen was deposited over the electron-transport layer 4118(1) by evaporation to a thickness of 10 nm.

As the electron-injection layer 4130, NBPhen and Ag were deposited over the electron-transport layer 4118(2) by co-evaporation in a weight ratio of NBPhen:Ag=1:0.19 to a thickness of 5 nm. Subsequently, 2Py3Tzn and Ag were deposited by co-evaporation in a weight ratio of 2Py3Tzn:Ag=1:0.35 to a thickness of 5 nm.

<Fabrication of Light-Emitting Element 44>

As the electron-transport layer 4118(2) of the light-emitting element 44, NBPhen was deposited over the electron-transport layer 4118(1) by evaporation to a thickness of 15 nm.

As the electron-injection layer 4130, TmPPPyTz and Ag were deposited over the electron-transport layer 4118(2) by co-evaporation in a weight ratio of TmPPPyTz:Ag=1:0.24 to a thickness of 5 nm.

<Fabrication of Light-Emitting Element 45>

As the electron-transport layer 4118(2) of the light-emitting element 45, NBPhen was deposited over the electron-transport layer 4118(1) by evaporation to a thickness of 10 nm.

As the electron-injection layer 4130, NBPhen and Ag were deposited over the electron-transport layer 4118(2) by co-evaporation in a weight ratio of NBPhen:Ag=1:0.3 to a thickness of 5 nm. Subsequently, tPy2A and Ag were deposited by co-evaporation in a weight ratio of tPy2A:Ag=1:0.30 to a thickness of 5 nm.

<Fabrication of Light-Emitting Element 46>

As the electron-transport layer 4118(2) of the light-emitting element 46, NBPhen was deposited over the electron-transport layer 4118(1) by evaporation to a thickness of 10 nm.

As the electron-injection layer 4130, NBPhen and Ag were deposited over the electron-transport layer 4118(2) by co-evaporation in a weight ratio of NBPhen:Ag=1:0.19 to a thickness of 5 nm. Subsequently, BTB and Ag were deposited by co-evaporation in a weight ratio of BTB:Ag=1:0.18 to a thickness of 5 nm.

«Fabrication of Comparative Light-Emitting Element 39»

The comparative light-emitting element 39 was fabricated through the same steps as those for the light-emitting element 43 except for the steps of forming the electron-transport layer 4118 and the charge-generation layer 4135.

As the electron-transport layer 4118, 2mDBTBPDBq-II was deposited over the light-emitting layer 4140 of the comparative light-emitting element 39 by evaporation to a thickness of 20 nm, and subsequently, NBPhen was deposited by evaporation to a thickness of 10 nm.

The charge-generation layer 4135 was not formed over the electron-injection layer 4130, and as the electrode 4102, aluminum (Al) was deposited by evaporation to a thickness of 200 nm.

«Fabrication of Comparative Light-Emitting Element 40»

The comparative light-emitting element 40 was fabricated through the same steps as those for the light-emitting element 44 except for the steps of forming the electron-transport layer 4118 and the charge-generation layer 4135.

As the electron-transport layer 4118, 2mDBTBPDBq-II was deposited over the light-emitting layer 4140 of the comparative light-emitting element 40 by evaporation to a thickness of 15 nm, and subsequently, NBPhen was deposited by evaporation to a thickness of 15 nm.

The charge-generation layer 4135 was not formed over the electron-injection layer 4130, and as the electrode 4102, aluminum (Al) was deposited by evaporation to a thickness of 200 nm.

«Fabrication of Comparative Light-Emitting Element 41»

The comparative light-emitting element 41 was fabricated through the same steps as those for the light-emitting element 45 except for the steps of forming the electron-transport layer 4118 and the charge-generation layer 4135.

As the electron-transport layer 4118, 2mDBTBPDBq-II was deposited over the light-emitting layer 4140 of the comparative light-emitting element 41 by evaporation to a thickness of 20 nm, and subsequently, NBPhen was deposited by evaporation to a thickness of 10 nm.

The charge-generation layer 4135 was not formed over the electron-injection layer 4130, and as the electrode 4102, aluminum (Al) was deposited by evaporation to a thickness of 200 nm.

«Fabrication of Comparative Light-Emitting Element 42»

The comparative light-emitting element 42 was fabricated through the same steps as those for the light-emitting element 46 except for the steps of forming the electron-transport layer 4118 and the charge-generation layer 4135.

As the electron-transport layer 4118, 2mDBTBPDBq-II was deposited over the light-emitting layer 4140 of the comparative light-emitting element 42 by evaporation to a thickness of 20 nm, and subsequently, NBPhen was deposited by evaporation to a thickness of 10 nm.

The charge-generation layer 4135 was not formed over the electron-injection layer 4130, and as the electrode 4102, aluminum (Al) was deposited by evaporation to a thickness of 200 nm.

<Characteristics of Light-Emitting Elements>

Next, the element characteristics of the fabricated comparative light-emitting elements 38 to 42 and light-emitting elements 43 to 46 were measured. The measurement was performed in a manner similar to that in Example 1.

Figure 76:
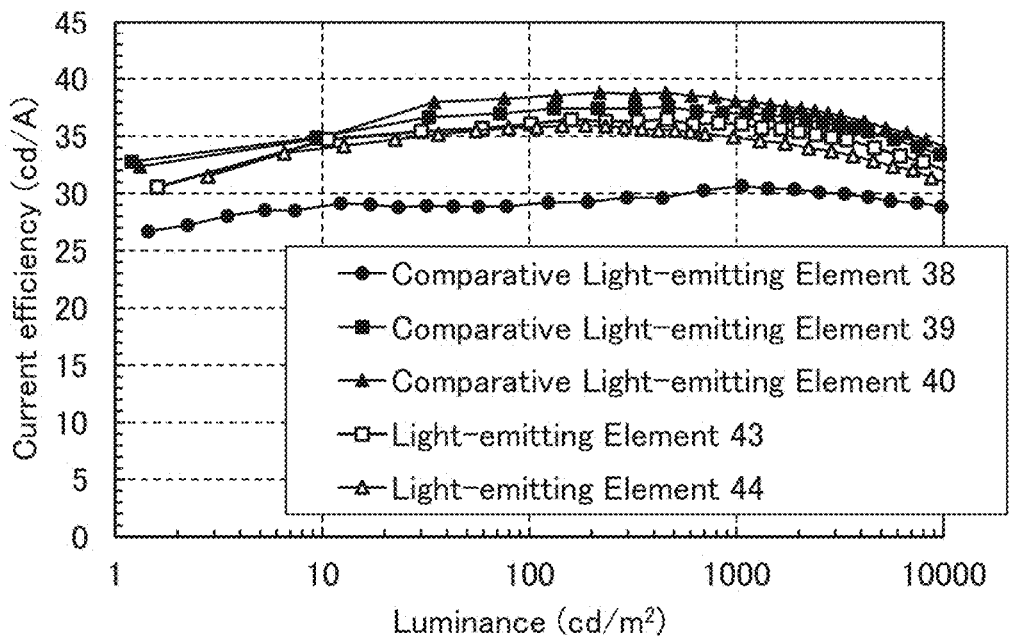
FIG. 76 shows current efficiency-luminance characteristics of light-emitting elements in Example.
Figure 77:
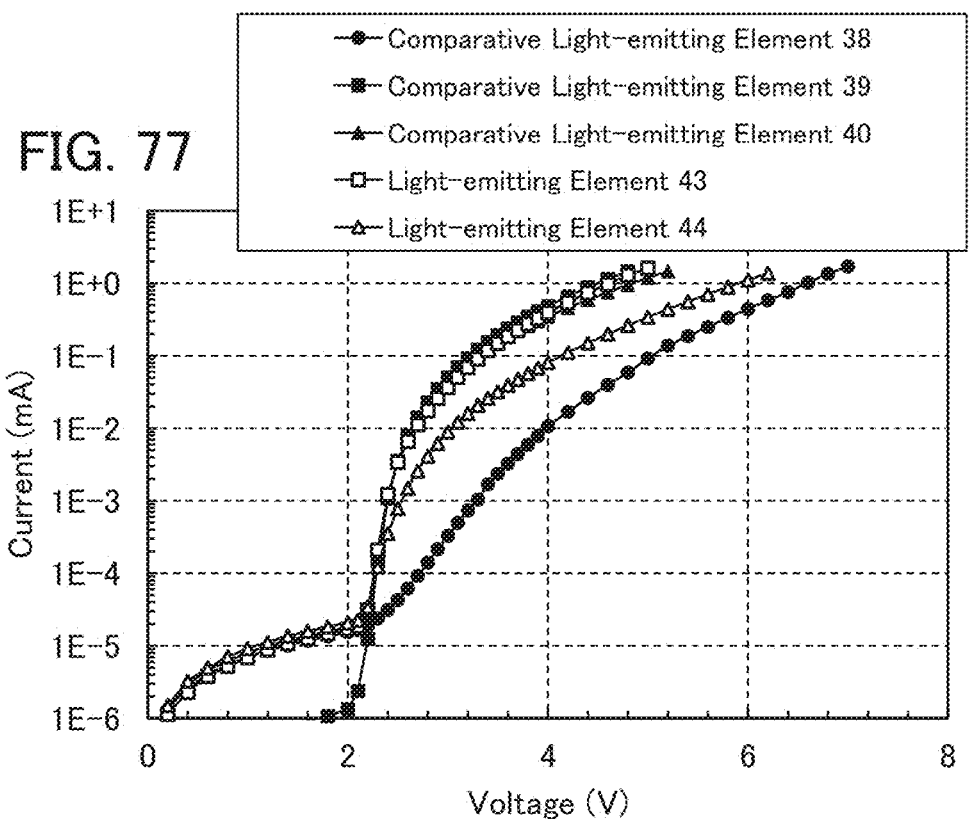
FIG. 77 shows current-voltage characteristics of light-emitting elements in Example.
Figure 79:
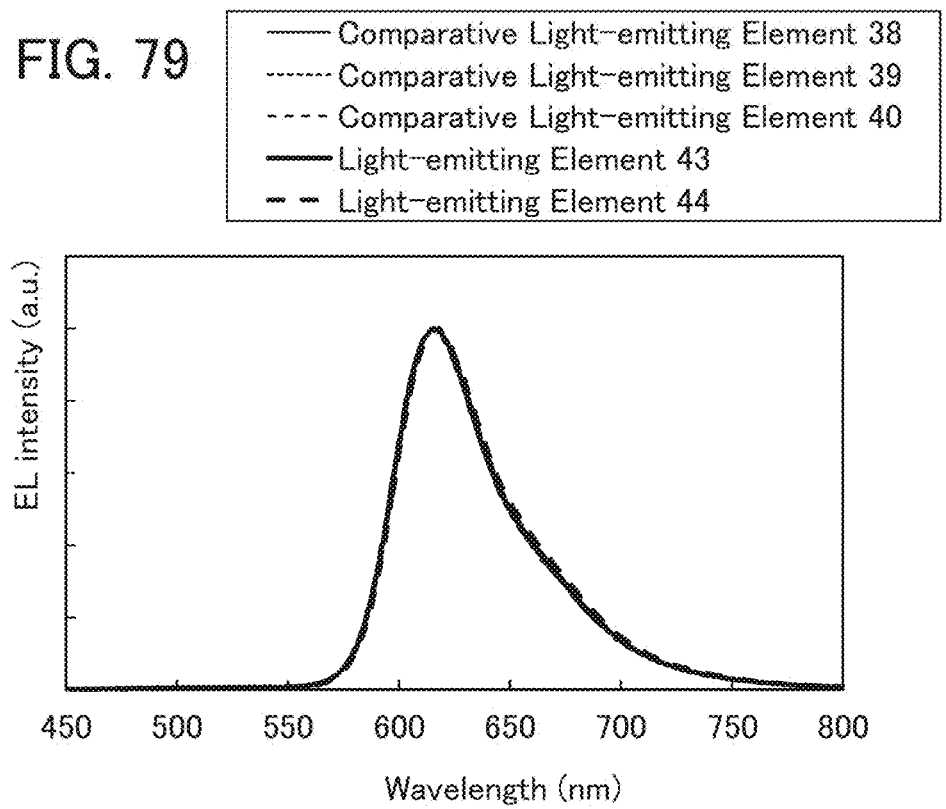
FIG. 79 shows electroluminescence spectra of light-emitting elements in Example.
Figure 80:
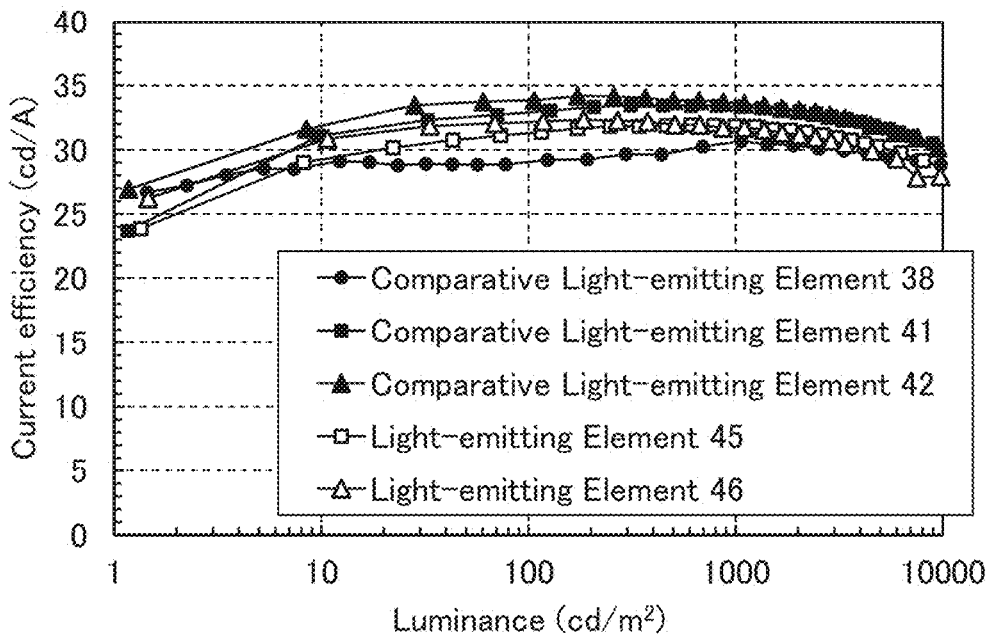
FIG. 80 shows current efficiency-luminance characteristics of light-emitting elements in Example.
Figure 81:
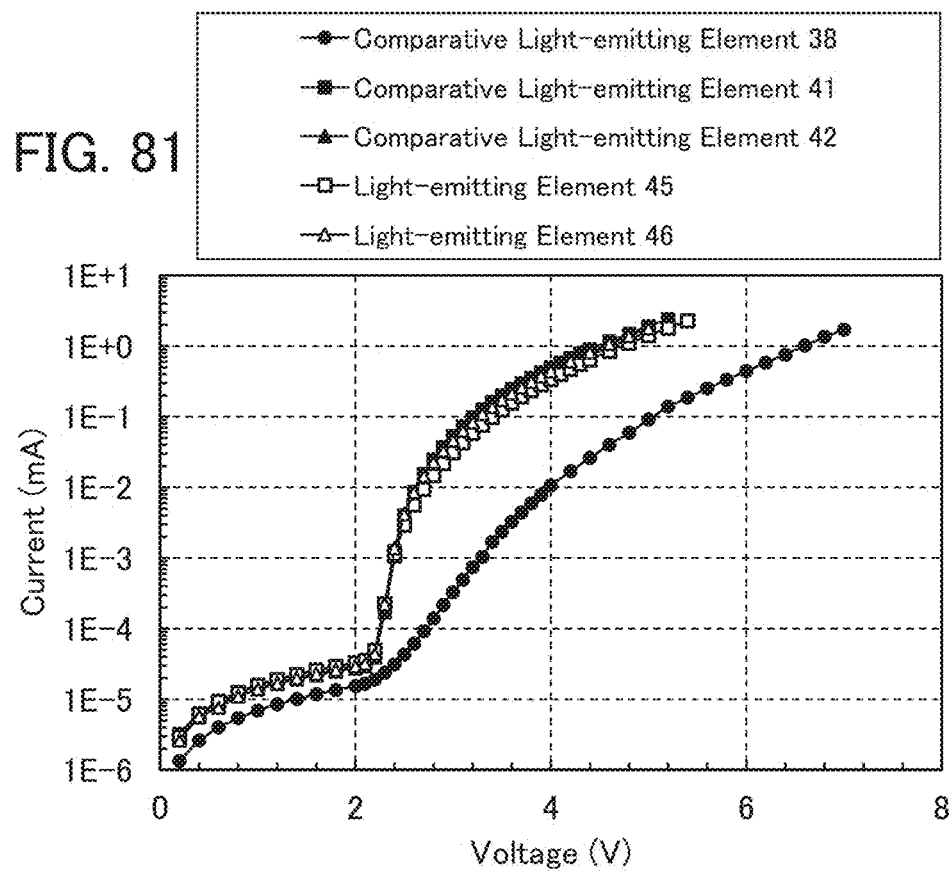
FIG. 81 shows current-voltage characteristics of light-emitting elements in Example.
Figure 82:
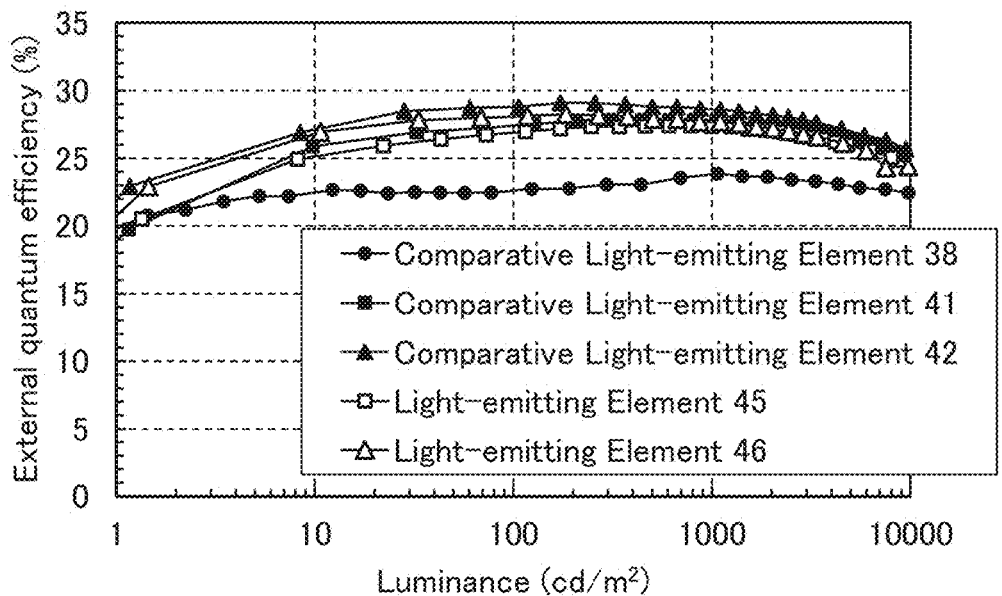
FIG. 82 shows external quantum efficiency-luminance characteristics of light-emitting elements in Example.
Figure 83:
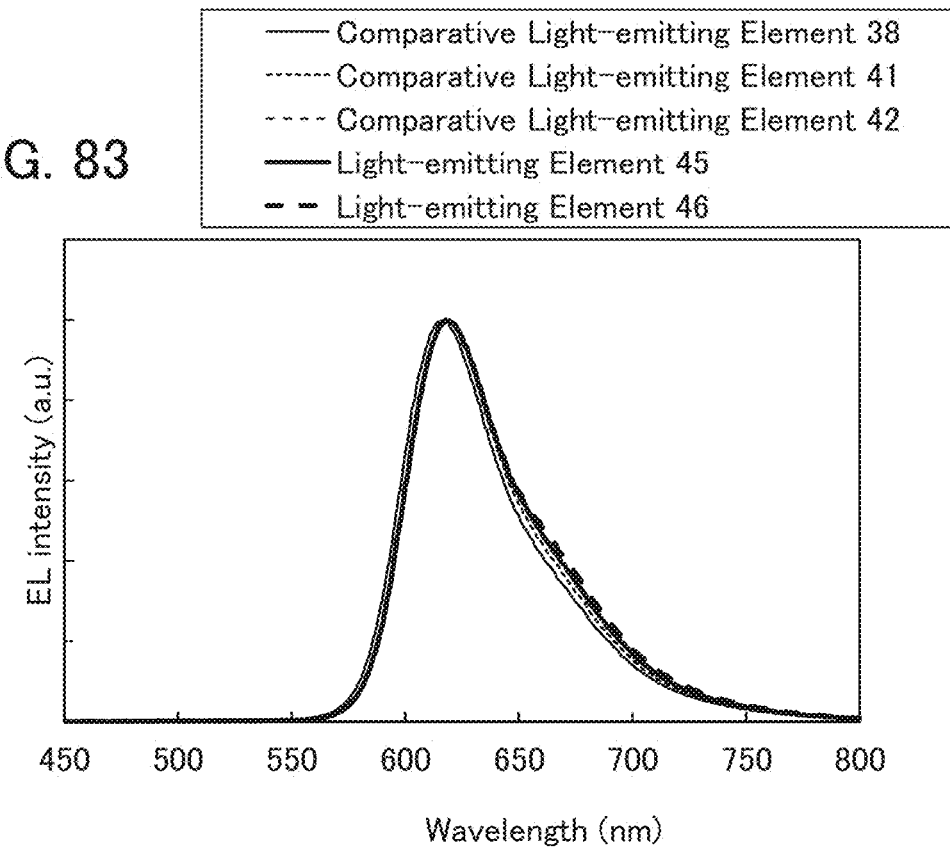
FIG. 83 shows electroluminescence spectra of light-emitting elements in Example.

FIG. 76 shows the current efficiency-luminance characteristics of the fabricated comparative light-emitting elements 38 to 40 and light-emitting elements 43 and 44; FIG. 77, the current-voltage characteristics thereof; and FIG. 78, the external quantum efficiency-luminance characteristics thereof. FIG. 79 shows the electroluminescence spectra of the light-emitting elements through which current flows at a current density of 2.5 mA/cm$^2$. FIG. 80 shows the current efficiency-luminance characteristics of the fabricated comparative light-emitting elements 38, 41, and 42 and light-emitting elements 45 and 46; FIG. 81, the current-voltage characteristics thereof; and FIG. 82, the external quantum efficiency-luminance characteristics thereof. FIG. 83 shows the electroluminescence spectra of the light-emitting elements through which current flows at a current density of 2.5 mA/cm$^2$.

Table 38 shows the element characteristics of the comparative light-emitting elements 38 to 42 and the light-emitting elements 43 to 46 at around 1000 cd/m$^2$.

TABLE 38

|  | Voltage (V) | Current density (mA/cm$^2$) | CIE chromaticity (x, y) | Luminance (cd/cm$^2$) | Current efficiency (cd/A) | Power efficiency (lm/W) | External quantum efficiency (%) |
| --- | --- | --- | --- | --- | --- | --- | --- |
| Comparative light-emitting element 38 | 5.20 | 3.47 | (0.662, 0.338) | 1060 | 30.7 | 18.5 | 23.9 |
| Comparative light-emitting element 39 | 3.30 | 3.04 | (0.663, 0.337) | 1120 | 37.0 | 35.2 | 29.0 |
| Comparative light-emitting element 40 | 3.30 | 2.60 | (0.663, 0.337) | 988 | 38.0 | 36.2 | 30.0 |
| Comparative light-emitting element 41 | 3.30 | 3.16 | (0.669, 0.331) | 1050 | 33.3 | 31.7 | 27.8 |
| Comparative light-emitting element 42 | 3.40 | 3.28 | (0.672, 0.328) | 1100 | 33.6 | 31.0 | 28.6 |
| Light-emitting element 43 | 3.40 | 2.95 | (0.663, 0.337) | 1060 | 36.1 | 33.3 | 28.9 |
| Light-emitting element 44 | 4.20 | 2.77 | (0.663, 0.337) | 968 | 34.9 | 26. | 27.9 |
| Light-emitting element 45 | 3.50 | 3.12 | (0.669, 0.330) | 995 | 31.8 | 28.6 | 27.4 |
| Light-emitting element 46 | 3.40 | 3.48 | (0.673, 0.327) | 1100 | 31.7 | 29.3 | 27.7 |

As shown in FIGS. 77 and 81, the comparative light-emitting elements 38 to 42 and the light-emitting elements 43 to 46 exhibited favorable current-voltage characteristics. In particular, the light-emitting elements 43 to 46 exhibited current-voltage characteristics superior to those of the comparative light-emitting element 38. This indicates that in the case where the electron-injection layer is in contact with the charge-generation layer, the composite material of a transition metal and an organic compound having an unshared electron pair has electron-injection properties superior to those of the Li compound which is typically used for the electron-injection layer. In addition, the light-emitting elements 43 to 46, each of which includes the charge-generation layer, exhibited favorable current-voltage characteristics equivalent to those of the comparative light-emitting elements 39 to 42, each of which does not include the charge-generation layer.

Figure 78:
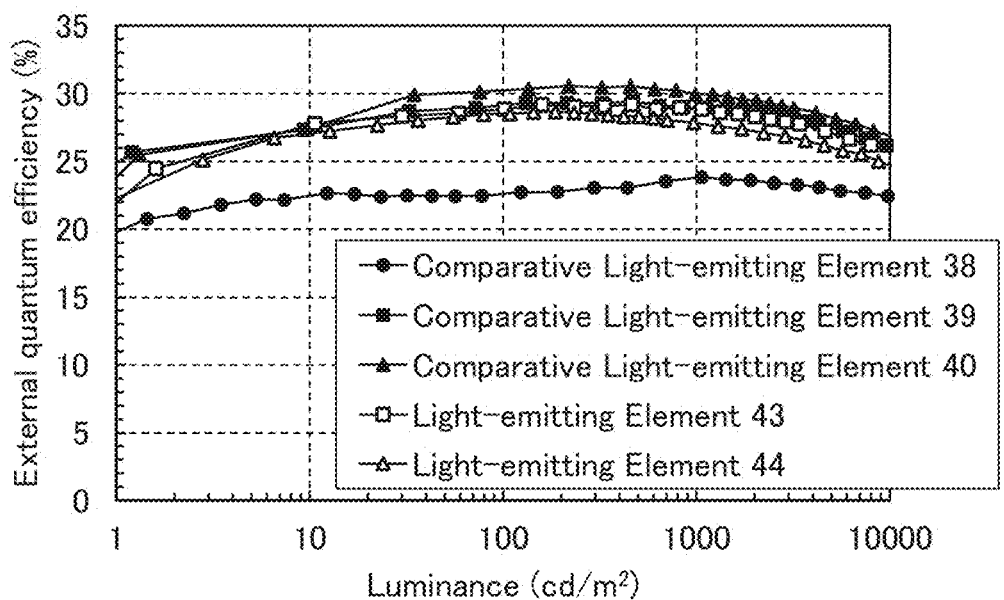
FIG. 78 shows external quantum efficiency-luminance characteristics of light-emitting elements in Example.

As shown in FIG. 78 and Table 38, the comparative light-emitting elements 38 to 42 and the light-emitting elements 43 to 46 each exhibited high emission efficiency with an external quantum efficiency exceeding 20%. The comparative light-emitting elements 38 to 42 and the light-emitting elements 43 to 46 also exhibited high current efficiency as shown in FIGS. 76 and 80. The light-emitting elements 43 to 46 according to one embodiment of the present invention exhibited higher efficiency than the comparative light-emitting element 38, which uses Li$_2$O typically used for the electron-injection layer. This indicates that the light-emitting elements 43 to 46 have a carrier balance superior to that of the comparative light-emitting element 38. In addition, the light-emitting elements 43 to 46 exhibited high efficiency equivalent to that of the comparative light-emitting elements 39 to 42 in which the charge-generation layer 4135 is not provided.

As shown in FIGS. 79 and 83, the comparative light-emitting elements 38 to 42 and the light-emitting elements 43 to 46 each exhibited red emission whose electroluminescence spectrum has a peak wavelength at approximately 616 nm and a full width at half maximum of 54 nm. The obtained electroluminescence spectrum reveals that the light is emitted from the guest material, Ir(dmdppr-dmp)$_2$(dmp).

<Reliability Test of Light-Emitting Elements>

A preservation test under constant temperature and humidity was performed on the comparative light-emitting element A and the light-emitting elements 43 to 46. Since each of the light-emitting elements is not sealed, the cathode and the EL layer are exposed to the atmosphere of the test environment. The measurement was performed in a manner similar to that in Example 11.

The emission state was evaluated by calculating the proportion of the emission area before and after the preservation test under constant temperature and humidity. The preservation test under constant temperature and humidity was performed on three samples of each of the light-emitting elements 43 to 46 and the comparative light-emitting element A. Table 39 shows the average emission area of the three samples.

TABLE 39

|  | Proportion of emission area |
|---|---|
| Comparative light-emitting element A | 0% |
| Light-emitting element 43 | 76% |
| Light-emitting element 44 | 82% |
| Light-emitting element 45 | 81% |
| Light-emitting element 46 | 80% |

In Table 39, the proportion of emission area (%) is the emission area after the preservation test under constant temperature and humidity/the emission area before the preservation test under constant temperature and humidity×100. Table 39 reveals that the light-emitting elements 43 to 46 according to one embodiment of the present invention each maintain an emission area proportion greater than or equal to 76% after the preservation test under constant temperature and humidity, i.e., have favorable moisture resistance. The moisture resistance of each of the light-emitting elements 43 to 46 according to one embodiment of the present invention is improved more than that of the comparative light-emitting element A, which uses Li$_2$O, a Li compound, for the electron-injection layer 4130. Moisture does not easily penetrate the light-emitting elements according to one embodiment of the present invention, which use a transition metal prone to react with water. Hence, highly moisture resistant light-emitting elements can be achieved. Unlike typical light-emitting elements, the light-emitting elements 43 to 46 are not sealed; hence, the moisture resistance of the light-emitting elements 43 to 46 is expected to further increase with sealing.

From the above, a material including a triazine ring and/or a pyrimidine ring can be favorably used for the light-emitting element according to one embodiment of the present invention. The structures shown in this example can be used in appropriate combination with any of the other embodiments and examples.

Example 13

Described in this example are examples of fabricating light-emitting elements 49 and 50 according to one embodiment of the present invention and comparative light-emitting elements 47 and 48. Table 40 shows structures of the comparative light-emitting element 38 as well as the comparative light-emitting elements 47 and 48. Table 41 shows structures of the light-emitting elements 49 and 50. A schematic cross-sectional view of the light-emitting elements fabricated in this example is shown in FIG. 70. The structure and abbreviation of a compound used in this example are shown below. Note that the above embodiments and examples can be referred to for the structures and abbreviations of the other compounds.

[Chemical Formula 8]

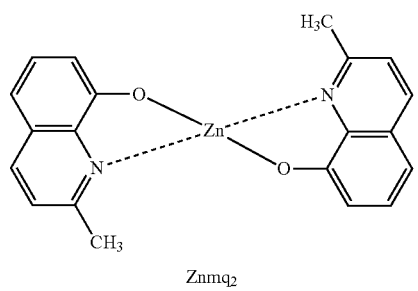

Znmq$_2$

TABLE 40

|  | Layer | Reference numeral | Thickness (nm) | Material | Weight ratio |
|---|---|---|---|---|---|
| Comparative light-emitting element 38 | Electrode | 4102 | 200 | Al | — |
| | Charge-generation layer | 4135 | 15 | DBT3P-II:MoO$_3$ | 1:0.5 |
| | Electron-injection layer | 4130 | 0.2 | Li$_2$O | — |
| | Electron-transport layer | 4118(2) | 20 | NBPhen | — |
| | | 4118(1) | 5 | 2mDBTBPDBq-II | — |
| | Light-emitting layer | 4140 | 40 | 2mDBTBPDBq-II:PCBBiF: Ir(dmdppr-dmp)$_2$(dpm) | 0.75:0.25:0.06 |
| | Hole-transport layer | 4112 | 20 | BPAFLP | — |
| | Hole-injection layer | 4111 | 65 | DBT3P-II:MoO$_3$ | 1:0.5 |
| | Electrode | 4101 | 70 | ITSO | — |

TABLE 40-continued

| | Layer | Reference numeral | Thickness (nm) | Material | Weight ratio |
|---|---|---|---|---|---|
| Comparative light-emitting element 47 | Electrode | 4102 | 200 | Al | — |
| | Electron-injection layer | 4130(2) | 5 | $Zn(BTZ)_2$:Ag | 1:0.21 |
| | | 4130(1) | 5 | NBPhen:Ag | 1:0.19 |
| | Electron-transport layer | 4118(2) | 10 | NBPhen | — |
| | | 4118(1) | 20 | 2mDBTBPDBq-II | — |
| | Light-emitting layer | 4140 | 40 | 2mDBTBPDBq-II:PCBBiF: $Ir(dmdppr-dmp)_2(dpm)$ | 0.75:0.25:0.06 |
| | Hole-transport layer | 4112 | 20 | BPAFLP | — |
| | Hole-injection layer | 4111 | 65 | DBT3P-II:$MoO_3$ | 1:0.5 |
| | Electrode | 4101 | 70 | ITSO | — |
| Comparative light-emitting element 48 | Electrode | 4102 | 200 | Al | — |
| | Electron-injection layer | 4130(2) | 5 | $Znmq_2$:Ag | 1:0.30 |
| | | 4130(1) | 5 | NBPhen:Ag | 1:0.30 |
| | Electron-transport layer | 4118(2) | 10 | NBPhen | — |
| | | 4118(1) | 20 | 2mDBTBPDBq-II | — |
| | Light-emitting layer | 4140 | 40 | 2mDBTBPDBq-II:PCBBiF: $Ir(dmdppr-dmp)_2(dpm)$ | 0.75:0.25:0.06 |
| | Hole-transport layer | 4112 | 20 | BPAFLP | — |
| | Hole-injection layer | 4111 | 65 | DBT3P-II:$MoO_3$ | 1:0.5 |
| | Electrode | 4101 | 70 | ITSO | — |

TABLE 41

| | Layer | Reference numeral | Thickness (nm) | Material | Weight ratio |
|---|---|---|---|---|---|
| Light-emitting element 49 | Electrode | 4102 | 200 | Al | — |
| | Charge-generation layer | 4135 | 15 | DBT3P-II:$MoO_3$ | 1:0.5 |
| | Electron-injection layer | 4130(2) | 5 | $Zn(BTZ)_2$:Ag | 1:0.21 |
| | | 4130(1) | 5 | NBPhen:Ag | 1:0.19 |
| | Electron-transport layer | 4118(2) | 10 | NBPhen | — |
| | | 4118(1) | 5 | 2mDBTBPDBq-II | — |
| | Light-emitting layer | 4140 | 40 | 2mDBTBPDBq-II:PCBBiF: $Ir(dmdppr-dmp)_2(dpm)$ | 0.75:0.25:0.06 |
| | Hole-transport layer | 4112 | 20 | BPAFLP | — |
| | Hole-injection layer | 4111 | 65 | DBT3P-II:$MoO_3$ | 1:0.5 |
| | Electrode | 4101 | 70 | ITSO | — |
| Light-emitting element 50 | Electrode | 4102 | 200 | Al | — |
| | Charge-generation layer | 4135 | 15 | DBT3P-II:$MoO_3$ | 1:0.5 |
| | Electron-injection layer | 4130(2) | 5 | $Znmq_2$:Ag | 1:0.30 |
| | | 4130(1) | 5 | NBPhen:Ag | 1:0.19 |
| | Electron-transport layer | 4118(2) | 10 | NBPhen | — |
| | | 4118(1) | 5 | 2mDBTBPDBq-II | — |
| | Light-emitting layer | 4140 | 40 | 2mDBTBPDBq-II:PCBBiF: $Ir(dmdppr-dmp)_2(dpm)$ | 0.75:0.25:0.06 |
| | Hole-transport layer | 4112 | 20 | BPAFLP | — |
| | Hole-injection layer | 4111 | 65 | DBT3P-II:$MoO_3$ | 1:0.5 |
| | Electrode | 4101 | 70 | ITSO | — |

The LUMO levels of the organic compounds that were used in the electron-injection layer 4130 of the light-emitting elements 49 and 50 and the comparative light-emitting elements 47 and 48, were calculated by cyclic voltammetry (CV) measurement. The measurement was performed in a manner similar to that in Example 1. The results are shown in Table 42.

TABLE 42

| | LUMO (eV) |
|---|---|
| $Zn(BTZ)_2$ | −3.16 |
| $Znmq_2$ | −2.68 |

«<Fabrication of Light-Emitting Elements 49 and 50»

The light-emitting elements 49 and 50 were fabricated through the same steps as those for the light-emitting element 45 except for the step of forming the electron-injection layer 4130.

<Fabrication of Light-Emitting Element 49>

As the electron-injection layer 4130, NBPhen and Ag were deposited over the electron-transport layer 4118(2) by co-evaporation in a weight ratio of NBPhen:Ag=1:0.19 to a thickness of 5 nm. Subsequently, $Zn(BTZ)_2$ and Ag were deposited by co-evaporation in a weight ratio of Zn$(BTZ)_2$:Ag=1:0.21 to a thickness of 5 nm.

<Fabrication of Light-Emitting Element 50>

As the electron-injection layer 4130, NBPhen and Ag were deposited over the electron-transport layer 4118(2) by co-evaporation in a weight ratio of NBPhen:Ag=1:0.30 to a thickness of 5 nm. Subsequently, $Znmq_2$ and Ag were deposited by co-evaporation in a weight ratio of $Znmq_2$:Ag=1:0.30 to a thickness of 5 nm.

«Fabrication of Comparative Light-Emitting Element 47»

The comparative light-emitting element 47 was fabricated through the same steps as those for the light-emitting element 49 except for the steps of forming the electron-transport layer 4118 and the charge-generation layer 4135.

As the electron-transport layer 4118, 2mDBTBPDBq-II was deposited over the light-emitting layer 4140 of the comparative light-emitting element 47 by evaporation to a thickness of 20 nm, and subsequently, NBPhen was deposited by evaporation to a thickness of 10 nm.

The charge-generation layer 4135 was not formed over the electron-injection layer 4130, and as the electrode 4102, aluminum (Al) was deposited by evaporation to a thickness of 200 nm.

«Fabrication of Comparative Light-Emitting Element 48»

The comparative light-emitting element 48 was fabricated through the same steps as those for the light-emitting element 50 except for the steps of forming the electron-transport layer 4118 and the charge-generation layer 4135.

As the electron-transport layer 4118, 2mDBTBPDBq-II was deposited over the light-emitting layer 4140 of the comparative light-emitting element 48 by evaporation to a thickness of 20 nm, and subsequently, NBPhen was deposited by evaporation to a thickness of 10 nm.

The charge-generation layer 4135 was not formed over the electron-injection layer 4130, and as the electrode 4102, aluminum (Al) was deposited by evaporation to a thickness of 200 nm.

<Characteristics of Light-Emitting Elements>

Next, the element characteristics of the fabricated comparative light-emitting elements 38, 47, and 48 and light-emitting elements 49 and 50 were measured. The measurement was performed in a manner similar to that in Example 1.

Figure 84:
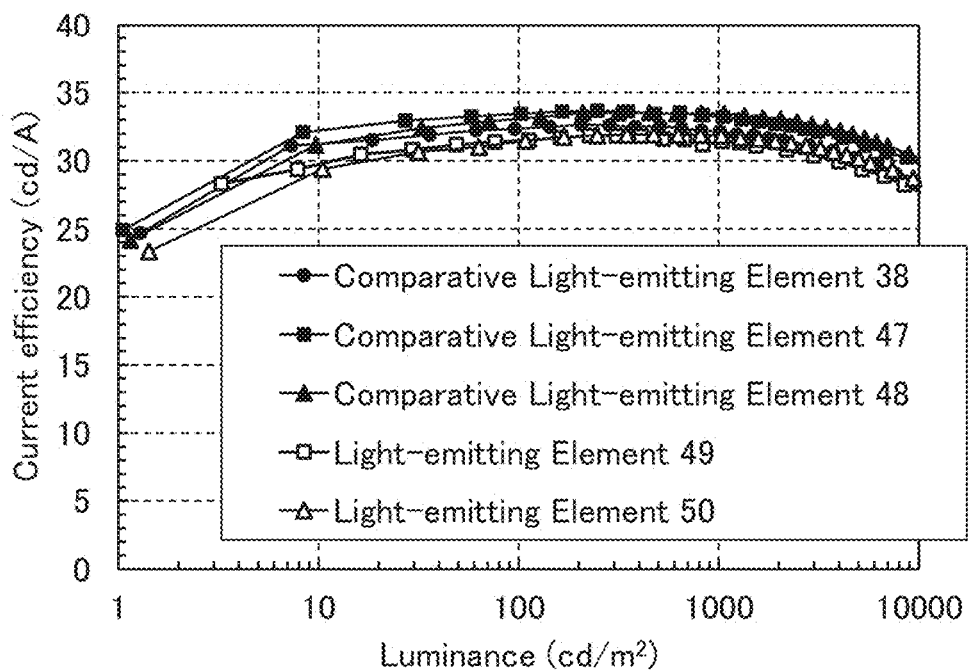
FIG. 84 shows current efficiency-luminance characteristics of light-emitting elements in Example.
Figure 85:
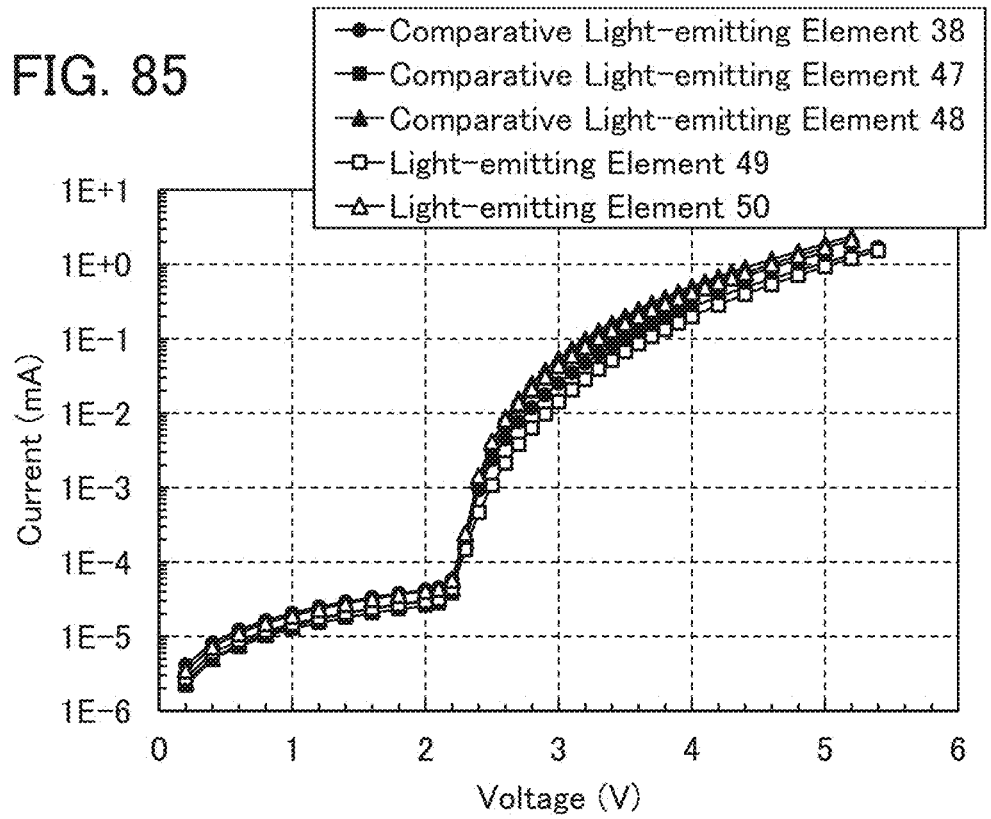
FIG. 85 shows current-voltage characteristics of light-emitting elements in Example.

FIG. 84 shows the current efficiency-luminance characteristics of the fabricated comparative light-emitting elements 38, 47, and 48 and light-emitting elements 49 and 50; FIG. 85, the current-voltage characteristics thereof; and FIG. 86, the external quantum efficiency-luminance characteristics thereof. FIG. 87 shows the electroluminescence spectra of the light-emitting elements through which current flows at a current density of 2.5 mA/cm$^2$.

Table 43 shows the element characteristics of the comparative light-emitting elements 38, 47, and 48 and the light-emitting elements 49 and 50 at around 1000 cd/m$^2$.

As shown in FIG. 85, the comparative light-emitting elements 38, 47, and 48 and the light-emitting elements 49 and 50 exhibited favorable, equivalent current-voltage characteristics. This indicates that in the case where a zinc compound is used for the electron-injection layer and the electron-injection layer is in contact with the charge-generation layer, the composite material of a transition metal and an organic compound having an unshared electron pair has electron-injection properties equivalent to those of the Li compound which is typically used for the electron-injection layer. In addition, the light-emitting elements 49 and 50, each of which includes the charge-generation layer, exhibited favorable current-voltage characteristics equivalent to those of the comparative light-emitting elements 47 and 48, each of which does not include the charge-generation layer.

Figure 86:
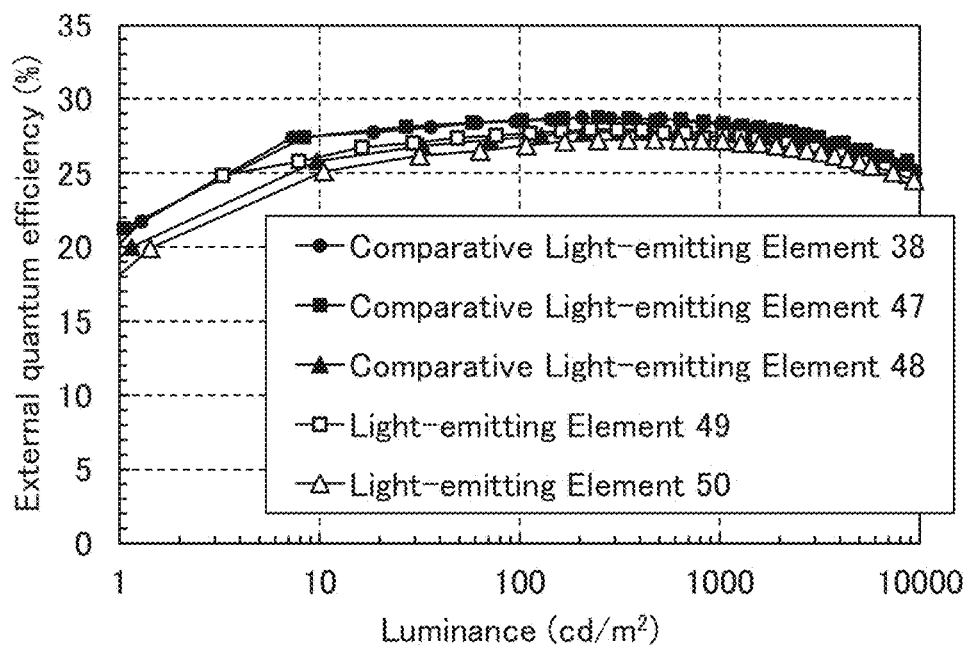
FIG. 86 shows external quantum efficiency-luminance characteristics of light-emitting elements in Example.
Figure 87:
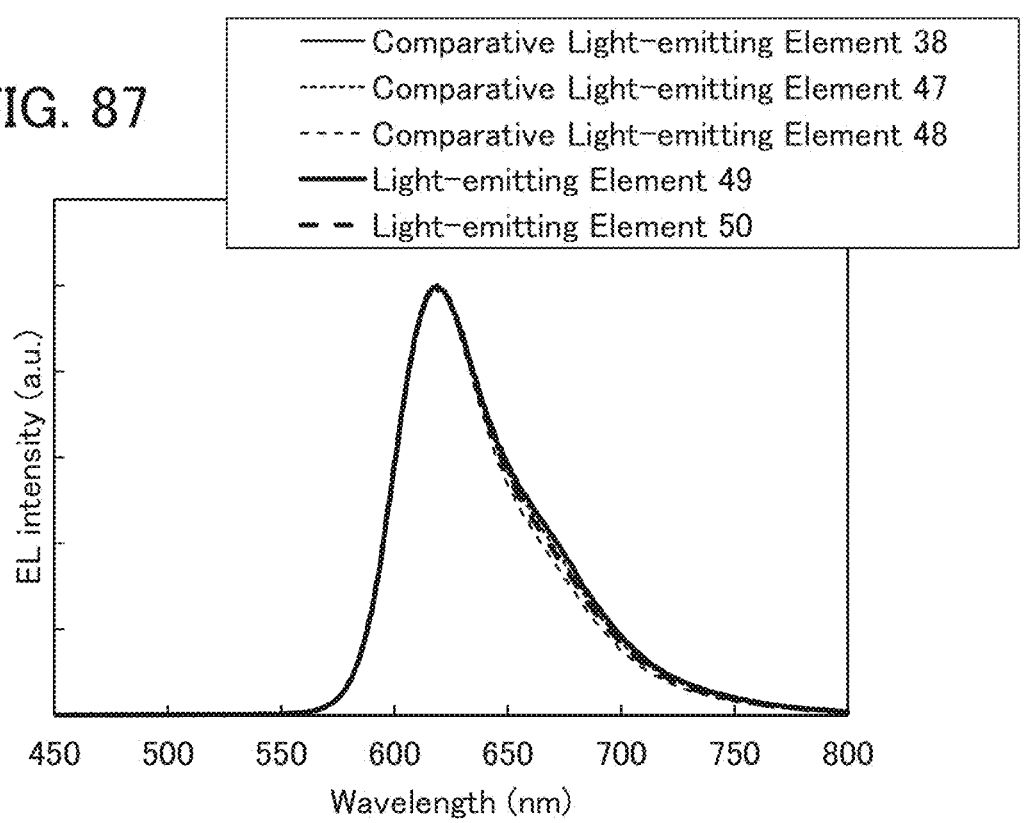
FIG. 87 shows electroluminescence spectra of light-emitting elements in Example.

As shown in FIG. 86 and Table 43, the comparative light-emitting elements 38, 47, and 48 and the light-emitting elements 49 and 50 each exhibited high emission efficiency with an external quantum efficiency exceeding 20%. The comparative light-emitting elements 38, 47, and 48 and the light-emitting elements 49 and 50 also exhibited high current efficiency as shown in FIG. 84.

As shown in FIG. 87, the comparative light-emitting elements 38, 47, and 48 and the light-emitting elements 49 and 50 each exhibited red emission whose electroluminescence spectrum has a peak wavelength at approximately 618 nm and a full width at half maximum of 60 nm. The obtained electroluminescence spectrum reveals that the light is emitted from the guest material, Ir(dmdppr-dmp)$_2$(dmp).

<Reliability Test of Light-Emitting Elements>

A preservation test under constant temperature and humidity was performed on the comparative light-emitting element A and the light-emitting elements 49 and 50. Since each of the light-emitting elements is not sealed, the cathode and the EL layer are exposed to the atmosphere of the test environment. The measurement was performed in a manner similar to that in Example 11.

The emission state was evaluated by calculating the proportion of the emission area before and after the preservation test under constant temperature and humidity. The preservation test under constant temperature and humidity was performed on three samples of each of the light-emitting elements 49 and 50 and the comparative light-emitting element A. Table 44 shows the average emission area of the three samples.

TABLE 43

| | Voltage (V) | Current density (mA/cm$^2$) | CIE chromaticity (x, y) | Luminance (cd/cm$^2$) | Current efficiency (cd/A) | Power efficiency (lm/W) | External quantum efficiency (%) |
|---|---|---|---|---|---|---|---|
| Comparative light-emitting element 38 | 5.20 | 3.47 | (0.662, 0.338) | 1060 | 30.7 | 18.5 | 23.9 |
| Comparative light-emitting element 47 | 3.40 | 3.16 | (0.672, 0.328) | 1049 | 33.2 | 30.7 | 28.4 |
| Comparative light-emitting element 48 | 3.30 | 3.18 | (0.668, 0.332) | 1065 | 33.5 | 31.9 | 27.7 |
| Light-emitting element 49 | 3.80 | 3.31 | (0.673, 0.327) | 1041 | 31.4 | 26.0 | 27.6 |
| Light-emitting element 50 | 3.40 | 3.24 | (0.669, 0.330) | 1031 | 31.8 | 29.4 | 27.2 |

TABLE 44

| | Proportion of emission area |
|---|---|
| Comparative light-emitting element A | 0% |
| Light-emitting element 49 | 83% |
| Light-emitting element 50 | 83% |

In Table 44, the proportion of emission area (%) is the emission area after the preservation test under constant temperature and humidity/the emission area before the preservation test under constant temperature and humidity×100. Table 44 reveals that the light-emitting elements 49 and 50 according to one embodiment of the present invention each maintain an emission area proportion greater than or equal to 80% after the preservation test under constant temperature and humidity, i.e., have favorable moisture resistance. The moisture resistance of each of the light-emitting elements 49 and 50 according to one embodiment of the present invention is improved more than that of the comparative light-emitting element A, which uses $Li_2O$, a Li compound, for the electron-injection layer 4130. Moisture does not easily penetrate the light-emitting elements according to one embodiment of the present invention, which use a transition metal prone to react with water. Hence, highly moisture resistant light-emitting elements can be achieved. Unlike typical light-emitting elements, the light-emitting elements 49 and 50 are not sealed; hence, the moisture resistance of the light-emitting elements 49 and 50 is expected to further increase with sealing.

From the above, a metal complex such as a zinc complex can be favorably used for the light-emitting element according to one embodiment of the present invention. The structures shown in this example can be used in appropriate combination with any of the other embodiments and examples.

Example 14

<Correlation Between Reliability in Preservation Test Under Constant Temperature and Humidity and LUMO Level of Electron-Injection Material>

Figure 88A:
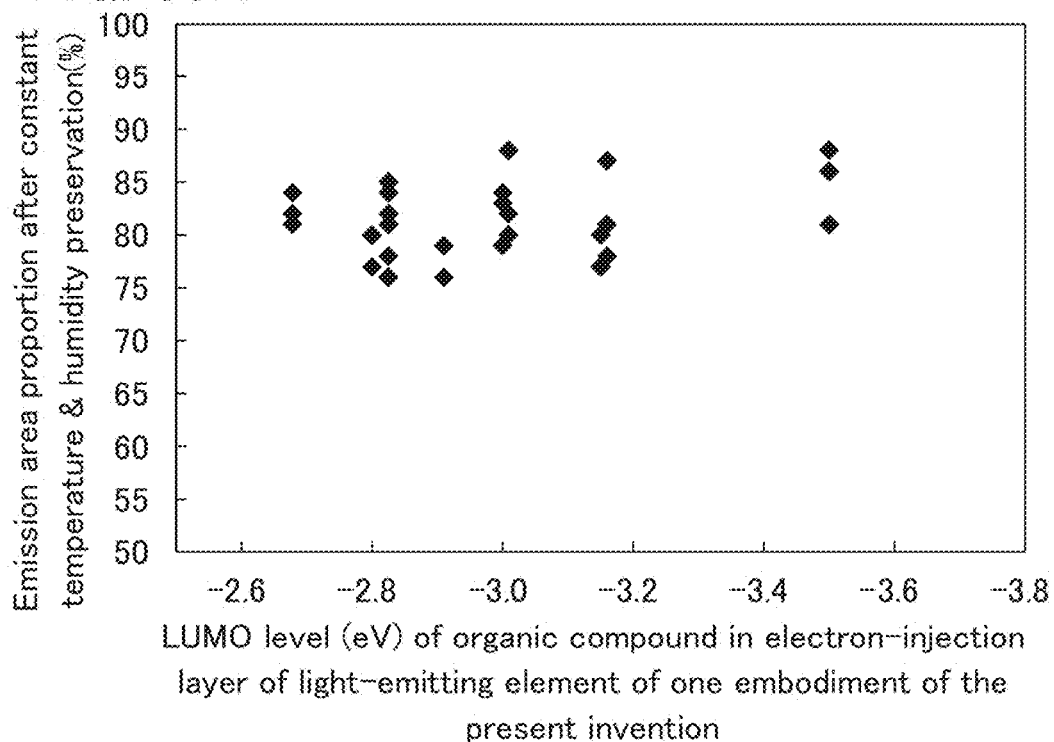
FIGS. 88A and 88B each show the relationship between the LUMO level of an organic compound and the proportion of the emission area after a constant temperature and humidity preservation test in Example.
Figure 88B:
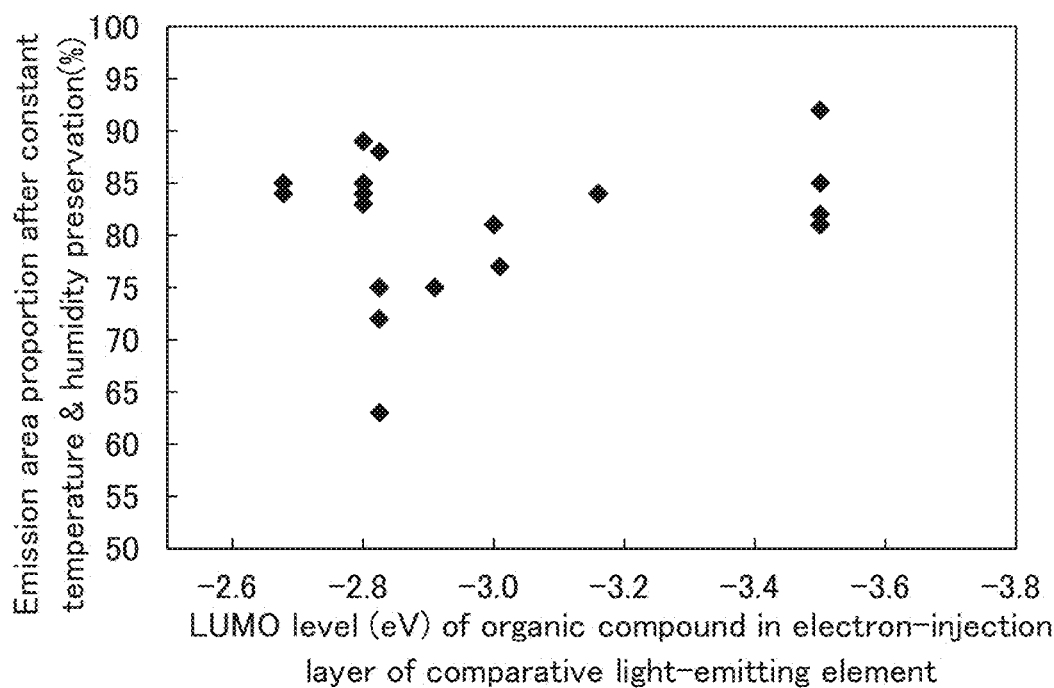

The results of the above preservation test under constant temperature and humidity described in Examples 11 to 13 were plotted with respect to the LUMO level. The results are shown in FIGS. 88A and 88B. Note that the preservation test under constant temperature and humidity was performed on three to seven samples of each light-emitting element with the same element structure. FIG. 88A shows the results of the preservation test under constant temperature and humidity of the light-emitting elements according to one embodiment of the present invention, each of which includes the charge-generation layer, whereas FIG. 88B shows the results of the preservation test under constant temperature and humidity of the comparative light-emitting elements, each of which does not include the charge-generation layer. Comparison between FIGS. 88A and 88B shows that in FIG. 88B, the proportion of emission area after the preservation under constant temperature and humidity is sometimes under 75% in a region with a high LUMO level (a region with a LUMO level greater than or equal to −3.0 eV), i.e., the moisture resistance varies. In contrast, all the light-emitting elements in FIG. 88A have high moisture resistance with a proportion of emission area exceeding 75% in that region. That is, the light-emitting elements according to one embodiment of the present invention, each of which includes the charge-generation layer between the cathode and the electron-injection layer, can be fabricated with small variation and high yield. Furthermore, the light-emitting elements according to one embodiment of the present invention have a wide choice of materials for the electron-injection layer, and therefore, have high productivity.

Example 15

Figure 89:
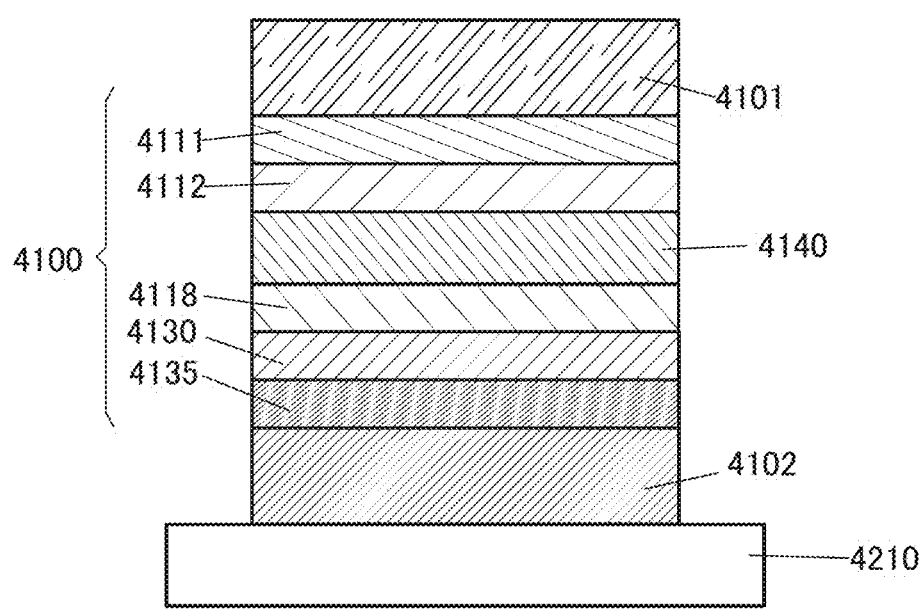
FIG. 89 is a schematic cross-sectional view illustrating a light-emitting element in Example.

Described in the above examples are examples of fabricating the ordered stacked structure in which an anode is provided over a substrate and an EL layer is stacked over the anode. Described in this example are examples of fabricating light-emitting elements 52 to 54 according to one embodiment of the present invention, each of which has an inverted stacked structure in which a cathode is provided over a substrate and an EL layer is stacked over the cathode, and comparative light-emitting elements 51 and 55 to 57. The comparative light-emitting element 51 uses $Li_2O$ for the electron-injection layer 4130, and the comparative light-emitting elements 55 to 57 do not include the charge-generation layer 4135. A schematic cross-sectional view of the light-emitting elements fabricated in this example is shown in FIG. 89. Details of the element structures are shown in Tables 45 to 47. The above examples and embodiments can be referred to for the structures and abbreviations of compounds used in this example.

TABLE 45

| | Layer | Reference numeral | Thickness (nm) | Material | Weight ratio |
|---|---|---|---|---|---|
| Comparative light-emitting element 51 | Electrode | 4101 | 200 | Al | — |
| | Hole-injection layer | 4111 | 25 | DBT3P-II:MoO$_3$ | 1:0.5 |
| | Hole-transport layer | 4112 | 20 | BPAFLP | — |
| | Light-emitting layer | 4140 | 40 | 2mDBTBPDBq-II:PCBBiF: Ir(dmdppr-dmp)$_2$(dpm) | 0.75:0.25.0.06 |
| | Electron-transport layer | 4118(2) | 5 | 2mDBTBPDBq-II | — |
| | | 4118(1) | 15 | NBPhen | — |
| | Electron-injection layer | 4130(2) | 0.2 | Li$_2$O | — |
| | | 4130(1) | 5 | NBPhen | — |
| | Charge-generation layer | 4135 | 40 | DBT3P-II:MoO$_3$ | 1:0.5 |
| | Electrode | 4102 | 70 | ITSO | — |
| Light-emitting element 52 | Electrode | 4101 | 200 | Al | — |
| | Hole-injection layer | 4111 | 25 | DBT3P-II:MoO$_3$ | 1:0.5 |
| | Hole-transport layer | 4112 | 20 | BPAFLP | — |
| | Light-emitting layer | 4140 | 40 | 2mDBTBPDBq-II:PCBBiF: Ir(dmdppr-dmp)$_2$(dpm) | 0.75:0.25.0.06 |
| | Electron-transport layer | 4118(2) | 5 | 2mDBTBPDBq-II | — |
| | | 4118(1) | 15 | NBPhen | — |

TABLE 45-continued

| Layer | Reference numeral | Thickness (nm) | Material | Weight ratio |
|---|---|---|---|---|
| Electron-injection layer | 4130 | 5 | NBPhen:Ag | 1:0.19 |
| Charge-generation layer | 4135 | 40 | DBT3P-II:MoO$_3$ | 1:0.5 |
| Electrode | 4102 | 70 | ITSO | — |

TABLE 46

| | Layer | Reference numeral | Thickness (nm) | Material | Weight ratio |
|---|---|---|---|---|---|
| Light-emitting element 53 | Electrode | 4101 | 200 | Al | — |
| | Hole-injection layer | 4111 | 25 | DBT3P-II:MoO$_3$ | 1:0.5 |
| | Hole-transport layer | 4112 | 20 | BPAFLP | — |
| | Light-emitting layer | 4140 | 40 | 2mDBTBPDBq-II:PCBBiF:Ir(dmdppr-dmp)$_2$(dpm) | 0.75:0.25:0.06 |
| | Electron-transport layer | 4118(2) | 5 | 2mDBTBPDBq-II | — |
| | | 4118(1) | 10 | NBPhen | — |
| | Electron-injection layer | 4130(2) | 5 | NBPhen:Ag | 1:0.19 |
| | | 4130(1) | 5 | Alq3:Ag | 1:0.24 |
| | Charge-generation layer | 4135 | 40 | DBT3P-II:MoO$_3$ | 1:0.5 |
| | Electrode | 4102 | 70 | ITSO | — |
| Light-emitting element 54 | Electrode | 4101 | 200 | Al | — |
| | Hole-injection layer | 4111 | 25 | DBT3P-II:MoO$_3$ | 1:0.5 |
| | Hole-transport layer | 4112 | 20 | BPAFLP | — |
| | Light-emitting layer | 4140 | 40 | 2mDBTBPDBq-II:PCBBiF:Ir(dmdppr-dmp)$_2$(dpm) | 0.75:0.25:0.06 |
| | Electron-transport layer | 4118(2) | 5 | 2mDBTBPDBq-II | — |
| | | 4118(1) | 10 | NBPhen | — |
| | Electron-injection layer | 4130(2) | 5 | NBPhen:Ag | 1:0.19 |
| | | 4130(1) | 5 | HATNA:Ag | 1:0.28 |
| | Charge-generation layer | 4135 | 40 | DBT3P-II:MoO$_3$ | 1:0.5 |
| | Electrode | 4102 | 70 | ITSO | — |

TABLE 47

| | Layer | Reference numeral | Thickness (nm) | Material | Weight ratio |
|---|---|---|---|---|---|
| Comparative light-emitting element 55 | Electrode | 4101 | 200 | Al | — |
| | Hole-injection layer | 4111 | 25 | DBT3P-II:MoO$_3$ | 1:0.5 |
| | Hole-transport layer | 4112 | 20 | BPAFLP | — |
| | Light-emitting layer | 4140 | 40 | 2mDBTBPDBq-II:PCBBiF:Ir(dmdppr-dmp)$_2$(dpm) | 0.75:0.25:0.06 |
| | Electron-transport layer | 4118(2) | 30 | 2mDBTBPDBq-II | — |
| | | 4118(1) | 30 | NBPhen | — |
| | Electron-injection layer | 4130 | 5 | NBPhen:Ag | 1:0.19 |
| | Electrode | 4102 | 70 | ITSO | — |
| Comparative light-emitting element 56 | Electrode | 4101 | 200 | Al | — |
| | Hole-injection layer | 4111 | 25 | DBT3P-II:MoO$_3$ | 1:0.5 |
| | Hole-transport layer | 4112 | 20 | BPAFLP | — |
| | Light-emitting layer | 4140 | 40 | 2mDBTBPDBq-II:PCBBiF:Ir(dmdppr-dmp)$_2$(dpm) | 0.75:0.25:0.06 |
| | Electron-transport layer | 4118(2) | 30 | 2mDBTBPDBq-II | — |
| | | 4118(1) | 25 | NBPhen | — |
| | Electron-injection layer | 4130(2) | 5 | NBPhen:Ag | 1:0.19 |
| | | 4130(1) | 5 | Alq3:Ag | 1:0.35 |
| | Electrode | 4102 | 70 | ITSO | — |
| Comparative light-emitting element 57 | Electrode | 4101 | 200 | Al | — |
| | Hole-injection layer | 4111 | 25 | DBT3P-II:MoO$_3$ | 1:0.5 |
| | Hole-transport layer | 4112 | 20 | BPAFLP | — |
| | Light-emitting layer | 4140 | 40 | 2mDBTBPDBq-II:PCBBiF:Ir(dmdppr-dmp)$_2$(dpm) | 0.75:0.25:0.06 |
| | Electron-transport layer | 4118(2) | 30 | 2mDBTBPDBq-II | — |
| | | 4118(1) | 25 | NBPhen | — |
| | Electron-injection layer | 4130(2) | 5 | NBPhen:Ag | 1:0.19 |
| | | 4130(1) | 5 | HATNA:Ag | 1:0.15 |
| | Electrode | 4102 | 70 | ITSO | — |

«Fabrication of comparative light-emitting element 51»

As the electrode 4102, an JTSO film was formed to a thickness of 70 nm over the substrate 4210. Note that the electrode area of the electrode 4102 was set to 4 mm² (2 mm×2 mm).

Then, as the charge-generation layer 4135, DBT3P-JJ and MoO₃ were deposited over the electrode 4102 by co-evaporation in a weight ratio of DBT3P-JJ:MoO₃=1:0.5 to a thickness of 40 nm.

Next, as the electron-injection layer 4130, NBPhen was deposited over the charge-generation layer 4135 by evaporation to a thickness of 5 nm. Subsequently, Li₂O was deposited by evaporation to a thickness of 0.2 nm.

Then, as the electron-transport layer 4118(1), NBPhen was deposited over the electron-injection layer 4130 by evaporation to a thickness of 15 nm. Subsequently, as the electron-transport layer 4118(2), 2mDBTBPDBq-II was deposited by evaporation to a thickness of 5 nm.

Then, as the light-emitting layer 4140, 2mDBTBPDBq-II, PCBBiF, and Ir(dmdppr-dmp)₂(dpm) were deposited over the electron-transport layer 4118(2) by co-evaporation in a weight ratio of 2mDBTBPDBq-II:PCBBiF:Ir(dmdppr-dmp)₂ (dpm)=0.75:0.25:0.06 to a thickness of 40 nm. Note that in the light-emitting layer 4140, 2mDBTBPDBq-II and PCBBiF are host materials and Ir(dmdppr-dmp)₂(dpm) is a guest material (a phosphorescent compound).

Then, as the hole-transport layer 4112, BPAFLP was deposited over the light-emitting layer 4140 by evaporation to a thickness of 20 nm.

Then, as the hole-injection layer 4111, DBT3P-II and MoO₃ were deposited over the hole-transport layer 4112 by co-evaporation in a weight ratio of DBT3P-II:MoO₃=1:0.5 to a thickness of 25 nm.

Next, as the electrode 4101, aluminum (Al) was deposited over the hole-injection layer 4111 by evaporation to a thickness of 200 nm.

Then, heat treatment at 80° C. for one hour was performed in the air without sealing. Through the above steps, the comparative light-emitting element 51 was obtained.

«Fabrication of Light-Emitting Element 52»

The light-emitting element 52 was fabricated through the same steps as those for the comparative light-emitting element 51 except for the step of forming the electron-injection layer 4130.

As the electron-injection layer 4130 of the light-emitting element 52, NBPhen and Ag were deposited over the charge-generation layer 4135 by co-evaporation in a weight ratio of NBPhen:Ag=1:0.19 to a thickness of 5 nm.

«Fabrication of Light-Emitting Element 53»

The light-emitting element 53 was fabricated through the same steps as those for the comparative light-emitting element 51 except for the steps of forming the electron-injection layer 4130 and the electron-transport layer 4118 (1).

As the electron-injection layer 4130 of the light-emitting element 53, Alq₃ and Ag were deposited over the charge-generation layer 4135 by co-evaporation in a weight ratio of Alq₃:Ag=1:0.24 to a thickness of 5 nm. Subsequently, NBPhen and Ag were deposited by co-evaporation in a weight ratio of NBPhen:Ag=1:0.19 to a thickness of 5 nm.

As the electron-transport layer 4118(1), NBPhen was deposited over the electron-injection layer 4130 by evaporation to a thickness of 10 nm. Subsequently, as the electron-transport layer 4118(2), 2mDBTBPDBq-II was deposited by evaporation to a thickness of 5 nm.

«Fabrication of Light-Emitting Element 54»

The light-emitting element 54 was fabricated through the same steps as those for the comparative light-emitting element 51 except for the steps of forming the electron-injection layer 4130 and the electron-transport layer 4118 (1).

As the electron-injection layer 4130 of the light-emitting element 54, HATNA and Ag were deposited over the charge-generation layer 4135 by co-evaporation in a weight ratio of HATNA:Ag=1:0.28 to a thickness of 5 nm. Subsequently, NBPhen and Ag were deposited by co-evaporation in a weight ratio of NBPhen:Ag=1:0.19 to a thickness of 5 nm.

As the electron-transport layer 4118(1), NBPhen was deposited over the electron-injection layer 4130 by evaporation to a thickness of 10 nm. Subsequently, as the electron-transport layer 4118(2), 2mDBTBPDBq-II was deposited by evaporation to a thickness of 5 nm.

«Fabrication of Comparative Light-Emitting Element 55»

The comparative light-emitting element 55 was fabricated through the same steps as those for the light-emitting element 52 except for the steps of forming the charge-generation layer 4135 and the electron-transport layer 4118.

In the comparative light-emitting element 55, the charge-generation layer 4135 was not formed and the electron-injection layer 4130 was formed over the electrode 4102.

As the electron-transport layer 4118(1), NBPhen was deposited over the electron-injection layer 4130 by evaporation to a thickness of 30 nm. Subsequently, as the electron-transport layer 4118(2), 2mDBTBPDBq-II was deposited by evaporation to a thickness of 30 nm.

«Fabrication of Comparative Light-Emitting Element 56»

The comparative light-emitting element 56 was fabricated through the same steps as those for the light-emitting element 53 except for the steps of forming the charge-generation layer 4135 and the electron-transport layer 4118.

In the comparative light-emitting element 56, the charge-generation layer 4135 was not formed and the electron-injection layer 4130 was formed over the electrode 4102.

As the electron-transport layer 4118(1), NBPhen was deposited over the electron-injection layer 4130 by evaporation to a thickness of 25 nm. Subsequently, as the electron-transport layer 4118(2), 2mDBTBPDBq-II was deposited by evaporation to a thickness of 30 nm.

«Fabrication of Comparative Light-Emitting Element 57»

The comparative light-emitting element 57 was fabricated through the same steps as those for the light-emitting element 54 except for the steps of forming the charge-generation layer 4135 and the electron-transport layer 4118.

In the comparative light-emitting element 57, the charge-generation layer 4135 was not formed and the electron-injection layer 4130 was formed over the electrode 4102.

As the electron-transport layer 4118(1), NBPhen was deposited over the electron-injection layer 4130 by evaporation to a thickness of 25 nm. Subsequently, as the electron-transport layer 4118(2), 2mDBTBPDBq-II was deposited by evaporation to a thickness of 30 nm.

<Characteristics of Light-Emitting Elements>

Next, the element characteristics of the fabricated comparative light-emitting element 51, light-emitting elements 52 to 54, and comparative light-emitting elements 55 to 57 were measured. The measurement was performed in a manner similar to that in Example 1.

Figure 90:
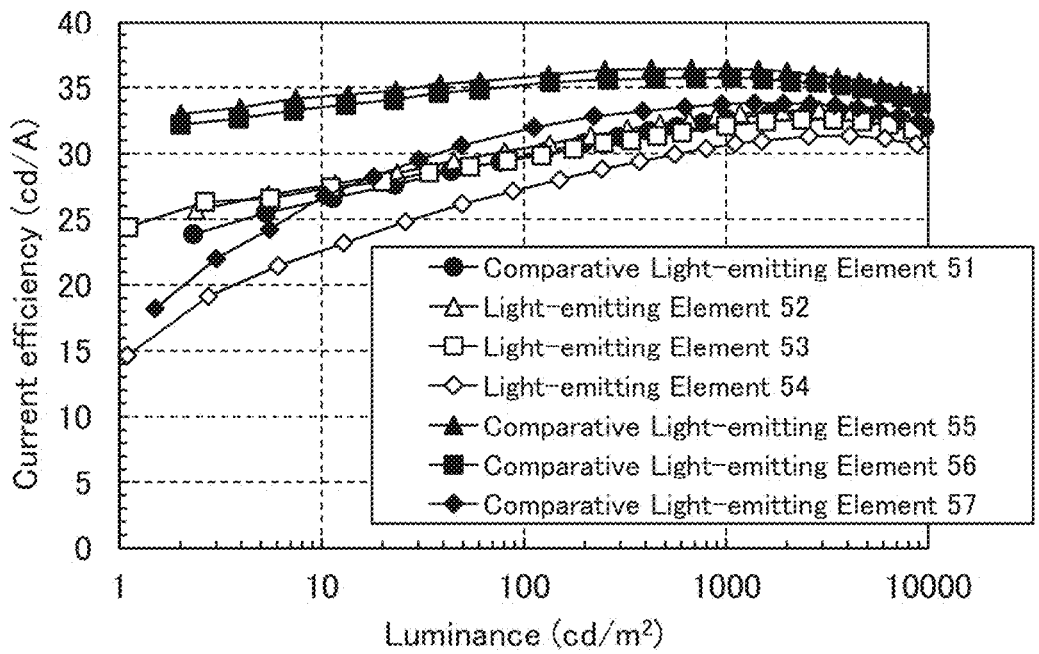
FIG. 90 shows current efficiency-luminance characteristics of light-emitting elements in Example.
Figure 91:
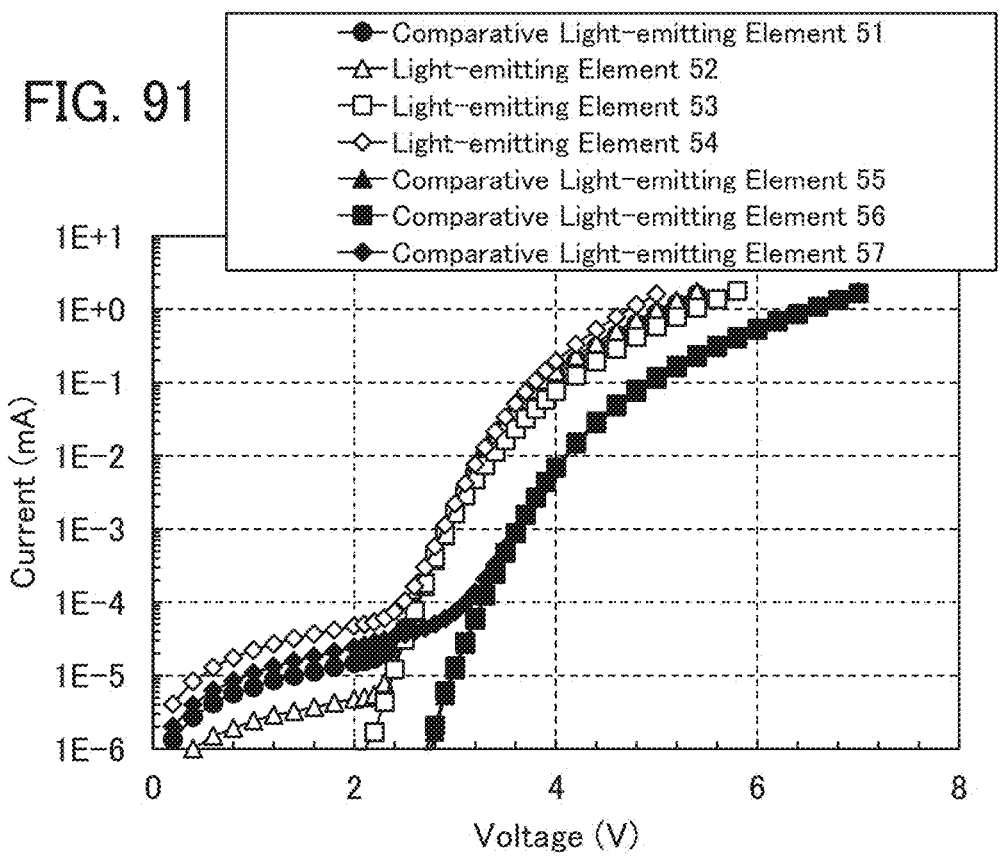
FIG. 91 shows current-voltage characteristics of light-emitting elements in Example.
Figure 92:
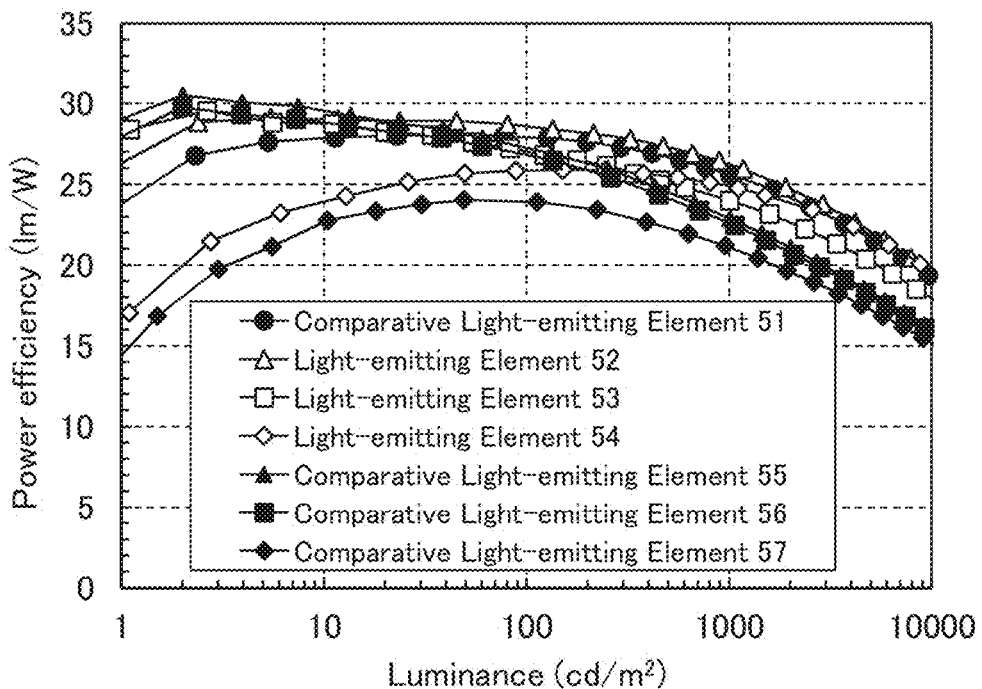
FIG. 92 shows power efficiency-luminance characteristics of light-emitting elements in Example.
Figure 93:
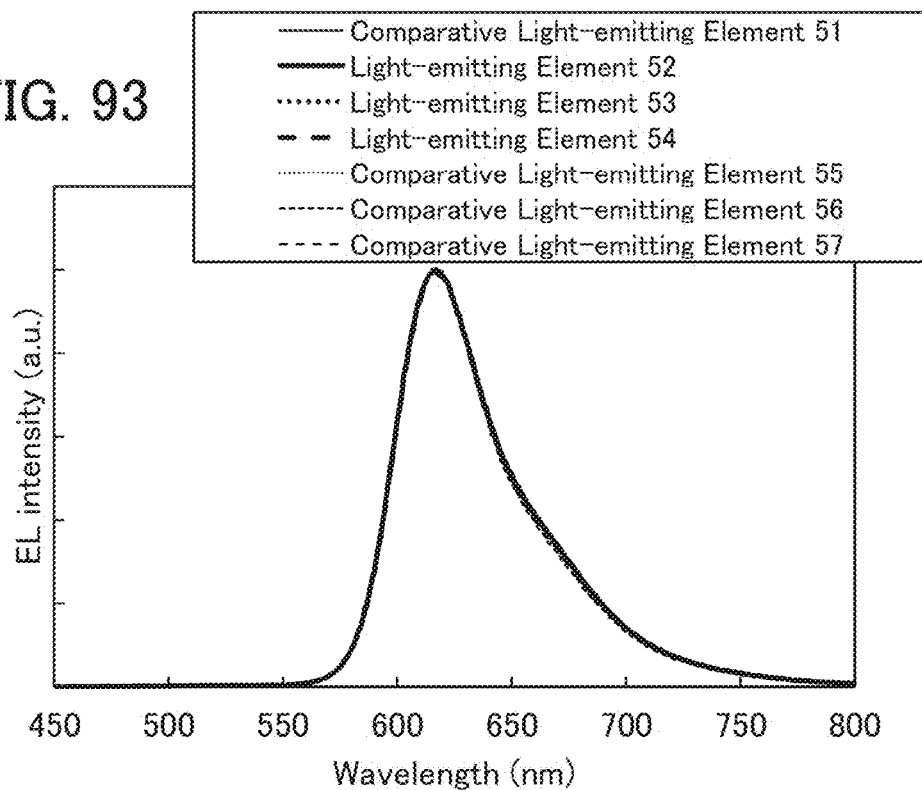
FIG. 93 shows electroluminescence spectra of light-emitting elements in Example.

FIG. 90 shows the current efficiency-luminance characteristics of the fabricated comparative light-emitting element 51, light-emitting elements 52 to 54, and comparative light-emitting elements 55 to 57; FIG. 91, the current-voltage characteristics thereof and FIG. 92, the power efficiency-luminance characteristics thereof. FIG. 93 shows the electroluminescence spectra of the light-emitting elements through which current flows at a current density of 2.5 mA/cm².

Table 48 shows the element characteristics of the comparative light-emitting element 51, the light-emitting elements 52 to 54, and the comparative light-emitting elements 55 to 57 at around 1000 cd/in.

TABLE 48

|  | Voltage (V) | Current density (mA/cm²) | CIE chromaticity (x, y) | Luminance (cd/cm²) | Current efficiency (cd/A) | Power efficiency (lm/W) | External quantum efficiency (%) |
| --- | --- | --- | --- | --- | --- | --- | --- |
| Comparative light-emitting element 51 | 4.00 | 3.09 | (0.664, 0.336) | 1007 | 32.6 | 25.6 | 25.8 |
| Light-emitting element 52 | 3.90 | 2.72 | (0.664, 0.335) | 892 | 32.8 | 26.5 | 26.0 |
| Light-emitting element 53 | 4.20 | 3.13 | (0.664, 0.336) | 1004 | 32.1 | 24.0 | 25.4 |
| Light-emitting element 54 | 3.90 | 3.62 | (0.664, 0.336) | 1112 | 30.7 | 24.8 | 24.5 |
| Comparative light-emitting element 55 | 5.00 | 2.77 | (0.662, 0.337) | 1009 | 36.4 | 22.9 | 28.3 |
| Comparative light-emitting element 56 | 5.00 | 2.98 | (0.662, 0.337) | 1067 | 35.7 | 22.5 | 27.6 |
| Comparative light-emitting element 57 | 5.00 | 2.83 | (0.664, 0.336) | 954 | 33.7 | 21.2 | 26.2 |

As shown in Table 48, the comparative light-emitting element 51, the light-emitting elements 52 to 54, and the comparative light-emitting elements 55 to 57 each exhibited very high emission efficiency with an external quantum efficiency of approximately 25%. The comparative light-emitting element 51, the light-emitting elements 52 to 54, and the comparative light-emitting elements 55 to 57 also exhibited high current efficiency as shown in FIG. 90. FIG. 92 and Table 48 show that the light-emitting elements 52 to 54 exhibited power efficiency superior to that of the comparative light-emitting elements 55 to 57 in a region with a luminance greater than or equal to approximately 200 cd/m². This indicates that the light-emitting element according to one embodiment of the present invention can obtain favorable efficiency when applied to the inverted stacked element.

As shown in FIG. 91, the comparative light-emitting element 51, the light-emitting elements 52 to 54, and the comparative light-emitting elements 55 to 57 exhibited favorable current-voltage characteristics. In addition, the light-emitting elements 52 to 54 according to one embodiment of the present invention exhibited current-voltage characteristics superior to those of the comparative light-emitting elements 55 to 57 each of which does not include the charge-generation layer 4135. This indicates that the light-emitting element according to one embodiment of the present invention can obtain favorable current-voltage characteristics when applied to the inverted stacked element.

As shown in FIG. 93, the comparative light-emitting element 51, the light-emitting elements 52 to 54, and the comparative light-emitting elements 55 to 57 each exhibited red emission whose electroluminescence spectrum has a peak wavelength at approximately 617 nm and a full width at half maximum of 54 nm. The obtained electroluminescence spectrum reveals that the light is emitted from the guest material, Ir(dmdppr-dmp)₂(dmp).

<Reliability Test of Light-Emitting Elements>

A preservation test under constant temperature and humidity was performed on the light-emitting elements 52 to 54. Since each of the light-emitting elements is not sealed, the anode and the EL layer are exposed to the atmosphere of the test environment. The measurement was performed in a manner similar to that in the above example.

The emission state was evaluated by calculating the proportion of the emission area before and after the preservation test under constant temperature and humidity. The preservation test under constant temperature and humidity was performed on six samples of each of the light-emitting elements 52 to 54. Table 49 shows the average emission area of the top three samples having a high proportion of emission area.

TABLE 49

|  | Proportion of emission area |
| --- | --- |
| Light-emitting element 52 | 79% |
| Light-emitting element 53 | 76% |
| Light-emitting element 54 | 71% |

The light-emitting elements 52 to 54 according to one embodiment of the present invention each maintain an emission area proportion greater than or equal to 70% after the preservation test under constant temperature and humidity, indicating that the light-emitting elements 52 to 54 have favorable moisture resistance. Hence, the light-emitting element according to one embodiment of the present invention can have favorable moisture resistance when applied to the inverted stacked element.

From the above, the light-emitting element according to one embodiment of the present invention can also be applied to the inverted stacked element. The structures shown in this example can be used in appropriate combination with any of the other embodiments and examples.

Example 16

Described in this example is an example of fabricating light-emitting elements 58 to 63 according to one embodiment of the present invention. A schematic cross-sectional view of the light-emitting elements fabricated in this example is shown in FIG. 12. Details of the element structures are shown in Tables 50 and 51. The above examples and embodiments can be referred to for the structures and abbreviations of compounds used in this example.

TABLE 50

| | Layer | Reference numeral | Thickness (nm) | Material | Weight ratio |
|---|---|---|---|---|---|
| Light-emitting element 58 | Electrode | 102 | 200 | Al | — |
| | Electron-injection layer | 130(2) | 5 | Alq3:Au | 1:0.4 |
| | | 130(1) | 5 | NBPhen:Ag | 1:0.3 |
| | Electron-transport layer | 118(2) | 10 | NBPhen | — |
| | | 118(1) | 20 | 2mDBTBPDBq-II | — |
| | Light-emitting layer | 140 | 40 | 2mDBTBPDBq-II:PCBBiF: Ir(dmdppr-dmp)$_2$(dpm) | 0.75:0.25:0.08 |
| | Hole-transport layer | 112 | 20 | PCBBiF | — |
| | Hole-injection layer | 111 | 25 | DBT3P-II:MoO$_3$ | 1:0.5 |
| | Electrode | 101 | 110 | ITSO | — |
| Light-emitting element 59 | Electrode | 102 | 200 | Al | — |
| | Electron-injection layer | 130(2) | 5 | HATNA:Au | 1:0.5 |
| | | 130(1) | 5 | NBPhen:Ag | 1:0.3 |
| | Electron-transport layer | 118(2) | 10 | NBPhen | — |
| | | 118(1) | 20 | 2mDBTBPDBq-II | — |
| | Light-emitting layer | 140 | 40 | 2mDBTBPDBq-II:PCBBiF: Ir(dmdppr-dmp)$_2$(dpm) | 0.75:0.25:0.08 |
| | Hole-transport layer | 112 | 20 | PCBBiF | — |
| | Hole-injection layer | 111 | 25 | DBT3P-II:MoO$_3$ | 1:0.5 |
| | Electrode | 101 | 110 | ITSO | — |
| Light-emitting element 60 | Electrode | 102 | 200 | Al | — |
| | Electron-injection layer | 130 | 5 | Alq3:Cu | 1:0.15 |
| | Electron-transport layer | 118(2) | 15 | NBPhen | — |
| | | 118(1) | 25 | 2mDBTBPDBq-II | — |
| | Light-emitting layer | 140 | 40 | 2mDBTBPDBq-II:PCBBiF: Ir(dmdppr-dmp)$_2$(dpm) | 0.75:0.25:0.08 |
| | Hole-transport layer | 112 | 20 | BPAFLP | — |
| | Hole-injection layer | 111 | 65 | DBT3P-II:MoO$_3$ | 1:0.5 |
| | Electrode | 101 | 70 | ITSO | — |

TABLE 51

| | Layer | Reference numeral | Thickness (nm) | Material | Weight ratio |
|---|---|---|---|---|---|
| Light-emitting element 61 | Electrode | 102 | 200 | Al | — |
| | Electron-injection layer | 130(2) | 5 | HATNA:Cu | 1:0.15 |
| | | 130(1) | 5 | NBPhen:Cu | 1:0.15 |
| | Electron-transport layer | 118(2) | 10 | NBPhen | — |
| | | 118(1) | 25 | 2mDBTBPDBq-II | — |
| | Light-emitting layer | 140 | 40 | 2mDBTBPDBq-II:PCBBiF: Ir(dmdppr-dmp)$_2$(dpm) | 0.75:0.25:0.08 |
| | Hole-transport layer | 112 | 20 | BPAFLP | — |
| | Hole-injection layer | 111 | 65 | DBT3P-II:MoO$_3$ | 1:0.5 |
| | Electrode | 101 | 70 | ITSO | — |
| Light-emitting element 62 | Electrode | 102 | 200 | Al | — |
| | Electron-injection layer | 130 | 5 | Alq3:Mn | 1:0.15 |
| | Electron-transport layer | 118(2) | 15 | NBPhen | — |
| | | 118(1) | 25 | 2mDBTBPDBq-II | — |
| | Light-emitting layer | 140 | 40 | 2mDBTBPDBq-II:PCBBiF: Ir(dmdppr-dmp)$_2$(dpm) | 0.75:0.25:0.08 |
| | Hole-transport layer | 112 | 20 | BPAFLP | — |
| | Hole-injection layer | 111 | 65 | DBT3P-II:MoO$_3$ | 1:0.5 |
| | Electrode | 101 | 70 | ITSO | — |
| Light-emitting element 63 | Electrode | 102 | 200 | Al | — |
| | Electron-injection layer | 130(2) | 5 | HATNA:Co | 1:0.15 |
| | | 130(1) | 5 | NBPhen:Ag | 1:0.3 |
| | Electron-transport layer | 118(2) | 10 | NBPhen | — |
| | | 118(1) | 25 | 2mDBTBPDBq-II | — |
| | Light-emitting layer | 140 | 40 | 2mDBTBPDBq-II:PCBBiF: Ir(dmdppr-dmp)$_2$(dpm) | 0.75:0.25:0.08 |
| | Hole-transport layer | 112 | 20 | BPAFLP | — |
| | Hole-injection layer | 111 | 65 | DBT3P-II:MoO$_3$ | 1:0.5 |
| | Electrode | 101 | 70 | ITSO | — |

<Fabrication of Light-Emitting Elements>

Fabrication methods of the light-emitting elements in this example will be described below. As a transition metal in a composite material of the transition metal and an organic compound having an unshared electron pair, which is used for an electron-injection layer, Au is used in the light-emitting elements 58 and 59, Cu is used in the light-emitting elements 60 and 61, Mn is used in the light-emitting element 62, and Co is used in the light-emitting element 63.

«<Fabrication of Light-Emitting Element 58»

As the electrode 101, an ITSO film was formed to a thickness of 110 nm over the substrate 210. Note that the electrode area of the electrode 101 was set to 4 mm$^2$ (2 mm×2 mm).

Then, as the hole-injection layer 111, DBT3P-II and molybdenum oxide ($MoO_3$) were deposited over the electrode 101 by co-evaporation in a weight ratio of DBT3P-II:$MoO_3$=1:0.5 to a thickness of 25 nm.

Then, as the hole-transport layer 112, PCBBiF was deposited over the hole-injection layer 111 by evaporation to a thickness of 20 nm.

Then, as the light-emitting layer 140, 2mDBTBPDBq-II, PCBBiF, and Ir(dmdppr-dmp)$_2$(dpm) were deposited over the hole-transport layer 112 by co-evaporation in a weight ratio of 2mDBTBPDBq-II:PCBBiF:Ir(dmdppr-dmp)$_2$(dpm)= 0.75:0.25:0.08 to a thickness of 40 nm. Note that in the light-emitting layer 140, 2mDBTBPDBq-II and PCBBiF are host materials and Ir(dmdppr-dmp)$_2$(dpm) is a guest material (a phosphorescent compound).

Next, as the electron-transport layer 118(1), 2mDBTBPDBq-II was deposited over the light-emitting layer 140 by evaporation to a thickness of 20 nm.

Next, as the electron-transport layer 118(2), NBPhen was deposited over the electron-transport layer 118(1) by evaporation to a thickness of 10 nm.

As an electron-injection layer 130(1), NBPhen and Ag were deposited over the electron-transport layer 118(2) by co-evaporation in a weight ratio of NBPhen:Ag=1:0.3 to a thickness of 5 nm.

As an electron-injection layer 130(2), Alq$_3$ and Au were deposited over the electron-injection layer 130(1) by co-evaporation in a weight ratio of Alq$_3$:Au=1:0.4 to a thickness of 5 nm.

Next, as the electrode 102, aluminum (Al) was deposited over the electron-injection layer 130(2) by evaporation to a thickness of 200 nm.

Then, heat treatment at 80° C. for one hour was performed in the air without sealing. Through the above steps, the light-emitting element 58 was obtained.

«Fabrication of Light-Emitting Element 59»

The light-emitting element 59 was fabricated through the same steps as those for the light-emitting element 58 except for the step of forming the electron-injection layer 130(2).

As the electron-injection layer 130(2) of the light-emitting element 59, HATNA and Au were deposited over the electron-injection layer 130(1) by co-evaporation in a weight ratio of HATNA:Au=1:0.5 to a thickness of 5 nm.

«Fabrication of Light-Emitting Element 60»

The light-emitting element 60 was fabricated through the same steps as those for the light-emitting element 58 except for the steps of forming the electron-transport layer 118(2) and the electron-injection layer 130.

As the electron-transport layer 118(2) of the light-emitting element 60, NBPhen was deposited over the electron-transport layer 118(1) by evaporation to a thickness of 15 nm.

As the electron-injection layer 130, Alq$_3$ and Cu were deposited over the electron-transport layer 118(2) by co-evaporation in a weight ratio of Alq$_3$:Cu=1:0.15 to a thickness of 5 nm.

«Fabrication of Light-Emitting Element 61»

The light-emitting element 61 was fabricated through the same steps as those for the light-emitting element 58 except for the step of forming the electron-injection layer 130.

As the electron-injection layer 130(1) of the light-emitting element 61, NBPhen and Cu were deposited over the electron-transport layer 118(2) by co-evaporation in a weight ratio of NBPhen:Cu=1:0.15 to a thickness of 5 nm.

As the electron-injection layer 130(2), HATNA and Cu were deposited over the electron-injection layer 130(1) by co-evaporation in a weight ratio of HATNA:Cu=1:0.15 to a thickness of 5 nm.

«Fabrication of Light-Emitting Element 62»

The light-emitting element 62 was fabricated through the same steps as those for the light-emitting element 58 except for the steps of forming the electron-transport layer 118(2) and the electron-injection layer 130.

As the electron-transport layer 118(2) of the light-emitting element 62, NBPhen was deposited over the electron-transport layer 118(1) by evaporation to a thickness of 15 nm.

As the electron-injection layer 130, Alq$_3$ and Mn were deposited over the electron-transport layer 118(2) by co-evaporation in a weight ratio of Alq$_3$:Mn=1:0.15 to a thickness of 5 nm.

«Fabrication of Light-Emitting Element 63»

The light-emitting element 63 was fabricated through the same steps as those for the light-emitting element 58 except for the step of forming the electron-injection layer 130(2).

As the electron-injection layer 130(2) of the light-emitting element 63, HATNA and Co were deposited over the electron-injection layer 130(1) by co-evaporation in a weight ratio of HATNA:Co=1:0.15 to a thickness of 5 nm.

<Characteristics of Light-Emitting Elements>

Next, the element characteristics of the fabricated light-emitting elements 58 to 63 were measured. The measurement was performed in a manner similar to that in Example 1.

Figure 94:
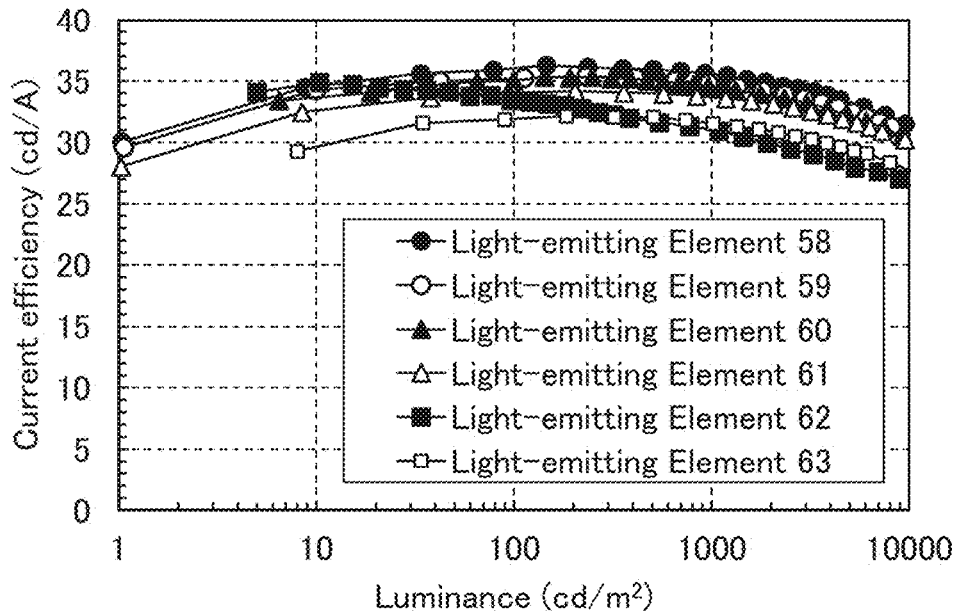
FIG. 94 shows current efficiency-luminance characteristics of light-emitting elements in Example.
Figure 95:
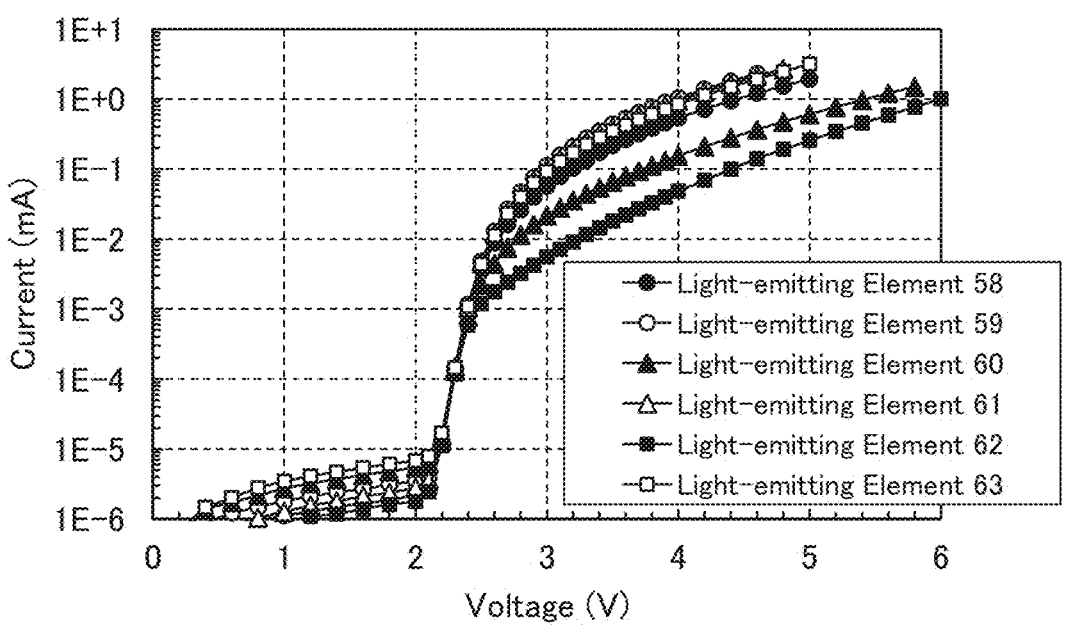
FIG. 95 shows current-voltage characteristics of light-emitting elements in Example.

FIG. 94 shows the current efficiency-luminance characteristics of the fabricated light-emitting elements 58 to 63; FIG. 95, the current-voltage characteristics thereof; and FIG. 96, the external quantum efficiency-luminance characteristics thereof. FIG. 97 shows the electroluminescence spectra of the light-emitting elements through which current flows at a current density of 2.5 mA/cm$^2$.

Table 52 shows the element characteristics of the light-emitting elements 58 to 63 at around 1000 cd/m².

TABLE 52

| | Voltage (V) | Current density (mA/cm²) | CIE chromaticity (x, y) | Luminance (cd/cm²) | Current efficiency (cd/A) | Power efficiency (lm/W) | External quantum efficiency % |
|---|---|---|---|---|---|---|---|
| Light-emitting element 58 | 3.20 | 2.60 | (0.67, 0.33) | 928 | 35.6 | 35.0 | 29.5 |
| Light-emitting element 59 | 3.00 | 2.78 | (0.67, 0.33) | 968 | 34.8 | 36.5 | 29.0 |
| Light-emitting element 60 | 3.80 | 2.79 | (0.67, 0.33) | 965 | 34.6 | 28.6 | 28.5 |
| Light-emitting element 61 | 3.00 | 2.51 | (0.67, 0.33) | 847 | 33.8 | 35.4 | 27.9 |
| Light-emitting element 62 | 4.60 | 3.53 | (0.66, 0.34) | 1091 | 30.9 | 21.1 | 24.0 |
| Light-emitting element 63 | 3.10 | 3.23 | (0.66, 0.34) | 1019 | 31.5 | 32.0 | 25.6 |

Figure 96:
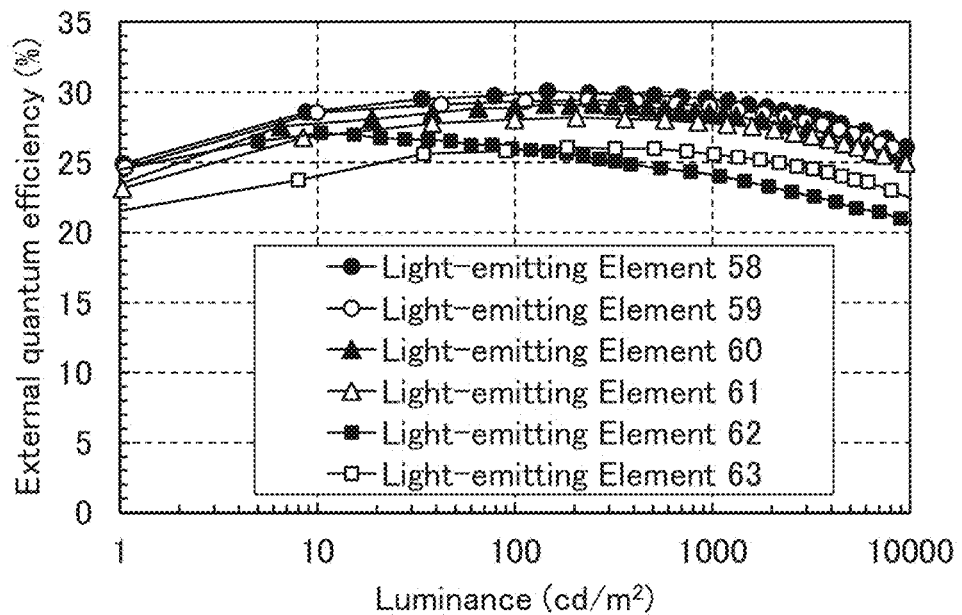
FIG. 96 shows external quantum efficiency-luminance characteristics of light-emitting elements in Example.
Figure 97:
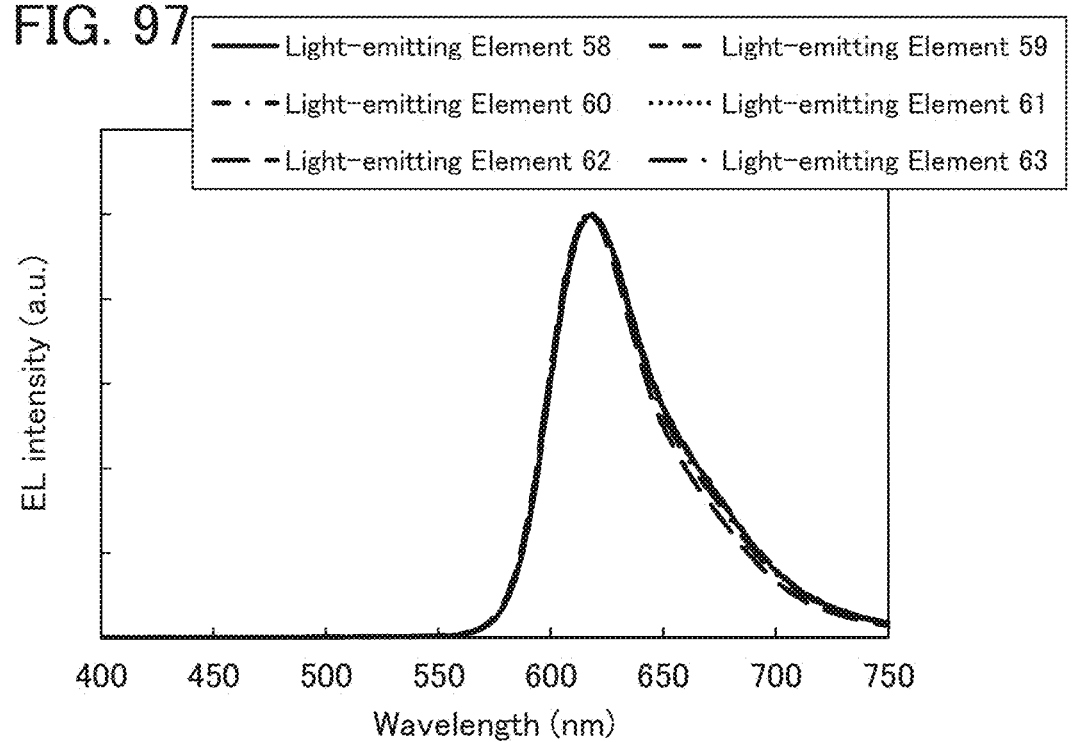
FIG. 97 shows electroluminescence spectra of light-emitting elements in Example.

As shown in FIG. 96 and Table 52, the light-emitting elements 58 to 63 each exhibited high emission efficiency with an external quantum efficiency exceeding 20%. The light-emitting elements 58 to 63 also exhibited high current efficiency as shown in FIG. 94 and Table 52.

As shown in FIG. 95, the light-emitting elements 58 to 63 exhibited favorable current-voltage characteristics, indicating that in the electron-injection layer, Au, Cu, Mn, or Co can be used as a transition metal in a composite material of the transition metal and an organic compound having an unshared electron pair.

As shown in FIG. 97, the light-emitting elements 58 to 63 each exhibited red emission whose electroluminescence spectrum has a peak wavelength at approximately 618 nm and a full width at half maximum of approximately 57 nm. The obtained electroluminescence spectrum reveals that the light is emitted from the guest material, Ir(dmdppr-dmp)$_2$(dmp).

<Reliability Test of Light-Emitting Elements>

A preservation test under constant temperature and humidity was performed on the light-emitting elements 58 to 63. Since each of the light-emitting elements is not sealed, the cathode and the EL layer are exposed to the atmosphere of the test environment. The measurement was performed in a manner similar to that in the above example.

The emission state was evaluated by calculating the proportion of the emission area before and after the preservation test under constant temperature and humidity. The preservation test under constant temperature and humidity was performed on three samples of each of the light-emitting elements 58 to 63. Table 53 shows the average emission area of the three samples.

TABLE 53

| | Proportion of emission area |
|---|---|
| Light-emitting element 58 | 83% |
| Light-emitting element 59 | 84% |
| Light-emitting element 60 | 75% |
| Light-emitting element 61 | 67% |
| Light-emitting element 62 | 76% |
| Light-emitting element 63 | 87% |

The light-emitting elements 58 to 63 according to one embodiment of the present invention each maintain an emission area proportion greater than or equal to 65% after the preservation test under constant temperature and humidity, indicating that the light-emitting elements 58 to 63 have favorable moisture resistance. Hence, Au, Cu, Mn, or Co can be favorably used in the light-emitting elements according to one embodiment of the present invention.

From the above, Au, Cu, Mn, or Co can be used in the light-emitting elements according to one embodiment of the present invention. The structures shown in this example can be used in appropriate combination with any of the other embodiments and examples.

Example 17

Described in this example are examples of fabricating light-emitting elements 65 and 66 according to one embodiment of the present invention and a comparative light-emitting element 64. A schematic cross-sectional view of the light-emitting elements fabricated in this example is shown in FIG. 12. Details of the element structures are shown in Table 54. The above examples and embodiments can be referred to for the structures and abbreviations of compounds used in this example.

TABLE 54

| | Layer | Reference numeral | Thickness (nm) | Material | Weight ratio |
|---|---|---|---|---|---|
| Comparative light-emitting element 64 | Electrode | 102 | 200 | Al | — |
| | Electron-injection layer | 130 | 0.2 | Li$_2$O | — |
| | Electron-transport layer | 118(2) | 20 | NBPhen | — |
| | | 118(1) | 5 | cgDBCzPA | — |
| | Light-emitting layer | 140 | 25 | cgDBCzPA: 1,6mMemFLPAPrn | 1:0.03 |
| | Hole-transport layer | 112 | 20 | PCPPn | — |
| | Hole-injection layer | 111 | 20 | DBT3P-II:MoO$_3$ | 1:0.5 |
| | Electrode | 101 | 70 | ITSO | — |

TABLE 54-continued

| | Layer | Reference numeral | Thickness (nm) | Material | Weight ratio |
|---|---|---|---|---|---|
| Comparative light-emitting element 65 | Electrode | 102 | 200 | Al | — |
| | Electron-injection layer | 130(2) | 5 | Alq:Ag | 1:0.3 |
| | | 130(1) | 5 | NBPhen:Ag | 1:0.3 |
| | Electron-transport layer | 118(2) | 10 | NBPhen | — |
| | | 118(1) | 5 | cgDBCzPA | — |
| | Light-emitting layer | 140 | 25 | cgDBCzPA: 1,6mMemFLPAPrn | 1:0.03 |
| | Hole-transport layer | 112 | 20 | PCPPn | — |
| | Hole-injection layer | 111 | 20 | DBT3P-II:MoO$_3$ | 1:0.5 |
| | Electrode | 101 | 70 | ITSO | — |
| Comparative light-emitting element 66 | Electrode | 102 | 200 | Al | — |
| | Electron-injection layer | 130(2) | 5 | HATNA:Ag | 1:0.3 |
| | | 130(1) | 5 | NBPhen:Ag | 1:0.3 |
| | Electron-transport layer | 118(2) | 10 | NBPhen | — |
| | | 118(1) | 5 | cgDBCzPA | — |
| | Light-emitting layer | 140 | 25 | cgDBCzPA: 1,6mMemFLPAPrn | 1:0.03 |
| | Hole-transport layer | 112 | 20 | PCPPn | — |
| | Hole-injection layer | 111 | 20 | DBT3P-II:MoO$_3$ | 1:0.5 |
| | Electrode | 101 | 70 | ITSO | — |

<Fabrication of Light-Emitting Elements>

Fabrication methods of the light-emitting elements in this example will be described below. The light-emitting elements shown in this example emit fluorescence.

«<Fabrication of Comparative Light-Emitting Element 64»

As the electrode 101, an JTSO film was formed to a thickness of 70 nm over the substrate 210. Note that the electrode area of the electrode 101 was set to 4 mm$^2$ (2 mm×2 mm).

Then, as the hole-injection layer 111, DBT3P-JJ and molybdenum oxide (MoO$_3$) were deposited over the electrode 101 by co-evaporation in a weight ratio of DBT3P-JJ:MoO$_3$=1:0.5 to a thickness of 20 nm.

Then, as the hole-transport layer 112, PCPPn was deposited over the hole-injection layer 111 by evaporation to a thickness of 20 nm.

Then, as the light-emitting layer 140, cgDBCzPA and 1,6mMemFLPAPrn were deposited over the hole-transport layer 112 by co-evaporation in a weight ratio of cgDBCzPA:1,6mMemFLPAPrn=1:0.03 to a thickness of 25 nm. Note that in the light-emitting layer 140, cgDBCzPA is a host material and 1,6mMemFLPAPrn is a guest material (a fluorescent compound).

Next, as the electron-transport layer 118(1), cgDBCzPA was deposited over the light-emitting layer 140 by evaporation to a thickness of 5 nm.

Then, as the electron-transport layer 118(2), NBPhen was deposited over the electron-transport layer 118(1) by evaporation to a thickness of 20 nm.

As the electron-injection layer 130, Li$_2$O was deposited over the electron-transport layer 118(2) by evaporation to a thickness of 0.2 nm.

Next, as the electrode 102, aluminum (Al) was deposited over the electron-injection layer 130(2) by evaporation to a thickness of 200 nm.

Then, heat treatment at 80° C. for one hour was performed in the air without sealing. Through the above steps, the light-emitting element 58 was obtained.

«Fabrication of Light-Emitting Element 65»

The light-emitting element 65 was fabricated through the same steps as those for the comparative light-emitting element 64 except for the steps of forming the electron-transport layer 118(2) and the electron-injection layer 130.

As the electron-transport layer 118(2) of the light-emitting element 65, NBPhen was deposited over the electron-transport layer 118(1) by evaporation to a thickness of 10 nm.

As the electron-injection layer 130(1), NBPhen and Ag were deposited over the electron-transport layer 118(2) by co-evaporation in a weight ratio of NBPhen:Ag=1:0.3 to a thickness of 5 nm.

As the electron-injection layer 130(2), Alq$_3$ and Ag were deposited over the electron-injection layer 130(1) by co-evaporation in a weight ratio of Alq$_3$:Ag=1:0.3 to a thickness of 5 nm.

«Fabrication of Light-Emitting Element 66»

The light-emitting element 66 was fabricated through the same steps as those for the light-emitting element 65 except for the step of forming the electron-injection layer 130.

As the electron-injection layer 130, HATNA and Ag were deposited over the electron-transport layer 118(2) by co-evaporation in a weight ratio of HATNA:Ag=1:0.3 to a thickness of 5 nm.

<Characteristics of Light-Emitting Elements>

Next, the element characteristics of the fabricated comparative light-emitting element 64 and light-emitting elements 65 and 66 were measured. The measurement was performed in a manner similar to that in Example 1.

Figure 98:
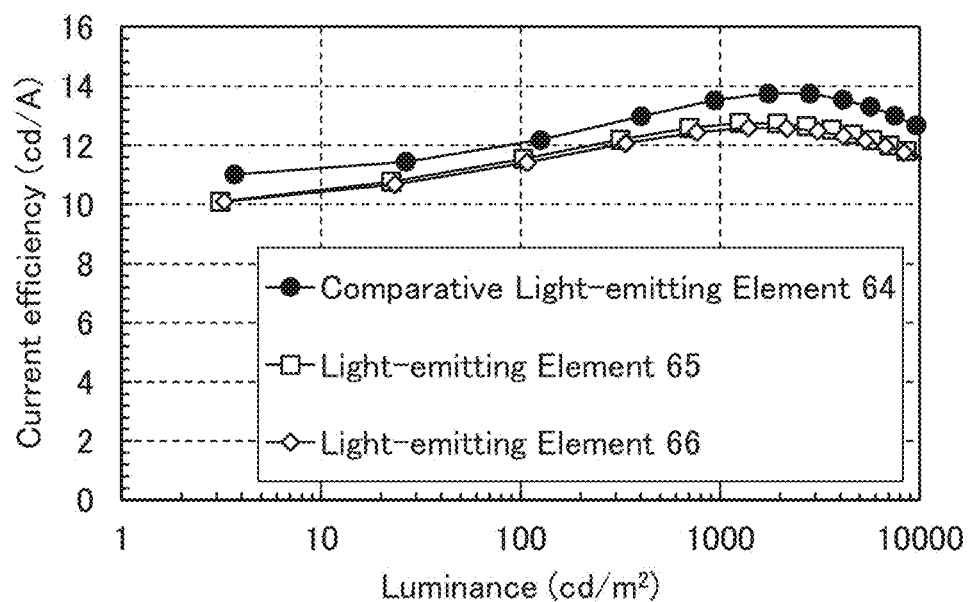
FIG. 98 shows current efficiency-luminance characteristics of light-emitting elements in Example.
Figure 99:
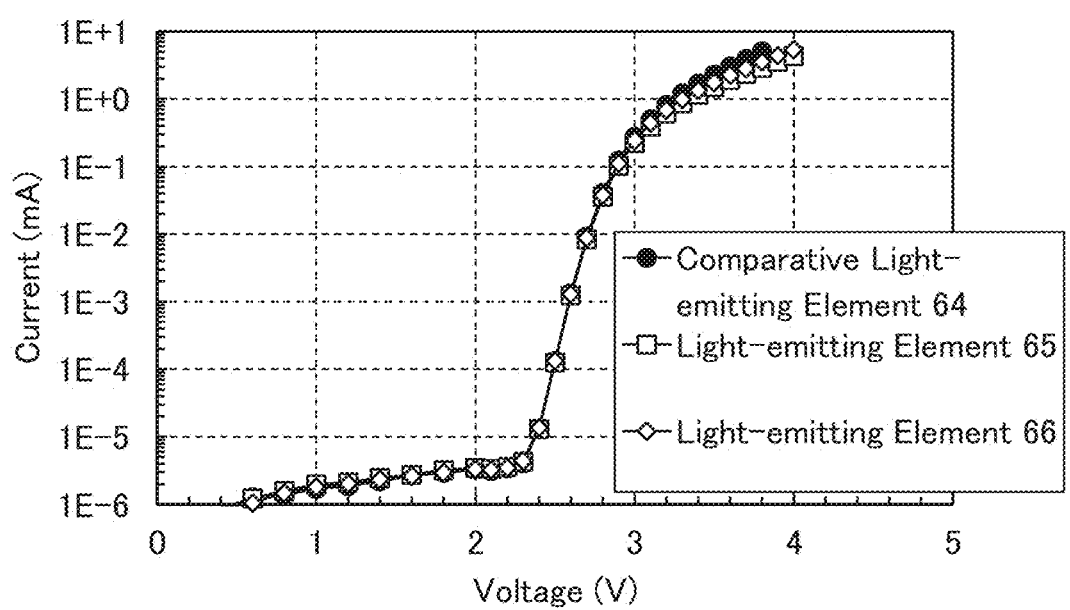
FIG. 99 shows current-voltage characteristics of light-emitting elements in Example.

FIG. 98 shows the current efficiency-luminance characteristics of the fabricated comparative light-emitting element 64 and light-emitting elements 65 and 66; FIG. 99, the current-voltage characteristics thereof; and FIG. 100, the external quantum efficiency-luminance characteristics thereof. FIG. 101 shows the electroluminescence spectra of the light-emitting elements through which current flows at a current density of 2.5 mA/cm$^2$.

Table 55 shows the element characteristics of the comparative light-emitting element 64 and the light-emitting elements 65 and 66 at around 1000 cd/m$^2$.

TABLE 55

|  | Voltage (V) | Current density (mA/cm²) | CIE chromaticity (x, y) | Luminance (cd/cm²) | Current efficiency (cd/A) | Power efficiency (lm/W) | External quantum efficiency (%) |
|---|---|---|---|---|---|---|---|
| Comparative light-emitting element 64 | 3.00 | 6.92 | (0.14, 0.17) | 936 | 13.5 | 14.2 | 11.1 |
| Light-emitting element 65 | 3.10 | 9.82 | (0.14, 0.17) | 1252 | 12.8 | 12.9 | 10.4 |
| Light-emitting element 66 | 3.00 | 6.14 | (0.14, 0.17) | 763 | 12.4 | 13.0 | 10.2 |

Figure 100:
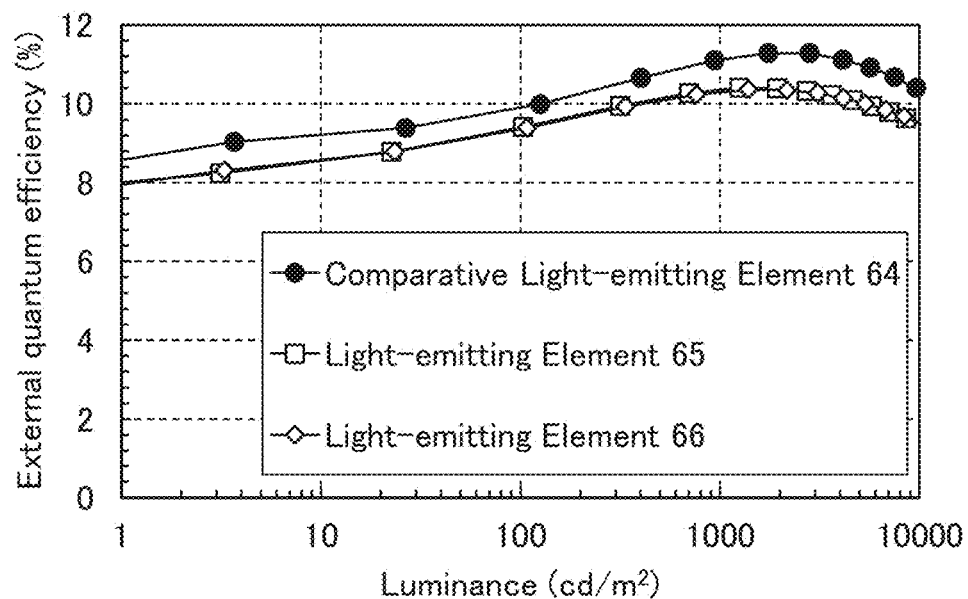
FIG. 100 shows external quantum efficiency-luminance characteristics of light-emitting elements in Example.
Figure 101:
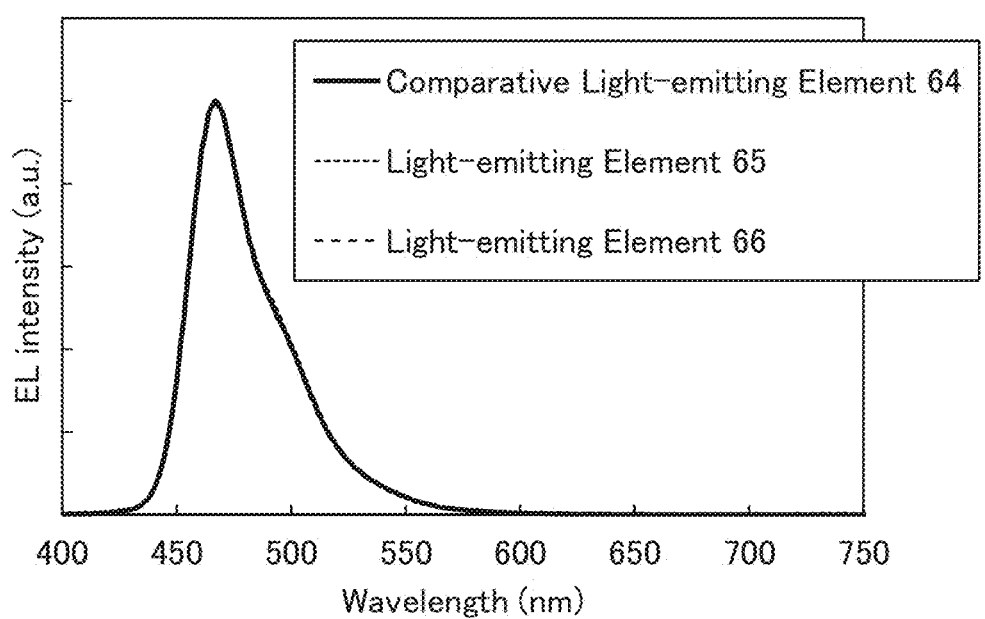
FIG. 101 shows electroluminescence spectra of light-emitting elements in Example.

As shown in FIG. 100 and Table 55, although the comparative light-emitting element 64 and the light-emitting elements 65 and 66 are fluorescent elements, each of them exhibited high emission efficiency with an external quantum efficiency exceeding 10%. The comparative light-emitting element 64 and the light-emitting elements 65 and 66 also exhibited high current efficiency as shown in FIG. 98. In addition, the light-emitting elements 65 and 66 according to one embodiment of the present invention exhibited high efficiency equivalent to that of the comparative light-emitting element 64, which uses $Li_2O$ typically used for the electron-injection layer.

As shown in FIG. 99, the comparative light-emitting element 64 and the light-emitting elements 65 and 66 exhibited favorable current-voltage characteristics. It was also found that the light-emitting elements 65 and 66 according to one embodiment of the present invention had electron-injection properties equivalent to those of the comparative light-emitting element 64, which uses $Li_2O$ typically used for the electron-injection layer.

As shown in FIG. 101, the comparative light-emitting element 64 and the light-emitting elements 65 and 66 each exhibited blue emission whose electroluminescence spectrum has a peak wavelength at approximately 466 nm and a full width at half maximum of approximately 40 nm. The obtained electroluminescence spectrum reveals that the light is emitted from the guest material, 1,6mMemFLPAPrn.

<Reliability Test of Light-Emitting Elements>

A preservation test under constant temperature and humidity was performed on the comparative light-emitting element 64 and the light-emitting elements 65 and 66. Since each of the light-emitting elements is not sealed, the cathode and the EL layer are exposed to the atmosphere of the test environment. The measurement was performed in a manner similar to that in the above example.

The emission state was evaluated by calculating the proportion of the emission area before and after the preservation test under constant temperature and humidity. The preservation test under constant temperature and humidity was performed on six samples of each of the comparative light-emitting element 64 and the light-emitting elements 65 and 66. Table 56 shows the average emission area of the top three samples having a high proportion of emission area.

TABLE 56

|  | Proportion of emission area |
|---|---|
| Comparative light-emitting element 64 | 0% |
| Light-emitting element 65 | 79% |
| Light-emitting element 66 | 82% |

The light-emitting elements 65 and 66 according to one embodiment of the present invention each maintain an emission area proportion of approximately 80% after the preservation test under constant temperature and humidity, indicating that the light-emitting elements 65 and 66 have favorable moisture resistance. Table 56 also shows that the moisture resistance of the light-emitting elements 65 and 66 is improved more than the comparative light-emitting element 64. Hence, the light-emitting element according to one embodiment of the present invention can have favorable moisture resistance when applied to the fluorescent element.

Example 18

Described in this example are examples of fabricating light-emitting elements 68 and 69 according to one embodiment of the present invention and a comparative light-emitting element 67. A schematic cross-sectional view of the light-emitting elements fabricated in this example is shown in FIG. 3B. Details of the element structures are shown in Tables 57 and 58. The above examples and embodiments can be referred to for the structures and abbreviations of compounds used in this example. Note that the comparative light-emitting element 67 uses a Li compound for the electron-injection layer 114 that is contact with the charge-generation layer 115, and the light-emitting elements 68 and 69 are light-emitting elements according to one embodiment of the present invention, each of which uses a composite material of a transition metal and an organic compound for the electron-injection layer 114.

TABLE 57

|  | Layer | Reference numeral | Thickness (nm) | Material | Weight ratio |
|---|---|---|---|---|---|
| Comparative light-emitting element 67 | Electrode | 102 | 200 | Al | — |
|  | Electron-injection layer | 130 | 5 | NBPhen:Cu | 1:0.2 |
|  | Electron-transport layer | 118(2) | 10 | NBPhen | — |
|  |  | 118(1) | 25 | 2mDBTBPDBq-II | — |
|  | Light-emitting layer | 140 | 40 | 2mDBTBPDBq-II:PCBBiF: Ir(dmdppr-dmp)$_2$(dpm) | 0.75:0.25:0.08 |
|  | Hole-transport layer | 119 | 20 | PCBBiF | — |
|  | Charge-generation layer | 115 | 80 | DBT3P-II:MoO$_3$ | 1:0.5 |
|  | Electron-injection layer | 114 | 0.2 | Li$_2$O | — |

TABLE 57-continued

| | Layer | Reference numeral | Thickness (nm) | Material | Weight ratio |
|---|---|---|---|---|---|
| | Electron-transport layer | 113(2) | 20 | NBPhen | — |
| | | 113(1) | 10 | 2mDBTBPDBq-II | — |
| | Light-emitting layer | 170 | 40 | 2mDBTBPDBq-II:PCBBiF: Ir(dmdppr-dmp)$_2$(dpm) | 0.75:0.25:0.08 |
| | Hole-transport layer | 112 | 20 | PCBBiF | — |
| | Hole-injection layer | 111 | 25 | DBT3P-II:MoO$_3$ | 1:0.5 |
| | Electrode | 101 | 110 | ITSO | — |
| Light-emitting element 68 | Electrode | 102 | 200 | Al | — |
| | Electron-injection layer | 130 | 5 | NBPhen:Cu | 1:0.2 |
| | Electron-transport layer | 118(2) | 10 | NBPhen | — |
| | | 118(1) | 25 | 2mDBTBPDBq-II | — |
| | Light-emitting layer | 140 | 40 | 2mDBTBPDBq-II:PCBBiF: Ir(dmdppr-dmp)$_2$(dpm) | 0.75:0.25:0.08 |
| | Hole-transport layer | 119 | 20 | PCBBiF | — |
| | Charge-generation layer | 115 | 80 | DBT3P-II:MoO$_3$ | 1:0.5 |
| | Electron-injection layer | 114 | 5 | NBPhen:Cu | 1:0.2 |
| | Electron-transport layer | 113(2) | 15 | NBPhen | — |
| | | 113(1) | 10 | 2mDBTBPDBq-II | — |
| | Light-emitting layer | 170 | 40 | 2mDBTBPDBq-II:PCBBiF: Ir(dmdppr-dmp)$_2$(dpm) | 0.75:0.25:0.08 |
| | Hole-transport layer | 112 | 20 | PCBBiF | — |
| | Hole-injection layer | 111 | 25 | DBT3P-II:MoO$_3$ | 1:0.5 |
| | Electrode | 101 | 110 | ITSO | — |

TABLE 58

| | Layer | Reference numeral | Thickness (nm) | Material | Weight ratio |
|---|---|---|---|---|---|
| Light-emitting element 69 | Electrode | 102 | 200 | Al | — |
| | Electron-injection layer | 130 | 1 | LiF | — |
| | Electron-transport layer | 118(2) | 15 | NBPhen | — |
| | | 118(1) | 25 | 2mDBTBPDBq-II | — |
| | Light-emitting layer | 140 | 40 | 2mDBTBPDBq-II:PCBBiF: Ir(dmdppr-dmp)$_2$(dpm) | 0.75:0.25:0.08 |
| | Hole-transport layer | 119 | 20 | PCBBiF | — |
| | Charge-generation layer | 115 | 80 | DBT3P-II:MoO$_3$ | 1:0.5 |
| | Electron-injection layer | 114 | 5 | NBPhen:Mn | 1:0.15 |
| | Electron-transport layer | 113(2) | 15 | NBPhen | — |
| | | 113(1) | 10 | 2mDBTBPDBq-II | — |
| | Light-emitting layer | 170 | 40 | 2mDBTBPDBq-II:PCBBiF: Ir(dmdppr-dmp)$_2$(dpm) | 0.75:0.25:0.08 |
| | Hole-transport layer | 112 | 20 | PCBBiF | — |
| | Hole-injection layer | 111 | 25 | DBT3P-II:MoO$_3$ | 1:0.5 |
| | Electrode | 101 | 110 | ITSO | — |

«<Fabrication of Comparative Light-Emitting Element 67»

As the electrode 101, an JTSO film was formed to a thickness of 110 nm. Note that the electrode area of the electrode 101 was set to 4 mm$^2$ (2 mm×2 mm).

Then, as the hole-injection layer 111, DBT3P-JJ and molybdenum oxide (MoO$_3$) were deposited over the electrode 101 by co-evaporation in a weight ratio of DBT3P-JJ:MoO$_3$=1:0.5 to a thickness of 25 nm.

Then, as the hole-transport layer 112, PCBBiF was deposited over the hole-injection layer 111 by evaporation to a thickness of 20 nm.

Then, as the light-emitting layer 170, 2mDBTBPDBq-JJ, PCBBiF, and Jr(dmdppr-dmp)$_2$(dpm) were deposited over the hole-transport layer 112 by co-evaporation in a weight ratio of 2mDBTBPDBq-JJ:PCBBiF:Jr(dmdppr-dmp)$_2$(dpm)= 0.75:0.25:0.08 to a thickness of 40 nm. Note that in the light-emitting layer 170, 2mDBTBPDBq-JJ and PCBBiF are host materials and Jr(dmdppr-dmp)$_2$(dpm) is a guest material (a phosphorescent compound).

Next, as an electron-transport layer 113(1), 2mDBTBPDBq-JJ was deposited over the light-emitting layer 170 by evaporation to a thickness of 10 nm.

Then, as an electron-transport layer 113(2), NBPhen was deposited over the electron-transport layer 113(1) by evaporation to a thickness of 20 nm.

As the electron-injection layer 114, Li$_2$O was deposited over the electron-transport layer 113(2) by evaporation to a thickness of 0.2 nm.

Then, as the charge-generation layer 115, DBT3P-II and MoO$_3$ were deposited over the electron-injection layer 114 by co-evaporation in a weight ratio of DBT3P-II:MoO$_3$=1: 0.5 to a thickness of 80 nm.

Then, as the hole-transport layer 119, PCBBiF was deposited over the charge-generation layer 115 by evaporation to a thickness of 20 nm.

Then, as the light-emitting layer 140, 2mDBTBPDBq-II, PCBBiF, and Ir(dmdppr-dmp)$_2$(dpm) were deposited over the hole-transport layer 119 by co-evaporation in a weight ratio of 2mDBTBPDBq-II:PCBBiF:Ir(dmdppr-dmp)$_2$(dpm) =0.75:0.25:0.08 to a thickness of 40 nm. Note that in the light-emitting layer 140, 2mDBTBPDBq-II and PCBBiF are host materials and Ir(dmdppr-dmp)$_2$(dpm) is a guest material (a phosphorescent compound).

Next, as the electron-transport layer 118(1), 2mDBT-BPDBq-II was deposited over the light-emitting layer 140 by evaporation to a thickness of 25 nm.

Then, as the electron-transport layer 118(2), NBPhen was deposited over the electron-transport layer 118(1) by evaporation to a thickness of 10 nm.

As the electron-injection layer 130, NBPhen and Cu were deposited over the electron-transport layer 118(2) by co-evaporation in a weight ratio of NBPhen:Cu=1:0.2 to a thickness of 5 nm.

Next, as the electrode 102, aluminum (Al) was deposited over the electron-injection layer 130 by evaporation to a thickness of 200 nm.

Next, in a glove box containing a nitrogen atmosphere, the light-emitting element 67 was sealed by fixing a sealing substrate to the substrate over which the organic compound was deposited using a sealant for an organic EL device. The sealing was performed in a manner similar to that in the above example. Through the above steps, the comparative light-emitting element 67 was obtained.

«Fabrication of Light-Emitting Element 68»

The light-emitting element 68 was fabricated through the same steps as those for the comparative light-emitting element 67 except for the steps of forming the electron-transport layer 113(2) and the electron-injection layer 114.

As the electron-transport layer 113(2) of the light-emitting element 68, NBPhen was deposited over the electron-transport layer 113(1) by evaporation to a thickness of 15 nm.

As the electron-injection layer 114, NBPhen and Cu were deposited over the electron-transport layer 113(2) by co-evaporation in a weight ratio of NBPhen:Cu=1:0.2 to a thickness of 5 nm.

«Fabrication of light-emitting element 69»

The light-emitting element 69 was fabricated through the same steps as those for the comparative light-emitting element 67 except for the steps of forming the electron-transport layer 113(2), the electron-injection layer 114, and the electron-injection layer 130.

As the electron-transport layer 113(2) of the light-emitting element 69, NBPhen was deposited over the electron-transport layer 113(1) by evaporation to a thickness of 15 nm.

As the electron-injection layer 114, NBPhen and Mn were deposited over the electron-transport layer 113(2) by co-evaporation in a weight ratio of NBPhen:Mn=1:0.15 to a thickness of 5 nm.

As the electron-injection layer 130, LiF was deposited over the electron-transport layer 113(2) by evaporation to a thickness of 1 nm.

<Characteristics of Light-Emitting Elements>

Next, the element characteristics of the fabricated comparative light-emitting element 67 and light-emitting elements 68 and 69 were measured. The measurement was performed in a manner similar to that in Example 1.

Figure 102:
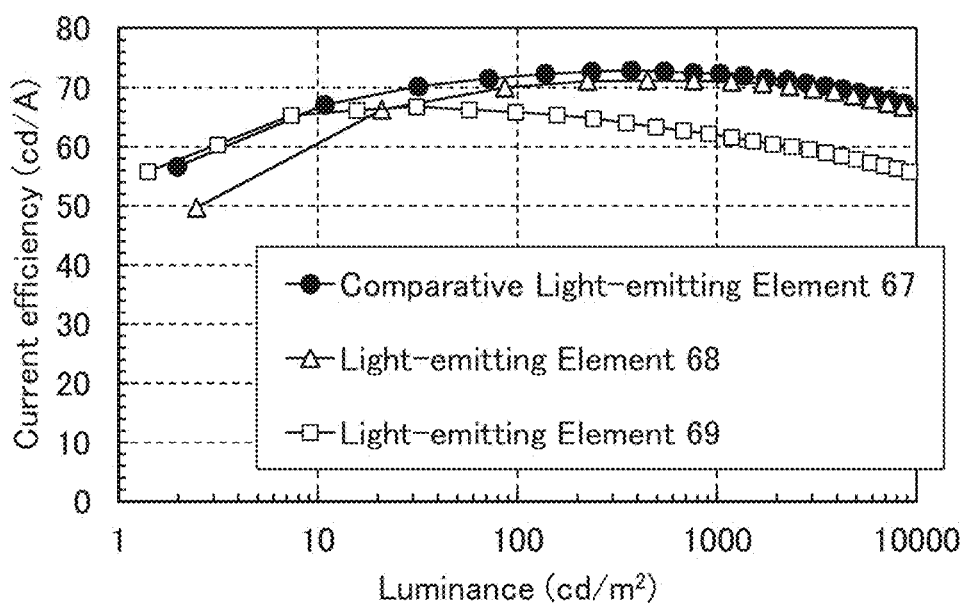
FIG. 102 shows current efficiency-luminance characteristics of light-emitting elements in Example.
Figure 103:
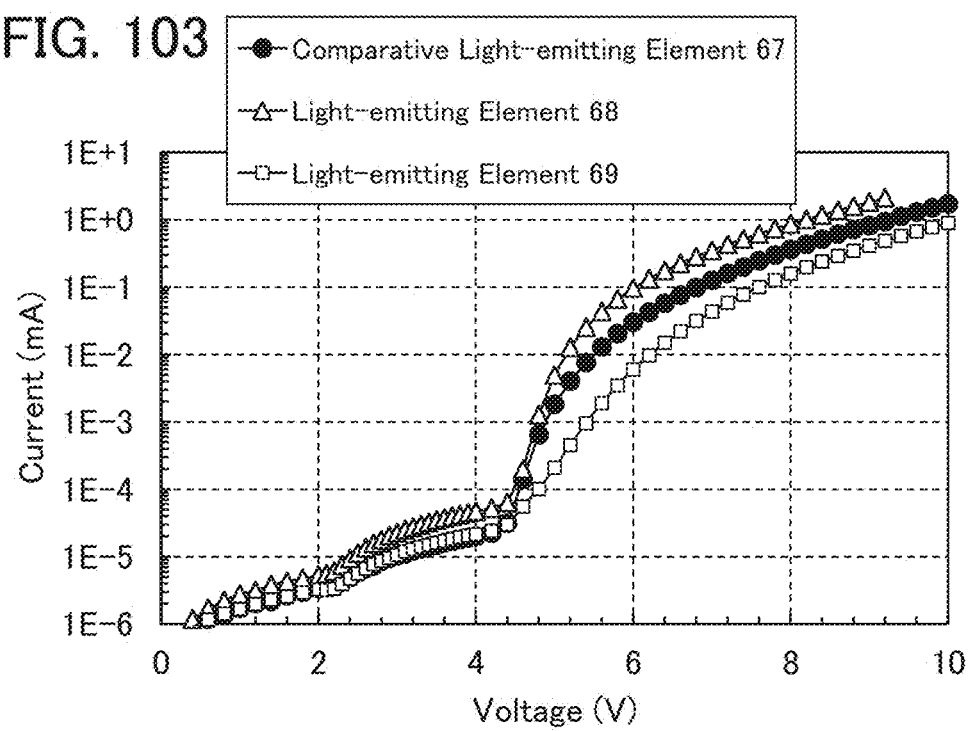
FIG. 103 shows current-voltage characteristics of light-emitting elements in Example.

FIG. 102 shows the current efficiency-luminance characteristics of the fabricated comparative light-emitting element 67 and light-emitting elements 68 and 69; FIG. 103, the current-voltage characteristics thereof; and FIG. 104, the external quantum efficiency-luminance characteristics thereof. FIG. 105 shows the electroluminescence spectra of the light-emitting elements through which current flows at a current density of 2.5 mA/cm$^2$.

Table 59 shows the element characteristics of the comparative light-emitting element 67 and the light-emitting elements 68 and 69 at around 1000 cd/m$^2$.

TABLE 59

|  | Voltage (V) | Current density (mA/cm$^2$) | CIE chromaticity (x, y) | Luminance (cd/cm$^2$) | Current efficiency (cd/A) | Power efficiency (lm/W) | External quantum efficiency (%) |
|---|---|---|---|---|---|---|---|
| Comparative light-emitting element 67 | 6.40 | 1.43 | (0.68, 0.33) | 1036 | 72.3 | 35.5 | 55.2 |
| Light-emitting element 68 | 5.80 | 1.67 | (0.68, 0.33) | 1182 | 71.0 | 38.4 | 54.9 |
| Light-emitting element 69 | 7.20 | 1.46 | (0.66, 0.34) | 908 | 62.2 | 27.2 | 44.1 |

Figure 104:
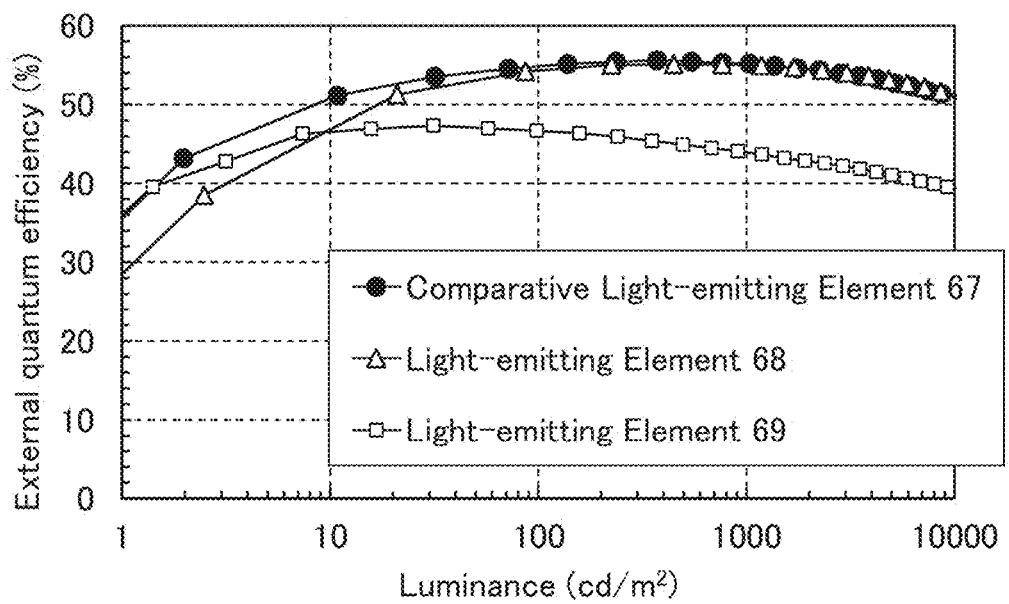
FIG. 104 shows external quantum efficiency-luminance characteristics of light-emitting elements in Example.
Figure 105:
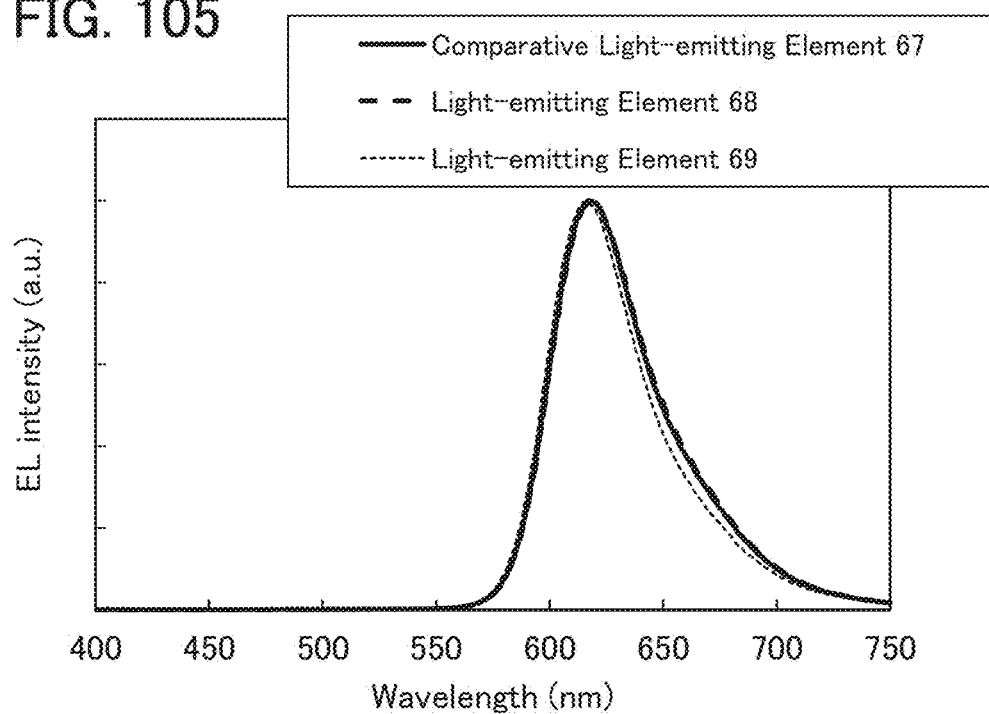
FIG. 105 shows electroluminescence spectra of light-emitting elements in Example.

As shown in FIG. 104 and Table 59, the comparative light-emitting element 67 and the light-emitting elements 68 and 69 each exhibited high emission efficiency with an external quantum efficiency exceeding 40%. The comparative light-emitting element 67 and the light-emitting elements 68 and 69 also exhibited high current efficiency as shown in FIG. 102.

As shown in FIG. 103, the comparative light-emitting element 67 and the light-emitting elements 68 and 69 exhibited favorable current-voltage characteristics, indicating that in the electron-injection layer 114, Cu or Mn can be used as a transition metal in a composite material of the transition metal and an organic compound having an unshared electron pair.

As shown in FIG. 105, the comparative light-emitting element 67 and the light-emitting elements 68 and 69 each exhibited red emission whose electroluminescence spectrum has a peak wavelength at approximately 618 nm and a full width at half maximum of approximately 53 nm. The obtained electroluminescence spectrum reveals that the light is emitted from the guest material, Ir(dmdppr-dmp)$_2$(dmp).

<Reliability Test of Light-Emitting Elements>

Figure 106:
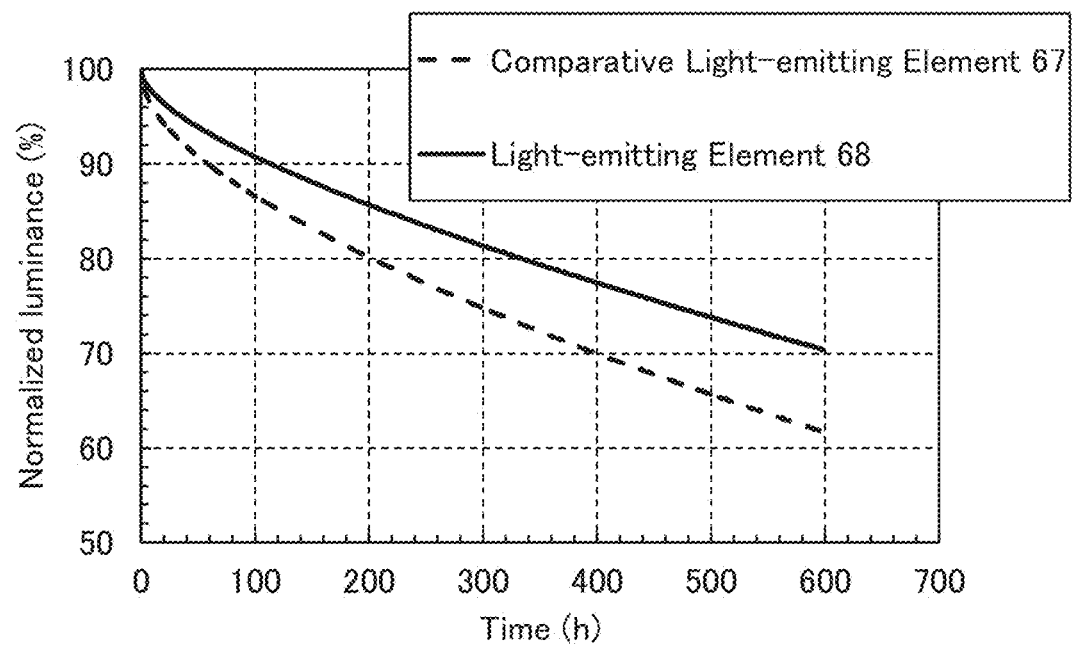
FIG. 106 shows results of driving lifetime tests of light-emitting elements in Example.

Next, driving lifetime tests of the comparative light-emitting element 67 and the light-emitting element 68 were performed. The measurement results of the driving lifetime tests are shown in FIG. 106. Note that in the driving lifetime tests, each light-emitting element was continuously driven at a constant current density of 25 mA/cm$^2$.

As shown in FIG. 106, the light-emitting element 68 exhibited a longer driving lifetime than the comparative light-emitting element 67. This indicates that the light-emitting element using the composite material of an organic compound and a transition metal for the electron-injection layer 114 has favorable reliability.

Example 19

Described in this example are the ESR measurement results of thin films made with a composite material of an organic compound and a transition metal.

<Fabrication of Thin Films for ESR Measurement>

Fabrication methods of thin films for ESR measurement will be described below.

As a thin film 1, NBPhen and Ag were deposited over a quartz substrate by vacuum evaporation in a weight ratio of NBPhen:Ag=1:0.19 to a thickness of 100 nm. Note that the molar ratio of NBPhen to Ag was set to 1:1.

As a thin film 2, NBPhen and Cu were formed in a weight ratio of NBPhen:Cu=1:0.11 to a thickness of 100 nm.

As a thin film 3, HATNA and Ag were formed in a weight ratio of HATNA:Ag=1:0.28 to a thickness of 100 nm.

As a thin film 4, HATNA and Cu were formed in a weight ratio of HATNA:Cu=1:0.17 to a thickness of 100 nm.

As a thin film 5, HATNA and Au were formed in a weight ratio of HATNA:Au=1:0.52 to a thickness of 100 nm.

As a comparative thin film 6, NBPhen and Li were formed in a weight ratio of NBPhen:Li=1:0.015 to a thickness of 100 nm.

As a comparative thin film 7, NBPhen and $Li_2O$ were formed in a weight ratio of NBPhen:$Li_2O$=1:0.05 to a thickness of 100 nm.

As a comparative thin film 8 made with an organic compound alone, NBPhen was deposited over a quartz substrate by vacuum evaporation to a thickness of 100 nm.

The ESR was measured with an electron spin resonance spectrometer (E500, produced by Hitachi High-Technologies Corporation). The measurement conditions were as follows: the measurement temperature was room temperature (23° C.); 1 mW of high-frequency power (microwave power) with 9.2 GHz was applied; and the direction of a magnetic field was parallel to the surface of the thin film.

Figure 107:
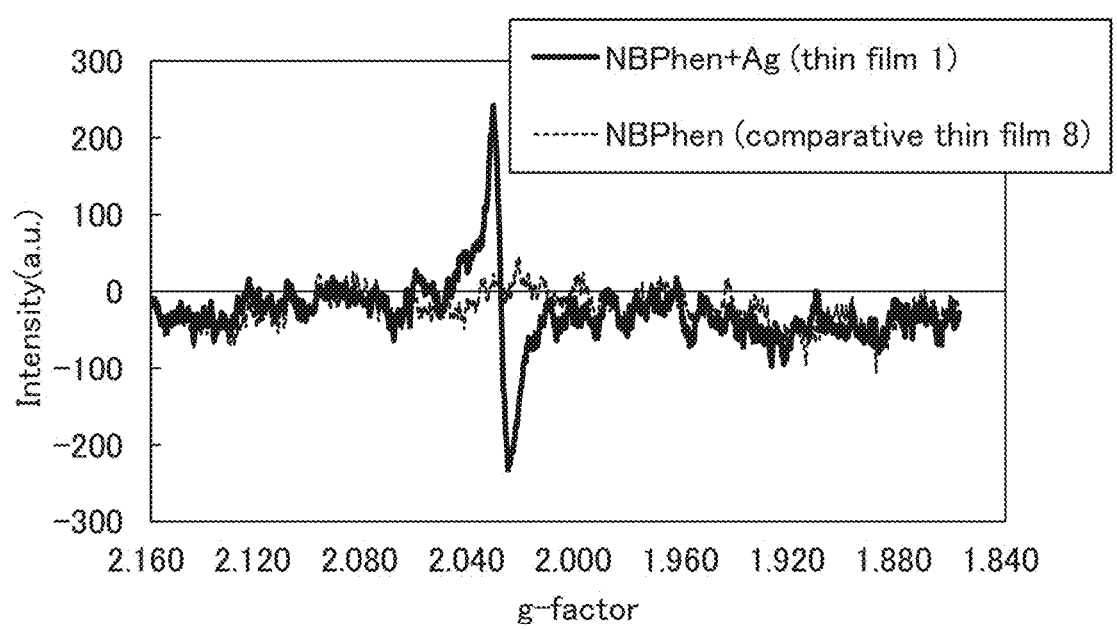
FIG. 107 shows electron spin resonance (ESR) measurement results.

FIG. 107 shows first derivative curves obtained by measuring the thin film 1 and the comparative thin film 8 by ESR. In FIG. 107, signals originating from SOMO, which was formed by interaction of NBPhen and Ag, were observed at approximately g=2.029 in the thin film 1. In contrast, no signal was observed in the comparative thin film 8.

Table 60 shows spin densities that were calculated from the ESR measurement results of the thin films 1 to 5 and the comparative thin films 6 to 8. The thin films 1 to 5 and the comparative thin films 6 and 7 each had a spin density greater than or equal to $1 \times 10^{17}$ spins/$cm^3$. Hence, the thin films 1 to 5 that can be used in one embodiment of the present invention can be favorably used for the electron-injection layer 130 and the electron-injection layer 114 in FIGS. 3A and 3B.

TABLE 60

| | Spin density [spins/$cm^3$] |
|---|---|
| NBPhen (Comparative thin film 8) | — |
| NBPhen + Ag (Thin film 1) | 2.3E+17 |
| NBPhen + Cu (Thin film 2) | 2.3E+18 |
| HATNA + Ag (Thin film 3) | 3.3E+17 |
| HATNA + Cu (Thin film 4) | 5.1E+18 |
| HATNA + Au (Thin film 5) | 1.2E+19 |
| NBPhen + Li (Comparative thin film 6) | 6.5E+17 |
| NBPhen + $Li_2O$ (Comparative thin film 7) | 6.2E+17 |

The thin films 1 and 3 each had a spin density less than or equal to $5 \times 10^{17}$ spins/$cm^3$. Hence, the thin films 1 and 3 that can be used in one embodiment of the present invention can be favorably used for the charge-generation layer and can effectively reduce crosstalk.

Example 20

Described in this example are examples of fabricating light-emitting elements 70 to 73 according to one embodiment of the present invention and a comparative light-emitting element 74. A schematic cross-sectional view of the light-emitting elements fabricated in this example is shown in FIG. 70. Details of the element structures are shown in Tables 61 and 62. Note that the fabrication steps of the elements are not described because they are similar to those in the above examples. The above examples can be referred to for the structures and abbreviations of compounds used in this example. Note that the light-emitting elements 70 to 73 respectively use Cu, Au, Mn, and Co as a transition metal in a composite material of the transition metal and an organic compound having an unshared electron pair in the electron-injection layer 4130. The comparative light-emitting element 74 uses a Li compound for the electron-injection layer 4130.

TABLE 61

| | Layer | Reference numeral | Thickness (nm) | Material | Weight ratio |
|---|---|---|---|---|---|
| Light-emitting element 70 | Electrode | 4102 | 200 | Al | — |
| | Charge-generation layer | 4135 | 15 | DBT3P-II:$MoO_3$ | 1:0.5 |
| | Electron-injection layer | 4130 | 0.2 | NBPhen:Cu | 1:0.15 |
| | Electron-transport layer | 4118(2) | 15 | NBPhen | — |
| | | 4118(1) | 5 | 2mDBTBPDBq-II | — |
| | Light-emitting layer | 4140 | 40 | 2mDBTBPDBq-II:PCBBiF: Ir(dmdppr-dmp)$_2$(dpm) | 0.75:0.25:0.08 |
| | Hole-transport layer | 4112 | 20 | PCBBiF | — |
| | Hole-injection layer | 4111 | 25 | DBT3P-II:$MoO_3$ | 1:0.5 |
| | Electrode | 4101 | 110 | ITSO | — |
| Light-emitting element 71 | Electrode | 4102 | 200 | Al | — |
| | Charge-generation layer | 4135 | 15 | DBT3P-II:$MoO_3$ | 1:0.5 |
| | Electron-injection layer | 4130(2) | 5 | Alq3:Au | 1:0.3 |
| | | 4130(1) | 5 | NBPhen:Ag | 1:0.15 |
| | Electron-transport layer | 4118(2) | 10 | NBPhen | — |
| | | 4118(1) | 5 | 2mDBTBPDBq-II | — |
| | Light-emitting layer | 4140 | 40 | 2mDBTBPDBq-II:PCBBiF: Ir(dmdppr-dmp)$_2$(dpm) | 0.75:0.25:0.08 |

TABLE 61-continued

| | Layer | Reference numeral | Thickness (nm) | Material | Weight ratio |
|---|---|---|---|---|---|
| | Hole-transport layer | 4112 | 20 | PCBBiF | — |
| | Hole-injection layer | 4111 | 25 | DBT3P-II:MoO$_3$ | 1:0.5 |
| | Electrode | 4101 | 110 | ITSO | — |
| Light-emitting element 72 | Electrode | 4102 | 200 | Al | — |
| | Charge-generation layer | 4135 | 15 | DBT3P-II:MoO$_3$ | 1:0.5 |
| | Electron-injection layer | 4130(2) | 5 | HATNA:Mn | 1:0.15 |
| | | 4130(1) | 5 | NBPhen:Ag | 1:0.3 |
| | Electron-transport layer | 4118(2) | 15 | NBPhen | — |
| | | 4118(1) | 5 | 2mDBTBPDBq-II | — |
| | Light-emitting layer | 4140 | 40 | 2mDBTBPDBq-II:PCBBiF: Ir(dmdppr-dmp)$_2$(dpm) | 0.75:0.25:0.08 |
| | Hole-transport layer | 4112 | 20 | PCBBiF | — |
| | Hole-injection layer | 4111 | 25 | DBT3P-II:MoO$_3$ | 1:0.5 |
| | Electrode | 4101 | 110 | ITSO | — |

TABLE 62

| | Layer | Reference numeral | Thickness (nm) | Material | Weight ratio |
|---|---|---|---|---|---|
| Light-emitting element 73 | Electrode | 4102 | 200 | Al | — |
| | Charge-generation layer | 4135 | 15 | DBT3P-II:MoO$_3$ | 1:0.5 |
| | Electron-injection layer | 4130(2) | 5 | HATNA:Co | 1:0.15 |
| | | 4130(1) | 5 | NBPhen:Ag | 1:0.3 |
| | Electron-transport layer | 4118(2) | 15 | NBPhen | — |
| | | 4118(1) | 5 | 2mDBTBPDBq-II | — |
| | Light-emitting layer | 4140 | 40 | 2mDBTBPDBq-II:PCBBiF: Ir(dmdppr-dmp)$_2$(dpm) | 0.75:0.25:0.08 |
| | Hole-transport layer | 4112 | 20 | PCBBiF | — |
| | Hole-injection layer | 4111 | 25 | DBT3P-II:MoO$_3$ | 1:0.5 |
| | Electrode | 4101 | 110 | ITSO | — |
| Comparative light-emitting element 74 | Electrode | 4102 | 200 | Al | — |
| | Charge-generation layer | 4135 | 15 | DBT3P-II:MoO$_3$ | 1:0.5 |
| | Electron-injection layer | 4130(1) | 0.2 | Li$_2$O | — |
| | Electron-transport layer | 4118(2) | 20 | NBPhen | — |
| | | 4118(1) | 5 | 2mDBTBPDBq-II | — |
| | Light-emitting layer | 4140 | 40 | 2mDBTBPDBq-II:PCBBiF: Ir(dmdppr-dmp)$_2$(dpm) | 0.75:0.25:0.08 |
| | Hole-transport layer | 4112 | 20 | PCBBiF | — |
| | Hole-injection layer | 4111 | 25 | DBT3P-II:MoO$_3$ | 1:0.5 |
| | Electrode | 4101 | 110 | ITSO | — |

<Characteristics of Light-Emitting Elements>

Next, the element characteristics of the fabricated light-emitting elements 70 to 73 and comparative light-emitting element 74 were measured. The measurement was performed in a manner similar to that in Example 1.

Figure 108:
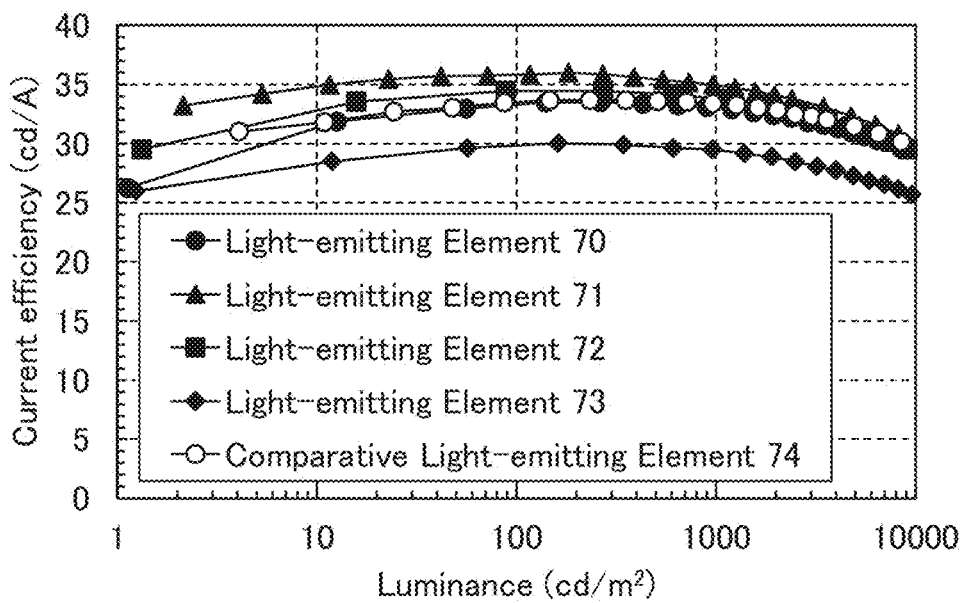
FIG. 108 shows current efficiency-luminance characteristics of light-emitting elements in Example.
Figure 109:
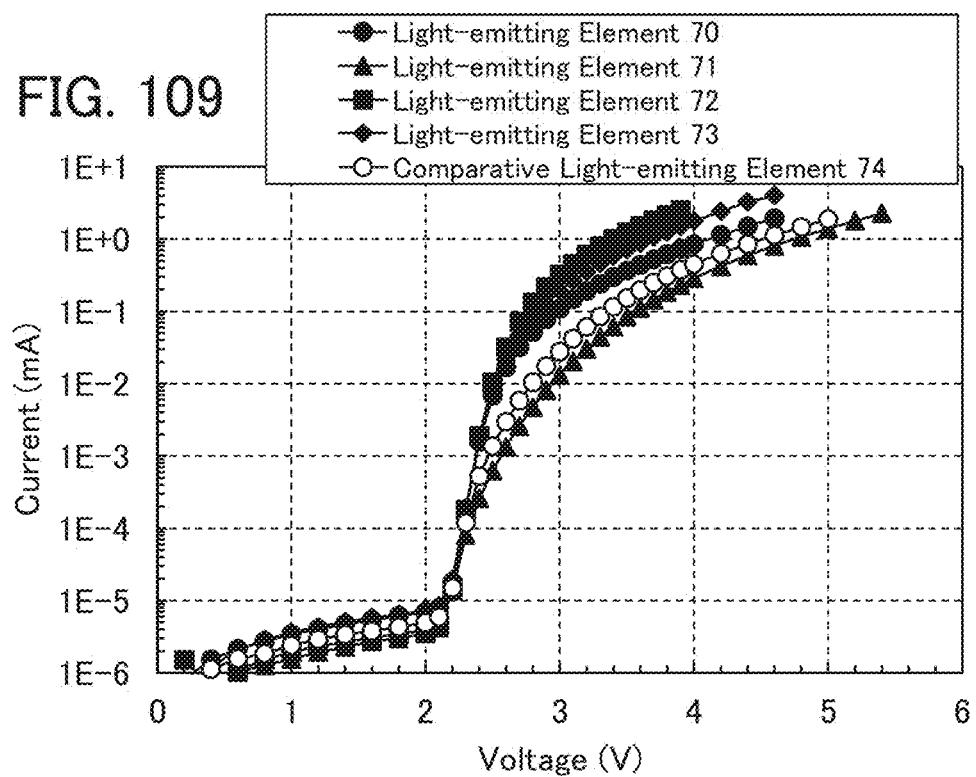
FIG. 109 shows current-voltage characteristics of light-emitting elements in Example.

FIG. 108 shows the current efficiency-luminance characteristics of the fabricated light-emitting elements 70 to 73 and comparative light-emitting element 74; FIG. 109, the current-voltage characteristics thereof, and FIG. 110, the external quantum efficiency-luminance characteristics thereof. FIG. 111 shows the electroluminescence spectra of the light-emitting elements through which current flows at a current density of 2.5 mA/cm$^2$.

Table 63 shows the element characteristics of the light-emitting elements 70 to 73 and the comparative light-emitting element 74 at around 1000 cd/m$^2$.

TABLE 63

| | Voltage (V) | Current density (mA/cm$^2$) | CIE chromaticity (x, y) | Luminance (cd/cm$^2$) | Current efficiency (cd/A) | Power efficiency (lm/W) | External quantum efficiency (%) |
|---|---|---|---|---|---|---|---|
| Light-emitting element 70 | 3.00 | 2.72 | (0.668, 0.333) | 1150 | 33.1 | 34.7 | 28.3 |
| Light-emitting element 71 | 3.60 | 2.77 | (0.669, 0.331) | 968 | 35.0 | 30.5 | 29.8 |
| Light-emitting element 72 | 2.80 | 3.29 | (0.666, 0.334) | 1111 | 33.8 | 37.9 | 27.8 |
| Light-emitting element 73 | 2.90 | 3.25 | (0.666, 0.334) | 960 | 29.5 | 32.0 | 24.8 |
| Comparative light-emitting element 74 | 3.40 | 2.89 | (0.667, 0.331) | 965 | 33.4 | 30.9 | 28.5 |

Figure 110:
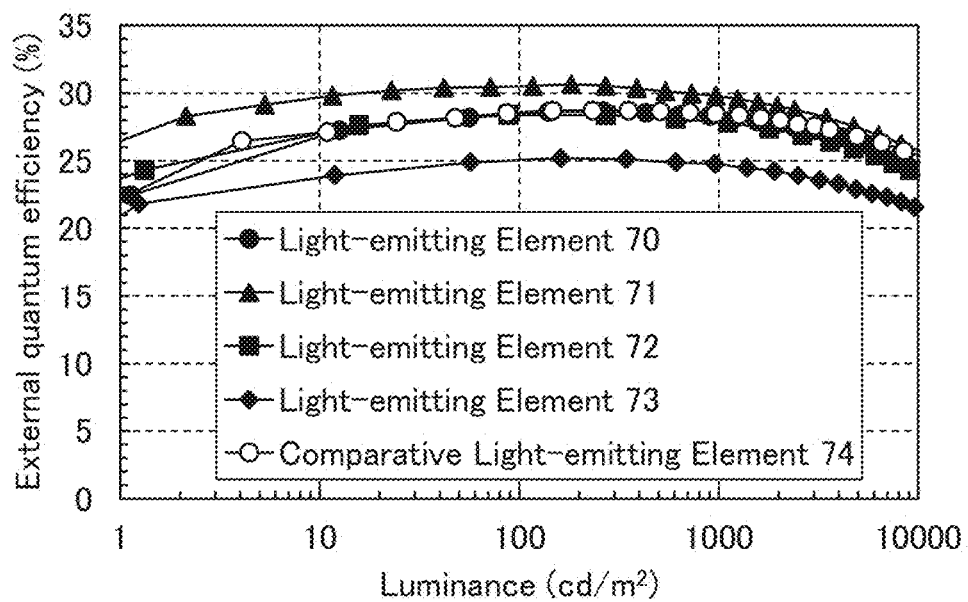
FIG. 110 shows external quantum efficiency-luminance characteristics of light-emitting elements in Example.
Figure 111:
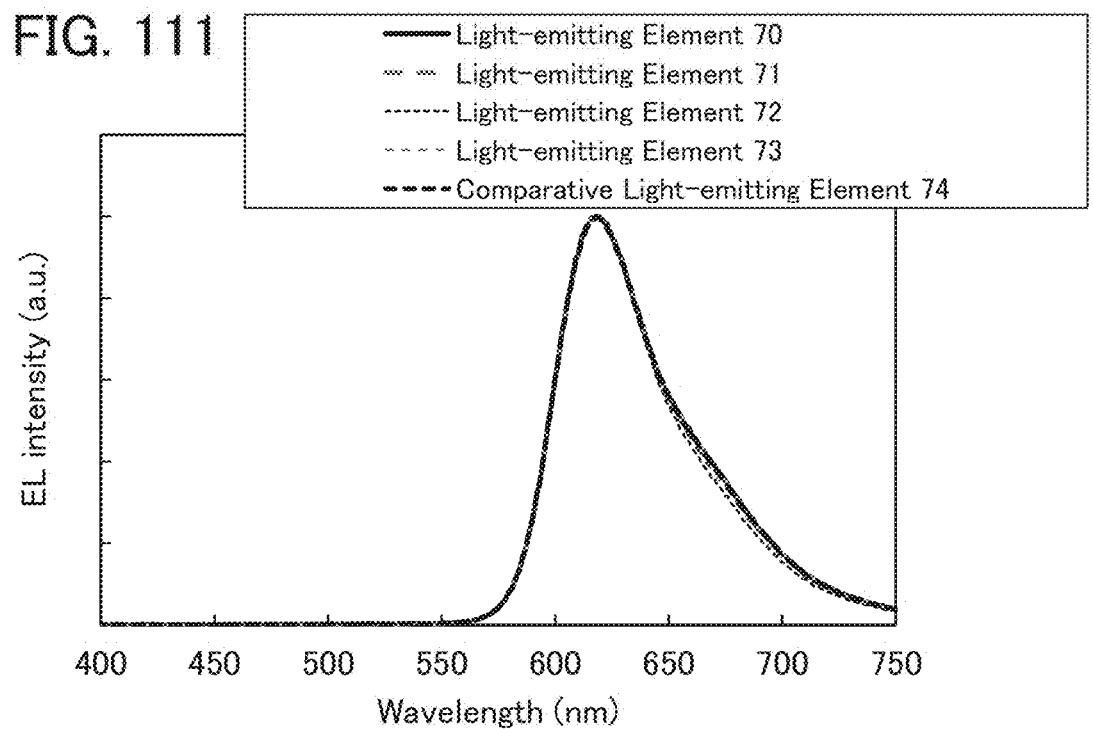
FIG. 111 shows electroluminescence spectra of light-emitting elements in Example.

As shown in FIG. 110 and Table 63, the light-emitting elements 70 to 73 and the comparative light-emitting element 74 each exhibited high emission efficiency with an external quantum efficiency exceeding 25%. The light-emitting elements 70 to 73 and the comparative light-emitting element 74 also exhibited high current efficiency as shown in FIG. 108. In addition, the light-emitting elements 70 to 73 according to one embodiment of the present invention exhibited high efficiency equivalent to that of the comparative light-emitting element 74, which uses $Li_2O$ typically used for the electron-injection layer.

As shown in FIG. 108, the light-emitting elements 70 to 73 and the comparative light-emitting element 74 exhibited favorable current-voltage characteristics. It was also found that the light-emitting elements 70 to 73 according to one embodiment of the present invention had electron-injection properties equivalent to those of the comparative light-emitting element 74, which uses $Li_2O$ typically used for the electron-injection layer.

As shown in FIG. 111, the light-emitting elements 70 to 73 and the comparative light-emitting element 74 each exhibited red emission whose electroluminescence spectrum has a peak wavelength at approximately 618 nm and a full width at half maximum of approximately 53 nm. The obtained electroluminescence spectrum reveals that the light is emitted from the guest material, $Ir(dmdppr-dmp)_2(dmp)$.

Thus, it was found that in the electron-injection layer 4130 of the light-emitting element according to one embodiment of the present invention, Au, Cu, Mn, or Co can be used as a transition metal in a composite material of the transition metal and an organic compound having an unshared electron pair.

REFERENCE NUMERALS

100: EL layer, 101: electrode, 101a: conductive layer, 101b: conductive layer, 102: electrode, 103: electrode, 103a: conductive layer, 103b: conductive layer, 104: electrode, 104a: conductive layer, 104b: conductive layer, 105: EL layer, 106: light-emitting unit, 107: EL layer, 108: light-emitting unit, 110: EL layer, 111: hole-injection layer, 112: hole-transport layer, 113: electron-transport layer, 114: electron-injection layer, 115: charge-generation layer, 116: hole-injection layer, 117: buffer layer, 118: electron-transport layer, 119: hole-transport layer, 130: electron-injection layer, 131: compound, 132: transition metal, 140: light-emitting layer, 150: light-emitting element, 152: light-emitting element, 154: light-emitting element, 160: charge-generation layer, 170: light-emitting layer, 210: substrate, 222B: region, 223: light-blocking layer, 224B: optical element, 250: light-emitting element, 252: light-emitting element, 411: substrate, 431: conductive layer, 432: semiconductor layer, 432p: semiconductor layer, 433a: conductive layer, 433b: conductive layer, 434: insulating layer, 435: impurity semiconductor layer, 437: semiconductor layer, 484: insulating layer, 601: source side driver circuit, 602: pixel portion, 603: gate side driver circuit, 604: sealing substrate, 605: sealant, 607: space, 608: wiring, 610: element substrate, 611: switching TFT, 612: current controlling TFT, 613: electrode, 614: insulator, 616: EL layer, 617: electrode, 618: light-emitting element, 623: n-channel TFT, 624: p-channel TFT, 633: electron-transport layer, 900: portable information terminal, 901: housing, 902: housing, 903: display portion, 905: hinge portion, 910: portable information terminal, 911: housing, 912: display portion, 913: operation button, 914: external connection port, 915: speaker, 916: microphone, 917: camera, 920: camera, 921: housing, 922: display portion, 923: operation buttons, 924: shutter button, 926: lens, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1024W: electrode, 1025B: lower electrode, 1025G: lower electrode, 1025R: lower electrode, 1025W: lower electrode, 1026: partition wall, 1028: EL layer, 1029: electrode, 1031: sealing substrate, 1032: sealant, 1033: base material, 1034B: coloring layer, 1034G: coloring layer, 1034R: coloring layer, 1036: overcoat layer, 1037: interlayer insulating film, 1040: pixel portion, 1041: driver circuit portion, 1042: peripheral portion, 2101: electrode, 2101a: conductive layer, 2101b: conductive layer, 2102: electrode, 2103: electrode, 2103a: conductive layer, 2103b: conductive layer, 2104: electrode, 2104a: conductive layer, 2104b: conductive layer, 2106: light-emitting unit, 2108: light-emitting unit, 2111: hole-injection layer, 2112: hole-transport layer, 2113: electron-transport layer, 2115: charge-generation layer, 2116: hole-injection layer, 2117: hole-transport layer, 2118: electron-transport layer, 2119: electron-injection layer, 2130: electron-injection layer, 2131: compound, 2140: light-emitting layer, 2145: partition wall, 2170: light-emitting layer, 2200: substrate, 2220: substrate, 2222B: region, 2222G: region, 2222R: region, 2223: light-blocking layer, 2224B: optical element, 2224G: optical element, 2224R: optical element, 2250a: light-emitting element, 2250b: light-emitting element, 2622B: region, 2622G: region, 2622R: region, 2631: hole-injection layer, 2632: hole-transport layer, 2633: electron-transport layer, 2634: electron-injection layer, 2635: charge-generation layer, 2637: hole-transport layer, 2638: electron-transport layer, 2639: electron-injection layer, 2642: electrode, 2644: light-emitting layer, 2646: light-emitting layer, 2650: substrate, 2652: substrate, 2661: electrode, 2662: electrode, 2663: electrode, 2664: electrode, 3500: multifunction terminal, 3502: housing, 3504: display portion, 3506: camera, 3508: lighting, 3600: light, 3602: housing, 3608: lighting, 3610: speaker, 3631: hole-injection layer, 3632: hole-transport layer, 3633: electron-transport layer, 3634: electron-injection layer, 3635: charge-generation layer, 3637: hole-transport layer, 3638: electron-transport layer, 3639: electron-injection layer, 3641: electrode, 3642: electrode, 3644: light-emitting layer, 3646: light-emitting layer, 3650: substrate, 3652: substrate, 4100: EL layer, 4101: electrode, 4102: electrode, 4111: hole-injection layer, 4112: hole-transport layer, 4118: electron-transport layer, 4135: charge-generation layer, 4130: electron-injection layer, 4140: light-emitting layer, 4210: substrate, 8501: lighting device, 8502: lighting device, 8503: lighting device, 8504: lighting device, 9000: housing, 9001: display portion, 9006: connection terminal, 9055: hinge, 9200: portable information terminal, 9201: portable information terminal, 9202: portable information terminal.

This application is based on Japanese Patent Application Serial No. 2017-077059 filed with Japan Patent Office on Apr. 7, 2017, Japanese Patent Application Serial No. 2017-077061 filed with Japan Patent Office on Apr. 7, 2017, and Japanese Patent Application Serial No. 2017-114262 filed with Japan Patent Office on Jun. 9, 2017, the entire contents of which are hereby incorporated by reference.

The invention claimed is:

1. A light-emitting element comprising:
a first light-emitting layer between an anode and a cathode; and
a first layer between the first light-emitting layer and the cathode,
wherein the first layer includes a first organic compound and a transition metal,
wherein the first organic compound includes an unshared electron pair, and
wherein spin density of a film including the first organic compound and the transition metal with a molar ratio of 1:1 is higher than or equal to $1\times10^{16}$ spins/cm$^3$.

2. The light-emitting element according to claim 1, further comprising a second light-emitting layer,
wherein the first layer is between the first light-emitting layer and the second light-emitting layer.

3. The light-emitting element according to claim 1,
wherein the film includes the first organic compound and the transition metal with a weight ratio of 1:0.11 to 1:0.52.

4. The light-emitting element according to claim 1,
wherein the transition metal is a metal belonging to Group 5, Group 7, Group 9, or Group 11 in the periodic table.

5. The light-emitting element according to claim 4,
wherein the electron deficient heteroaromatic ring includes at least one of a pyridine ring, a diazine ring, and a triazine ring.

6. The light-emitting element according to claim 1,
wherein the first organic compound includes an electron deficient heteroaromatic ring.

7. The light-emitting element according to claim 1,
wherein the first organic compound has 25 to 100 carbon atoms.

8. The light-emitting element according to claim 1,
wherein a LUMO level of the first organic compound is higher than or equal to −3.6 eV and lower than or equal to −2.3 eV.

9. The light-emitting element according to claim 1, further comprising a second layer between the cathode and the first layer,
wherein the second layer includes a second organic compound including an electron deficient heteroaromatic ring.

10. The light-emitting element according to claim 1,
wherein an alkali metal and an alkaline earth metal are not included in the light-emitting element.

11. A display device comprising:
the light-emitting element according to claim 1; and
at least one of a color filter and a transistor.

12. A light-emitting element comprising:
a first light-emitting unit and a second light-emitting unit between an anode and a cathode; and
a first layer between the first light-emitting unit and the second light-emitting unit,
wherein the first layer includes a first organic compound and a transition metal,
wherein the first organic compound includes an unshared electron pair, and
wherein an unpaired electron is observed by electron spin resonance in a film including the first organic compound and the transition metal.

13. The light-emitting element according to claim 12,
wherein the film includes the first organic compound and the transition metal with a weight ratio of 1:0.11 to 1:0.52.

14. The light-emitting element according to claim 12,
wherein the transition metal is a metal belonging to Group 5, Group 7, Group 9, or Group 11 in the periodic table.

15. The light-emitting element according to claim 12,
wherein the first organic compound includes an electron deficient heteroaromatic ring.

16. The light-emitting element according to claim 15,
wherein the electron deficient heteroaromatic ring includes at least one of a pyridine ring, a diazine ring, and a triazine ring.

17. The light-emitting element according to claim 12,
wherein the first organic compound has 25 to 100 carbon atoms.

18. The light-emitting element according to claim 12,
wherein a LUMO level of the first organic compound is higher than or equal to −3.6 eV and lower than or equal to −2.3 eV.

19. The light-emitting element according to claim 12,
wherein an alkali metal and an alkaline earth metal are not included in the light-emitting element.

20. A display device comprising:
the light-emitting element according to claim 12; and
at least one of a color filter and a transistor.

* * * * *